(12) United States Patent
Masunaga et al.

(10) Patent No.: US 12,429,772 B2
(45) Date of Patent: Sep. 30, 2025

(54) CHEMICALLY AMPLIFIED RESIST COMPOSITION, PHOTOMASK BLANK, METHOD FOR FORMING RESIST PATTERN, AND METHOD FOR PRODUCING POLYMER COMPOUND

(71) Applicant: SHIN-ETSU CHEMICAL CO., LTD., Tokyo (JP)

(72) Inventors: Keiichi Masunaga, Joetsu (JP); Kenji Funatsu, Joetsu (JP); Masaaki Kotake, Joetsu (JP); Naoya Inoue, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 671 days.

(21) Appl. No.: 17/735,647

(22) Filed: May 3, 2022

(65) Prior Publication Data
US 2022/0404701 A1    Dec. 22, 2022

(30) Foreign Application Priority Data
May 13, 2021 (JP) .................... 2021-081707

(51) Int. Cl.
G03F 7/039 (2006.01)
C08F 212/14 (2006.01)
G03F 7/038 (2006.01)

(52) U.S. Cl.
CPC .......... G03F 7/0392 (2013.01); C08F 212/24 (2020.02); G03F 7/0382 (2013.01)

(58) Field of Classification Search
CPC ..... G03F 7/0392; G03F 7/0382; C08F 212/24
See application file for complete search history.

(56) References Cited

U.S. PATENT DOCUMENTS

| | | | |
|---|---|---|---|
| 2006/0135745 A1 | 6/2006 | Hada et al. | |
| 2006/0166133 A1 | 7/2006 | Koitabashi et al. | |
| 2006/0228648 A1 | 10/2006 | Ohsawa et al. | |
| 2007/0042292 A1* | 2/2007 | Yoneda | G03F 7/0392 430/270.1 |
| 2008/0090179 A1 | 4/2008 | Takeda et al. | |
| 2008/0096128 A1 | 4/2008 | Takeda et al. | |
| 2008/0118860 A1 | 5/2008 | Harada et al. | |
| 2008/0153030 A1 | 6/2008 | Kobayashi et al. | |
| 2008/0241736 A1 | 10/2008 | Kobayashi et al. | |
| 2008/0305411 A1 | 12/2008 | Koitabashi et al. | |
| 2008/0318171 A1* | 12/2008 | Tsubaki | G03F 7/11 430/326 |
| 2010/0055608 A1 | 3/2010 | Ohashi et al. | |
| 2010/0099042 A1 | 4/2010 | Ohashi et al. | |
| 2010/0119970 A1 | 5/2010 | Ohsawa et al. | |
| 2010/0209827 A1 | 8/2010 | Ohashi et al. | |
| 2010/0324329 A1 | 12/2010 | Nagai et al. | |
| 2011/0177464 A1 | 7/2011 | Takeda et al. | |
| 2011/0294047 A1 | 12/2011 | Koitabashi et al. | |
| 2012/0028188 A1 | 2/2012 | Ichikawa et al. | |
| 2012/0135355 A1* | 5/2012 | Tsubaki | G03F 7/325 430/311 |
| 2012/0308920 A1 | 12/2012 | Domon et al. | |
| 2012/0308932 A1 | 12/2012 | Sagehashi et al. | |
| 2013/0023638 A1 | 1/2013 | Furukawa et al. | |
| 2013/0123446 A1 | 5/2013 | Oikawa | |
| 2013/0209922 A1 | 8/2013 | Masunaga et al. | |
| 2014/0242505 A1 | 8/2014 | Yamaguchi et al. | |
| 2014/0272707 A1 | 9/2014 | Fukushima et al. | |
| 2014/0315131 A1 | 10/2014 | Hatakeyama | |
| 2016/0090355 A1 | 3/2016 | Domon et al. | |
| 2016/0299428 A1 | 10/2016 | Masunaga et al. | |
| 2016/0299430 A1 | 10/2016 | Domon et al. | |
| 2017/0121437 A1 | 5/2017 | Tsuchimura | |
| 2017/0351177 A1 | 12/2017 | Hatakeyama et al. | |
| 2018/0039177 A1 | 2/2018 | Masunaga et al. | |
| 2019/0010119 A1 | 1/2019 | Suzuki et al. | |
| 2019/0361348 A1 | 11/2019 | Kotake et al. | |
| 2019/0361350 A1* | 11/2019 | Inoue | G03F 7/0395 |
| 2020/0133121 A1* | 4/2020 | Domon | C07D 327/08 |

FOREIGN PATENT DOCUMENTS

| | | |
|---|---|---|
| CN | 110526841 A | 12/2019 |
| JP | 2003-270788 A | 9/2003 |
| JP | 2004-115630 A | 4/2004 |
| JP | 2004-143281 A | 5/2004 |
| JP | 2004-323704 A | 11/2004 |

(Continued)

OTHER PUBLICATIONS

Oct. 25, 2022 Extended Search Report issued in European Patent Application No. 22172513.8.
Feb. 23, 2023 Office Action and Search Report Issued in Taiwanese Patent Application No. 111117420.
Jun. 25, 2024 Office Action issued in Japanese Patent Application No. 2021-081707.
Oct. 15, 2024 Office Action issued in Japanese Patent Application No. 2021-081707.
Feb. 1, 2024 Office Action issued in Korean Patent Application No. 10-2022-0057280.
Mar. 5, 2024 Office Action issued in Japanese Patent Application No. 2021-081707.

(Continued)

*Primary Examiner* — Mark F. Huff
*Assistant Examiner* — Christine Curiac
(74) *Attorney, Agent, or Firm* — Oliff PLC

(57) ABSTRACT

A chemically amplified resist composition contains (A) a polymer compound containing one or two or more kinds of repeating units, at least one kind of the repeating units is polymerized from a polymerizable monomer with not more than 1000 ppm of a residual oligomer in a form of dimer to hexamer. An object of the present invention is to provide: a chemically amplified resist composition capable of achieving favorable resolution, pattern profile, and line edge roughness, and simultaneously suppressing development-residue defect, which would otherwise cause mask defect; and a method for forming a resist pattern by using this composition.

13 Claims, No Drawings

(56) References Cited

FOREIGN PATENT DOCUMENTS

| | | |
|---|---|---|
| JP | 2005-189789 A | 7/2005 |
| JP | 3790649 B2 | 6/2006 |
| JP | 2006-201532 A | 8/2006 |
| JP | 2006-215180 A | 8/2006 |
| JP | 2006-274276 A | 10/2006 |
| JP | 2006-335715 A | 12/2006 |
| JP | 2007-145797 A | 6/2007 |
| JP | 2008-095009 A | 4/2008 |
| JP | 2008-102383 A | 5/2008 |
| JP | 2008-111103 A | 5/2008 |
| JP | 2008-158339 A | 7/2008 |
| JP | 2008-197606 A | 8/2008 |
| JP | 2008-239918 A | 10/2008 |
| JP | 2008-249762 A | 10/2008 |
| JP | 2008-304590 A | 12/2008 |
| JP | 2009-242809 A | 10/2009 |
| JP | 2010-2633 A | 1/2010 |
| JP | 2010-077404 A | 4/2010 |
| JP | 2010-113209 A | 5/2010 |
| JP | 2010-116550 A | 5/2010 |
| JP | 4466881 B2 | 5/2010 |
| JP | 2010-215608 A | 9/2010 |
| JP | 2011-070033 A | 4/2011 |
| JP | 2012-189977 A | 10/2012 |
| JP | 2012-246265 A | 12/2012 |
| JP | 2012-246426 A | 12/2012 |
| JP | 2013-101271 A | 5/2013 |
| JP | 5250495 B2 | 7/2013 |
| JP | 2013-164588 A | 8/2013 |
| JP | 2014-177407 A | 9/2014 |
| JP | 2014-219657 A | 11/2014 |
| JP | 2016-065016 A | 4/2016 |
| JP | 2016-200805 A | 12/2016 |
| JP | 2017-219836 A | 12/2017 |
| JP | 2019-204048 A | 11/2019 |
| KR | 10-2013-0080430 A | 7/2013 |
| KR | 10-2016-0120231 A | 10/2016 |
| KR | 10-2018-0016276 A | 2/2018 |
| TW | 201907230 A | 2/2019 |
| WO | 2006/121096 A1 | 11/2006 |
| WO | 2011/115190 A1 | 9/2011 |
| WO | 2016/017248 A1 | 2/2016 |

OTHER PUBLICATIONS

Mar. 7, 2025 Office Action issued in European Patent Application No. 22172513.8.

Apr. 22, 2025 Office Action issued in Chinese Patent Application No. 202210518733.9.

* cited by examiner

CHEMICALLY AMPLIFIED RESIST COMPOSITION, PHOTOMASK BLANK, METHOD FOR FORMING RESIST PATTERN, AND METHOD FOR PRODUCING POLYMER COMPOUND

TECHNICAL FIELD

The present invention relates to a chemically amplified resist composition and a method for forming a resist pattern therefrom.

BACKGROUND ART

Recently, as LSIs advance toward higher integration and higher processing speed, miniaturization of pattern rule is progressing rapidly. In this situation, a pattern of 0.2 μm or less is processed often using chemically amplified resists with an acid as a catalyst. Moreover, high-energy beams such as ultraviolet ray, deep ultraviolet ray, and electron beam (EB) are used as the exposure light source. Particularly, EB lithography, which is utilized as ultrafine processing technique, is also indispensable as the method for processing a photomask blank in producing a photomask for semiconductor manufacture.

Polymers having many aromatic skeletons with acidic side chains, such as polyhydroxystyrene, are useful as resist materials for KrF excimer laser, but are not used as resist materials for the ArF excimer laser because such polymers strongly absorb light at a wavelength of around 200 nm. These polymers, however, are important materials in that high etching resistance is achieved as resist materials for EB and extreme ultraviolet ray (EUV), which are effective techniques for forming a finer pattern than a processing limit of ArF excimer laser.

Resist compositions used in such photolithography include: positive type in which an exposed portion is dissolved to form a pattern; and negative type in which an exposed portion is left to form a pattern. Among these, one which is easy to use is selected depending on a required resist pattern. Chemically-amplified negative resist compositions normally contain: a polymer compound which is dissolved in an aqueous alkaline developer; an acid generator which is decomposed by exposure light to generate an acid; and a crosslinking agent which forms crosslinks between the polymer compound molecules with the acid serving as a catalyst to insolubilize the polymer compound in the developer (the polymer compound and the crosslinking agent can be integrated), or contain a material which makes the polymer compound change its polarity to achieve insolubilization in the developer. Further, a basic compound is normally added to control diffusion of acid generated by light exposure.

A phenol-derived unit is an example of an alkali-soluble unit constituting a polymer compound dissolved in an aqueous alkaline developer as mentioned above. Heretofore, a variety of such positive-type resist compositions and negative-type resist compositions have been developed for exposure particularly with KrF excimer laser beam. However, these have not been employed for ArF excimer laser beam because the phenol-derived unit does not have light transmittance to exposure light at a wavelength of 150 to 220 nm. Nevertheless, recently, these compositions have drawn attention again as positive- and negative-type resist compositions for short wavelength exposure such as EB and EUV, which are exposure methods to obtain finer pattern. For example, Patent Documents 1, 2, 3 and 4 have been reported.

Meanwhile, to control resist sensitivity and pattern profile in the photolithography, various improvements have been studied by way of modifying, for example, process conditions, selection and combination of basic compounds serving as acid diffusion regulator and acid generator used in resist compositions. For example, Patent Documents 5 and 6 have been reported.

On the other hand, as the pattern miniaturization progresses, resist residue after development brings about defect problem, and causes scum residue or bridge within a resist pattern. Hence, such residue may lower the yield that is important in semiconductor manufacturing processes. Thus, the defect reduction is strongly desired. As the improvement scheme, Patent Documents 7, 8 suggest removing an unreacted monomer from a polymer, and Patent Documents 9, 10 suggest removal methods by filtration. As methods for removing an unreacted monomer from a polymer, dedicated crystallization step, water-washing and liquid separation, or the like may be employed. Nonetheless, these methods have problems: the nature of the polymer may be changed by further removing essential components, the yield is lowered, and it is difficult to remove targeted low-molecular-weight component from the polymer in some cases.

Further, column chromatography and filtration have a problem with productivity, and also it is difficult to completely remove such oligomers including dimer to octamer. It is substantially important to remove oligomer components that give more influential contribution to development residue than monomer components. These methods are insufficient particularly in the-state-of-art lithography for semiconductor processes after 14-nm node, and further improvement has been sought.

CITATION LIST

Patent Literature

Patent Document 1: JP 2006-201532 A
Patent Document 2: JP 2006-215180 A
Patent Document 3: JP 2008-249762 A
Patent Document 4: JP 2008-95009 A
Patent Document 5: JP 2016-65016 A
Patent Document 6: JP 2016-200805 A
Patent Document 7: JP 2003-270788 A
Patent Document 8: JP 2006-274276 A
Patent Document 9: JP 2011-70033 A
Patent Document 10: JP 2005-189789 A

SUMMARY OF INVENTION

Technical Problem

The present invention has been made in view of the above circumstances. An object of the present invention is to provide: a chemically amplified resist composition capable of achieving favorable resolution, pattern profile, and line edge roughness, and simultaneously suppressing development-residue defect, which would otherwise cause mask defect; and a method for forming a resist pattern by using this composition.

Solution to Problem

To achieve the object, the present invention provides a chemically amplified resist composition comprising
(A) a polymer compound comprising one or two or more kinds of repeating units, wherein at least one kind of the repeating units is polymerized from a polymerizable monomer with not more than 1000 ppm of a residual oligomer in a form of dimer to hexamer.

The material of such a polymer has little content of oligomer components in the state of monomer before the polymerization, and purification is not necessarily performed in the state of polymer. Thus, the chemically amplified resist composition is capable of suppressing development-residue defect, which would otherwise cause mask defect, while achieving favorable resolution, pattern profile, and line edge roughness.

Preferably, the chemically amplified resist composition is a chemically-amplified positive resist composition,
the component (A) is a polymer compound comprising a repeating unit A1 shown by the following general formula (A1), and
the repeating unit A1 is polymerized from a polymerizable monomer with not more than 1000 ppm of a residual oligomer in a form of dimer to hexamer,

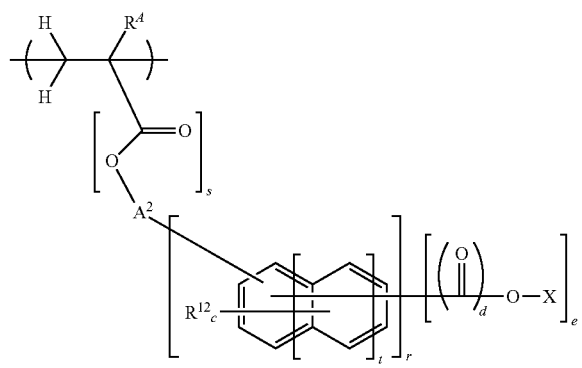

(A1)

wherein $R^A$ represents a hydrogen atom, a fluorine atom, a methyl group, or a trifluoromethyl group; each $R^{12}$ independently represents a halogen atom, a linear, branched, or cyclic acyloxy group having 2 to 8 carbon atoms optionally substituted with a halogen atom, a linear, branched, or cyclic alkyl group having 1 to 6 carbon atoms optionally substituted with a halogen atom, or a linear, branched, or cyclic alkoxy group having 1 to 6 carbon atoms optionally substituted with a halogen atom; $A^2$ represents a single bond, or a linear, branched, or cyclic alkylene group having 1 to 11 carbon atoms optionally having an ether bond or an ester bond in a carbon-carbon bond; "s" represents 0 or 1; "t" represents an integer of 0 to 2; "c" represents an integer satisfying $0 \leq c \leq 5+2t-e$; "d" represents 0 or 1; "e" represents an integer of 1 to 3; "r" represents 0 or 1; and X represents an acid-labile group when "e" is 1, or represents a hydrogen atom or an acid-labile group when "e" is 2 or more, provided that at least one X is an acid-labile group.

Preferably, the chemically amplified resist composition is a chemically-amplified negative resist composition,
the component (A) is a polymer compound comprising a repeating unit A2 shown by the following general formula (A2), and
the repeating unit A2 is polymerized from a polymerizable monomer with not more than 1000 ppm of a residual oligomer in a form of dimer to hexamer,

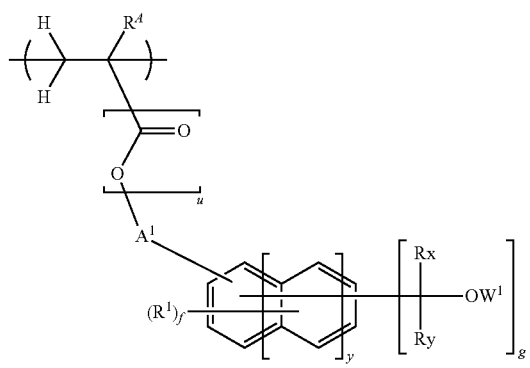

(A2)

wherein $R^A$ represents a hydrogen atom, a fluorine atom, a methyl group, or a trifluoromethyl group; A1 represents a single bond, or a saturated hydrocarbylene group having 1 to 10 carbon atoms, and $—CH_2—$ constituting the saturated hydrocarbylene group is optionally substituted with $—O—$; each $R^1$ independently represents a halogen atom, a saturated hydrocarbylcarbonyloxy group having 2 to 8 carbon atoms optionally substituted with a halogen atom, a saturated hydrocarbyl group having 1 to 6 carbon atoms optionally substituted with a halogen atom, or a saturated hydrocarbyloxy group having 1 to 6 carbon atoms optionally substituted with a halogen atom; $W^1$ represents a hydrogen atom, an aliphatic hydrocarbyl group having 1 to 10 carbon atoms, or an aryl group optionally having a substituent, and $—CH_2—$ constituting the aliphatic hydrocarbyl group is optionally substituted with $—O—$, $—C(=O)—$, $—O—C(=O)—$, or $—C(=O)—O—$; Rx and Ry each independently represent a hydrogen atom, a saturated hydrocarbyl group having 1 to 15 carbon atoms optionally substituted with a hydroxy group or a saturated hydrocarbyloxy group, or an aryl group optionally having a substituent, provided that Rx and Ry do not represent hydrogen atoms simultaneously, or Rx and Ry are optionally bonded to each other to form a ring together with a carbon atom bonded therewith; "y" represents an integer of 0 to 2; "u" represents 0 or 1; "f" represents an integer satisfying $0 \leq f \leq 5+2y-g$; and "g" represents an integer of 1 to 3.

In the resist composition, these repeating units which cause reaction by action of acid generated by light exposure would have considerable influence on defect. Thus, suppressing oligomers in the polymerizable monomers for forming these repeating units can maximize the effects of the present invention.

The component (A) may be a polymer compound comprising a repeating unit A3 shown by the following general formula (A3),

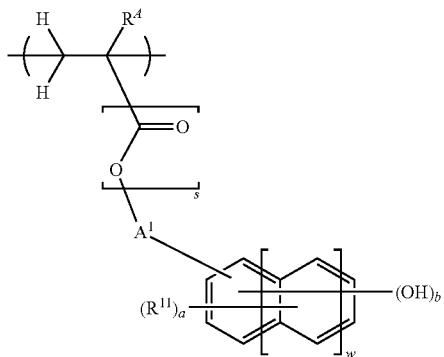
(A3)

wherein $R^A$ represents a hydrogen atom, a fluorine atom, a methyl group, or a trifluoromethyl group; each $R^{11}$ independently represents a halogen atom, a saturated hydrocarbylcarbonyloxy group having 2 to 8 carbon atoms optionally substituted with a halogen atom, a saturated hydrocarbyl group having 1 to 6 carbon atoms optionally substituted with a halogen atom, or a saturated hydrocarbyloxy group having 1 to 6 carbon atoms optionally substituted with a halogen atom; $A^1$ represents a single bond or a saturated hydrocarbylene group having 1 to 10 carbon atoms, and —$CH_2$— constituting the saturated hydrocarbylene group is optionally substituted with —O—; "s" represents 0 or 1; "w" represents an integer of 0 to 2; "a" represents an integer satisfying $0 \leq a \leq 5+2w-b$; and "b" represents an integer of 1 to 3.

Moreover, the component (A) may be a polymer compound comprising at least one selected from repeating units A4 to A11 shown by the following general formulae (A4) to (A11),

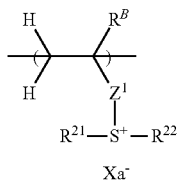
(A4)

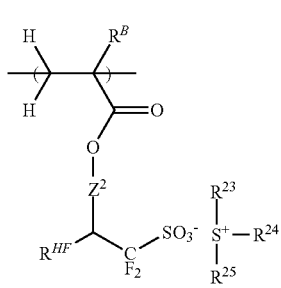
(A5)

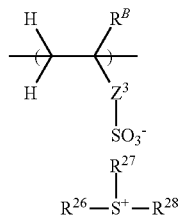
(A6)

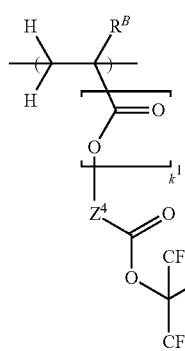
(A7)

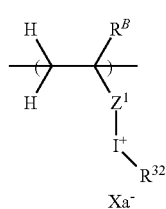
(A8)

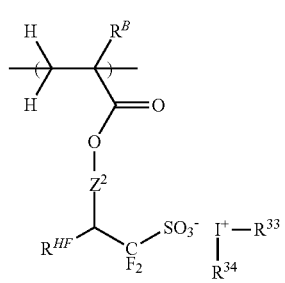
(A9)

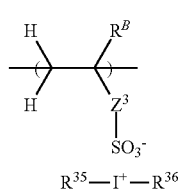
(A10)

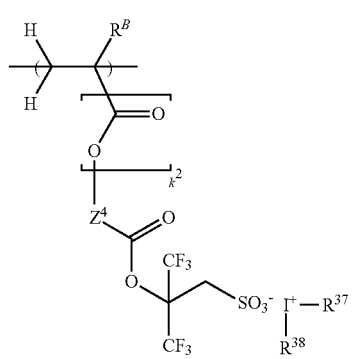
(A11)

wherein each $R^B$ independently represents a hydrogen atom or a methyl group; $Z^1$ represents a single bond, an aliphatic hydrocarbylene group having 1 to 6 carbon atoms, a phenylene group, a naphthylene group, or a group having 7 to 18 carbon atoms obtained from a combination thereof, —O—$Z^{11}$—, —C(=O)—O—$Z^{11}$—, or —C(=O)—NH—$Z^{11}$—; $Z^{11}$ represents an aliphatic hydrocarbylene group having 1 to 6 carbon atoms, a phenylene group, a naphthylene group, or a group having 7 to 18 carbon atoms obtained from a combination thereof, and optionally contains a carbonyl group, an ester bond, an ether bond, or a hydroxy group; $Z^2$ represents a single bond or —$Z^{21}$—C(=O)—O—; $Z^{21}$ represents a hydrocarbylene group having 1 to 20 carbon atoms optionally containing a heteroatom; $Z^3$ represents a single bond, a methylene group, an ethylene group, a phenylene group, a fluorinated phenylene group, a trifluoromethyl group-substituted phenylene group, —O—$Z^{31}$—, —C(=O)—O—$Z^{31}$—, or —C(=O)—NH—$Z^{31}$—; $Z^{31}$ represents an aliphatic hydrocarbylene group having 1 to 6 carbon atoms, a phenylene group, a fluorinated phenylene group, a trifluoromethyl group-substituted phenylene group, or a group having 7 to 20 carbon atoms obtained from a combination thereof, and optionally contains a carbonyl group, an ester bond, an ether bond, or a hydroxy group; $Z^4$ represents a single bond, or a hydrocarbylene group having 1 to 30 carbon atoms optionally containing a heteroatom; $k^1$ and $k^2$ each independently represent 0 or 1, but $k^1$ and $k^2$ each represent 0 when $Z^4$ is a single bond; $R^{21}$ to $R^{38}$ each independently represent a hydrocarbyl group having 1 to 20 carbon atoms optionally containing a heteroatom; $R^{21}$ and $R^{22}$ are optionally bonded to each other to form a ring together with a sulfur atom bonded therewith; $R^{23}$ and $R^{24}$, $R^{26}$ and $R^{27}$, or $R^{29}$ and $R^{30}$, are optionally bonded to each other to form a ring together with a sulfur atom bonded therewith; $R^{HF}$ represents a hydrogen atom or a trifluoromethyl group; and $Xa^-$ represents a non-nucleophilic counter ion.

Further, the component (A) may be a polymer compound comprising at least one selected from repeating units A12 to A14 shown by the following general formulae (A12), (A13), and (A14),

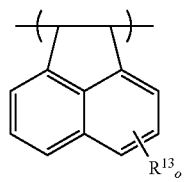

(A12)

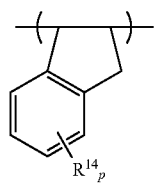

(A13)

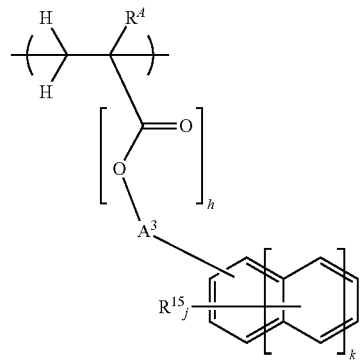

(A14)

wherein $R^4$ represents a hydrogen atom, a fluorine atom, a methyl group, or a trifluoromethyl group; $R^{13}$ and $R^{14}$ each independently represent a hydroxy group, a halogen atom, an acetoxy group, a linear, branched, or cyclic acyloxy group having 2 to 8 carbon atoms optionally substituted with a halogen atom, a linear, branched, or cyclic alkyl group having 1 to 8 carbon atoms optionally substituted with a halogen atom, a linear, branched, or cyclic alkoxy group having 1 to 8 carbon atoms optionally substituted with a halogen atom, or a linear, branched, or cyclic alkylcarbonyloxy group having 2 to 8 carbon atoms optionally substituted with a halogen atom; $R^{15}$ represents an acetyl group, an acetoxy group, a linear, branched, or cyclic alkyl group having 1 to 20 carbon atoms, a linear, branched, or cyclic alkoxy group having 1 to 20 carbon atoms, a linear, branched, or cyclic acyloxy group having 2 to 20 carbon atoms, a linear, branched, or cyclic alkoxyalkyl group having 2 to 20 carbon atoms, an alkylthioalkyl group having 2 to 20 carbon atoms, a halogen atom, a nitro group, a cyano group, a sulfinyl group, or a sulfonyl group; $A^3$ represents a single bond, or a linear, branched, or cyclic alkylene group having 1 to 10 carbon atoms, and optionally has an ether bond in a carbon-carbon bond; "o" and "p" each independently represent an integer of 0 to 4; "h" represents an integer of 0 or 1; "j" represents an integer of 0 to 5; and "k" represents an integer of 0 to 2.

In the present invention, polymer compounds as described above are suitably usable as the component (A).

More preferably, the chemically amplified resist composition is a chemically-amplified positive resist composition, and
  the component (A) is a polymer compound comprising the repeating unit A1 shown by the general formula (A1) and a repeating unit A3 shown by the following general formula (A3), but no repeating units A4 to A11 shown by the following general formulae (A4) to (A11), (A3)

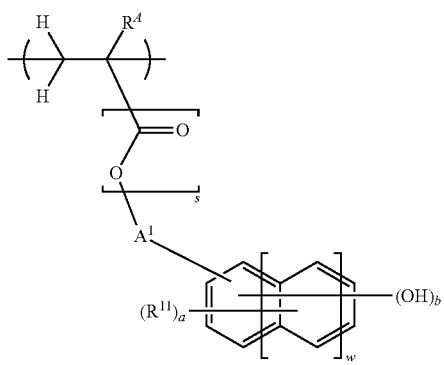

(A7)

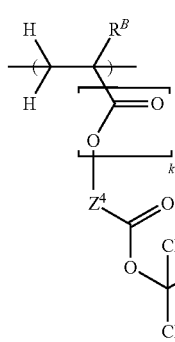

(A8)

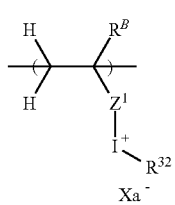

(A9)

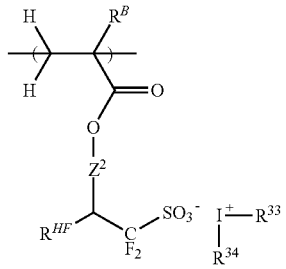

wherein $R^A$ represents a hydrogen atom, a fluorine atom, a methyl group, or a trifluoromethyl group; each $R^{11}$ independently represents a halogen atom, a saturated hydrocarbyl-carbonyloxy group having 2 to 8 carbon atoms optionally substituted with a halogen atom, a saturated hydrocarbyl group having 1 to 6 carbon atoms optionally substituted with a halogen atom, or a saturated hydrocarbyloxy group having 1 to 6 carbon atoms optionally substituted with a halogen atom; A1 represents a single bond or a saturated hydrocarbylene group having 1 to 10 carbon atoms, and —CH$_2$- constituting the saturated hydrocarbylene group is optionally substituted with —O—; "s" represents 0 or 1; "w" represents an integer of 0 to 2; "a" represents an integer satisfying 0≤a≤5+2w−b; and "b" represents an integer of 1 to 3, and (A10)

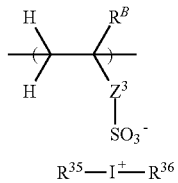

(A4)

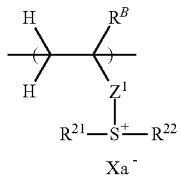

(A11)

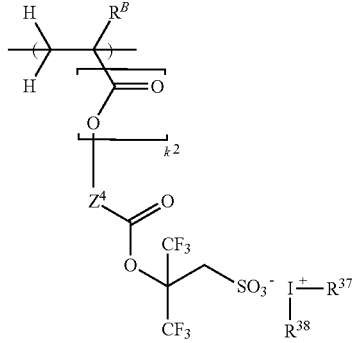

(A5)

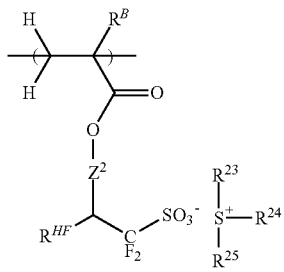

(A6)

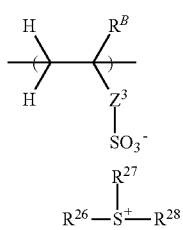

wherein each $R^B$ independently represents a hydrogen atom or a methyl group; $Z^1$ represents a single bond, an aliphatic hydrocarbylene group having 1 to 6 carbon atoms, a phenylene group, a naphthylene group, or a group having 7 to 18 carbon atoms obtained from a combination thereof, —O—$Z^{11}$—, —C(=O)—O—$Z^{11}$—, or —C(=O)—NH—$Z^{11}$—; $Z^{11}$ represents an aliphatic hydrocarbylene group having 1 to 6 carbon atoms, a phenylene group, a naphthylene group, or a group having 7 to 18 carbon atoms obtained from a combination thereof, and optionally contains a carbonyl group, an ester bond, an ether bond, or a hydroxy group; $Z^2$ represents a single bond or $—Z^{21}—C(=O)—O—$; $Z^{21}$ represents a hydrocarbylene group having 1 to 20 carbon atoms optionally containing a heteroatom; $Z^3$ represents a single bond, a methylene group, an ethylene group, a phenylene group, a fluorinated phenylene group, a trifluoromethyl group-substituted phenylene group, $—O—Z^{31}—$, $—C(=O)—O—Z^{31}—$, or $—C(=O)—NH—Z^{31}—$; $Z^{31}$ represents an aliphatic hydrocarbylene group having 1 to 6 carbon atoms, a phenylene group, a fluorinated phenylene group, a trifluoromethyl group-substituted phenylene group, or a group having 7 to 20 carbon atoms obtained from a combination thereof, and optionally contains a carbonyl group, an ester bond, an ether bond, or a hydroxy group; $Z^4$ represents a single bond, or a hydrocarbylene group having 1 to 30 carbon atoms optionally containing a heteroatom; $k^1$ and $k^2$ each independently represent 0 or 1, but $k^1$ and $k^2$ each represent 0 when $Z^4$ is a single bond; $R^{21}$ to $R^{38}$ each independently represent a hydrocarbyl group having 1 to 20 carbon atoms optionally containing a heteroatom; $R^{21}$ and $R^{22}$ are optionally bonded to each other to form a ring together with a sulfur atom bonded therewith; $R^{23}$ and $R^{24}$, $R^{26}$ and $R^{27}$, or $R^{29}$ and $R^{30}$, are optionally bonded to each other to form a ring together with a sulfur atom bonded therewith; $R^{HF}$ represents a hydrogen atom or a trifluoromethyl group; and $Xa^-$ represents a non-nucleophilic counter ion.

When the inventive chemically amplified resist composition is used as a chemically-amplified positive resist composition, the component (A) can be such materials as described above.

More preferably, the chemically amplified resist composition is a chemically-amplified negative resist composition, and
the component (A) is a polymer compound comprising the repeating unit A2 shown by the general formula (A2) and a repeating unit A3 shown by the following general formula (A3), but no repeating units A4 to A11 shown by the following general formulae (A4) to (A11),

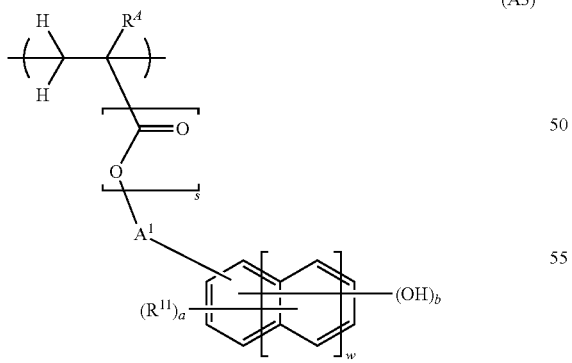

(A3)

wherein $R^4$ represents a hydrogen atom, a fluorine atom, a methyl group, or a trifluoromethyl group; each $R^{11}$ independently represents a halogen atom, a saturated hydrocarbylcarbonyloxy group having 2 to 8 carbon atoms optionally substituted with a halogen atom, a saturated hydrocarbyl group having 1 to 6 carbon atoms optionally substituted with a halogen atom, or a saturated hydrocarbyloxy group having 1 to 6 carbon atoms optionally substituted with a halogen atom; $A^1$ represents a single bond or a saturated hydrocarbylene group having 1 to 10 carbon atoms, and $—CH_2—$ constituting the saturated hydrocarbylene group is optionally substituted with $—O—$; "s" represents 0 or 1; "w" represents an integer of 0 to 2; "a" represents an integer satisfying $0 \leq a \leq 5+2w-b$; and "b" represents an integer of 1 to 3, and

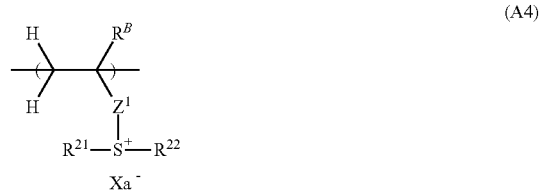

(A4)

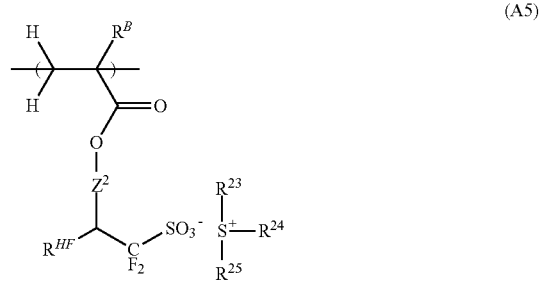

(A5)

(A6)

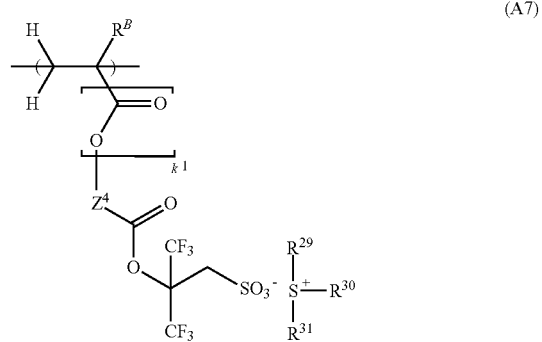

(A7)

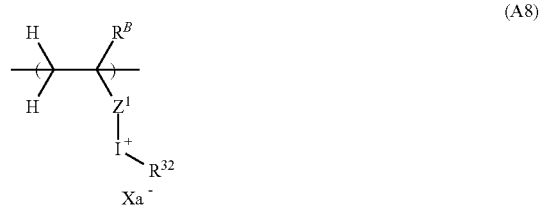

(A8)

-continued

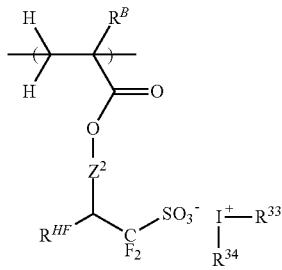
(A9)

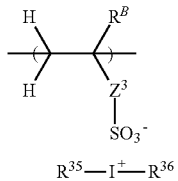
(A10)

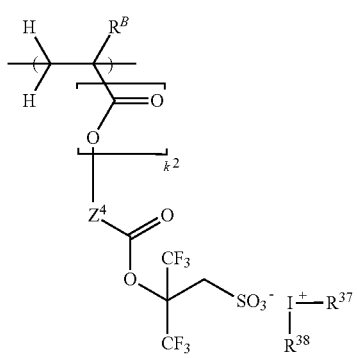
(A11)

wherein each $R^B$ independently represents a hydrogen atom or a methyl group; $Z^1$ represents a single bond, an aliphatic hydrocarbylene group having 1 to 6 carbon atoms, a phenylene group, a naphthylene group, or a group having 7 to 18 carbon atoms obtained from a combination thereof, —O—$Z^{11}$—, —C(=O)—O—$Z^{11}$—, or —C(=O)—NH—$Z^{11}$—; $Z^{11}$ represents an aliphatic hydrocarbylene group having 1 to 6 carbon atoms, a phenylene group, a naphthylene group, or a group having 7 to 18 carbon atoms obtained from a combination thereof, and optionally contains a carbonyl group, an ester bond, an ether bond, or a hydroxy group; $Z^2$ represents a single bond or —$Z^{21}$—C(=O)—O—; $Z^{21}$ represents a hydrocarbylene group having 1 to 20 carbon atoms optionally containing a heteroatom; $Z^3$ represents a single bond, a methylene group, an ethylene group, a phenylene group, a fluorinated phenylene group, a trifluoromethyl group-substituted phenylene group, —O—$Z^{31}$—, —C(=O)—O—$Z^{31}$—, or —C(=O)—NH—$Z^{31}$—; $Z^{31}$ represents an aliphatic hydrocarbylene group having 1 to 6 carbon atoms, a phenylene group, a fluorinated phenylene group, a trifluoromethyl group-substituted phenylene group, or a group having 7 to 20 carbon atoms obtained from a combination thereof, and optionally contains a carbonyl group, an ester bond, an ether bond, or a hydroxy group; $Z^4$ represents a single bond, or a hydrocarbylene group having 1 to 30 carbon atoms optionally containing a heteroatom; $k^1$ and $k^2$ each independently represent 0 or 1, but $k^1$ and $k^2$ each represent 0 when $Z^4$ is a single bond; $R^{21}$ to $R^{38}$ each independently represent a hydrocarbyl group having 1 to 20 carbon atoms optionally containing a heteroatom; $R^{21}$ and $R^{22}$ are optionally bonded to each other to form a ring together with a sulfur atom bonded therewith;

$R^{23}$ and $R^{24}$, $R^{26}$ and $R^{27}$, or $R^{29}$ and $R^{30}$, are optionally bonded to each other to form a ring together with a sulfur atom bonded therewith; $R^{HF}$ represents a hydrogen atom or a trifluoromethyl group; and $Xa^-$ represents a non-nucleophilic counter ion.

Additionally, the component (A) is preferably a polymer compound comprising:
one or both of a repeating unit shown by the following general formula (A2-1) and a repeating unit shown by the following general formula (A2-2);
a repeating unit shown by the following general formula (A3-1); and
a repeating unit shown by the following general formula (A5-1),

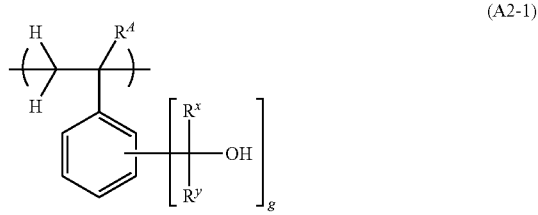
(A2-1)

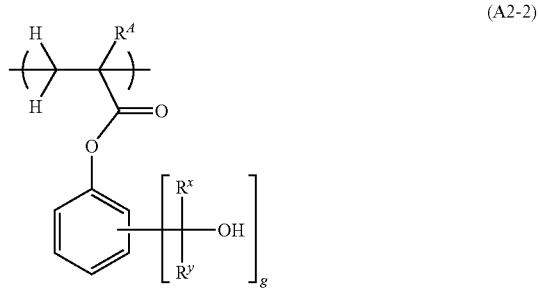
(A2-2)

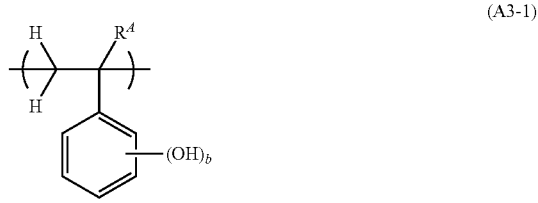
(A3-1)

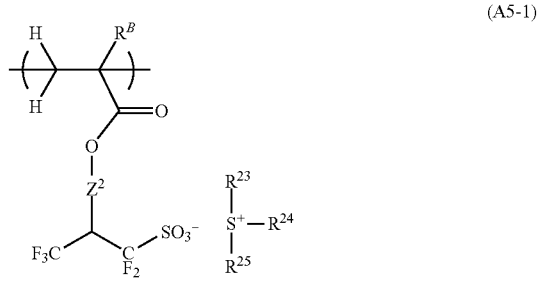
(A5-1)

wherein $R^A$ represents a hydrogen atom, a fluorine atom, a methyl group, or a trifluoromethyl group; Rx and Ry each independently represent a hydrogen atom, a saturated hydrocarbyl group having 1 to 15 carbon atoms optionally substituted with a hydroxy group or a saturated hydrocarbyloxy group, or an aryl group optionally having a substituent, provided that Rx and Ry do not represent hydrogen atoms simultaneously, or Rx and Ry are optionally bonded to each other to form a ring together with a carbon atom bonded therewith; "g" represents an integer of 1 to 3; "b" represents an integer of 1 to 3; each $R^B$ independently represents a hydrogen atom or a methyl group; $Z^2$ represents a single bond or —Z²¹—C(=O)—O—; Z²¹ represents a hydrocarbylene group having 1 to 20 carbon atoms optionally containing a heteroatom; R²³ to R²⁵ each independently represent a hydrocarbyl group having 1 to 20 carbon atoms optionally containing a heteroatom; and R²³ and R²⁴ are optionally bonded to each other to form a ring together with a sulfur atom bonded therewith.

When the inventive chemically amplified resist composition is used as a chemically-amplified negative resist composition, the component (A) can be such materials as described above.

Further, the polymer compound of the component (A) is preferably a polymer from two or more kinds of polymerizable monomers, and a total of 5000 ppm or less of residual oligomers in a form of dimer to hexamer are contained in all the polymerizable monomers.

Such component (A) can more reliably suppress development-residue defect.

The inventive chemically amplified resist composition preferably further comprises (B) an acid generator.

Such a chemically amplified resist composition is more suitable.

The present invention also provides a photomask blank comprising the above-described chemically amplified resist composition coated thereon.

The inventive chemically amplified resist composition is particularly useful in patterning using photomask blanks as substrates.

Further, the present invention provides a method for forming a resist pattern, comprising:

(1) a step of forming a resist film on a substrate by using the above-described chemically amplified resist composition;

(2) a step of irradiating the resist film with a high-energy beam to form a pattern; and (3) a step of developing the pattern-irradiated resist film by using an alkaline developer.

Since such a patterning method employs the inventive chemically amplified resist composition, it is possible to achieve favorable resolution, pattern profile, and line edge roughness, and simultaneously suppress development-residue defect, which would otherwise cause mask defect.

In this event, the high-energy beam is preferably an ArF excimer laser beam, a KrF excimer laser beam, an extreme ultraviolet ray, or an electron beam.

These high-energy beams are suitably applicable.

More preferably, the substrate has a top surface composed of a material containing at least one of chromium, silicon, tantalum, molybdenum, cobalt, nickel, tungsten, and tin.

The inventive chemically amplified resist composition is capable of reducing development residue regardless of the type of the substrate.

Furthermore, the present invention provides a method for producing a polymer compound comprising one or two or more kinds of repeating units used in a chemically amplified resist composition, the method comprising polymerizing at least one kind of a polymerizable monomer with not more than 1000 ppm of a residual oligomer in a form of dimer to hexamer to obtain the polymer compound.

In this way, purification is not necessarily performed at the stage of polymer, and the material with reduced content of oligomer components at the stage of monomer before the polymerization is employed to enable production of a polymer compound used in a chemically amplified resist composition that is capable of achieving favorable resolution, pattern profile, and line edge roughness, and simultaneously suppressing development-residue defect, which would otherwise cause mask defect.

Preferably, at least one kind of repeating units obtained from the polymerizable monomer with not more than 1000 ppm of a residual oligomer in a form of dimer to hexamer is a repeating unit A1 shown by the following general formula (A1),

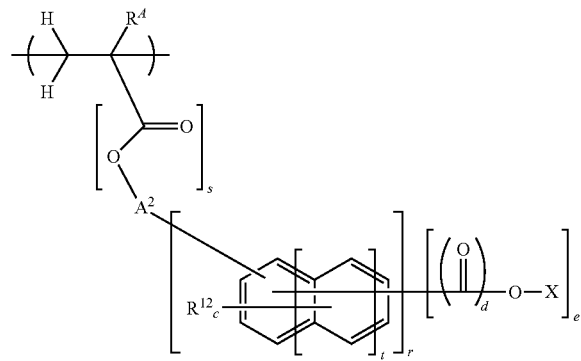

(A1)

wherein $R^A$ represents a hydrogen atom, a fluorine atom, a methyl group, or a trifluoromethyl group; each $R^{12}$ independently represents a halogen atom, a linear, branched, or cyclic acyloxy group having 2 to 8 carbon atoms optionally substituted with a halogen atom, a linear, branched, or cyclic alkyl group having 1 to 6 carbon atoms optionally substituted with a halogen atom, or a linear, branched, or cyclic alkoxy group having 1 to 6 carbon atoms optionally substituted with a halogen atom; $A^2$ represents a single bond, or a linear, branched, or cyclic alkylene group having 1 to 11 carbon atoms optionally having an ether bond or an ester bond in a carbon-carbon bond; "s" represents 0 or 1; "t" represents an integer of 0 to 2; "c" represents an integer satisfying $0 \leq c \leq 5+2t-e$; "d" represents 0 or 1; "e" represents an integer of 1 to 3; "r" represents 0 or 1; and X represents an acid-labile group when "e" is 1, or represents a hydrogen atom or an acid-labile group when "e" is 2 or more, provided that at least one X is an acid-labile group.

Preferably, at least one kind of repeating units obtained from the polymerizable monomer with not more than 1000 ppm of a residual oligomer in a form of dimer to hexamer is a repeating unit A2 shown by the following general formula (A2),

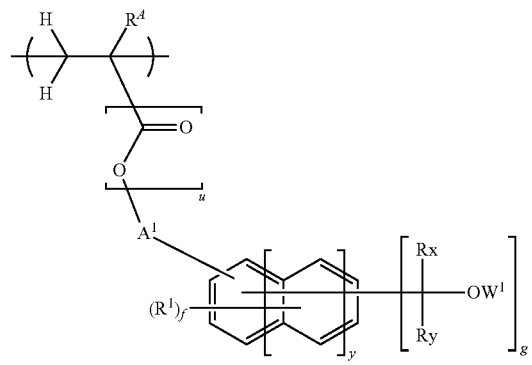

(A2)

wherein $R^4$ represents a hydrogen atom, a fluorine atom, a methyl group, or a trifluoromethyl group; $A^1$ represents a single bond, or a saturated hydrocarbylene group having 1 to 10 carbon atoms, and —$CH_2$-constituting the saturated hydrocarbylene group is optionally substituted with —O—; each $R^1$ independently represents a halogen atom, a saturated hydrocarbylcarbonyloxy group having 2 to 8 carbon atoms optionally substituted with a halogen atom, a saturated hydrocarbyl group having 1 to 6 carbon atoms optionally substituted with a halogen atom, or a saturated hydrocarbyloxy group having 1 to 6 carbon atoms optionally substituted with a halogen atom; W1 represents a hydrogen atom, an aliphatic hydrocarbyl group having 1 to 10 carbon atoms, or an aryl group optionally having a substituent, and —$CH_2$— constituting the aliphatic hydrocarbyl group is optionally substituted with —O—, —C(=O)—, —O—C(=O)—, or —C(=O)—O—; Rx and Ry each independently represent a hydrogen atom, a saturated hydrocarbyl group having 1 to 15 carbon atoms optionally substituted with a hydroxy group or a saturated hydrocarbyloxy group, or an aryl group optionally having a substituent, provided that Rx and Ry do not represent hydrogen atoms simultaneously, or Rx and Ry are optionally bonded to each other to form a ring together with a carbon atom bonded therewith; "y" represents an integer of 0 to 2; "u" represents 0 or 1; "f" represents an integer satisfying $0 \leq f \leq 5+2y-g$; and "g" represents an integer of 1 to 3.

In the resist composition, these repeating units which cause reaction by action of acid generated by light exposure would considerably influence defect. Thus, it is preferable to suppress oligomers in the polymerizable monomers from which these repeating units are formed.

Advantageous Effects of Invention

The inventive chemically amplified resist composition contains a polymer prepared from a material with little content of oligomer components in the state of monomer before the polymerization. This makes it possible to eliminate the need of purification in the state of polymer, and to provide a chemically amplified resist composition and a method for forming a resist pattern, which enable favorable resolution, pattern profile, and line edge roughness (LER), as well as suppression of development-residue defect, which would otherwise cause mask defect.

The method for forming a pattern using the inventive chemically amplified resist composition is capable of suppressing development-residue defect, while satisfactorily forming a pattern with high resolution and low LER. Thus, this patterning method is suitably applicable to finely processing techniques, particularly ArF, KrF, EUV, and EB lithographies, etc.

DESCRIPTION OF EMBODIMENTS

As noted above, there have been demands for the development of chemically amplified resist composition that can achieve favorable resolution, pattern profile, and line edge roughness, and simultaneously suppress development-residue defect, which otherwise causes mask defect.

The present inventors have earnestly studied to achieve the above object and consequently found that when a polymer compound having a repeating unit polymerized from a particular polymerizable monomer is introduced to a resist composition, development-residue defect, which would otherwise cause mask defect, can be suppressed while favorable resolution, pattern profile, and line edge roughness are achieved. This finding has led to the present invention.

Specifically, the present invention is a chemically amplified resist composition comprising
(A) a polymer compound comprising one or two or more kinds of repeating units, wherein
at least one kind of the repeating units is polymerized from a polymerizable monomer with not more than 1000 ppm of a residual oligomer in a form of dimer to hexamer.

Hereinafter, the present invention will be described in detail, but the present invention is not limited to the following.

[Chemically Amplified Resist Composition]

A resist composition according to the present invention is a chemically amplified resist composition containing (A) a polymer compound containing one or two or more kinds of repeating units. At least one kind of the repeating units is polymerized from a polymerizable monomer with not more than 1000 ppm of a residual oligomer in a form of dimer to hexamer.

[(A) Polymer Compound]

To obtain the polymer compound (A) used in the present invention, generally, a polymerizable monomer synthesized for polymerization to the polymer compound is purified. The purification method is not particularly limited, but can be performed by water washing, liquid separation, distillation, recrystallization, filtration, ultrafiltration, centrifugation, high-performance liquid chromatography, column chromatography, etc.

In the component (A), at least one kind of the repeating units corresponds to a polymerizable monomer incorporating not more than 1000 ppm of a residual oligomer in a form of dimer to hexamer. The content is more preferably not more than 500 ppm, further preferably not more than 300 ppm, quite preferably not more than 200 ppm, particularly preferably not more than 100 ppm. The oligomer to be controlled includes preferably dimer to hexamer, particularly preferably dimer to tetramer.

Additionally, a polymerization inhibitor, such as TBC and BHT, may be added as a stabilizer in the purification stage, during the long-term storage after the purification, and when heating is necessary to prepare a solution for extraction after the purification.

If a polymer compound polymerized by using only a polymerizable monomer incorporating more than 1000 ppm of the oligomer component is used in a resist composition, development-residue defect may occur and lower the yield important in semiconductor manufacturing process.

Note that the residual oligomer can be analyzed by LC-MS measurement.

In the polymer compound of the component (A), a proportion of the repeating unit polymerized from the polymerizable monomer with not more than 1000 ppm of a residual oligomer in a form of dimer to hexamer is not particularly limited, but is preferably 5 mol % or more, more preferably 10 mol % or more, further preferably 20 mol % or more, quite preferably 30 mol % or more, particularly preferably 40 mol % or more, furthermore preferably 80 mol % or more, still furthermore preferably 100 mol %.

Among one or two or more kinds of the repeating units contained in the polymer compound of the component (A), any repeating unit may be the repeating unit polymerized from the polymerizable monomer with not more than 1000 ppm of a residual oligomer in a form of dimer to hexamer. Thus, this repeating unit may be, for example, any of repeating units contained in the polymer compound of the component (A), which are to be described later.

The polymerizable monomer used in the present invention may be: a polymerizable monomer that provides a unit having a mechanism allowing solubilization with respect to an alkaline developer through elimination reaction of an acid-leaving group by action of acid generated by light exposure; or a polymerizable monomer that provides a unit having a mechanism allowing insolubilization with respect to an alkaline developer through elimination reaction of an acid-leaving group by action of acid generated by light exposure. The content of residual oligomer of dimer to hexamer in such polymerizable monomers is preferably 1000 ppm or less, more preferably 500 ppm or less, further preferably 300 ppm or less, quite preferably 200 ppm or less, particularly preferably 100 ppm or less. As the oligomer to be controlled, oligomers of dimer to tetramer are preferably controlled. In the resist composition, the units that cause the reactions by action of acid generated by light exposure have considerable influence on defect. Hence, it is important to suppress the oligomers.

<Repeating Unit A1>

When the inventive chemically amplified resist composition serves as a chemically-amplified positive resist composition, it is preferable to incorporate a repeating unit A1 shown by the following general formula (A1) as the unit having a mechanism allowing solubilization with respect to an alkaline developer through the elimination reaction of an acid-leaving group. In this case, the repeating unit A1 is preferably polymerized from the polymerizable monomer with not more than 1000 ppm of a residual oligomer in a form of dimer to hexamer.

group when "e" is 1, or is a hydrogen atom or an acid-labile group when "e" is 2 or more. Nevertheless, at least one X is an acid-labile group.

In the repeating unit A1, at least one phenolic hydroxy group bonded to an aromatic ring is protected with an acid-labile group, a carboxyl group bonded to an aromatic ring is protected with an acid-labile group, or a carboxyl group incorporated in (meth)acrylate is protected with an acid-labile group. Such an acid-labile group is not particularly limited, as long as an acidic group is formed after the acid-labile group leaves by acid. Any acid-labile groups employed in many conventionally known chemically amplified resist compositions can be used.

Among the repeating units incorporated in the inventive polymer compound of the component (A), the repeating unit having an acid-labile group represented by the repeating unit in the general formula (A1) is obtained by substituting a hydrogen atom of a phenolic hydroxyl group, preferably a hydroxyl group of hydroxystyrene or hydroxyphenyl(meth)acrylate. The monomer to obtain this repeating unit can be exemplified by monomers disclosed in paragraph [0029] of JP2014-219657A. In the case where "d" shown in the repeating unit of the general formula (A1) is 1, the repeating unit having an acid-labile group is obtained by substituting a hydrogen atom of a carboxyl group, particularly a hydroxyl group of (meth)acrylate. The monomer to obtain this repeating unit can be exemplified by monomers disclosed in paragraph [0028] of JP2014-219657A.

Likewise, the structure of the acid-labile group can be exemplified by monomers disclosed in paragraphs [0030] to [0082] of JP2014-219657A. Specific examples of preferable structures of the acid-labile group include ones in formulae (H-3)-1 to (H-3)-19 shown below.

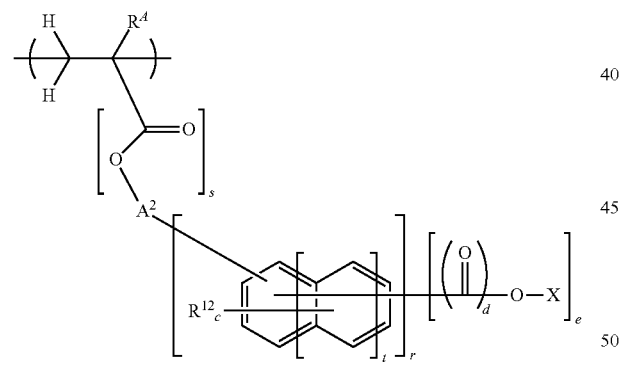

(A1)

In the formula, $R^A$ represents a hydrogen atom, a fluorine atom, a methyl group, or a trifluoromethyl group. Each $R^{12}$ independently represents a halogen atom, a linear, branched, or cyclic acyloxy group having 2 to 8 carbon atoms optionally substituted with a halogen atom, a linear, branched, or cyclic alkyl group having 1 to 6 carbon atoms optionally substituted with a halogen atom, or a linear, branched, or cyclic alkoxy group having 1 to 6 carbon atoms optionally substituted with a halogen atom. $A^2$ represents a single bond, or a linear, branched, or cyclic alkylene group having 1 to 11 carbon atoms optionally having an ether bond or an ester bond in a carbon-carbon bond. "s" represents 0 or 1. "t" represents an integer of 0 to 2. "c" represents an integer satisfying $0 \leq c \leq 5+2t-e$. "d" represents 0 or 1. "e" represents an integer of 1 to 3. "r" represents 0 or 1. X is an acid-labile

(H-3)-1

(H-3)-2

(H-3)-3

(H-3)-4

(H-3)-5

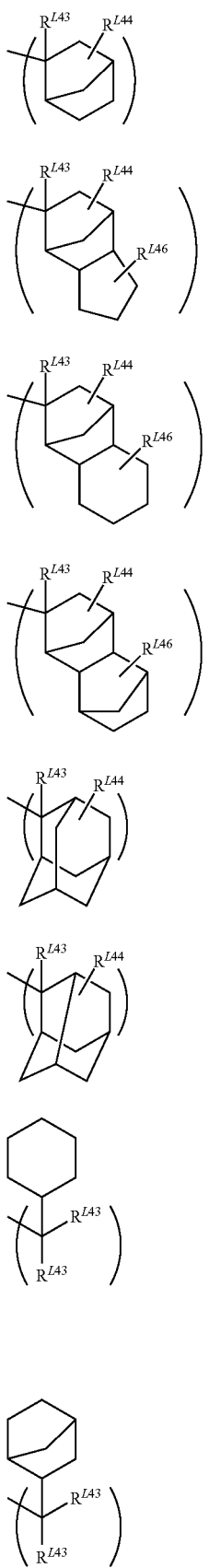
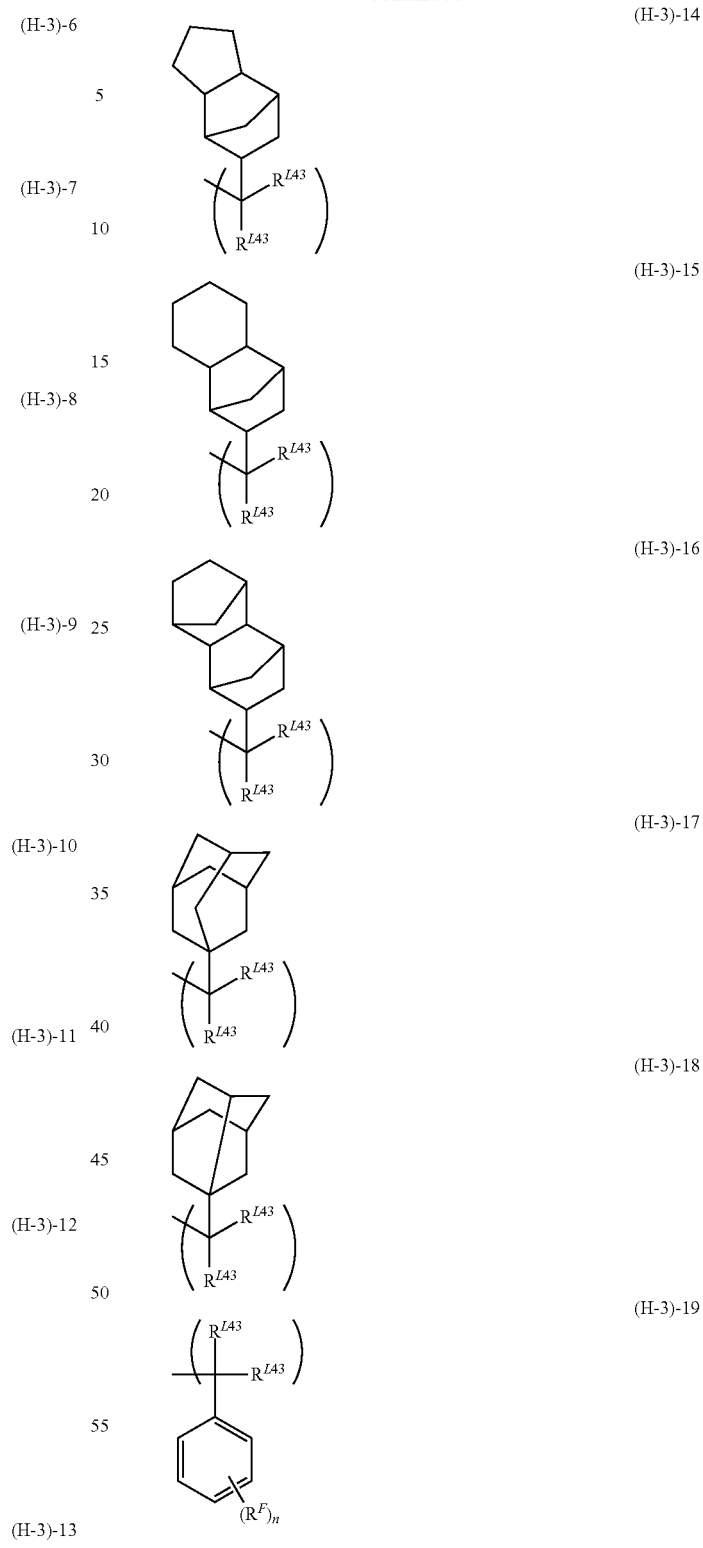

In the formulae (H-3)-1 to (H-3)-19, $R^{L43}$'s represent identical or different saturated hydrocarbyl groups or aryl groups, such as a phenyl group, having 6 to 20 carbon atoms. Each $R^{L44}$ and $R^{L46}$ represents a hydrogen atom, or a saturated hydrocarbyl group having 1 to 20 carbon atoms. $R^{L45}$ represents an aryl group, such as a phenyl group, having 6 to 20 carbon atoms. The saturated hydrocarbyl groups may be linear, branched, or cyclic. Additionally, the aryl groups are preferably a phenyl group or the like. $R^F$ represents a fluorine atom or a trifluoromethyl group. "n" represents an integer of 1 to 5.

A tertiary alkyl group is preferably selected as the acid-labile group because a resist film can be formed to have a thickness of, for example, 10 to 100 nm, and even when a fine pattern is formed to have a line width of 45 nm or less, the formed pattern has small LER. The tertiary alkyl group preferably has 4 to 18 carbon atoms in order that the resulting monomer to be polymerized is collected by distillation. Moreover, examples of alkyl substituents on the tertiary carbon of the tertiary alkyl group include linear, branched, or cyclic alkyl groups having 1 to 20 carbon atoms optionally containing an oxygen-containing functional group, such as an ether group or a carbonyl group. The alkyl substituents of the tertiary carbon may be bonded to each other to form a ring.

Specific examples of the alkyl substituents of the tertiary carbon include a methyl group, an ethyl group, a propyl group, an adamantyl group, a norbornyl group, a tetrahydrofuran-2-yl group, a 7-oxanorbornan-2-yl group, a cyclopentyl group, a 2-tetrahydrofuryl group, a tricyclo[5.2.1.0$^{2,6}$]decyl group, a tetracyclo[4.4.0.1$^{2,5}$.1$^{7,10}$]dodecyl group, and a 3-oxo-1-cyclohexyl group.

Moreover, Examples of the tertiary alkyl group having these substituents include a tert-butyl group, a tert-pentyl group, a 1-ethyl-1-methylpropyl group, a 1,1-diethylpropyl group, a 1,1,2-trimethylpropyl group, a 1-adamantyl-1-methylethyl group, a 1-methyl-1-(2-norbornyl)ethyl group, a 1-methyl-1-(tetrahydrofuran-2-yl)ethyl group, a 1-methyl-1-(7-oxanorbornan-2-yl)ethyl group, a 1-methylcyclopentyl group, a 1-ethylcyclopentyl group, a 1-propylcyclopentyl group, a 1-isopropylcyclopentyl group, a 1-cyclopentylcyclopentyl group, a 1-cyclohexylcyclopentyl group, a 1-(2-tetrahydrofuryl)cyclopentyl group, a 1-(7-oxanorbornan-2-yl)cyclopentyl group, a 1-methylcyclohexyl group, a 1-ethylcyclohexyl group, a 1-cyclopentylcyclohexyl group, a 1-cyclohexylcyclohexyl group, a 2-methyl-2-norbornyl group, a 2-ethyl-2-norbornyl group, an 8-methyl-8-tricyclo[5.2.1.0$^{2,6}$]decyl group, an 8-ethyl-8-tricyclo[5.2.1.0$^{2,6}$]decyl group, a 3-methyl-3-tetracyclo[4.4.0.1$^{2,5}$.1$^{7,10}$]dodecyl group, a 3-ethyl-3-tetracyclo[4.4.0.1$^{2,5}$.1$^{7,10}$]dodecyl group, a 2-methyl-2-adamantyl group, a 2-ethyl-2-adamantyl group, a 2-isopropyl-2-adamantyl group, a 1-methyl-3-oxo-1-cyclohexyl group, a 1-methyl-1-(tetrahydrofuran-2-yl)ethyl group, a 5-hydroxy-2-methyl-2-adamantyl group, a 5-hydroxy-2-ethyl-2-adamantyl group, etc. Structures shown below are preferable.

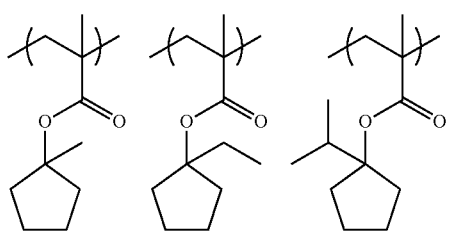

-continued

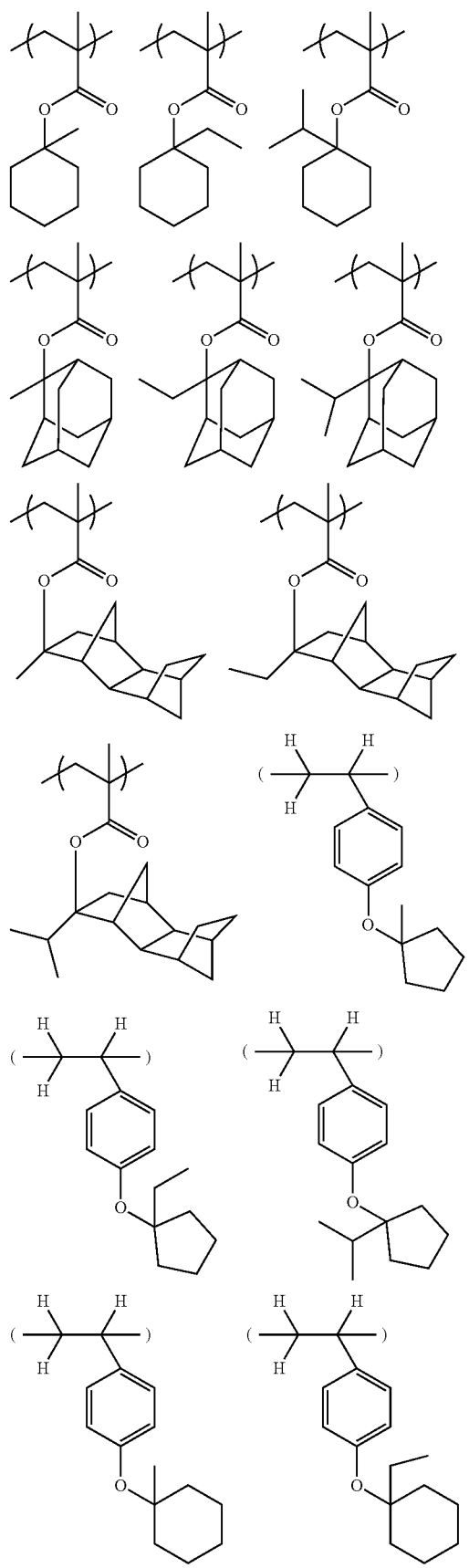

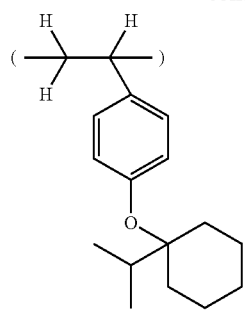
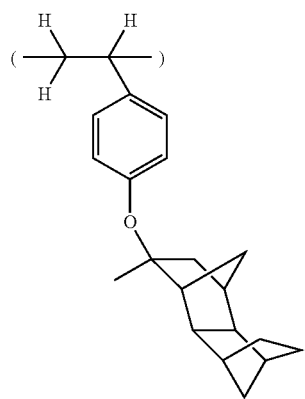
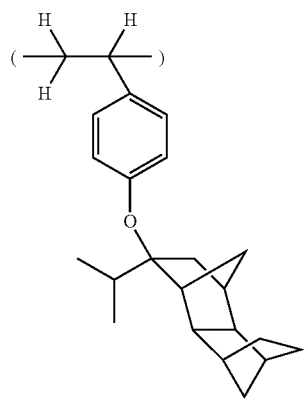
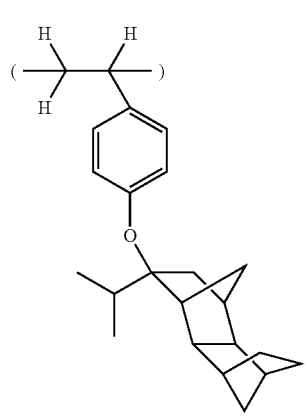
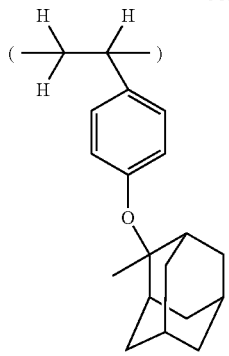
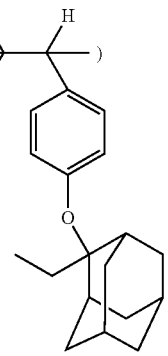
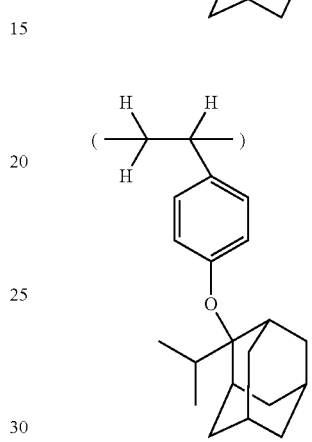
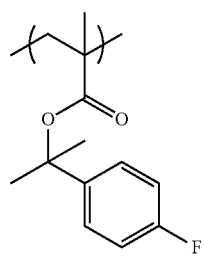
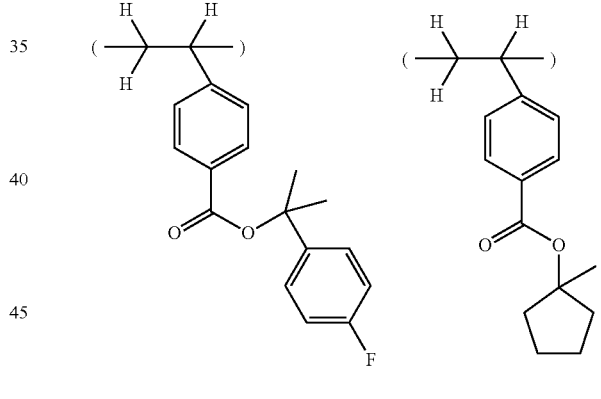
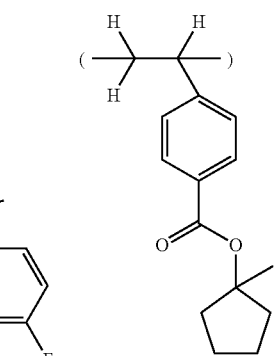
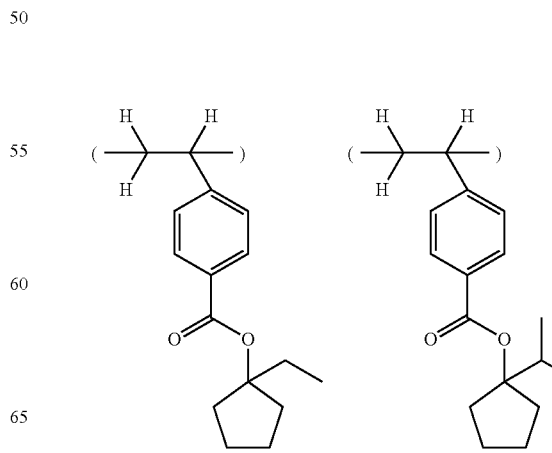
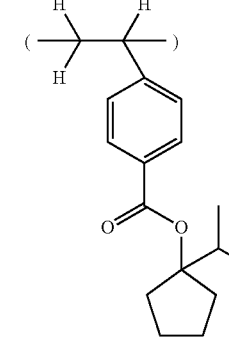

-continued

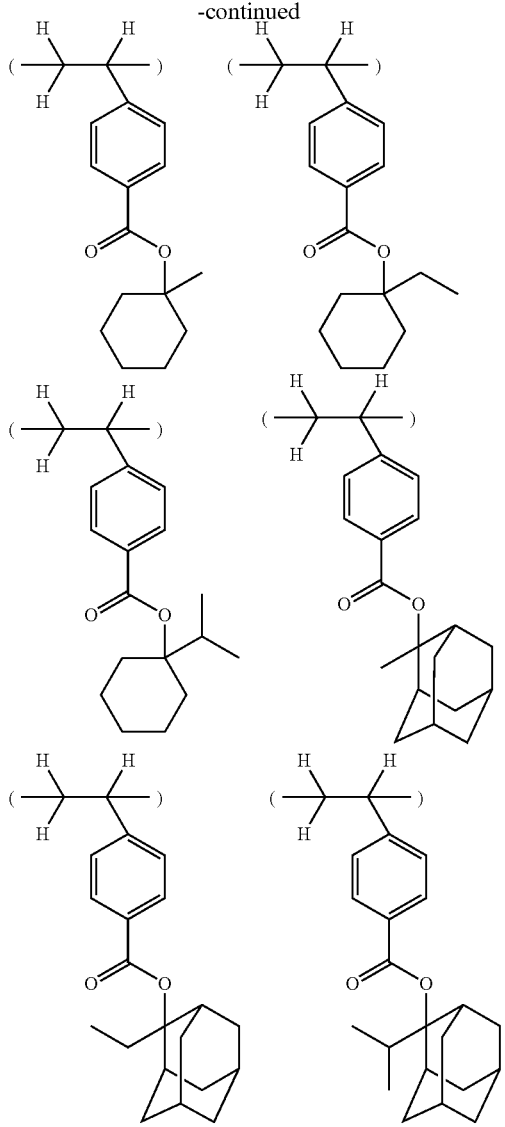

Further, an acetal group as shown in the following general formula (B2-1) is often utilized as an acid-labile group. The acetal group is useful choice as an acid-labile group that stably provides a pattern whose interface with a substrate is relatively rectangular.

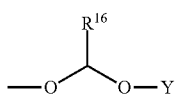
(B2-1)

In the formula, $R^{16}$ represents a hydrogen atom, or a linear, branched, or cyclic alkyl group having 1 to 10 carbon atoms. Y represents a linear, branched, or cyclic alkyl group having 1 to 30 carbon atoms.

$R^{16}$ is appropriately selected in accordance with design for the sensitivity of the group decomposable by an acid. For example, a hydrogen atom is selected in design for decomposition by a strong acid while securing relatively high stability; and a linear alkyl group is selected in design utilizing relatively high reactivity for higher sensitivity to pH change. In a design where solubility greatly changes by decomposition, with the terminal being substituted with a relatively large alkyl group, $R^{16}$ preferably contains a secondary carbon which has a bond with an acetal carbon, although it depends on the combination of an acid generator and a basic compound blended to the resist composition. Examples of $R^{16}$ having a secondary carbon bonded to acetal carbon include an isopropyl group, a sec-butyl group, a cyclopentyl group, a cyclohexyl group, etc.

In the acetal group, Y is preferably a polycyclic alkyl group having 7 to 30 carbon atoms to obtain higher resolution. When Y is a polycyclic alkyl group, it is preferable to form a bond between the acetal oxygen and the secondary carbon constituting the polycyclic structure. When the bond is on a secondary carbon of the ring structure, the polymer compound is more stable and the resist composition has better storage stability than when the bond is formed on a tertiary carbon of the ring structure, thereby preventing the resolution from degradation. This instance is preferable compared to a case where Y has a linear alkyl group having 1 or more carbon atoms and bonded through the primary carbon thereof because the polymer is improved in glass transition temperature (Tg) and the developed resist pattern does not cause profile defect due to baking.

Preferable examples of the acetal group shown by the general formula (B2-1) include ones shown below, but are not limited thereto. Note that, in the following formulae, $R^{16}$ is as defined above.

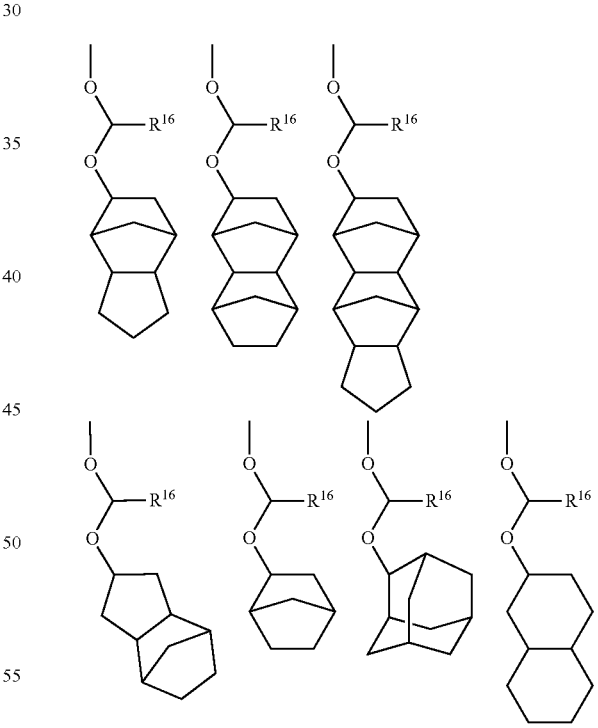

The repeating unit A1 is introduced in a range of preferably 5 to 70 mol %, more preferably 5 to 60 mol %, relative to all the repeating units in the polymer compound of the component (A).

<Repeating Unit A2>

When the inventive chemically amplified resist composition serves as a chemically-amplified negative resist composition, it is preferable to incorporate a repeating unit A2 shown by the following general formula (A2) as the unit having a mechanism allowing insolubilization with respect to an alkaline developer through the elimination reaction of an acid-leaving group. In this case, the repeating unit A2 is preferably polymerized from the polymerizable monomer with not more than 1000 ppm of a residual oligomer in a form of dimer to hexamer.

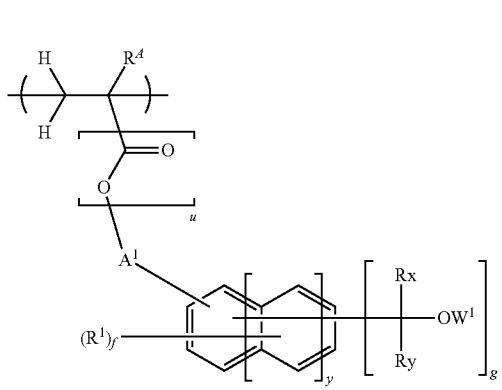

(A2)

In the formula, $R^A$ represents a hydrogen atom, a fluorine atom, a methyl group, or a trifluoromethyl group. $A^1$ represents a single bond, or a saturated hydrocarbylene group having 1 to 10 carbon atoms, and —$CH_2$— constituting the saturated hydrocarbylene group is optionally substituted with —O—. Each $R^1$ independently represents a halogen atom, a saturated hydrocarbylcarbonyloxy group having 2 to 8 carbon atoms optionally substituted with a halogen atom, a saturated hydrocarbyl group having 1 to 6 carbon atoms optionally substituted with a halogen atom, or a saturated hydrocarbyloxy group having 1 to 6 carbon atoms optionally substituted with a halogen atom. W1 represents a hydrogen atom, an aliphatic hydrocarbyl group having 1 to 10 carbon atoms, or an aryl group optionally having a substituent, and —$CH_2$— constituting the aliphatic hydrocarbyl group is optionally substituted with —O—, —C(=O)—, —O—C(=O)—, or —C(=O)—O—. Rx and Ry each independently represent a hydrogen atom, a saturated hydrocarbyl group having 1 to 15 carbon atoms optionally substituted with a hydroxy group or a saturated hydrocarbyloxy group, or an aryl group optionally having a substituent. Nevertheless, Rx and Ry do not represent hydrogen atoms simultaneously. Alternatively, Rx and Ry are optionally bonded to each other to form a ring together with a carbon atom bonded therewith. "y" represents an integer of 0 to 2. "u" represents 0 or 1. "f" represents an integer satisfying $0 \leq f \leq 5 + 2y - g$. "g" represents an integer of 1 to 3.

The repeating unit A2 is a repeating unit which induces alkali-insolubilization and crosslinking reaction between the polymer molecules through elimination reaction of the acidic leaving group by action of acid generated from an acid generator upon irradiation with a high energy beam. The repeating unit A2 can act to facilitate the reaction for forming negative resist more efficiently, thereby making it possible to improve the resolution performance.

Examples of the aliphatic hydrocarbyl group having 1 to 10 carbon atoms, or the aryl group optionally having a substituent (aliphatic monovalent hydrocarbon group or monovalent aromatic ring group) represented by W1 include a methyl group, an ethyl group, a propyl group, an isopropyl group, a cyclopentyl group, a cyclohexyl group, an adamantyl group, a methylcarbonyl group, a phenyl group, etc.

Preferable examples of Rx or Ry include a methyl group, an ethyl group, a propyl group, a butyl group, structural isomers thereof, and these groups in which one or some of hydrogen atoms thereof are substituted with a hydroxy group or alkoxy group.

"y" is an integer of 0 to 2. When "y" is 0, there is a benzene ring; when "y" is 1, there is a naphthalene ring; and when "y" is 2, there is an anthracene ring.

Examples of the alkylene group represented by $A^1$ include a methylene group, an ethylene group, a propylene group, a butylene group, a pentylene group, a hexylene group, structural isomers each with a carbon skeleton having a branched or cyclic structure, etc. When the alkylene group contains an ether bond and "u" in the general formula (A2) is 1, the ether bond may be located at any position except for the positions between the α-carbon and β-carbon with respect to the ester oxygen. Meanwhile, when "u" is 0, the atom bonded to the main chain may be substituted with the ether bond, and a second ether bond may be formed at any position except for the positions between the α-carbon and β-carbon with respect to the ether bond bonded to the main chain.

Preferable examples of the repeating unit A2 include repeating units shown by the following general formulae (A2-1), (A2-2).

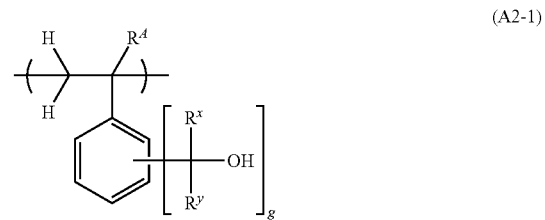

(A2-1)

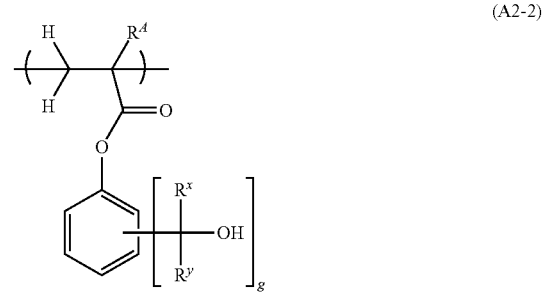

(A2-2)

In the formulae, $R^A$, Rx, Ry, and "g" are as defined above.

Preferable examples of the repeating unit A2 include ones shown below, but are not limited thereto. Note that, in the following examples, Me represents a methyl group, and Ac represents an acetyl group.

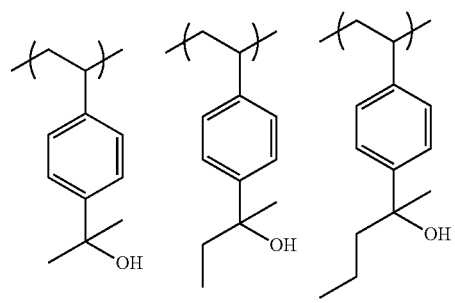

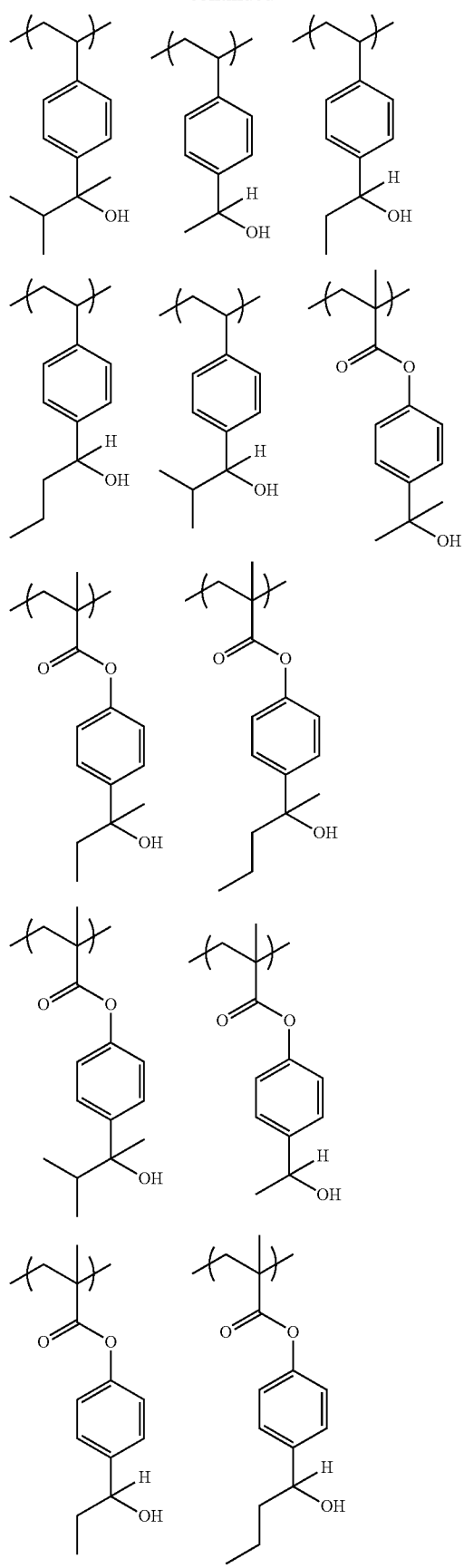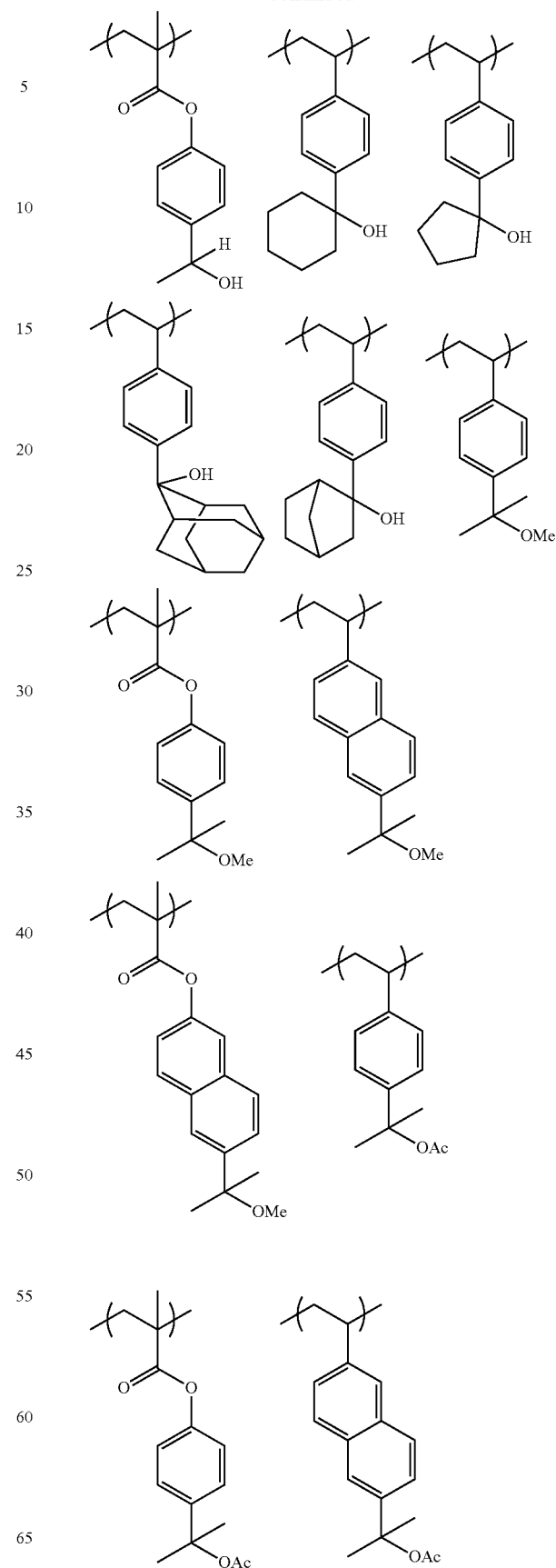

33
-continued
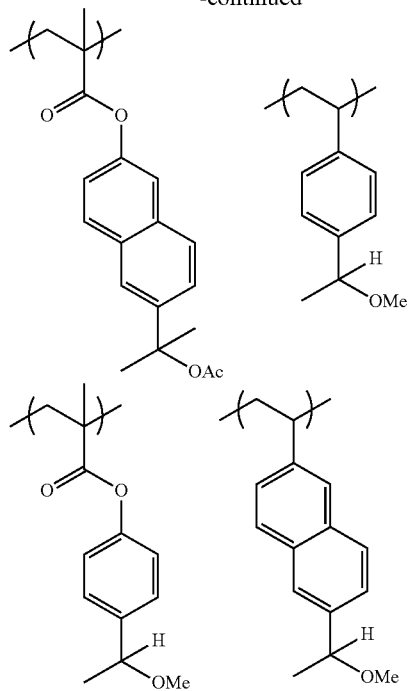
34
-continued
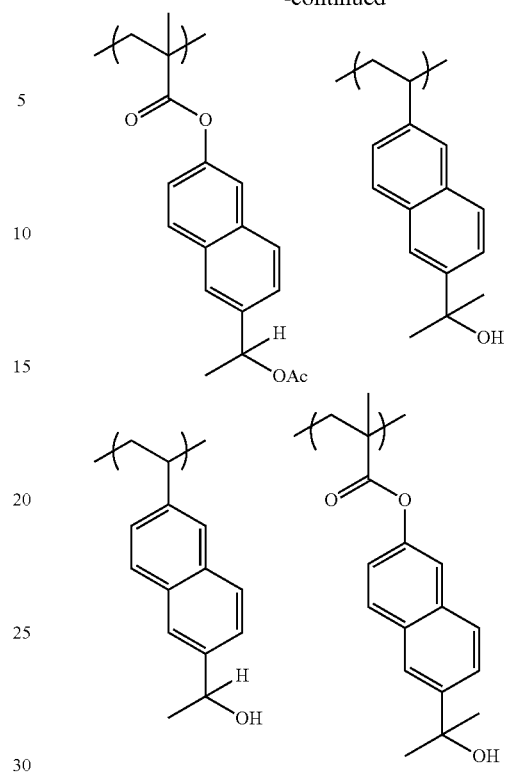
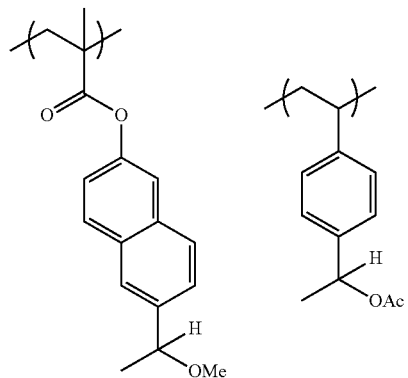
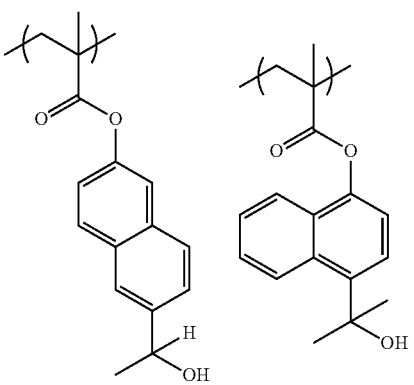
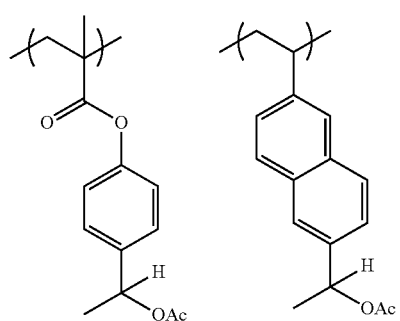
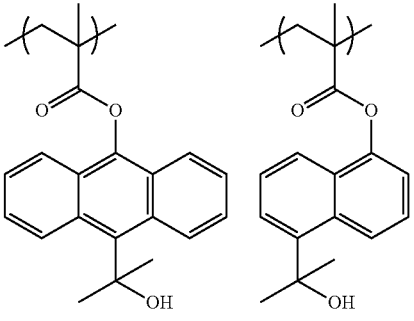

-continued
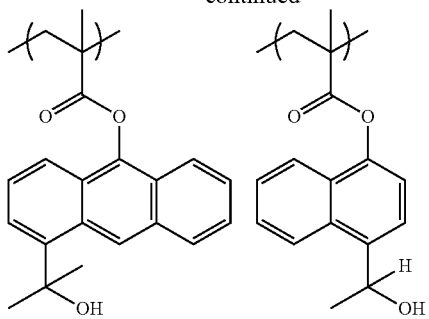
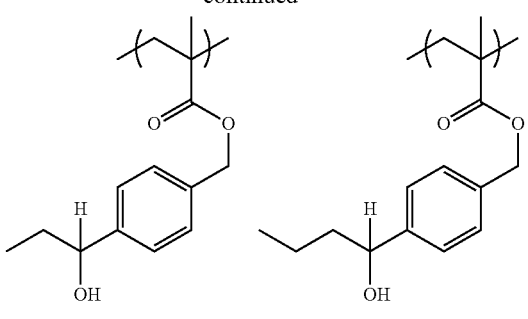
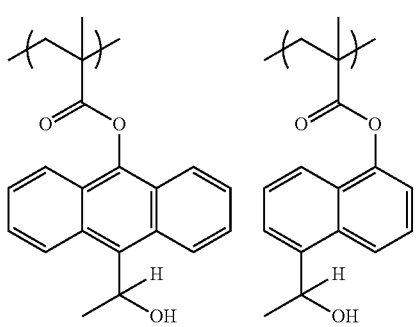
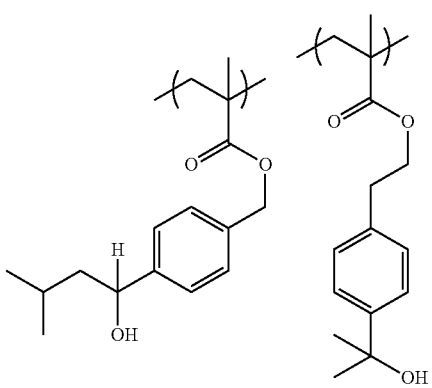
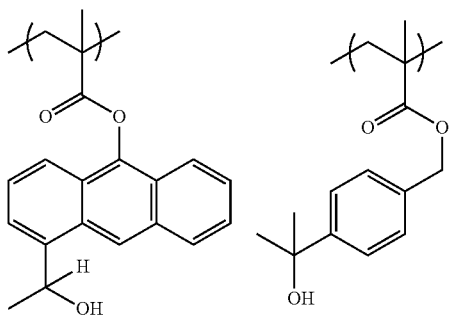
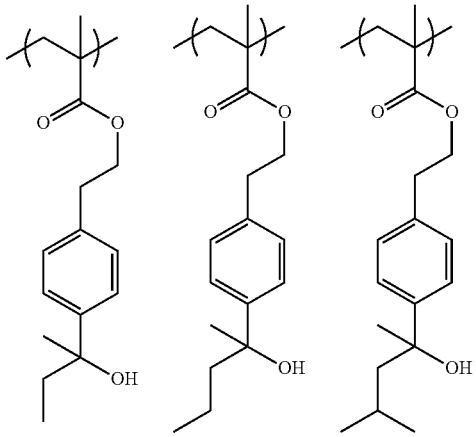
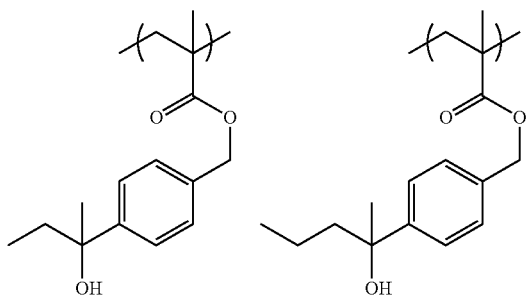
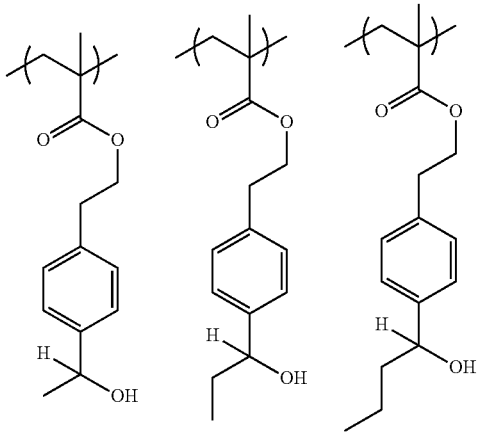
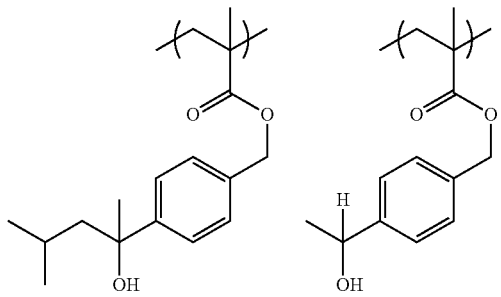

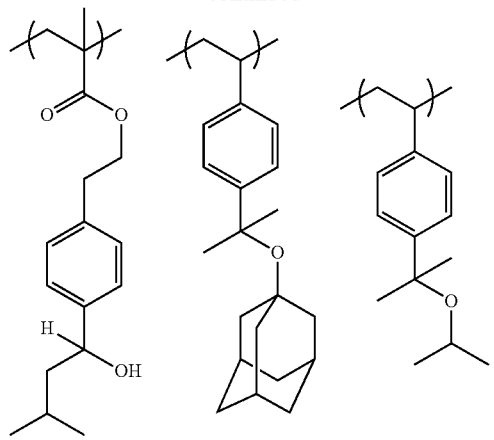
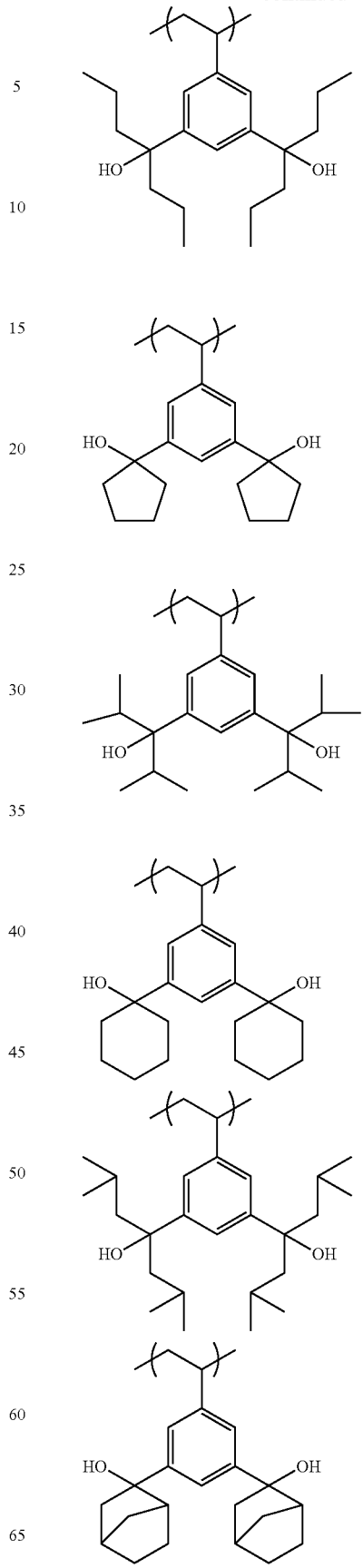

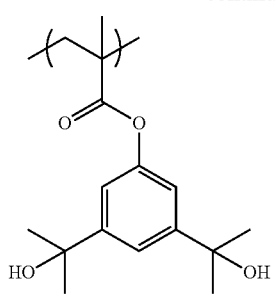
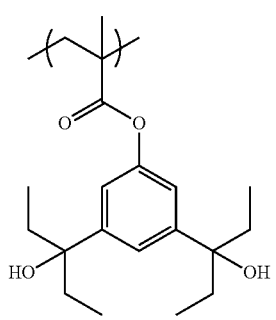
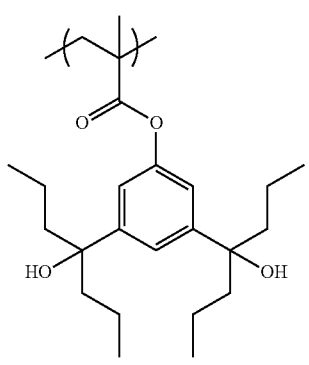
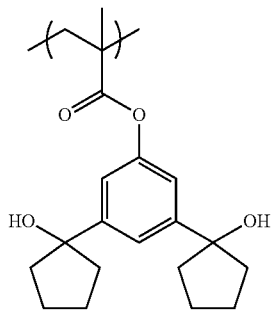
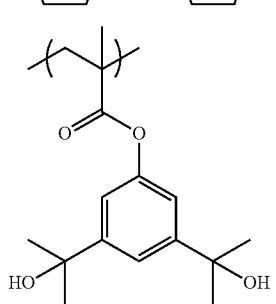
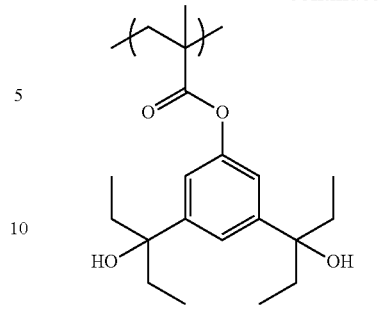
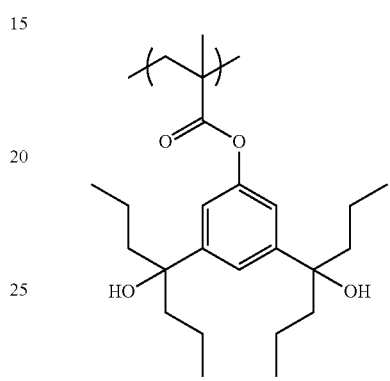
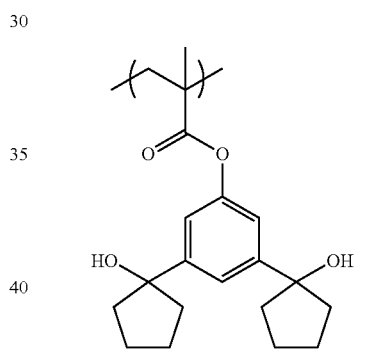
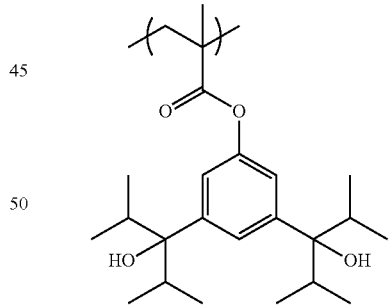
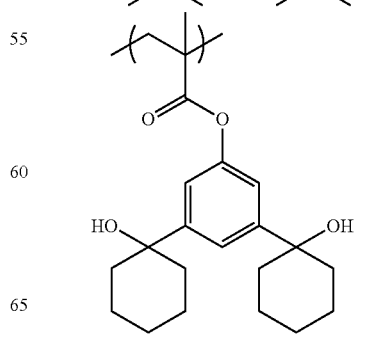

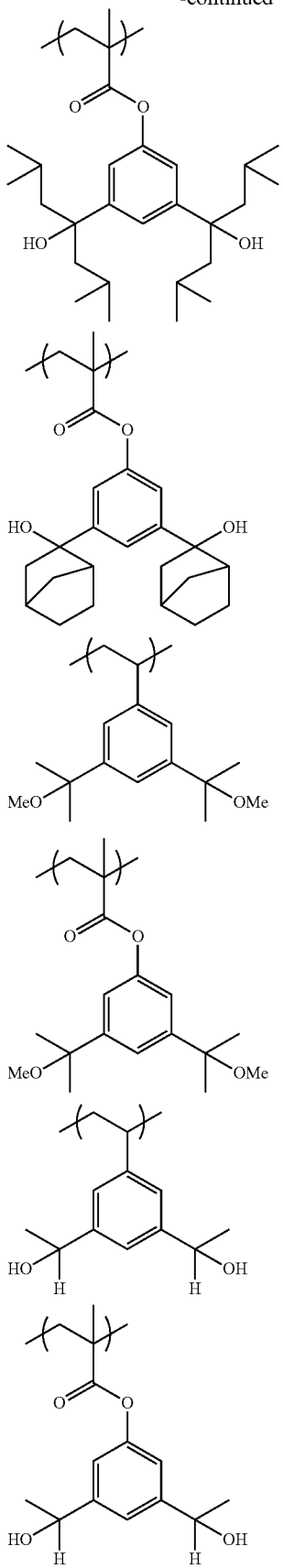

Regarding the content of the repeating unit A2, the lower limit thereof is preferably 5 mol %, more preferably 10 mol %, relative to all the repeating units constituting the polymer compound of the component (A); and the upper limit thereof is preferably 70 mol %, more preferably 60 mol %.

<Repeating Unit A3>

Preferably, the polymer compound of the component (A) used in the inventive chemically amplified resist composition further contains a repeating unit A3 shown by the following general formula (A3).

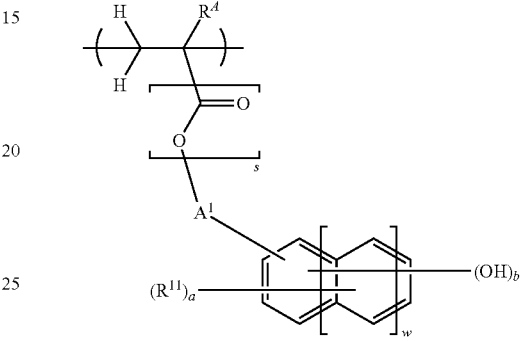

(A3)

In the formula, $R^A$ represents a hydrogen atom, a fluorine atom, a methyl group, or a trifluoromethyl group. Each $R^{11}$ independently represents a halogen atom, a saturated hydrocarbylcarbonyloxy group having 2 to 8 carbon atoms optionally substituted with a halogen atom, a saturated hydrocarbyl group having 1 to 6 carbon atoms optionally substituted with a halogen atom, or a saturated hydrocarbyloxy group having 1 to 6 carbon atoms optionally substituted with a halogen atom. A1 represents a single bond or a saturated hydrocarbylene group having 1 to 10 carbon atoms, and —CH$_2$- constituting the saturated hydrocarbylene group is optionally substituted with —O—. "s" represents 0 or 1. "w" represents an integer of 0 to 2. "a" represents an integer satisfying 0≤a≤5+2w−b. "b" represents an integer of 1 to 3.

Preferable examples of the repeating unit A3 not having a linker (—CO—O-A$^1$-) (i.e., in the general formula (A3), "s" is 0 and A$^1$ is a single bond) include units derived from 3-hydroxystyrene, 4-hydroxystyrene, 5-hydroxy-2-vinylnaphthalene, 6-hydroxy-2-vinylnaphthalene, etc. Among these, a repeating unit shown by the following general formula (A3-1) and the like are more preferable.

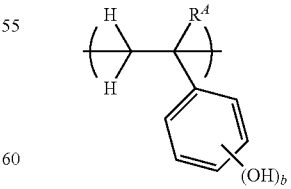

(A3-1)

In the formula, $R^A$ and "b" are as defined above.

Preferable examples of the repeating unit A3 having a linker (—CO—O-A$^1$-) include ones shown below, but are not limited thereto.

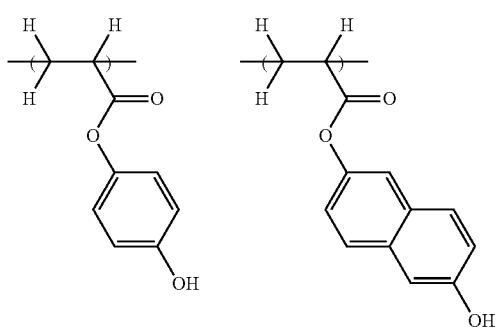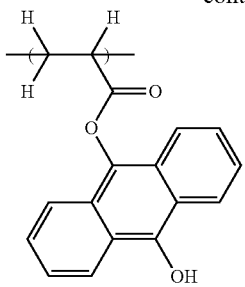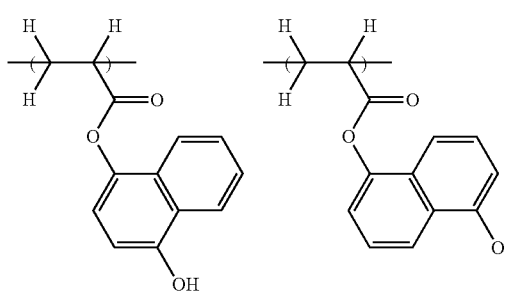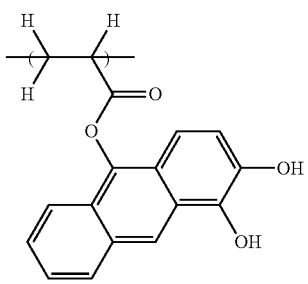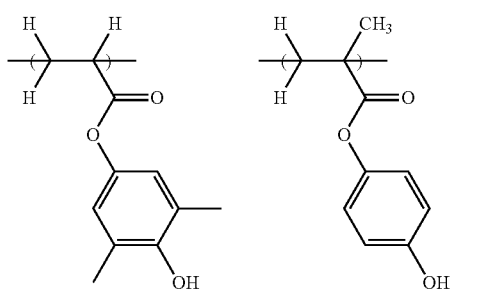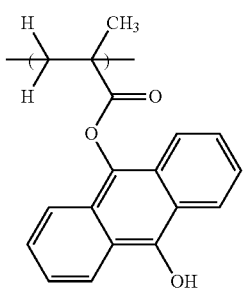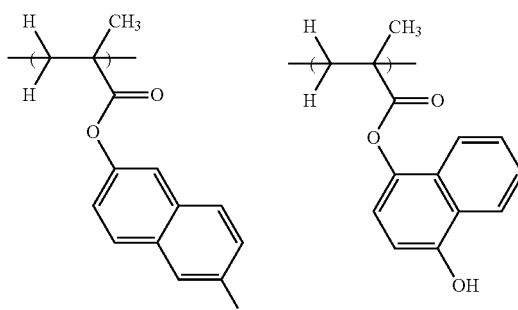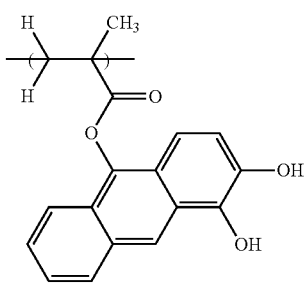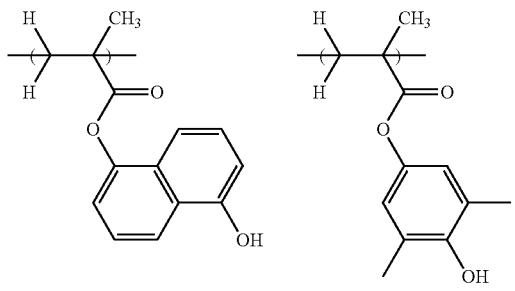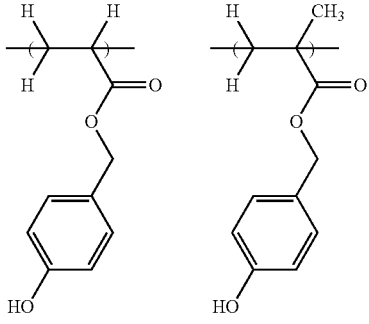

-continued

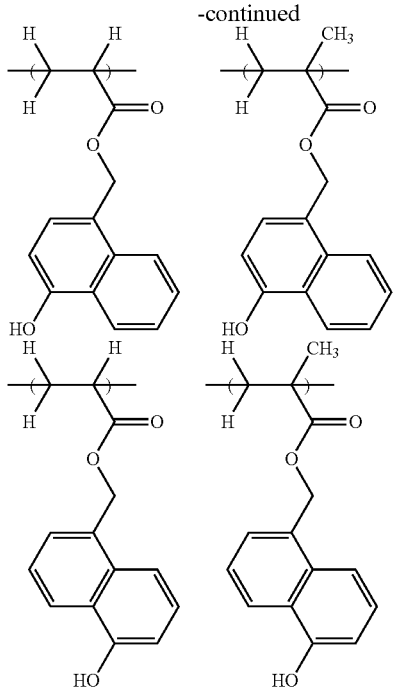

One kind or several kinds of the repeating unit A3 may be used singly or in combination. The repeating unit A3 is introduced in a range of preferably 10 to 95 mol %, more preferably 30 to 85 mol %, relative to all the repeating units in the polymer compound of the component (A). Nevertheless, as described later, when the present invention employs and contains at least one or more of repeating units shown by general formulae (A12) and (A13) for imparting higher etching resistance to the polymer and these unit(s) have a phenolic hydroxy group as a substituent, the content of the repeating unit A3 in addition to the proportion of the unit(s) preferably falls within the above ranges.

<Repeating Units A4 to A11>

The inventive chemically amplified resist composition may further contain at least one selected from repeating units shown by the following general formulae (A4) to (A11).

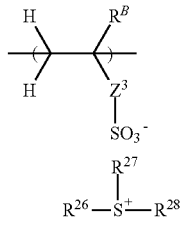 (A4)

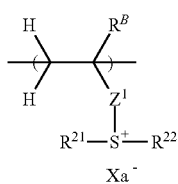

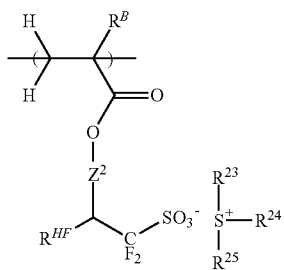 (A5)

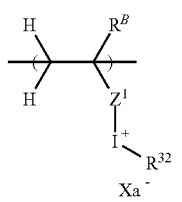 (A6)

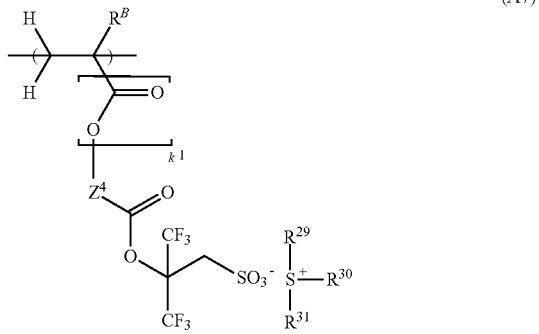 (A7)

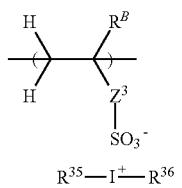 (A8)

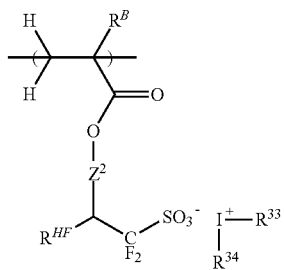 (A9)

(A10)

(A11)

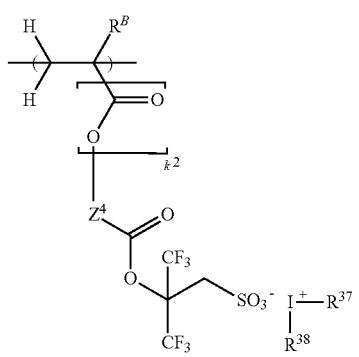

In the formulae, each $R^B$ independently represents a hydrogen atom or a methyl group. $Z^1$ represents a single bond, an aliphatic hydrocarbylene group having 1 to 6 carbon atoms, a phenylene group, a naphthylene group, or a group having 7 to 18 carbon atoms obtained from a combination thereof, —O—$Z^{11}$—, —C(=O)—O—$Z^{11}$—, or —C(=O)—NH—$Z^{11}$—. $Z^{11}$ represents an aliphatic hydrocarbylene group having 1 to 6 carbon atoms, a phenylene group, a naphthylene group, or a group having 7 to 18 carbon atoms obtained from a combination thereof, and optionally contains a carbonyl group, an ester bond, an ether bond, or a hydroxy group. $Z^2$ represents a single bond or —$Z^{21}$—C(=O)—O—. $Z^{21}$ represents a hydrocarbylene group having 1 to 20 carbon atoms optionally containing a heteroatom. $Z^3$ represents a single bond, a methylene group, an ethylene group, a phenylene group, a fluorinated phenylene group, a trifluoromethyl group-substituted phenylene group, —O—$Z^{31}$—, —C(=O)—O—$Z^{31}$—, or —C(=O)—NH—$Z^{31}$—. $Z^{31}$ represents an aliphatic hydrocarbylene group having 1 to 6 carbon atoms, a phenylene group, a fluorinated phenylene group, a trifluoromethyl group-substituted phenylene group, or a group having 7 to 20 carbon atoms obtained from a combination thereof, and optionally contains a carbonyl group, an ester bond, an ether bond, or a hydroxy group. $Z^4$ represents a single bond or a hydrocarbylene group having 1 to 30 carbon atoms optionally containing a heteroatom. $k^1$ and $k^2$ each independently represent 0 or 1, but $k^1$ and $k^2$ each represent 0 when $Z^4$ is a single bond. $R^{21}$ to $R^{38}$ each independently represent a hydrocarbyl group having 1 to 20 carbon atoms optionally containing a heteroatom. $R^{21}$ and $R^{22}$ are optionally bonded to each other to form a ring together with a sulfur atom bonded therewith. $R^{23}$ and $R^{24}$, $R^{26}$ and $R^{27}$, or $R^{29}$ and $R^{30}$, are optionally bonded to each other to form a ring together with a sulfur atom bonded therewith. $R^{HF}$ represents a hydrogen atom or a trifluoromethyl group. $Xa^-$ represents a non-nucleophilic counter ion.

Examples of the hydrocarbylene group (divalent hydrocarbon group) having 1 to 20 carbon atoms optionally containing a heteroatom represented by $Z^{21}$ in —$Z^{21}$—C(=O)—O— as $Z^2$ in the general formulae (A5, A9) include ones shown below, but are not limited thereto.

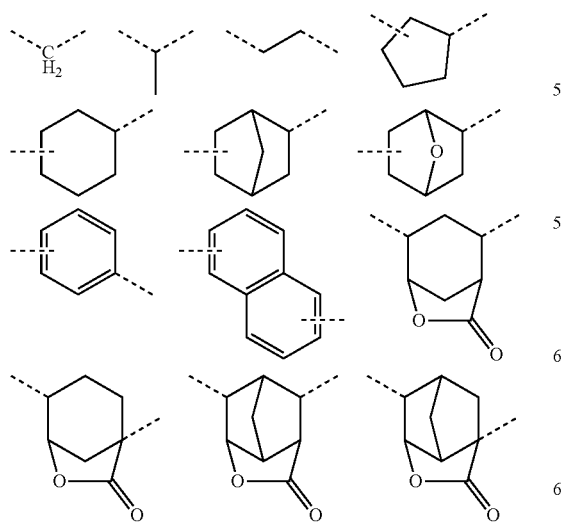

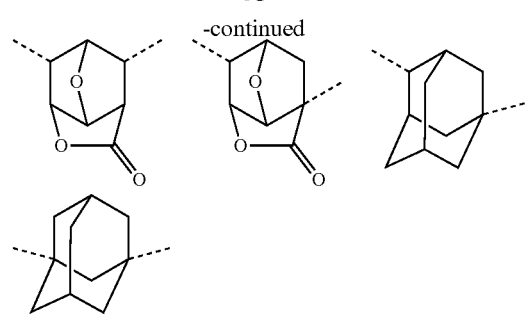

In the formulae, each broken line represents a bonding site.

Examples of the non-nucleophilic counter ion represented by $Xa^-$ in the repeating units A4, A8 include ones disclosed in JP2010-113209A and JP2007-145797A. Moreover, specific examples of the repeating units A5, A9, where $R^{HF}$ is a hydrogen atom, include ones disclosed in JP2010-116550A. Specific examples of the repeating units A5, A9, where $R^{HF}$ is a trifluoromethyl group, include ones disclosed in JP2010-77404A. Examples of the repeating units A6, A10 include ones disclosed in JP2012-246265A and JP2012-246426A.

Preferable examples of anion moieties in monomers to give the repeating units A7, A11 include ones shown below, but are not limited thereto.

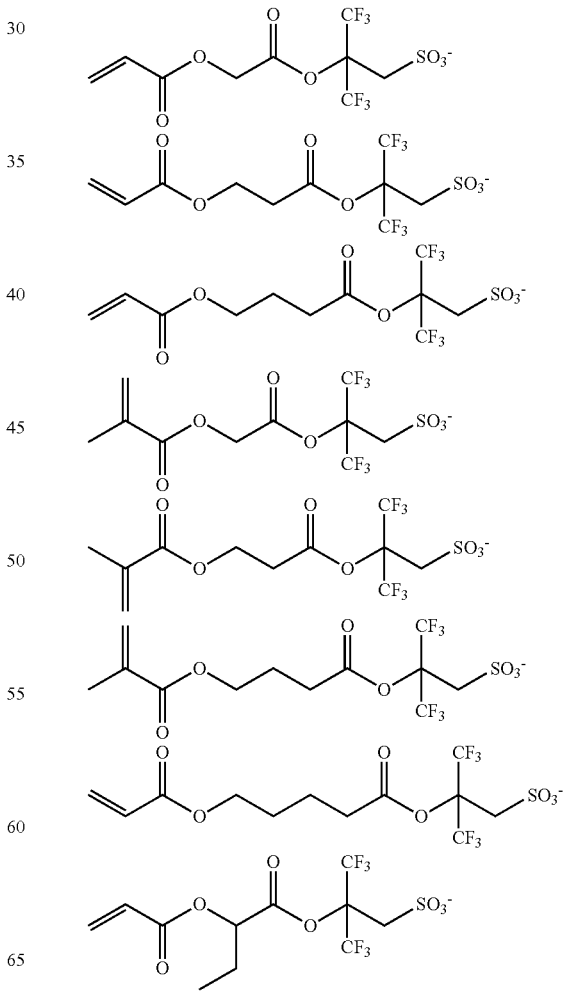

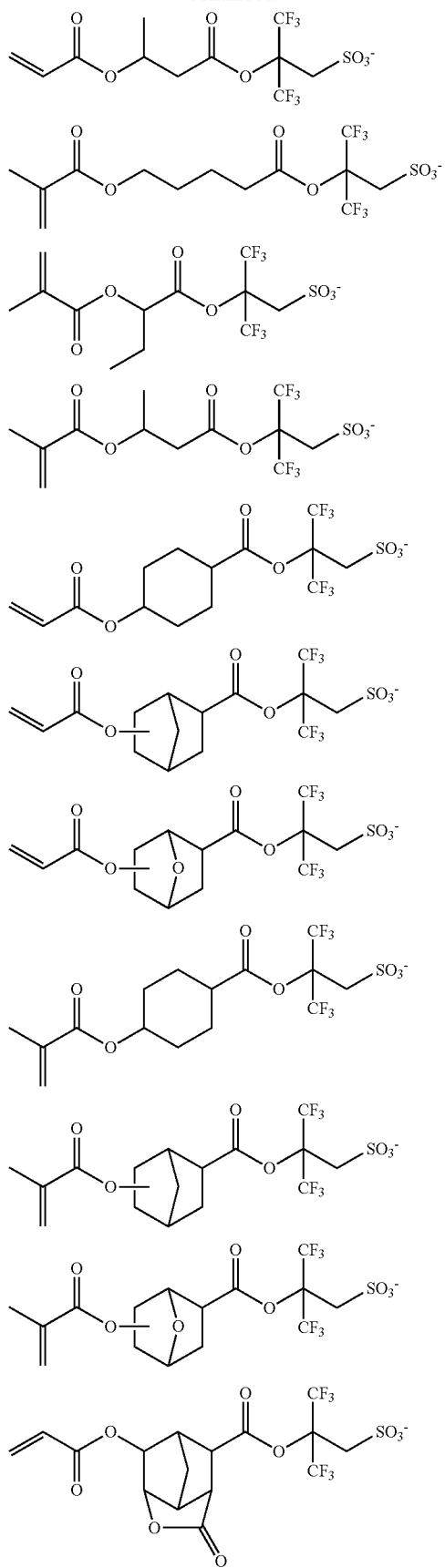
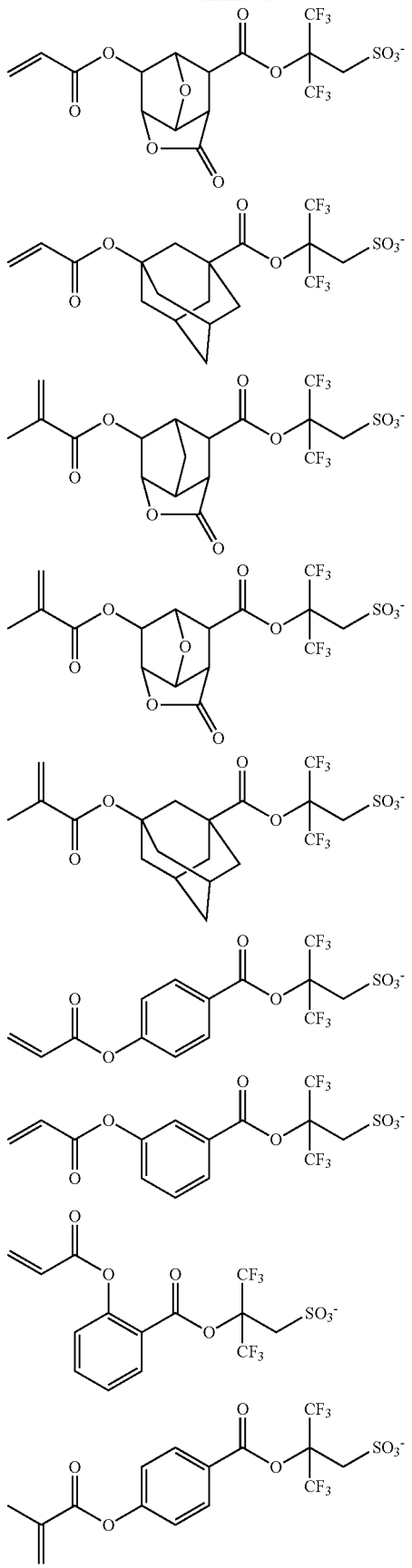

-continued

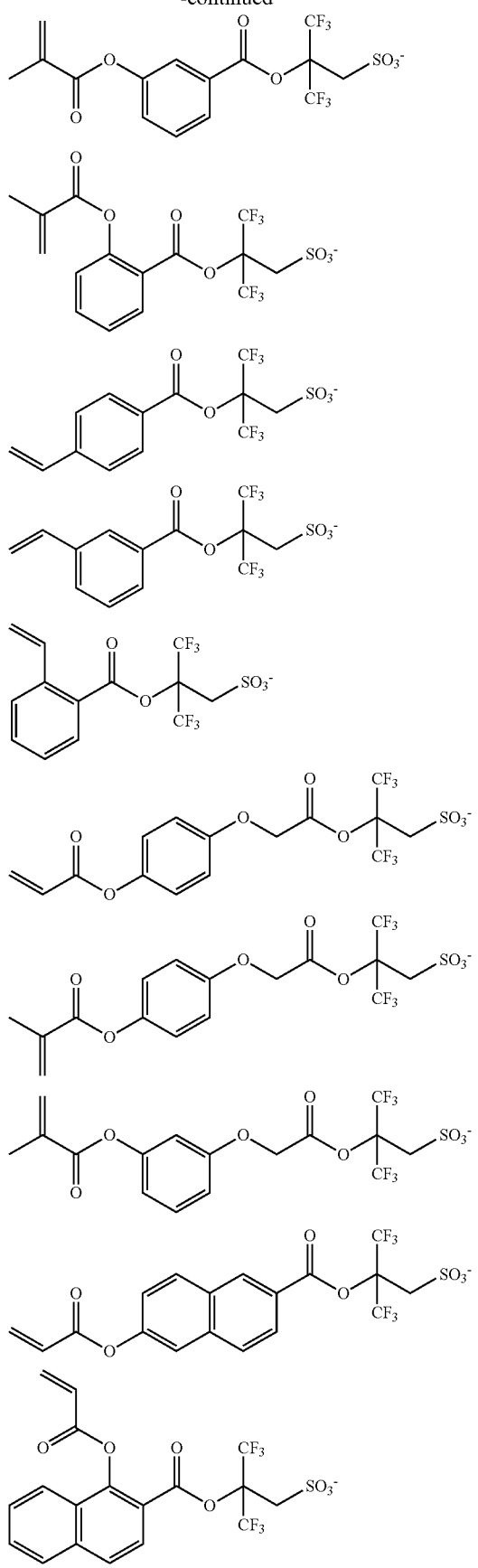

-continued

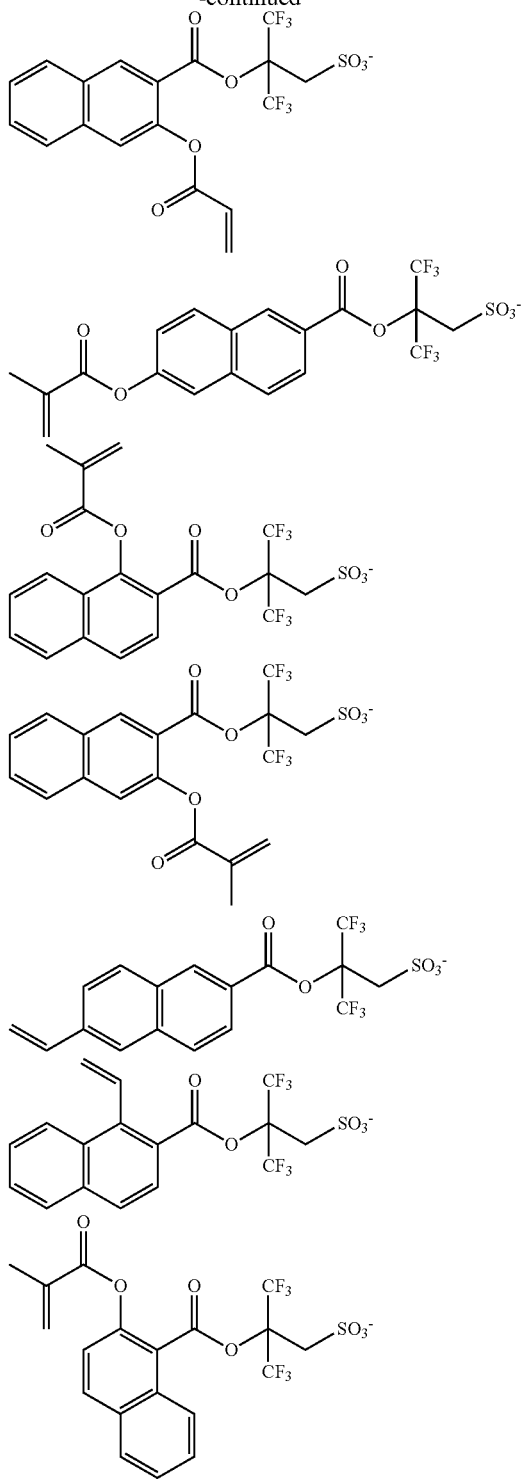

In the general formulae (A4) to (A11), $R^{21}$ to $R^{38}$ are each independently a hydrocarbyl group having 1 to 20 carbon atoms optionally containing a heteroatom. The hydrocarbyl group may be saturated or unsaturated, and may be linear, branched, or cyclic. Specific examples thereof include ones exemplified in paragraphs [0022], [0023] of JP2010-116550A. Moreover, the hydrocarbyl group may have some or all of hydrogen atoms substituted with a group containing a heteroatom, such as an oxygen atom, a sulfur atom, a nitrogen atom, or a halogen atom. A group containing a heteroatom, such as an oxygen atom, a sulfur atom, or a nitrogen atom, may be present in a carbon-carbon bond of the hydrocarbyl group; consequently, the hydrocarbyl group may contain a hydroxy group, a fluorine atom, a chlorine atom, a bromine atom, an iodine atom, a cyano group, a carbonyl group, an ether bond, an ester bond, a sulfonic acid ester bond, a carbonate bond, a lactone ring, a sultone ring, a carboxylic anhydride, a haloalkyl group, etc.

Further, $R^{21}$ and $R^{22}$ may be bonded to each other to form a ring together with a sulfur atom bonded to $R^{21}$ and $R^{22}$. $R^{23}$ and $R^{24}$, $R^{26}$ and $R^{27}$, or $R^{29}$ and $R^{30}$, may be bonded to each other to form a ring together with a sulfur atom bonded therewith. Examples of the rings formed in these events include the following, etc.

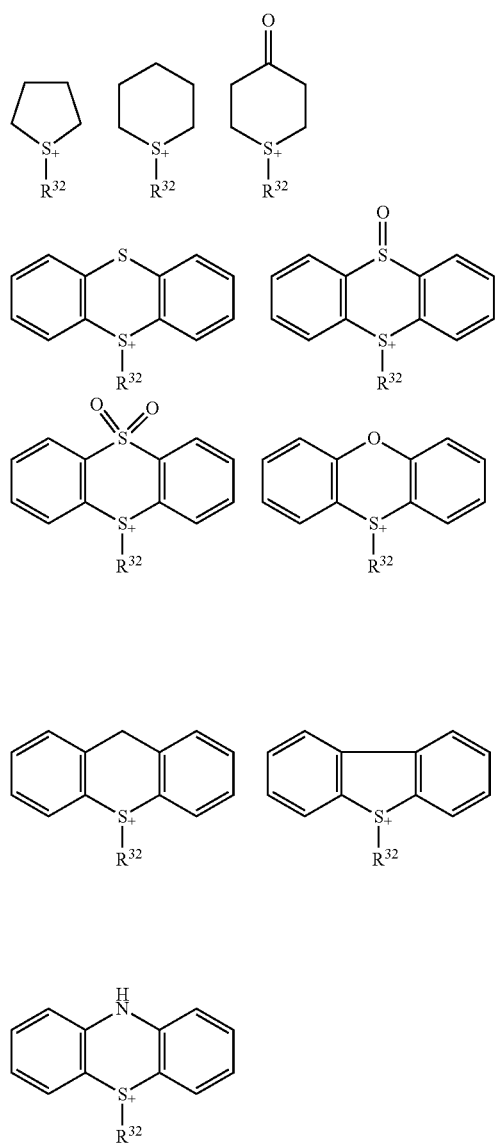

In the formulae, $R^{32}$ is the same as the groups represented by $R^{21}$ to $R^{38}$.

Examples of specific structures of the sulfonium cations in the general formulae (A5) to (A7) include ones shown below, but are not limited thereto.

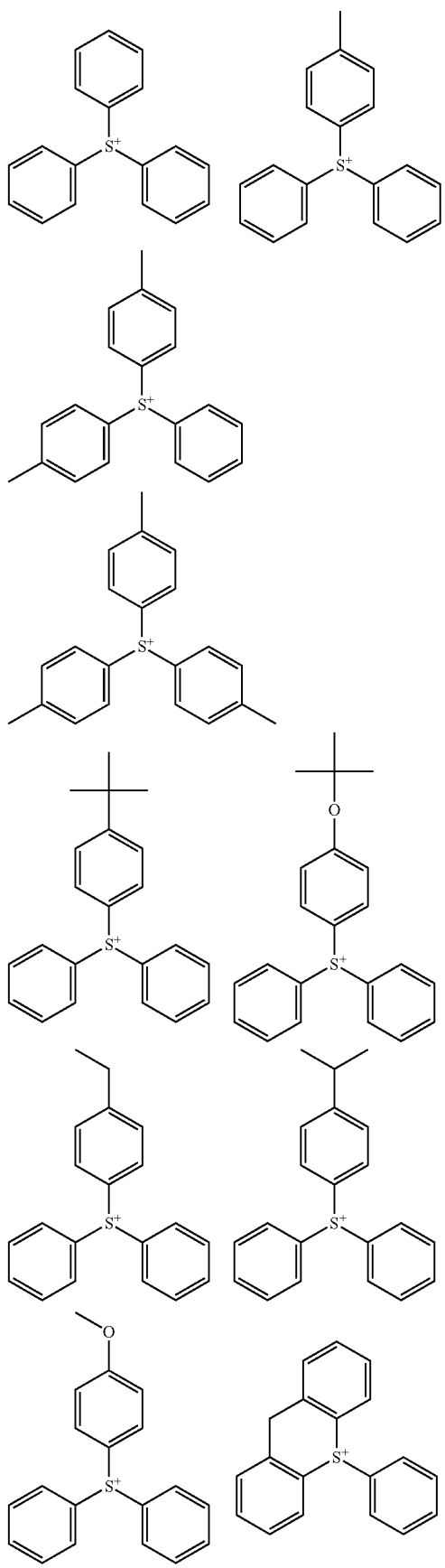

-continued
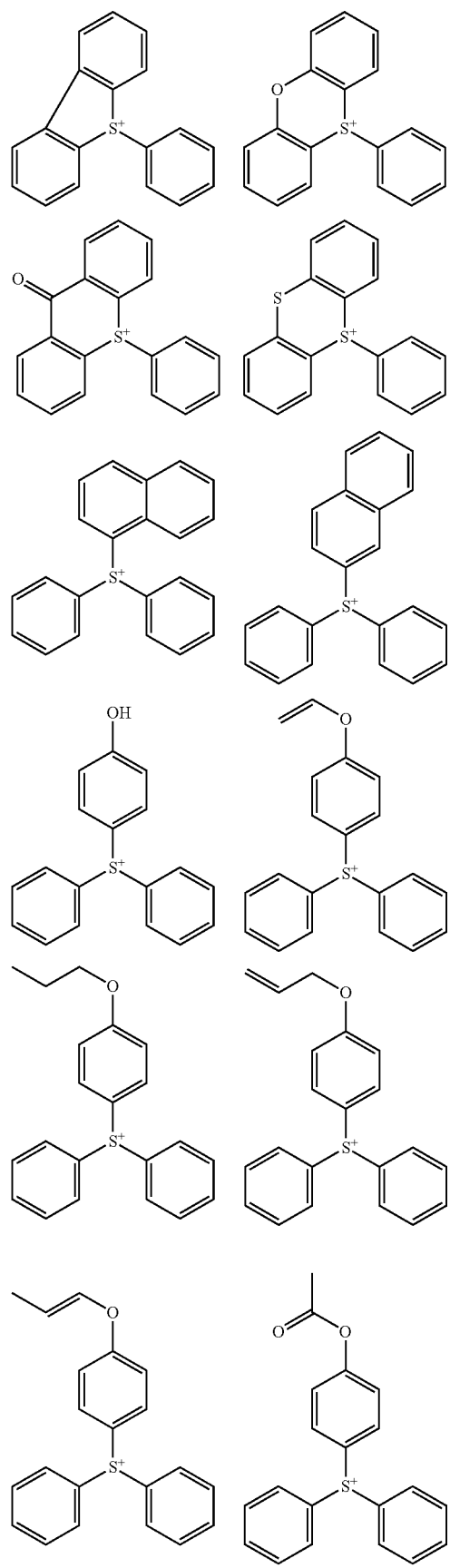
-continued
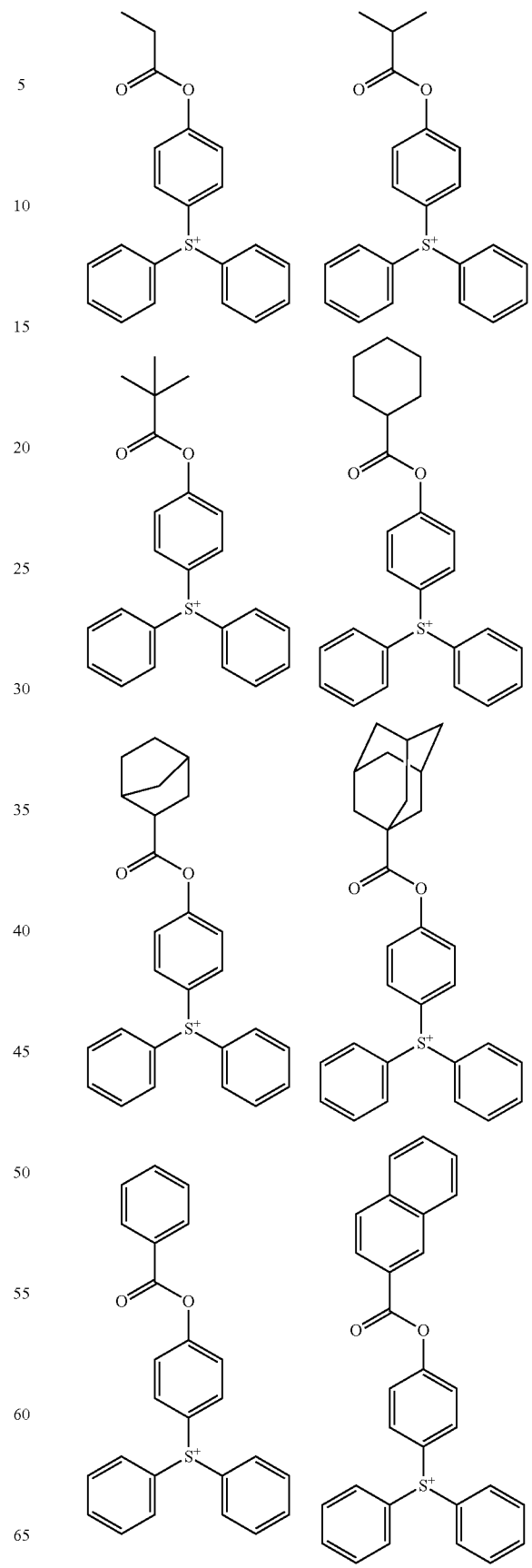

57
-continued
58
-continued
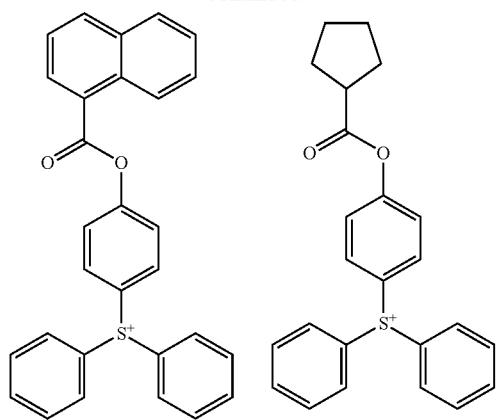
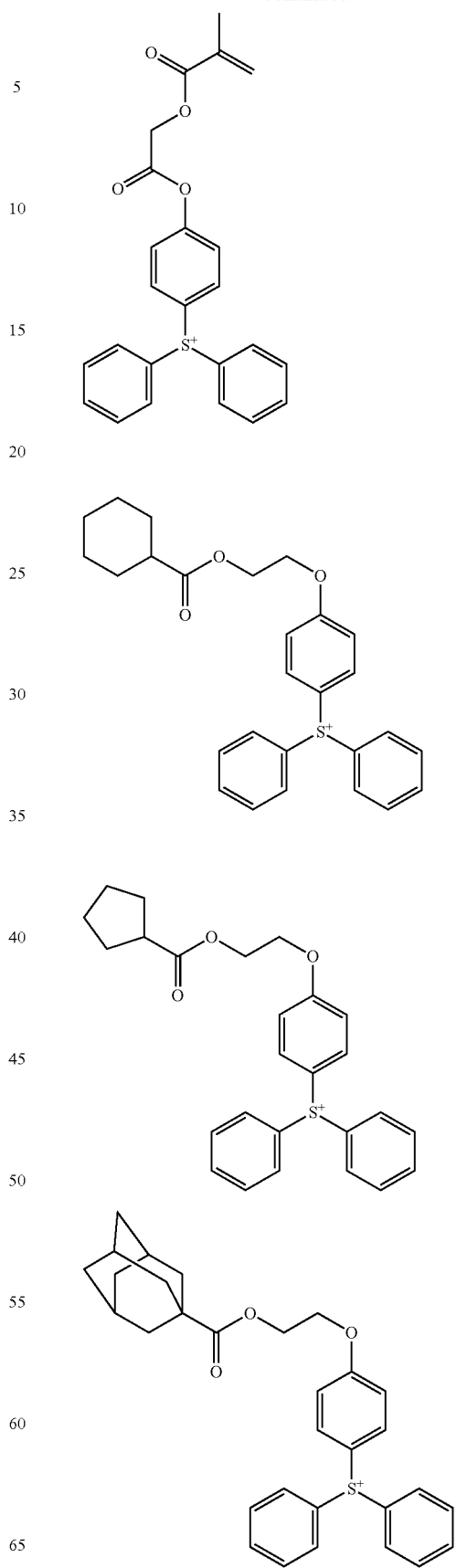

59
-continued
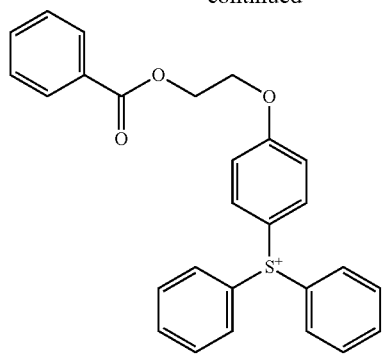
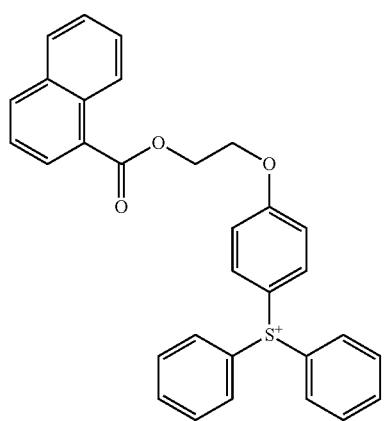
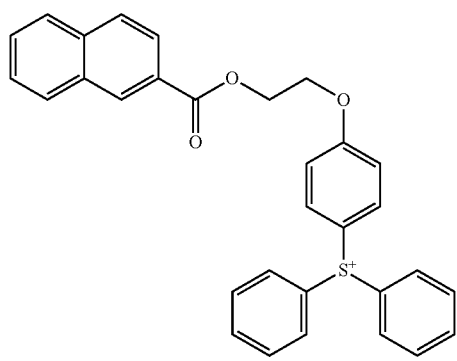
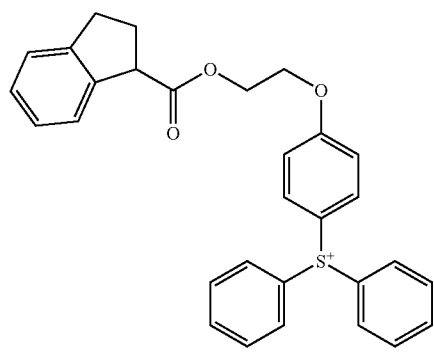
60
-continued
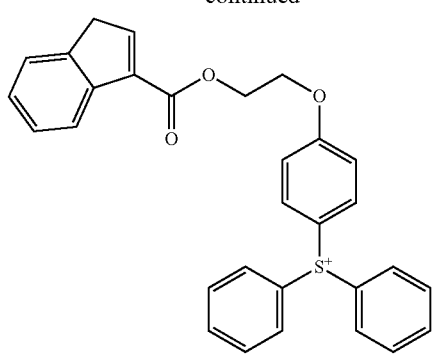
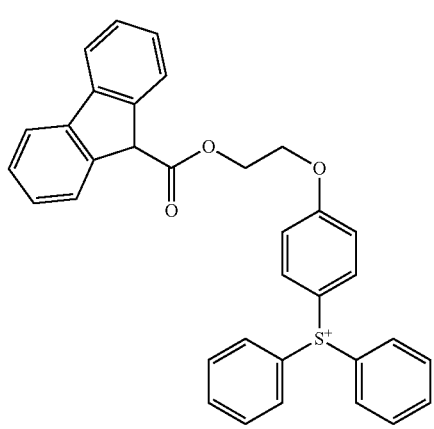
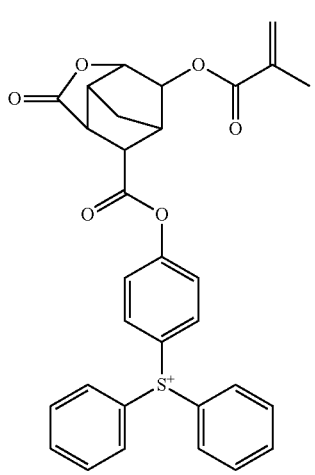
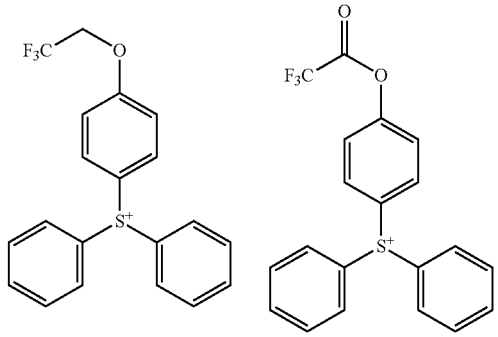

61
-continued
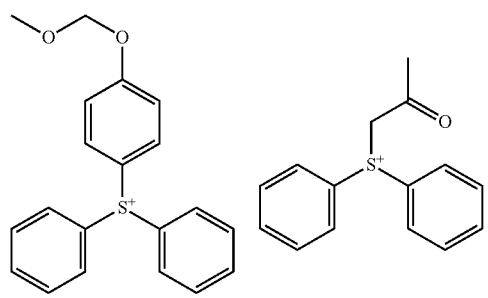
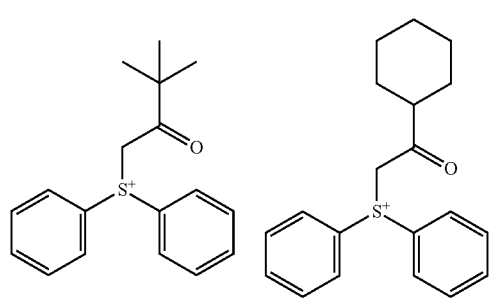
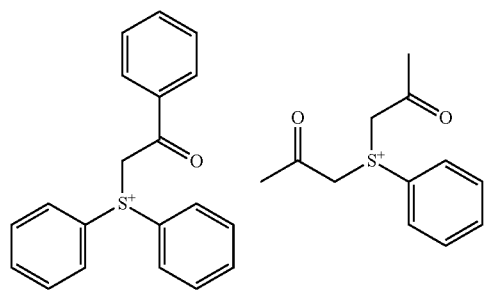
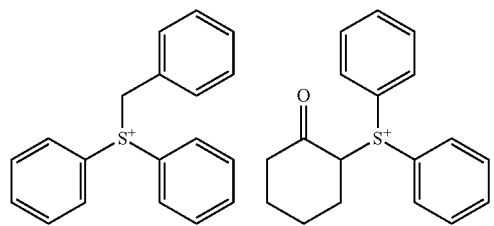
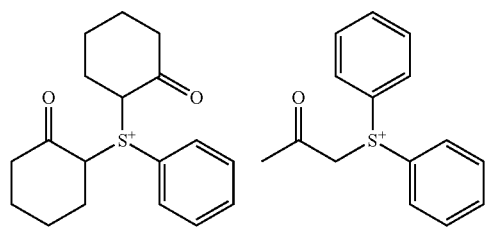
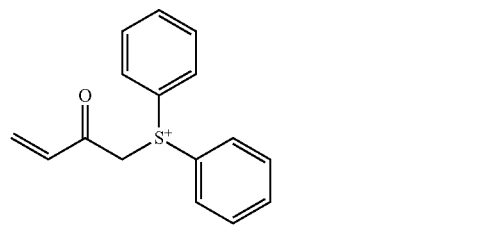
62
-continued
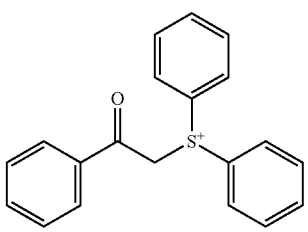
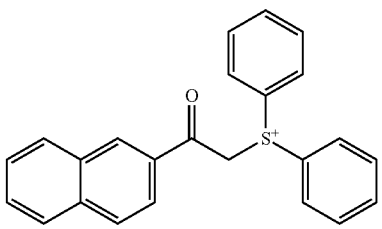
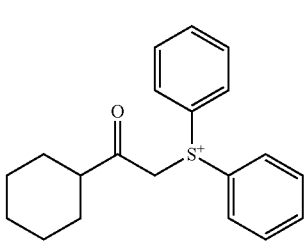
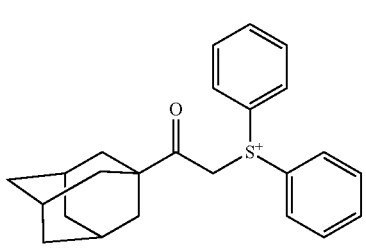
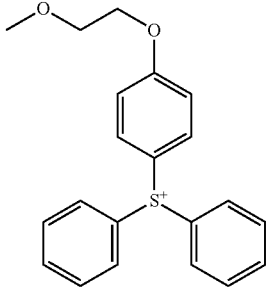
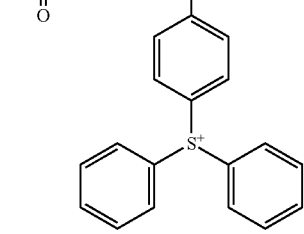

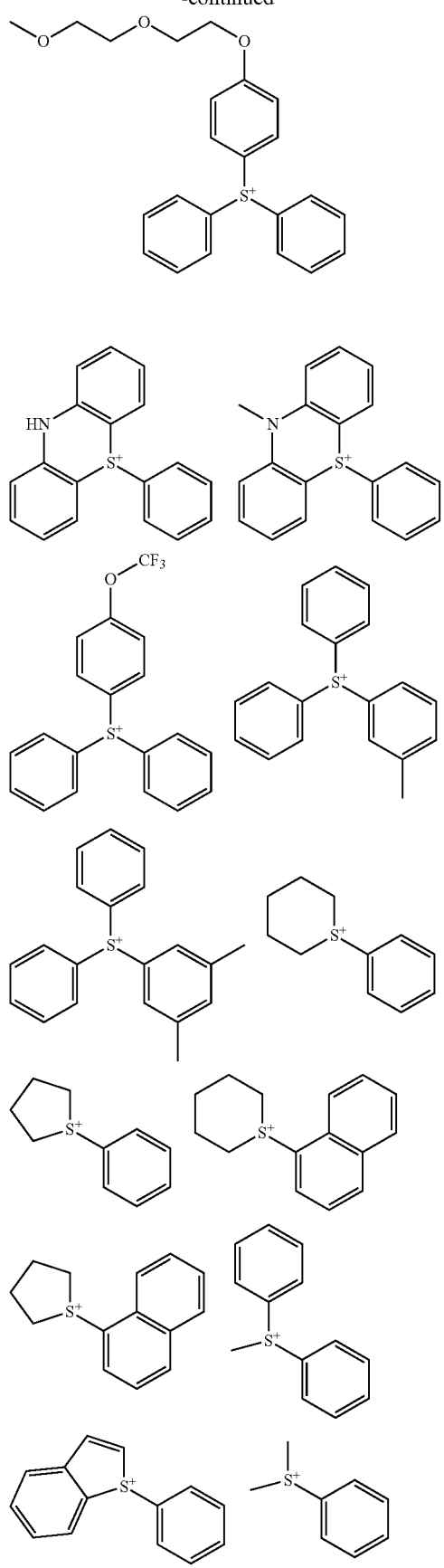
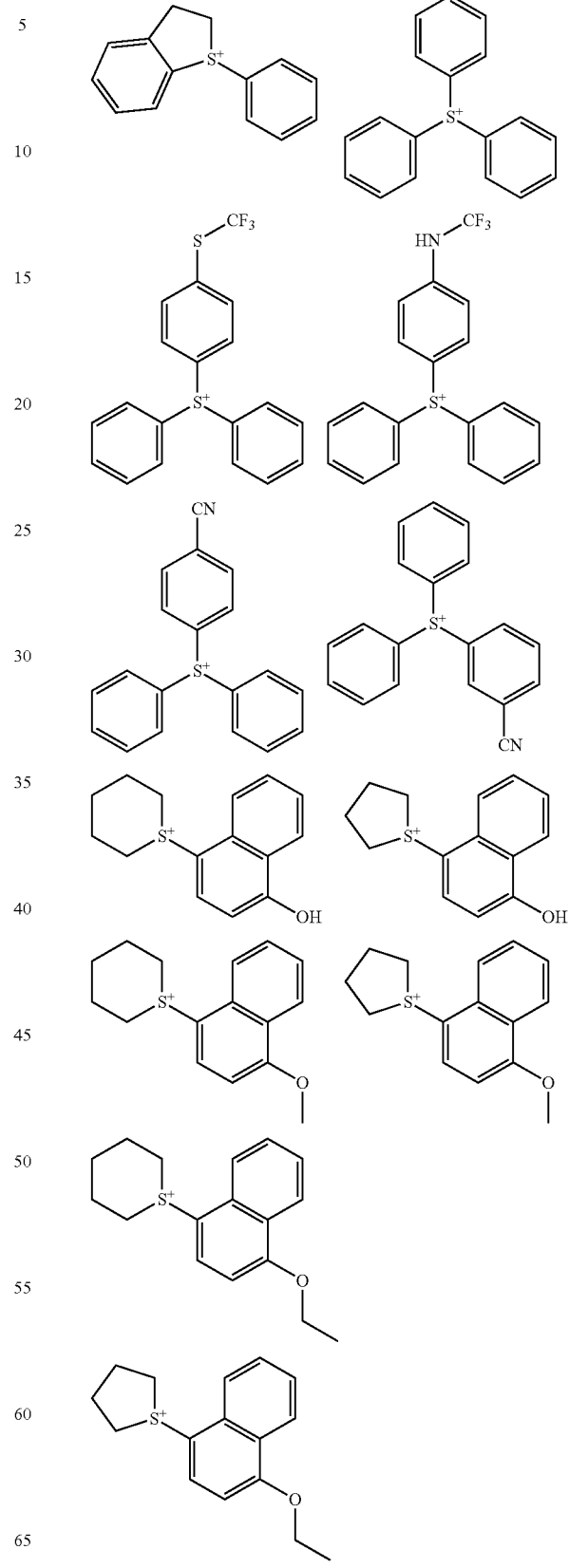

-continued
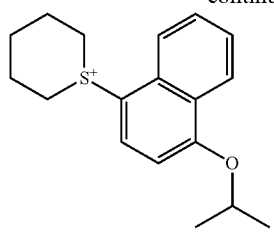
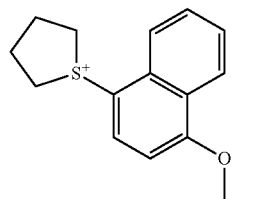
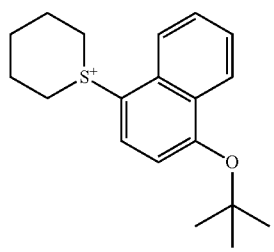
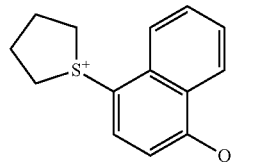
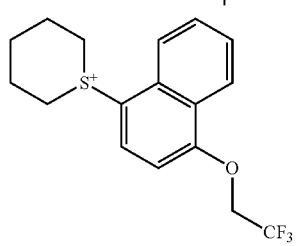
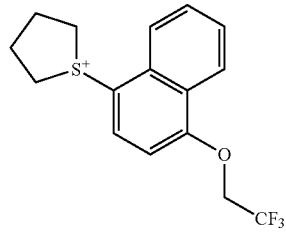
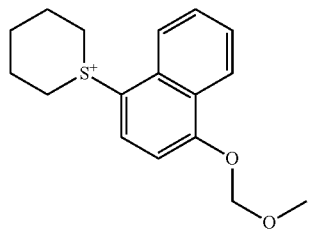
-continued
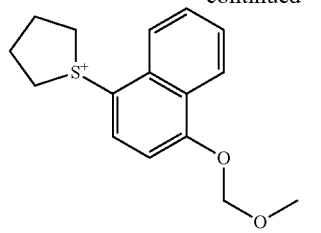
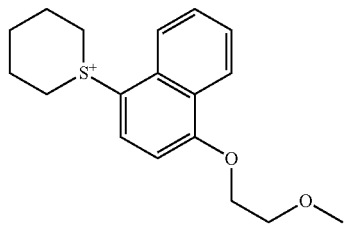
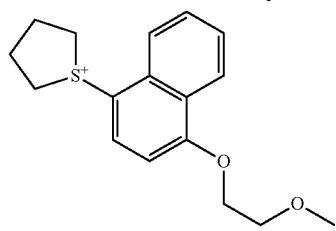
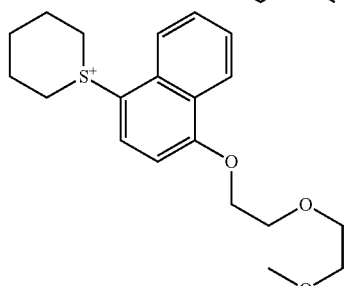
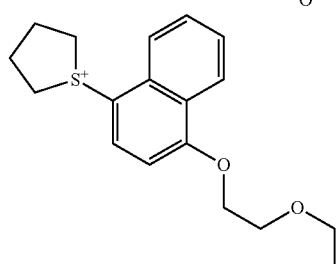
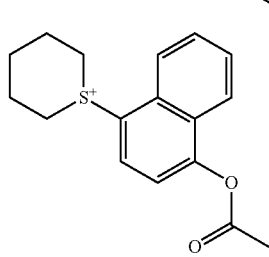
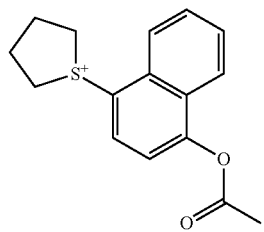

-continued
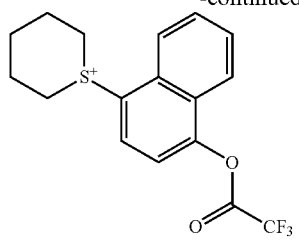
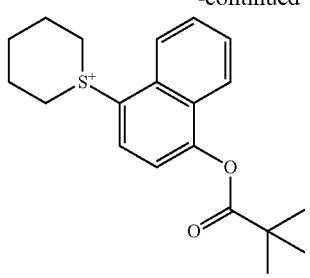
-continued
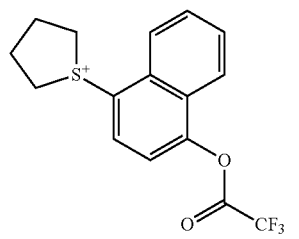
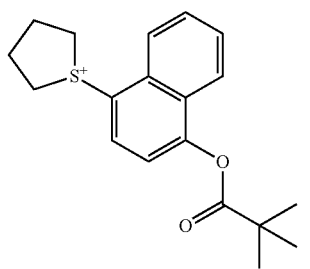
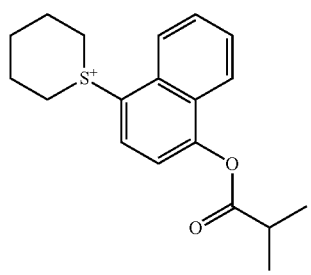
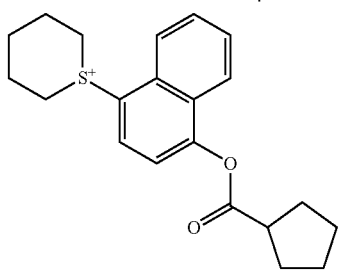
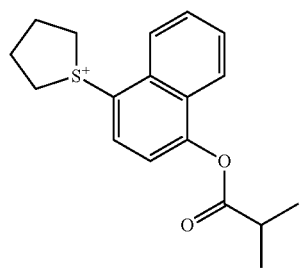
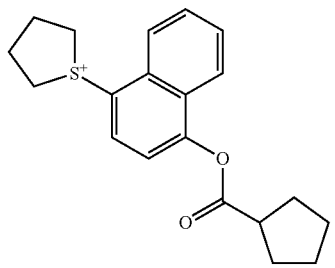
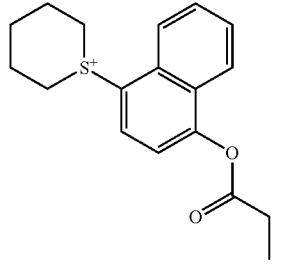
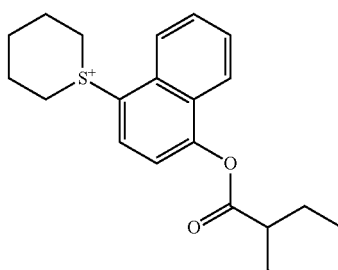
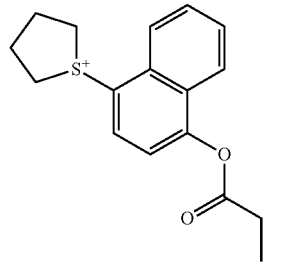
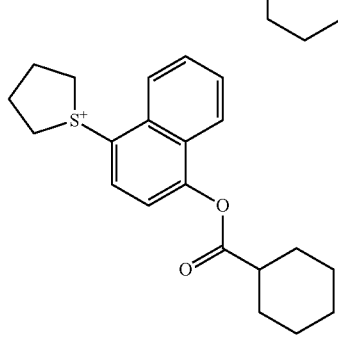

69
-continued
70
-continued
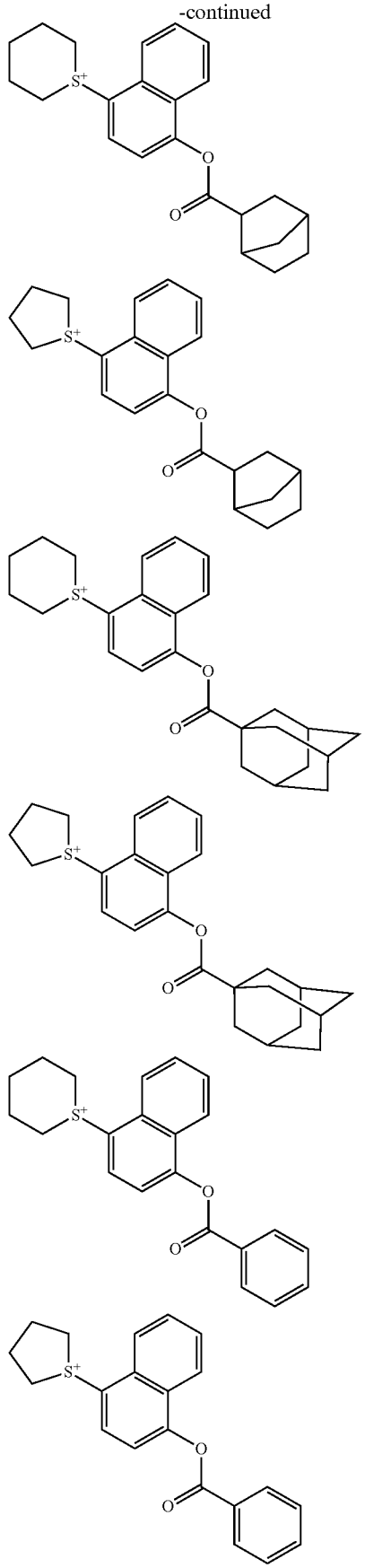
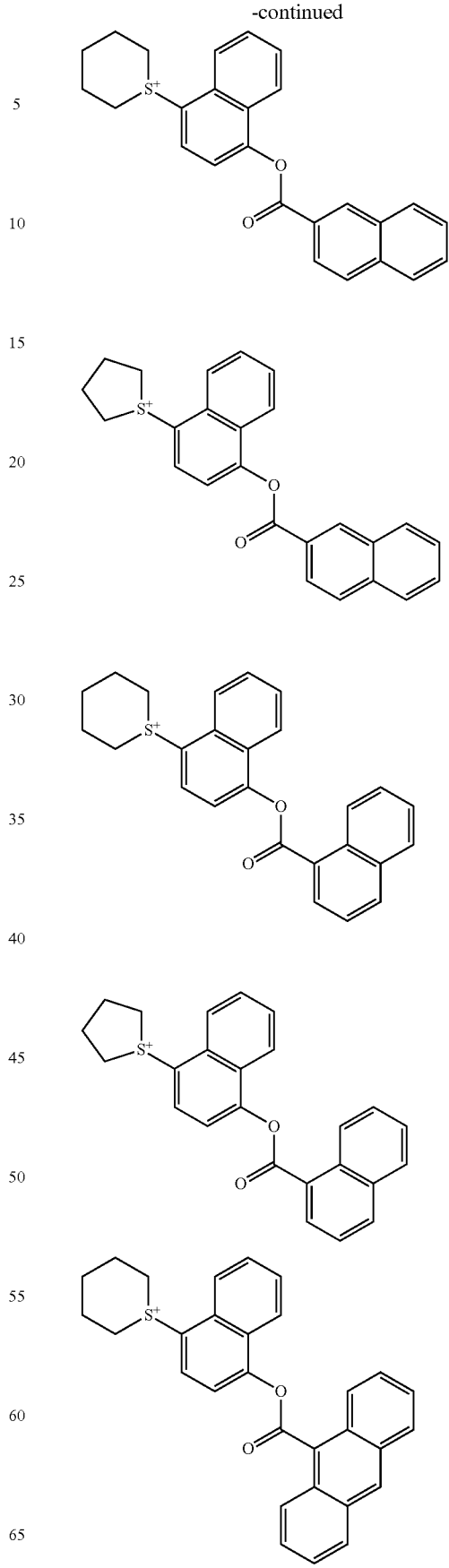

-continued
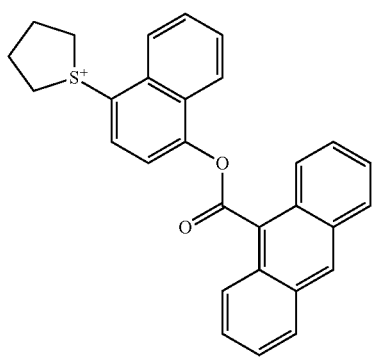
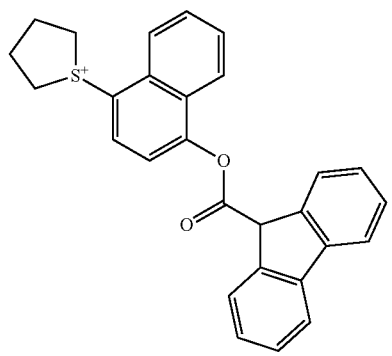
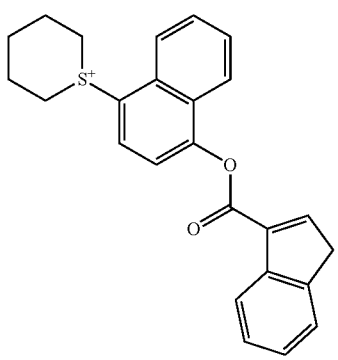
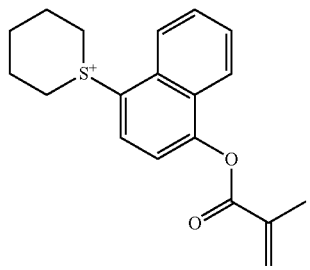
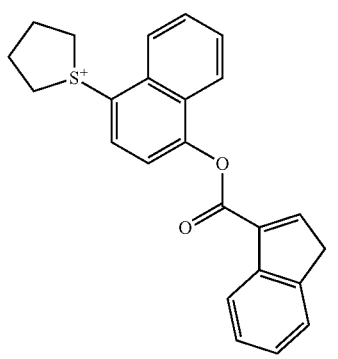
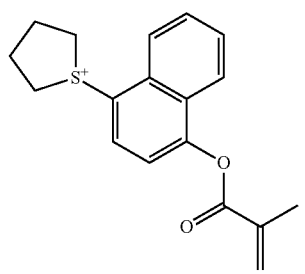
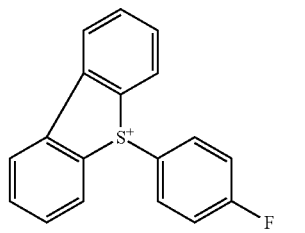
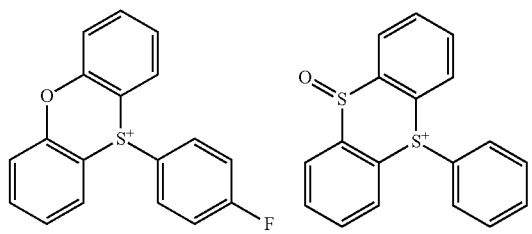
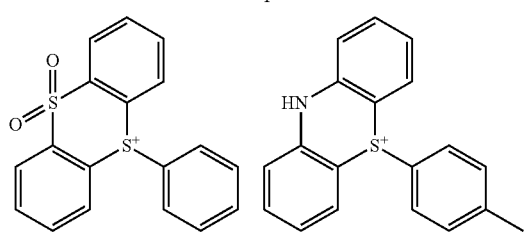
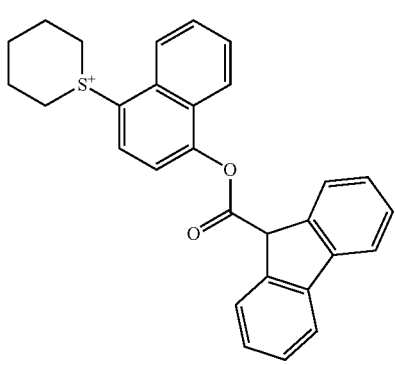

73
-continued
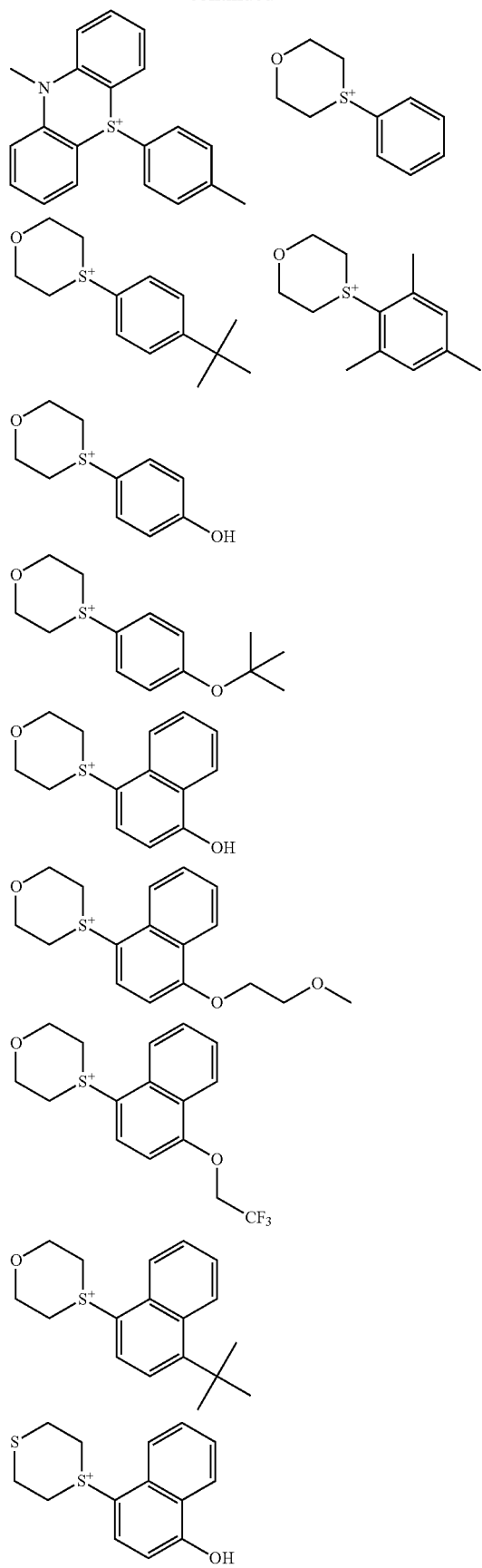
74
-continued
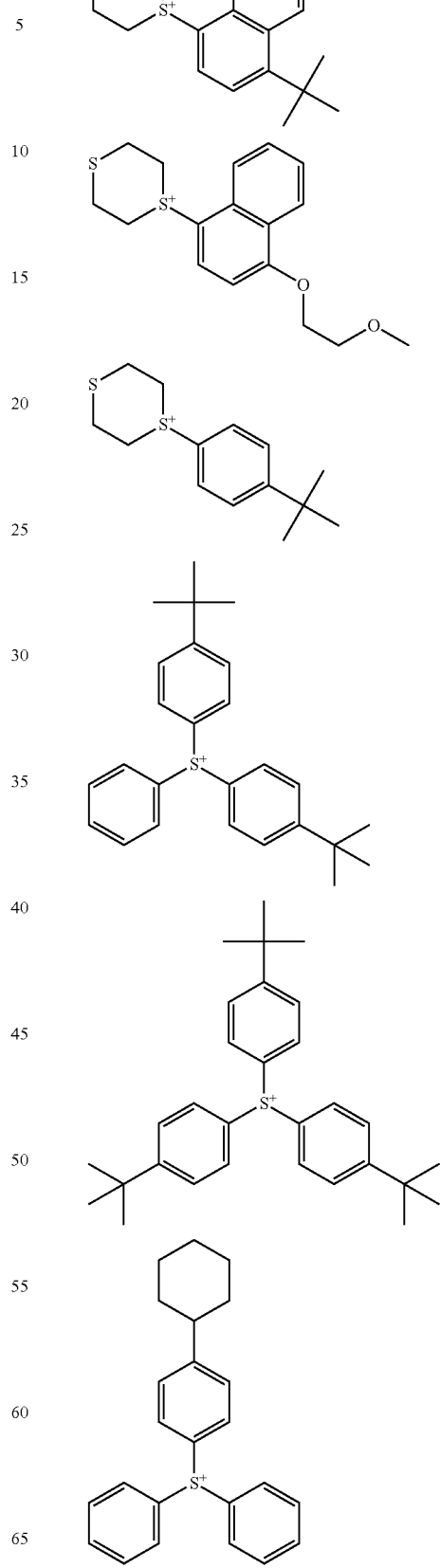

75
-continued
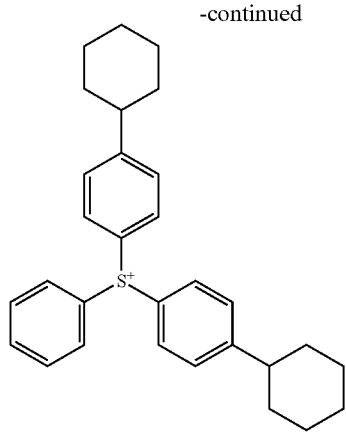
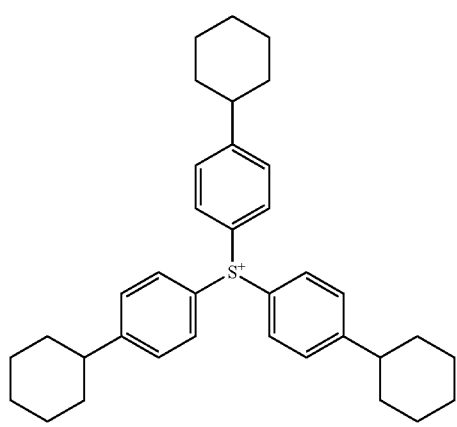
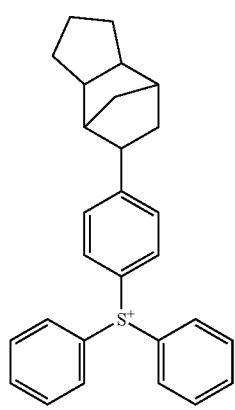
76
-continued
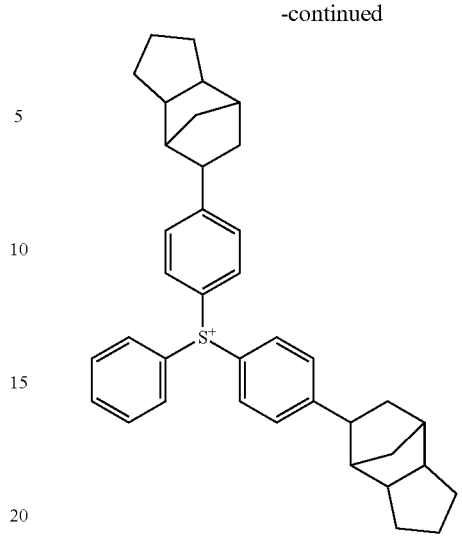
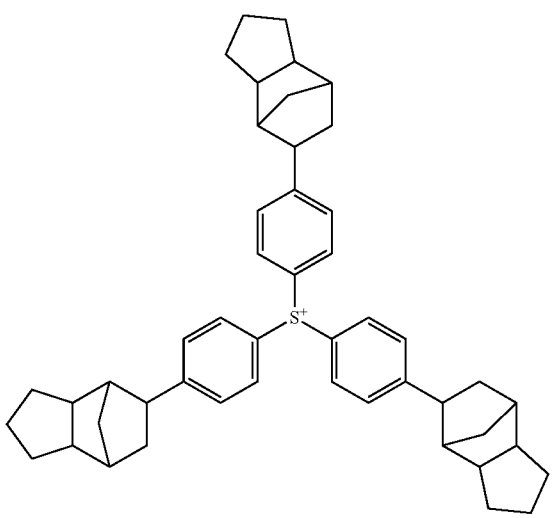
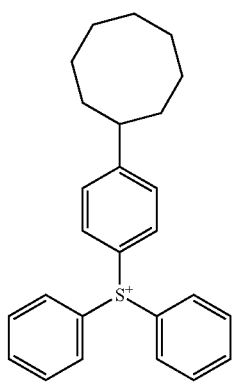

77
-continued
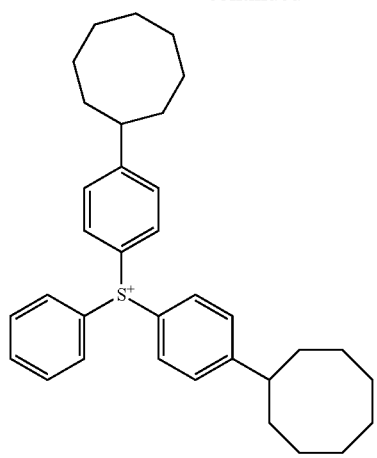
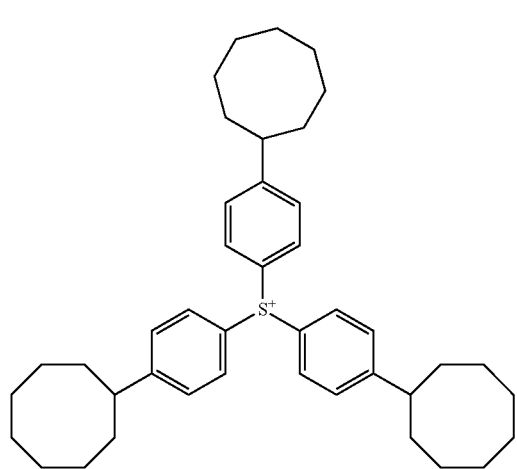
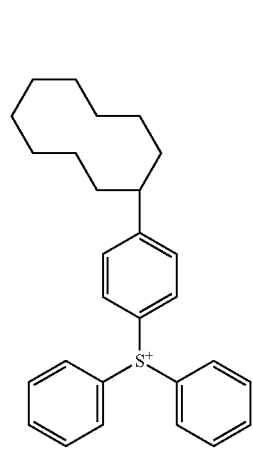
78
-continued
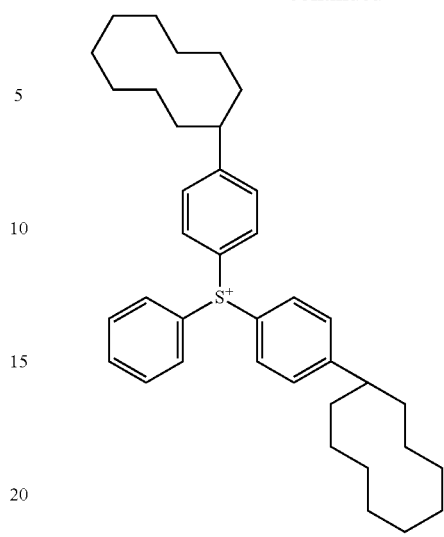
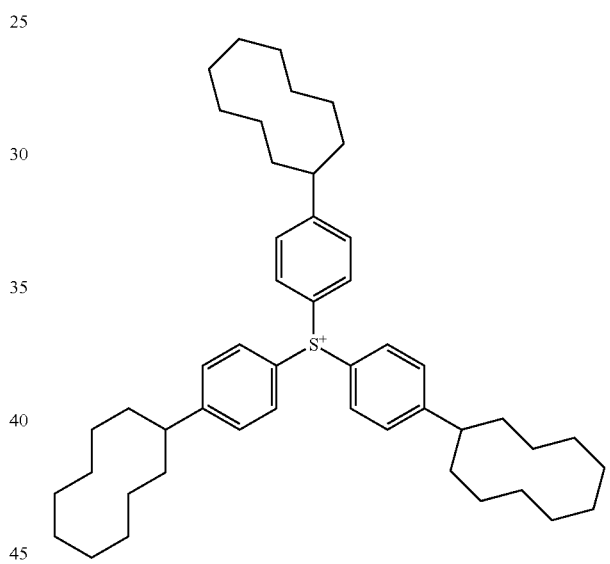
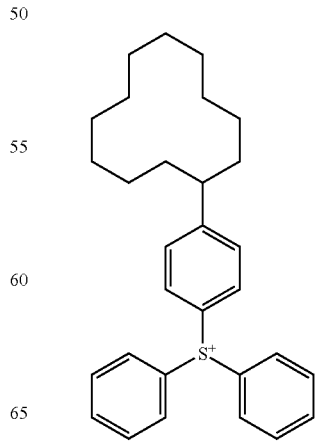

79
-continued
80
-continued
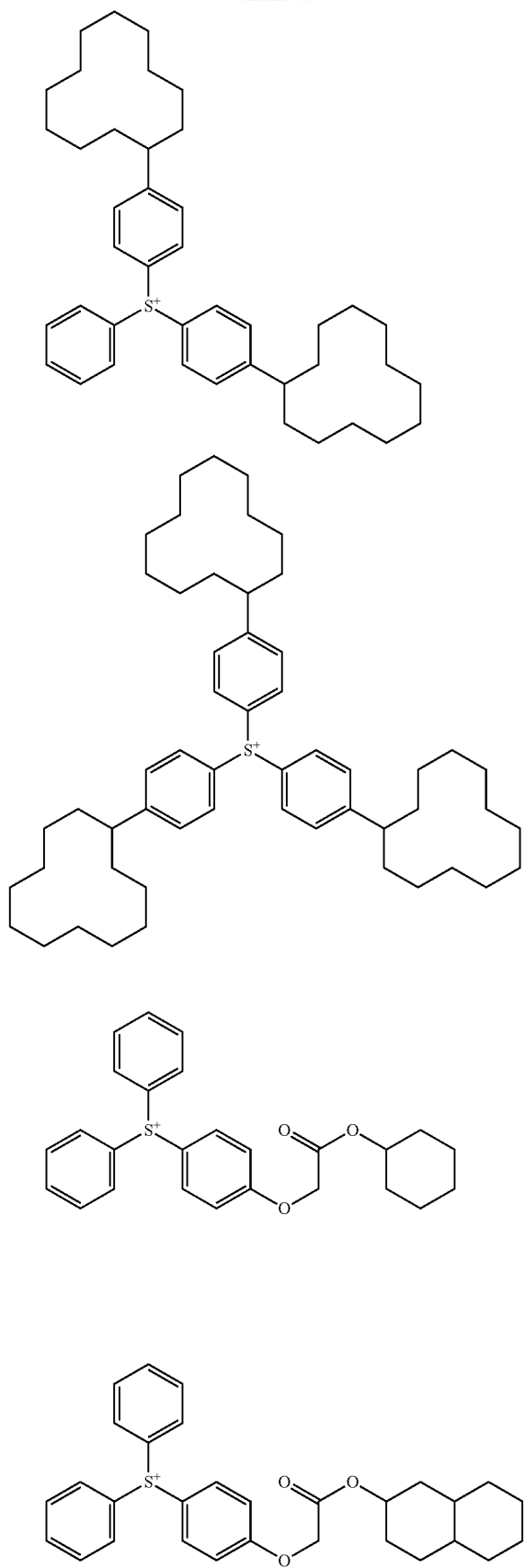
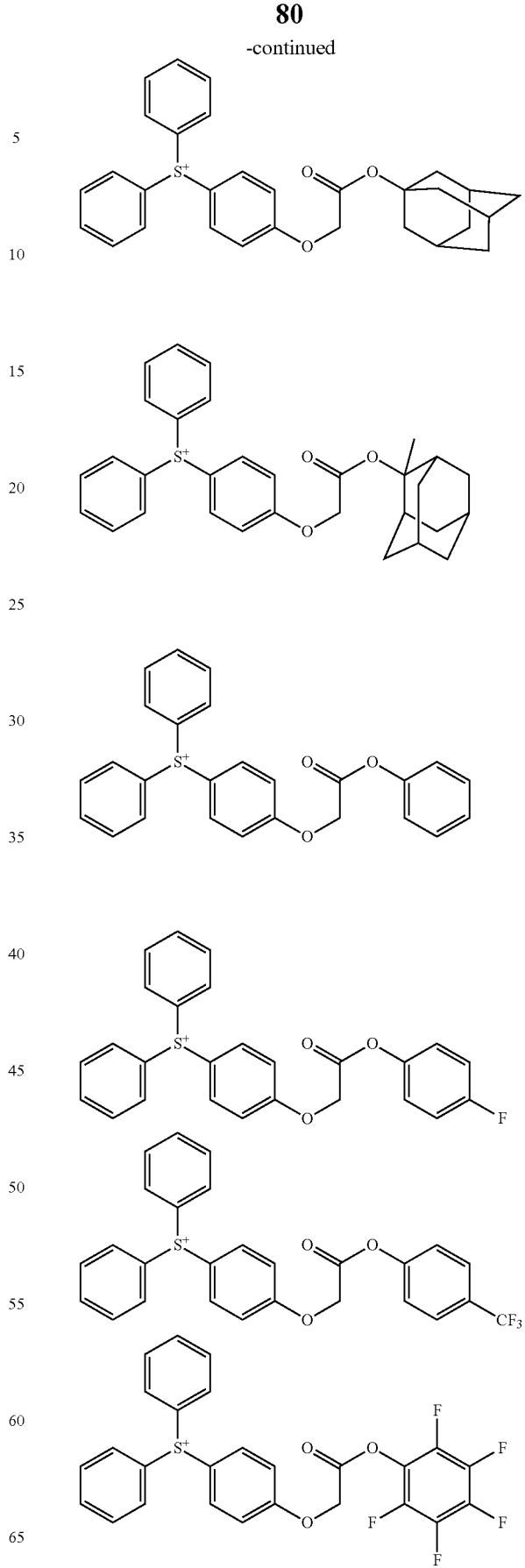

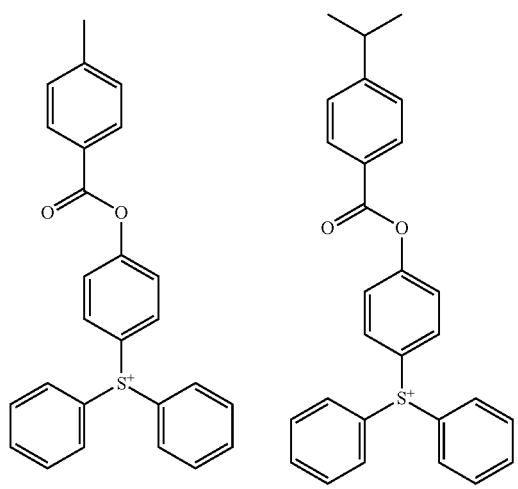
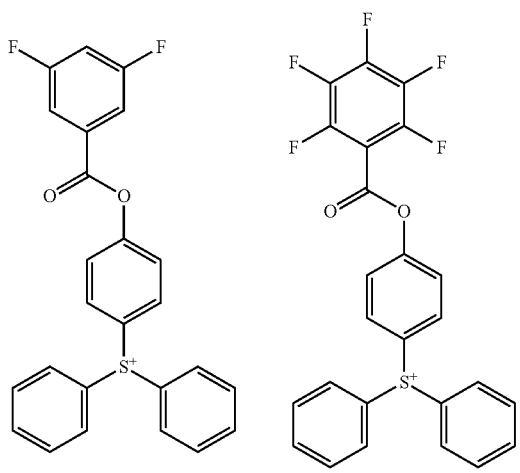
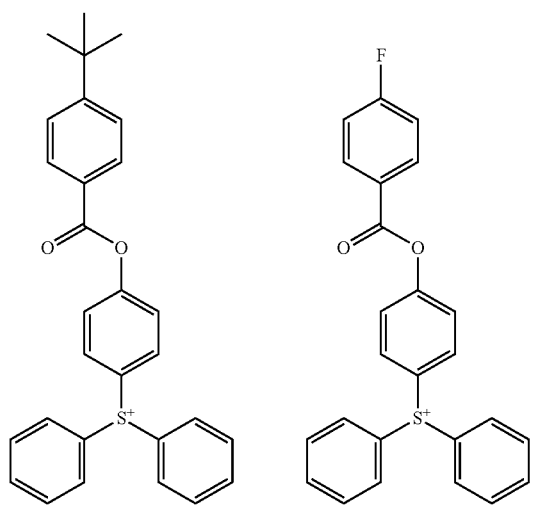
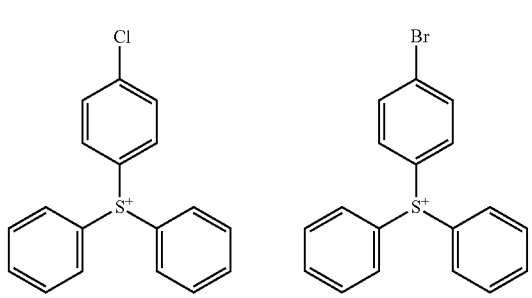
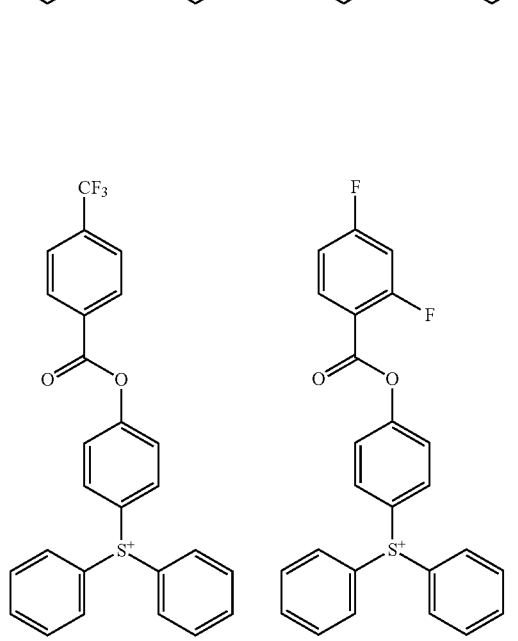
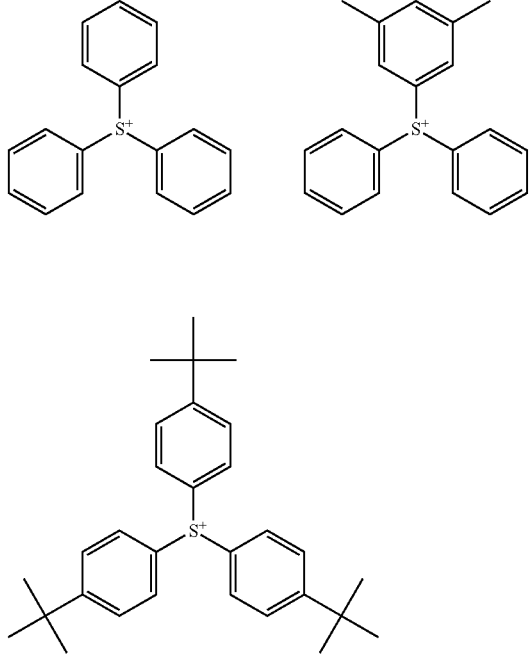

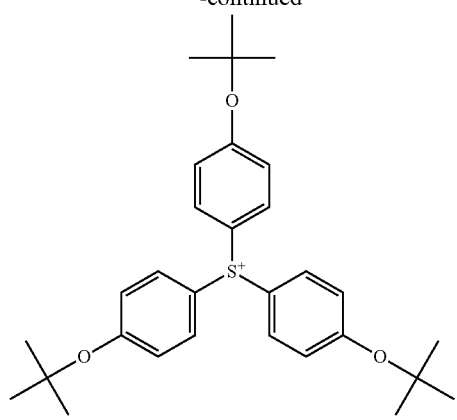
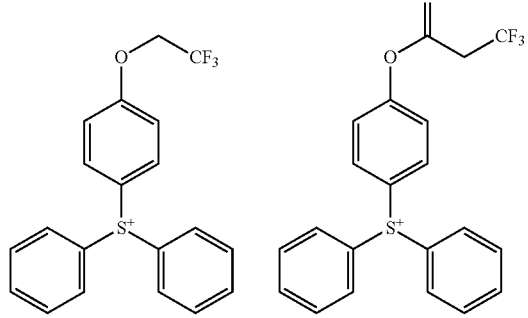
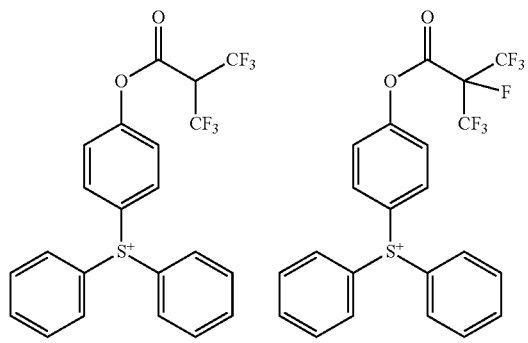
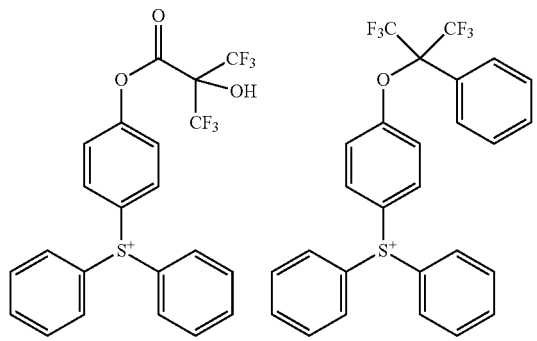
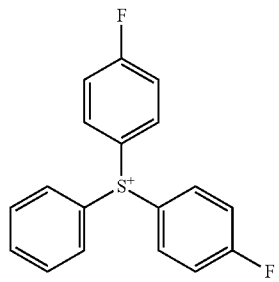
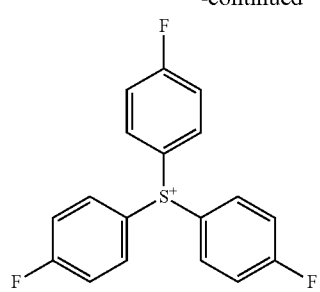
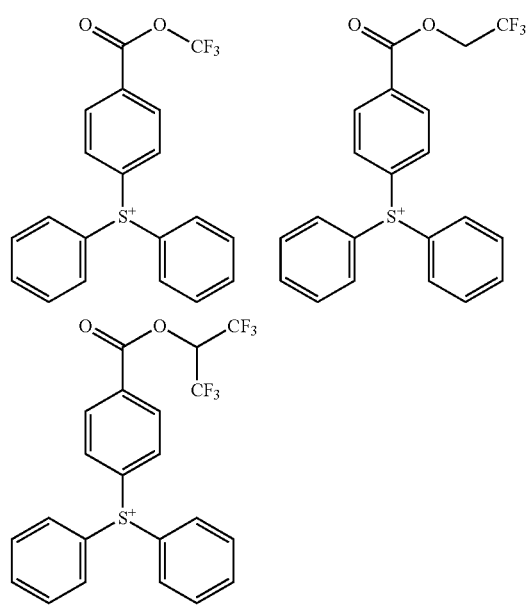

85
-continued
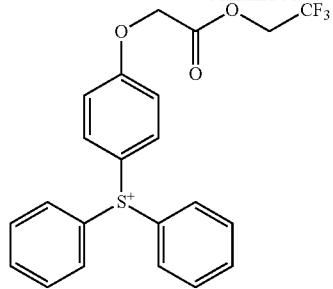
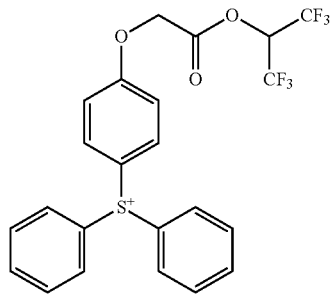
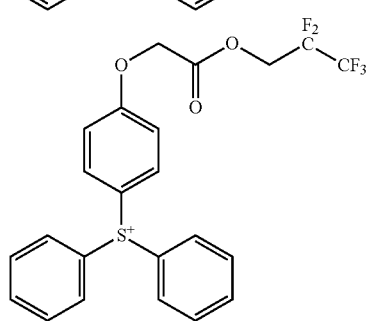
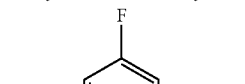
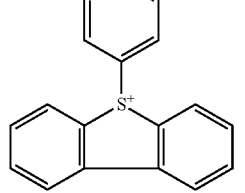
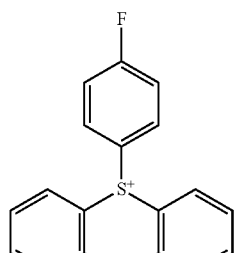
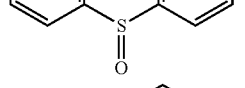
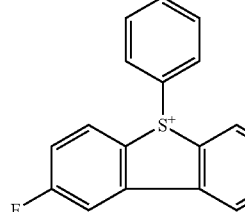
86
-continued
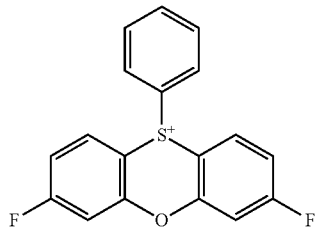
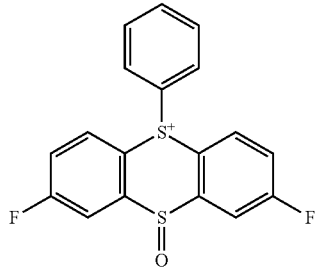
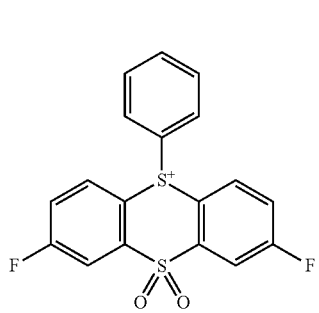
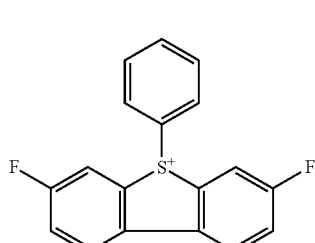
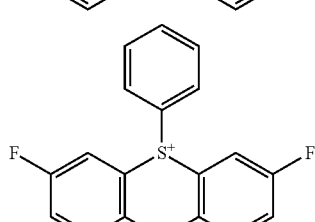
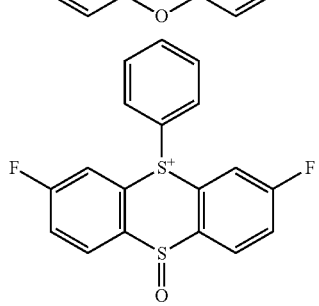

87
-continued
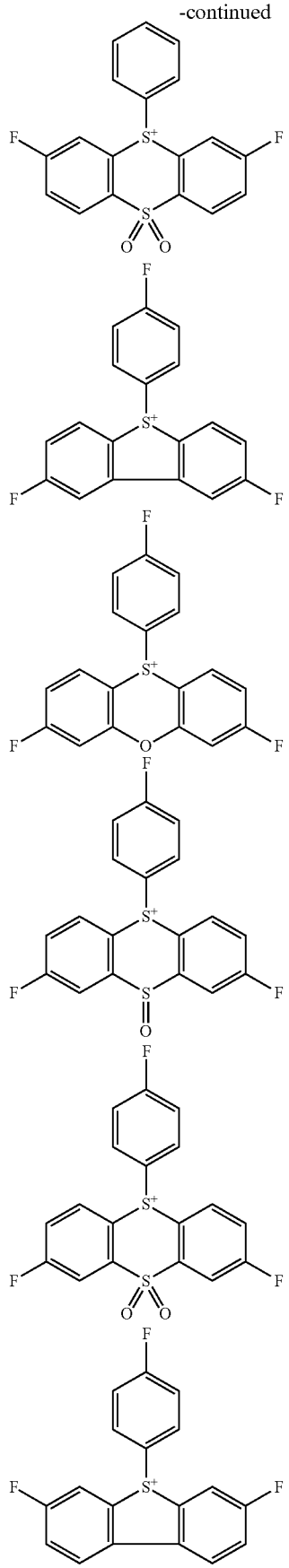
88
-continued
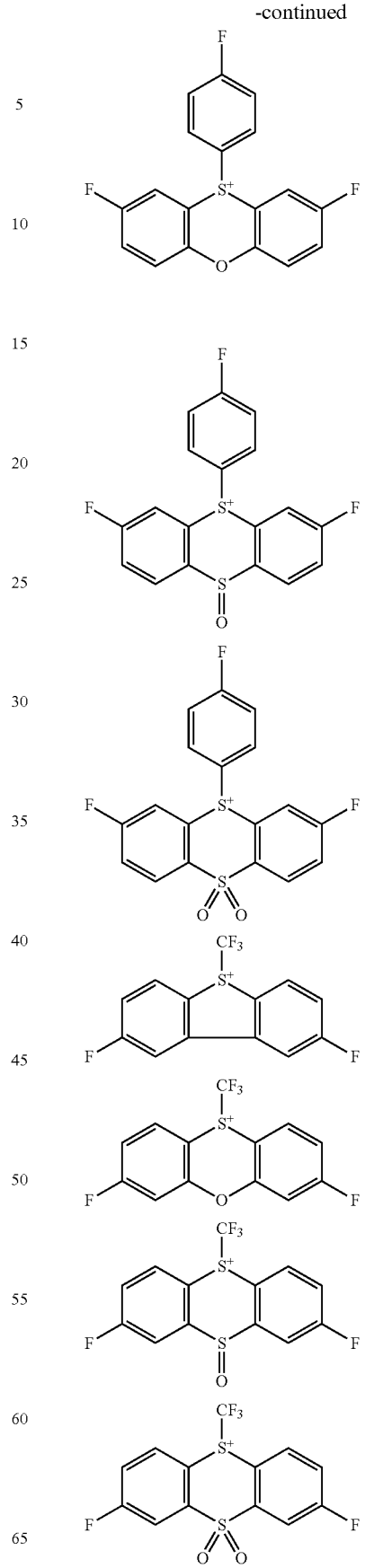

89
-continued
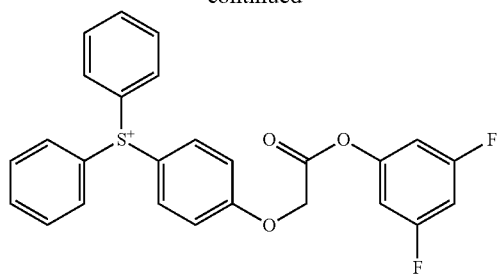
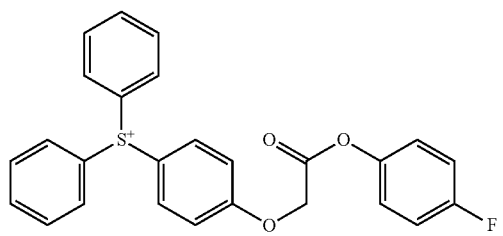
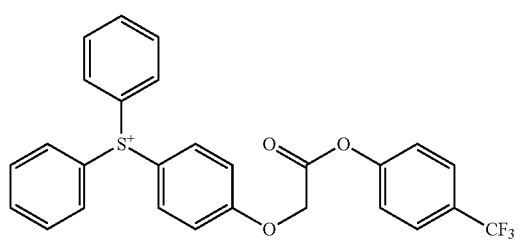
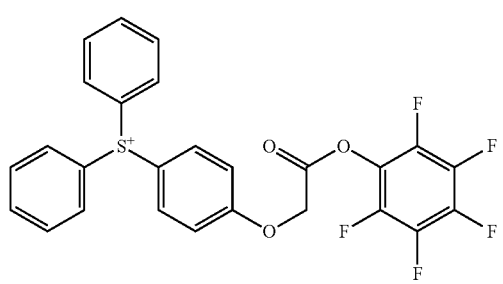
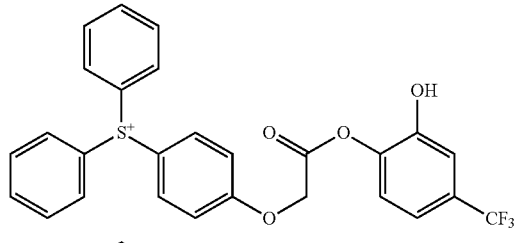
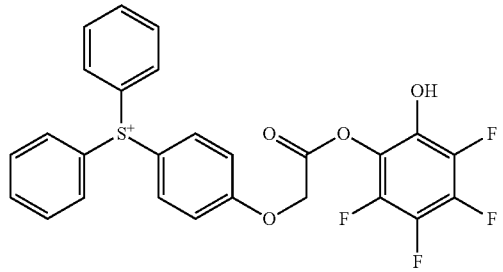
90
-continued
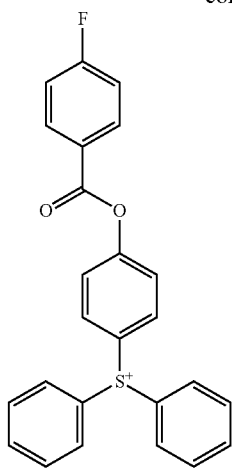
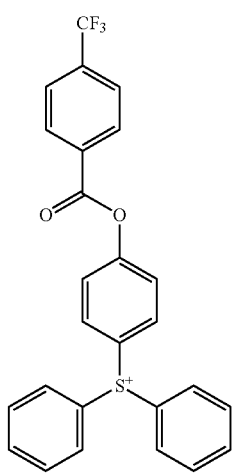 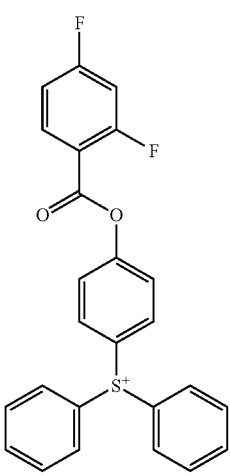
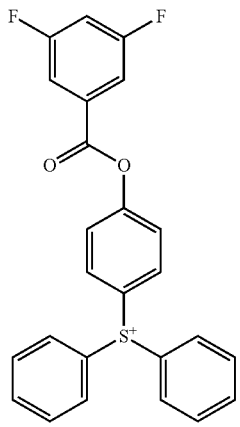

91
-continued
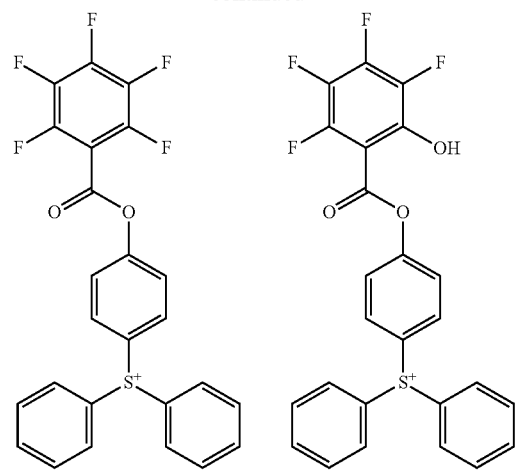
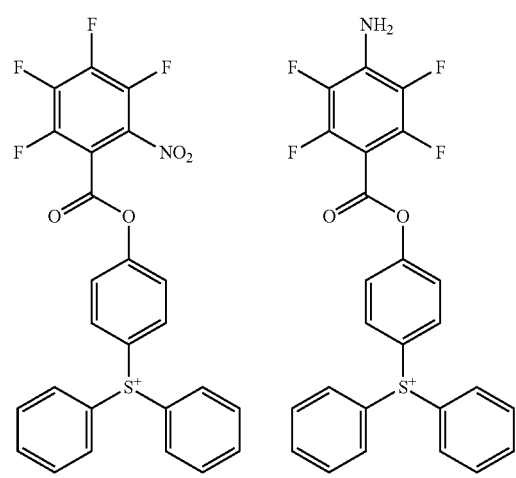
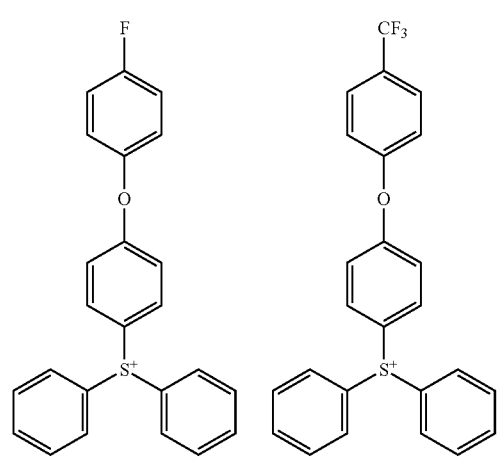
92
-continued
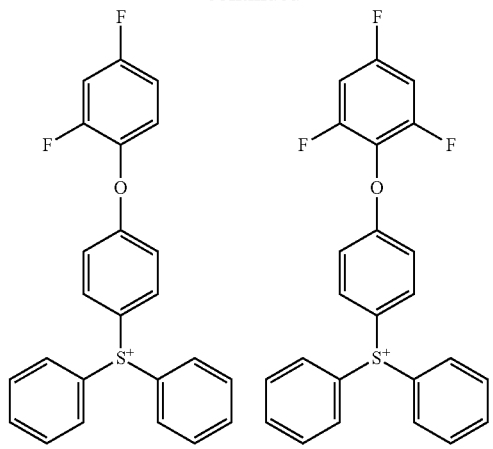
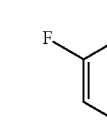
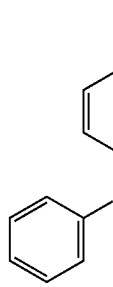
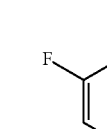
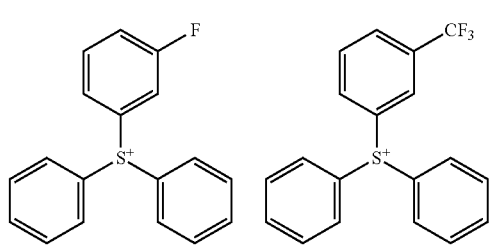

-continued
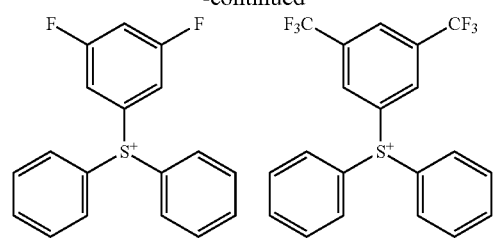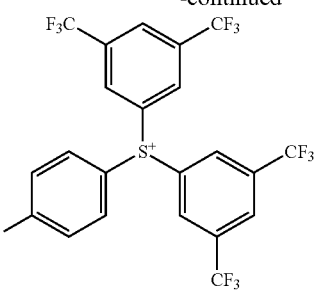
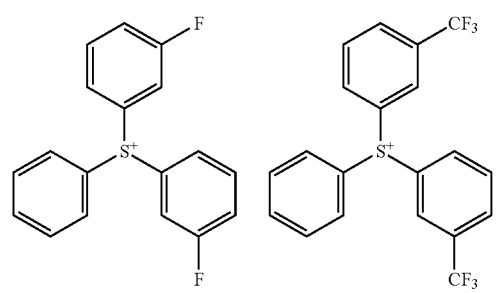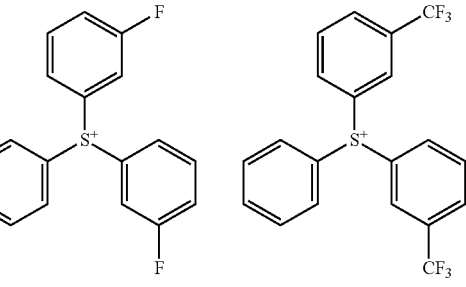
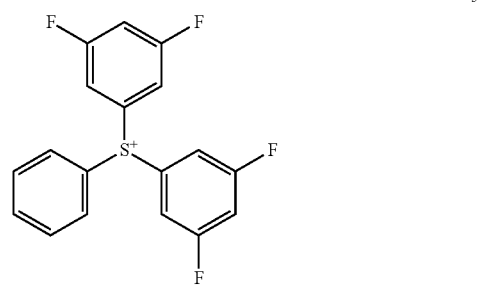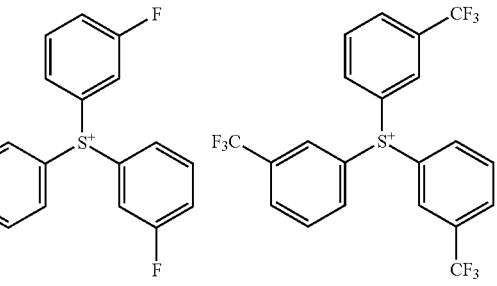
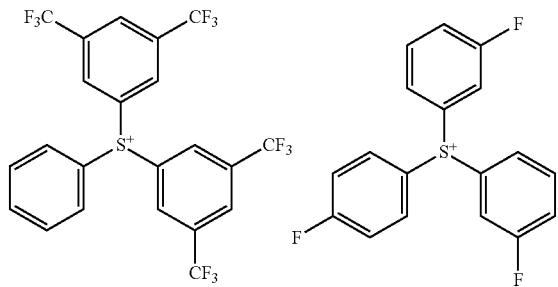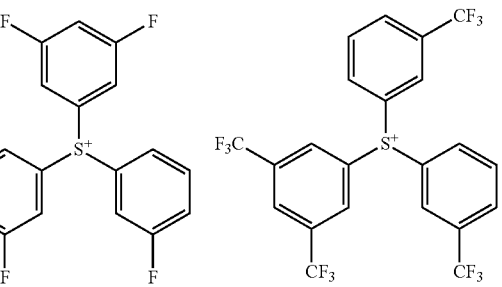
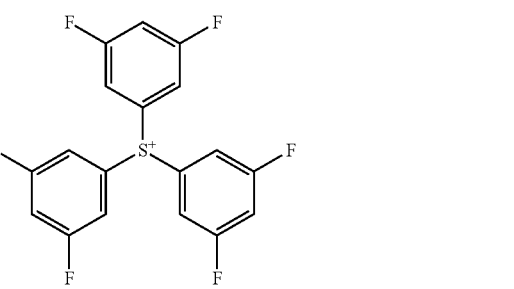
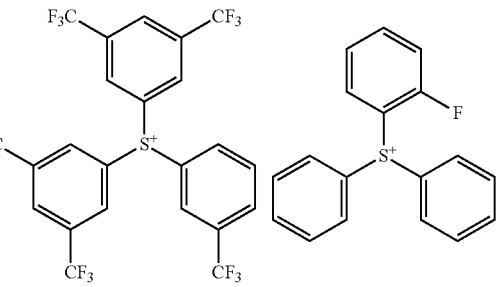

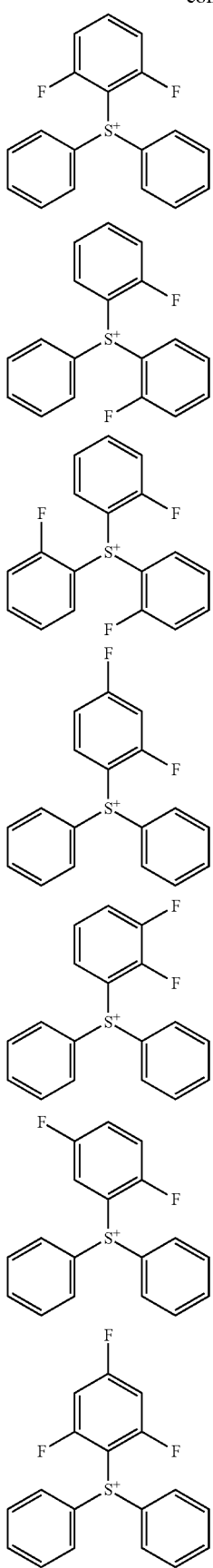
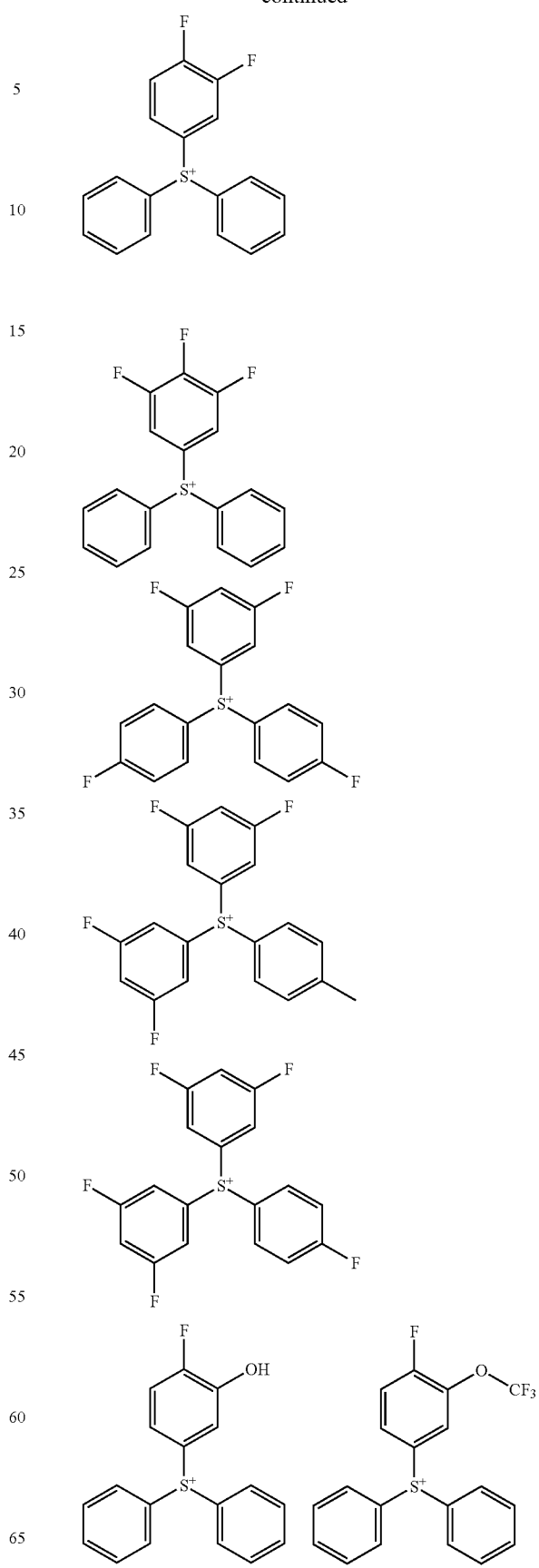

-continued
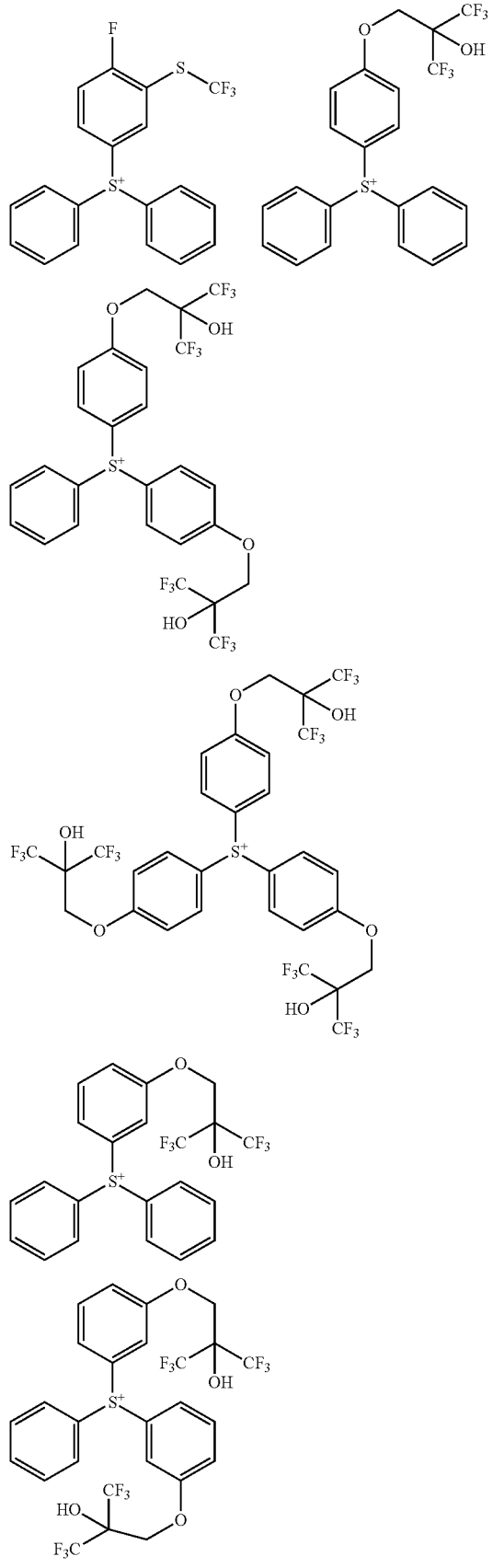
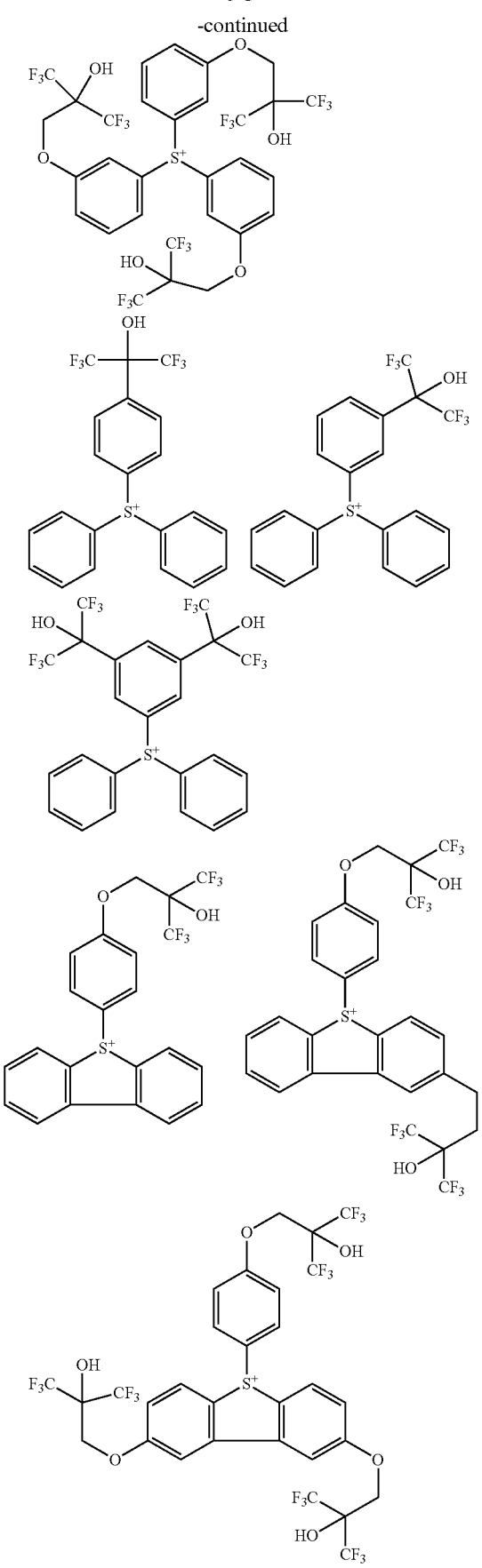

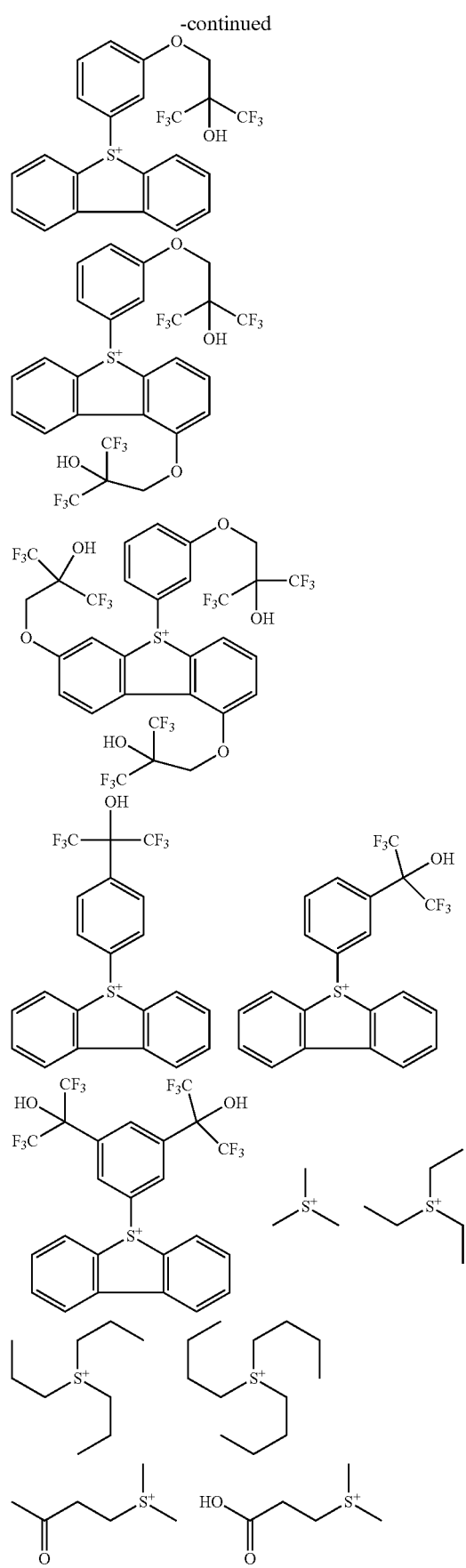
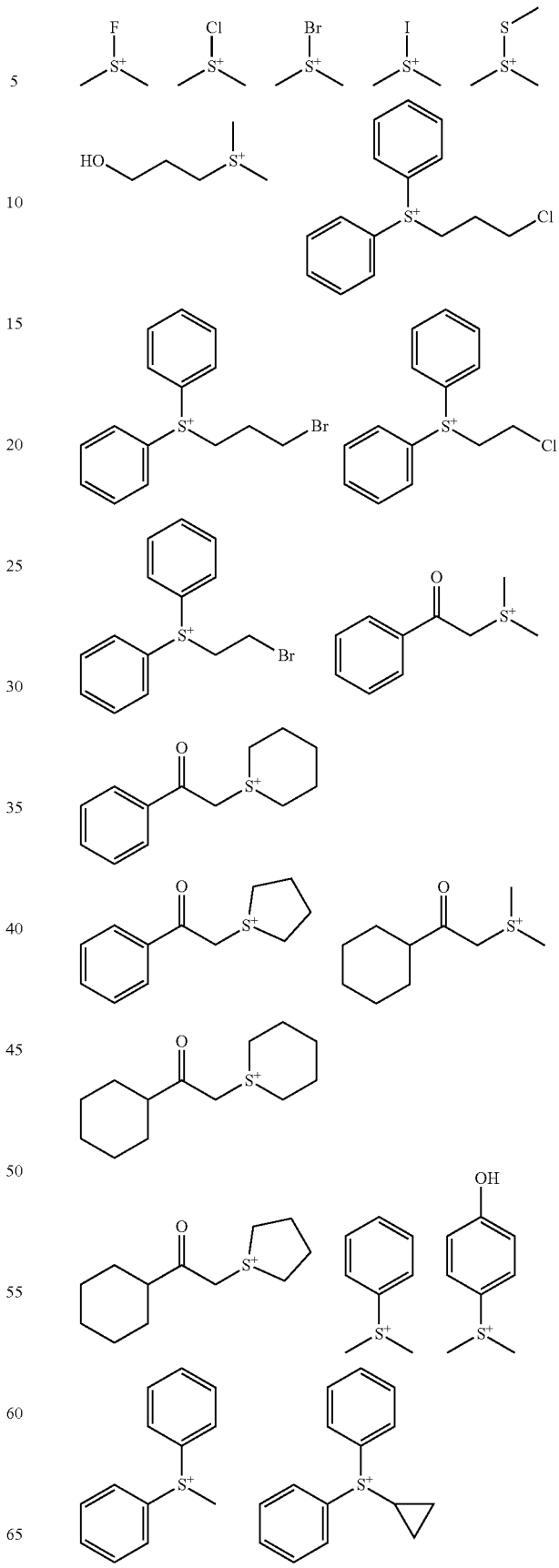

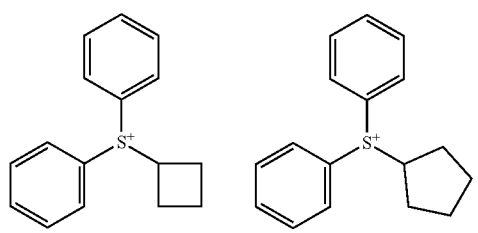
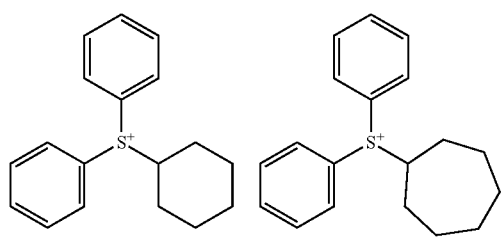
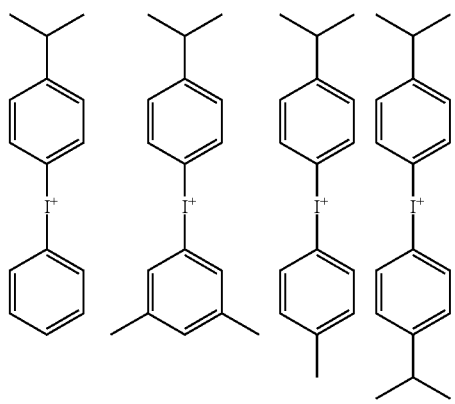
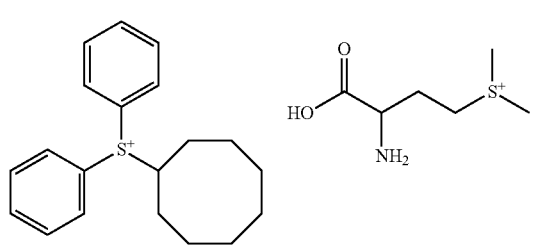
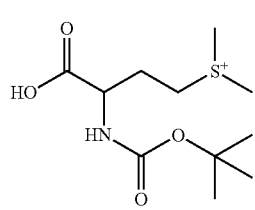
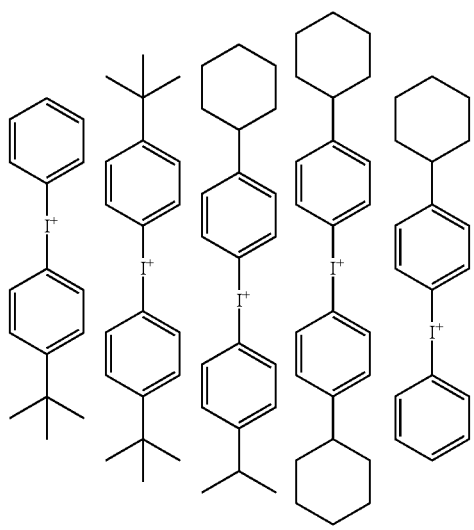
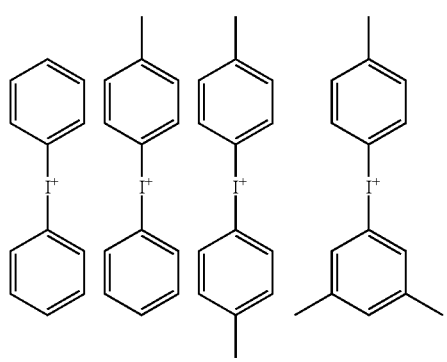
Examples of specific structures of the iodonium cations in the general formulae (A9) to (A11) include ones shown below, but are not limited thereto.
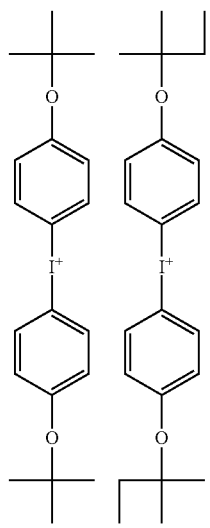

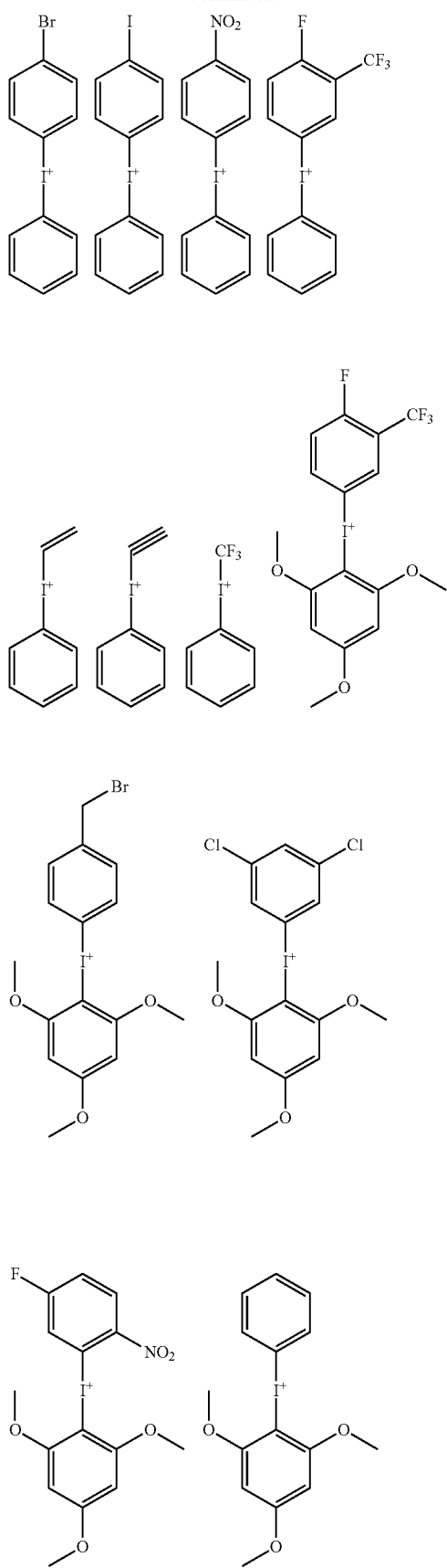
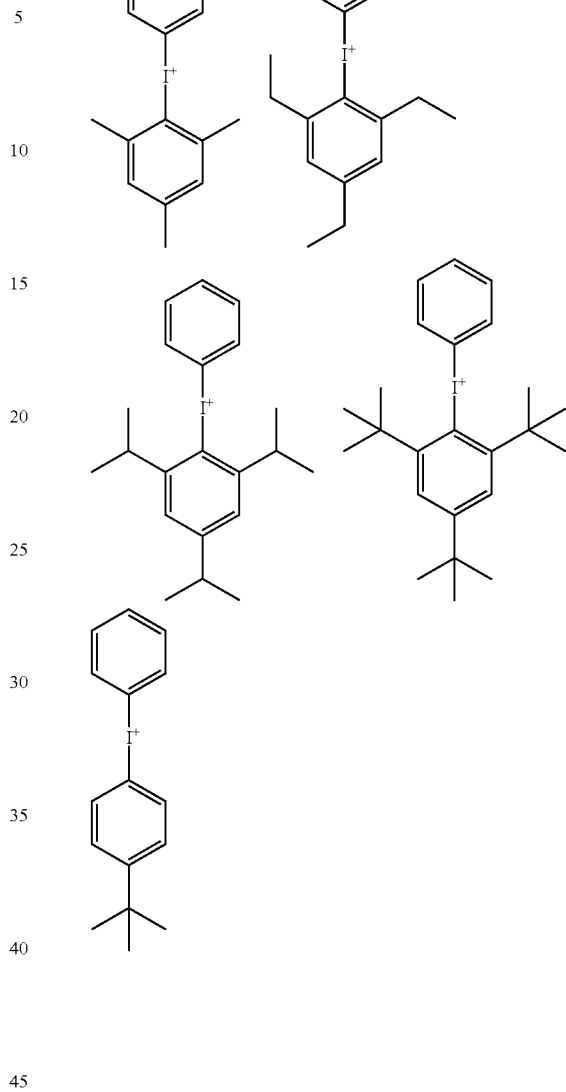

The repeating units A4 to A11 are units configured to generate an acid upon irradiation with high-energy beam. Presumably, incorporating these units into the polymer adequately suppresses acid diffusion, so that a pattern with reduced LER can be obtained. Moreover, incorporating these units into the polymer presumably exhibits effects such as: reducing LER by suppressing a phenomenon in which an acid evaporated from the exposed portion during baking in vacuum re-adheres to an unexposed portion; for negative type, suppressing undesirable reaction for negative resist formation in an unexposed portion, thereby reducing defect, etc.; and for positive type, reducing profile deterioration due to film reduction, etc. The content of the repeating units A4 to A11 is preferably 0.1 to 30 mol %, more preferably 0.5 to 20 mol %, relative to all the repeating units constituting the polymer compound.

<Repeating Units A12 to A14>

The polymer compound of the component (A) may contain at least one selected from repeating units A12 to A14 shown by the following general formulae (A12) to (A14) so as to enhance the etching resistance.

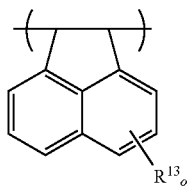

(A12)

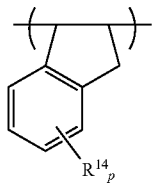

(A13)

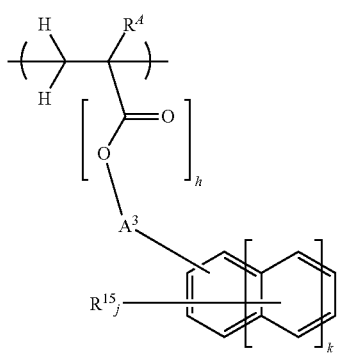

(A14)

In the formulae, $R^A$ represents a hydrogen atom, a fluorine atom, a methyl group, or a trifluoromethyl group. $R^{13}$ and $R^{14}$ each independently represent a hydroxy group, a halogen atom, an acetoxy group, a linear, branched, or cyclic acyloxy group having 2 to 8 carbon atoms optionally substituted with a halogen atom, a linear, branched, or cyclic alkyl group having 1 to 8 carbon atoms optionally substituted with a halogen atom, a linear, branched, or cyclic alkoxy group having 1 to 8 carbon atoms optionally substituted with a halogen atom, or a linear, branched, or cyclic alkylcarbonyloxy group having 2 to 8 carbon atoms optionally substituted with a halogen atom. $R^{15}$ represents an acetyl group, an acetoxy group, a linear, branched, or cyclic alkyl group having 1 to 20 carbon atoms, a linear, branched, or cyclic alkoxy group having 1 to 20 carbon atoms, a linear, branched, or cyclic acyloxy group having 2 to 20 carbon atoms, a linear, branched, or cyclic alkoxyalkyl group having 2 to 20 carbon atoms, an alkylthioalkyl group having 2 to 20 carbon atoms, a halogen atom, a nitro group, a cyano group, a sulfinyl group, or a sulfonyl group. $A^3$ represents a single bond, or a linear, branched, or cyclic alkylene group having 1 to 10 carbon atoms, and optionally has an ether bond in a carbon-carbon bond. "o" and "p" each independently represent an integer of 0 to 4. "h" represents an integer of 0 or 1. "j" represents an integer of 0 to 5. "k" represents an integer of 0 to 2.

Examples of the alkylene group represented by $A^3$ include a methylene group, an ethylene group, a propylene group, a butylene group, a pentylene group, a hexylene group, structural isomers each with a carbon skeleton having a branched or cyclic structure, etc. When the alkylene group contains an ether bond and "h" in the general formula (A14) is 1, the ether bond may be located at any position except for the positions between the α-carbon and β-carbon with respect to the ester oxygen. Meanwhile, when "h" is 0, the atom bonded to the main chain may be substituted with an ether oxygen, and a second ether bond may be formed at any position except for the positions between the α-carbon and β-carbon with respect to the ether oxygen bonded to the main chain. Note that the alkylene group preferably has 10 or fewer carbon atoms because sufficient solubility to an alkaline developer can be obtained.

As to $R^{15}$, preferable examples of the halogen atom include chlorine, bromine, and iodine atoms. Preferable examples of the alkyl group include a methyl group, an ethyl group, a propyl group, a butyl group, a pentyl group, a hexyl group, structural isomers thereof, a cyclopentyl group, and a cyclohexyl group. Preferable examples of the alkoxy group include a methoxy group, an ethoxy group, a propoxy group, a butoxy group, a pentyloxy group, a hexyloxy group, structural isomers of carbohydrate moieties thereof, a cyclopentyloxy group, a cyclohexyloxy group, etc. Among these, a methoxy group and an ethoxy group are particularly useful. The acyloxy group can be readily introduced by a chemical modification method after the polymerization of the polymer, too, and can be advantageously used to slightly adjust solubility of the base polymer in an alkaline developer. Examples of the acyloxy group include a methylcarbonyloxy group, an ethylcarbonyloxy group, propylcarbonyloxy group, a butylcarbonyloxy group, pentylcarbonyloxy group, a hexylcarbonyloxy group, structural isomers thereof, a cyclopentylcarbonyloxy group, a cyclohexylcarbonyloxy group, a benzoyloxy group, etc. The acyloxy group having 20 or fewer carbon atoms will optimize the effects of controlling and adjusting (mainly lowering) the solubility of the base resin in an alkaline developer, and can suppress scum (development defect). Meanwhile, among the above preferable substituents, substituents usefully employable and particularly readily prepared as the monomer are a chlorine atom, a bromine atom, an iodine atom, a methyl group, an ethyl group, and a methoxy group.

In the general formula (A14), "k" is an integer of 0 to 2. When "k" is 0, it indicates a benzene skeleton; when "k" is 1, it indicates a naphthalene skeleton; and when "k" is 2, it indicates an anthracene skeleton. When "k" is 0, "j" is preferably an integer of 0 to 3; and when "k" is 1 or 2, "j" is preferably an integer of 0 to 4.

When "h" is 0 and $A^3$ is a single bond, that is, when the aromatic ring is directly bonded to the main chain of the polymer compound, this means there is no linker. Preferable examples of the repeating unit A14 in this case include units derived from styrene, 4-chlorostyrene, 4-methylstyrene, 4-methoxystyrene, 4-bromostyrene, 4-acetoxystyrene, 2-hydroxypropylstyrene, 2-vinylnaphthalene, 3-vinylnaphthalene, etc.

Meanwhile, when "h" is 1, this means an ester skeleton is present as a linker. Preferable examples of the repeating unit A14 in this case include ones shown below, but are not limited thereto.

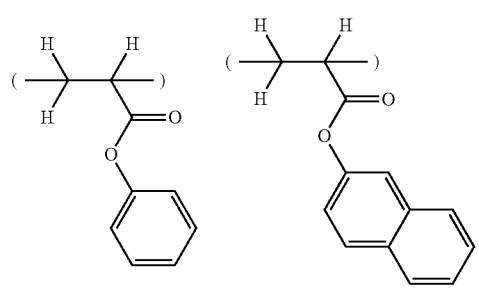

107
-continued
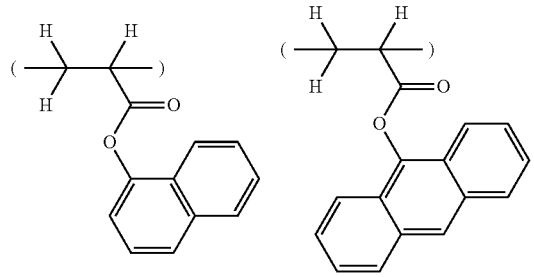
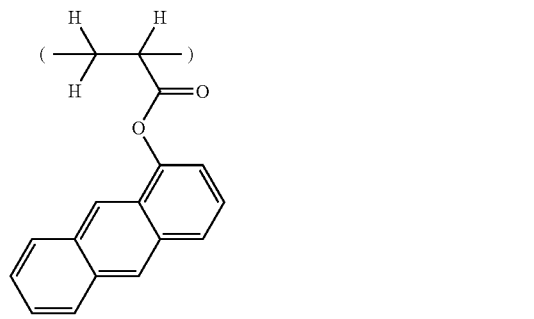
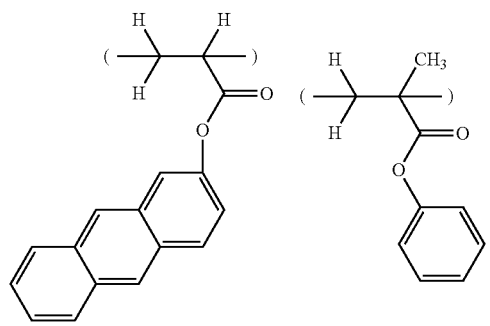
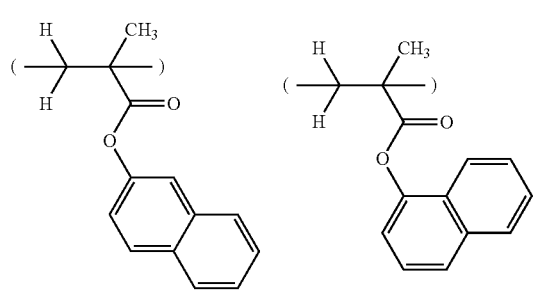
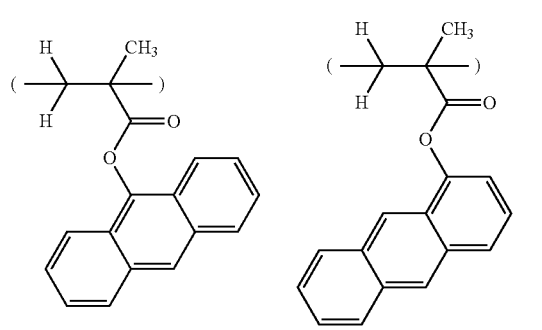
108
-continued
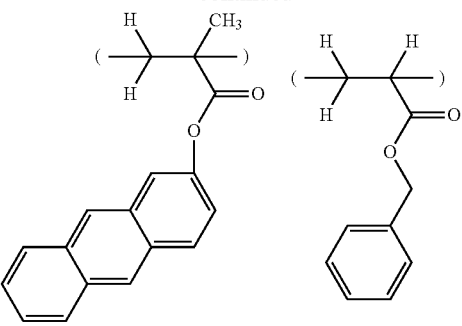
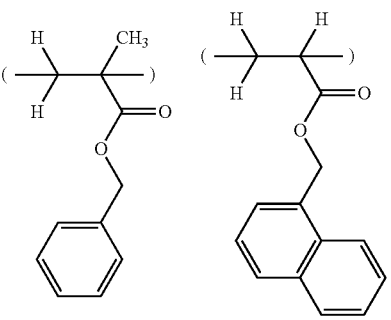
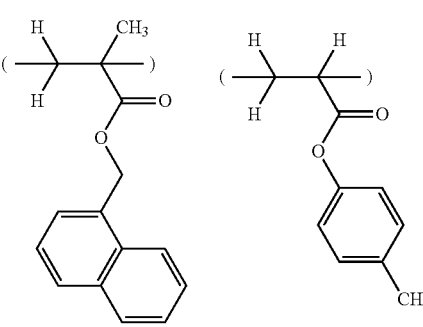
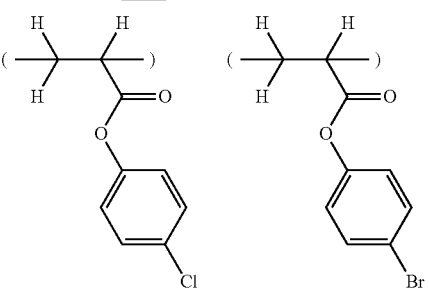

-continued

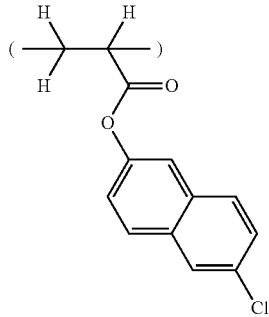
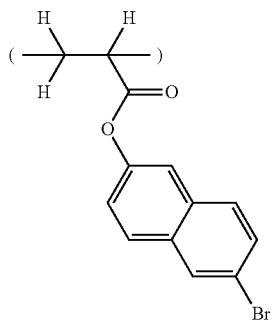
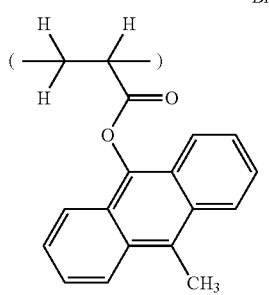
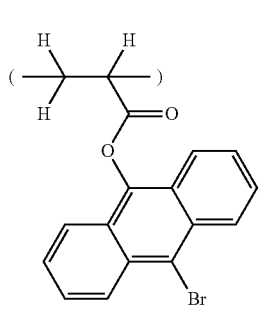
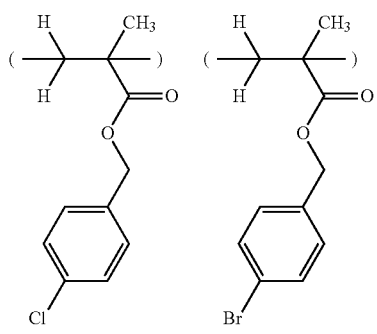

-continued

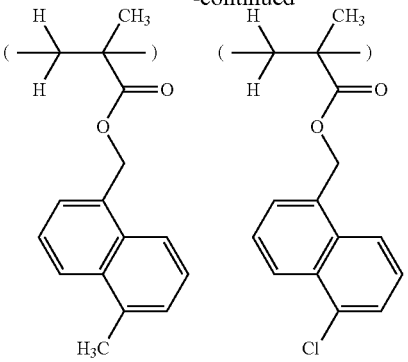
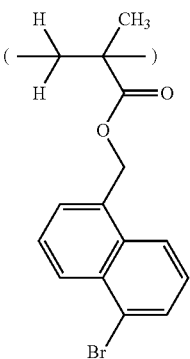

When at least one of the repeating units A12 to A14 is used as a constituent unit, the effect of enhancing the resistance to electron beam irradiation in etching and pattern inspection is obtained by the cyclic structure added to the main chain, in addition to the etching resistance by the aromatic ring.

One or two or more of the repeating units A12 to A14 may be used singly or in combination. To obtain the effect of enhancing the etching resistance, the lower limit of the content of the repeating units A12 to A14 is preferably 2 mol %, more preferably 5 mol %, relative to all the repeating units constituting the polymer compound of the component (A); and the upper limit thereof is preferably 35 mol %, more preferably 20 mol %.

<(Meth)Acrylic Acid Ester Repeating Unit Having Adhesive Group>

The polymer compound of the component (A) may contain a (meth)acrylic acid ester repeating unit having an adhesive group, such as a lactone structure or a hydroxy group other than a phenolic hydroxy group, and other repeating units so as to slightly adjust the properties of the resist film. Examples of the (meth)acrylic acid ester repeating unit having an adhesive group include units shown by the following formulae (b1) to (b3).

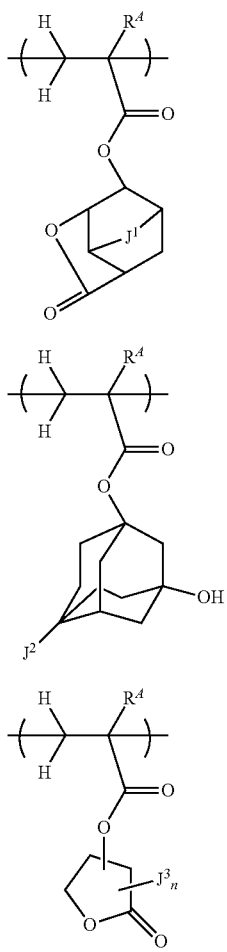

(b1)

(b2)

(b3)

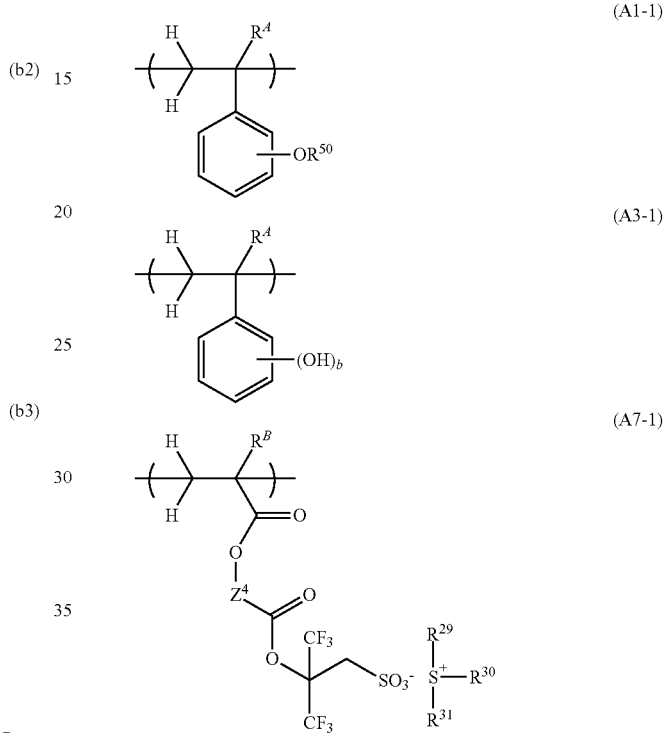

(A1-1)

(A3-1)

(A7-1)

repeating units A4 to A11 is preferably 0.5 to 20 mol %, more preferably 1 to 10 mol %. Note that another repeating unit(s) may be incorporated in an amount of 0 to 30 mol %, preferably 0 to 20 mol %.

When a positive-type resist is constructed, the polymer compound of the component (A) preferably contains a repeating unit shown by the following general formula (A1-1), a repeating unit shown by the following general formula (A3-1), and a repeating unit shown by the following general formula (A7-1).

In the formulae, $R^A$, $R^B$, $Z^4$, $R^{29}$, $R^{30}$, $R^{31}$, and "b" are as defined above. $R^{50}$ represents an acid-labile group.

Moreover, when a positive-type resist is constructed, the polymer compound of the component (A) is preferably such that the component (A) is a polymer compound containing the repeating unit A1 shown by the general formula (A1) and the repeating unit A3 shown by the general formula (A3), but not containing the repeating units A4 to A11 shown by the general formulae (A4) to (A11).

Meanwhile, when a negative-type resist is constructed, the polymer compound of the component (A) preferably contains a repeating unit shown by the following general formula (A2-1) or (A2-2), a repeating unit shown by the following general formula (A3-1), and a repeating unit shown by the following general formula (A5-1).

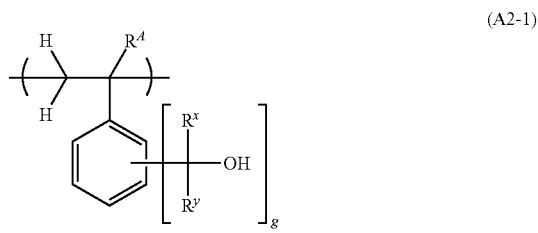

(A2-1)

In the formulae, $R^A$ is as defined above. $J^1$ represents —O— or a methylene group. J2 represents a hydrogen atom or a hydroxy group. J3 represents a linear, branched, or cyclic alkyl group having 1 to 4 carbon atoms. "n" represents an integer of 0 to 3.

These units can be used supplementarily as a unit to impart adhesiveness on a substrate or a unit to adjust solubility without showing acidity.

In the case where the polymer compound of the component (A) does not contain the repeating units A4 to A11, the content of the repeating unit A3 in the polymer compound is preferably 25 to 95 mol %, more preferably 40 to 85 mol %. The content of the repeating units A12 to A14 is preferably 0 to 30 mol %, more preferably 3 to 20 mol %. The content of the repeating unit A1 or A2 is preferably 5 to 70 mol %, more preferably 5 to 60 mol %. Note that another repeating unit(s) may be incorporated in an amount of 0 to 30 mol %, preferably 0 to 20 mol %.

In the case where the polymer compound of the component (A) contains the repeating units A4 to A11, the content of the repeating unit A3 in the polymer compound is preferably 25 to 94.5 mol %, more preferably 36 to 85 mol %. The content of the repeating units A12 to A14 is preferably 0 to 30 mol %, more preferably 3 to 20 mol %. The content of the repeating unit A1 or A2 is preferably 5 to 70 mol %, more preferably 5 to 60 mol %. The total content of the repeating unit A1 or A2 and the repeating units A12, A13, A14 is preferably 60 to 99.5 mol %. The content of the (A2-2)

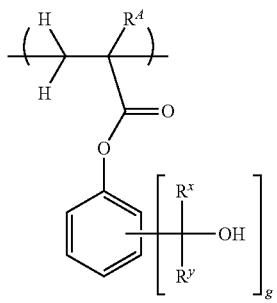

(A3-1)

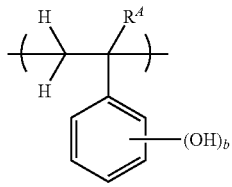

(A5-1)

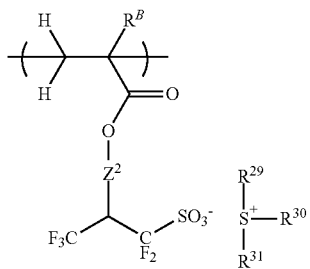

In the formulae, $R^A$, $R^B$, $Z^2$, $R^{23}$, $R^{24}$, $R^{25}$, Rx, Ry, "b", and "g" are as defined above.

Moreover, when a negative-type resist is constructed, the polymer compound of the component (A) is preferably a polymer compound containing the repeating unit A2 shown by the general formula (A2) and the repeating unit A3 shown by the general formula (A3), but not containing the repeating units A4 to A11 shown by the general formulae (A4) to (A11).

The polymer compound of the component (A) may be a combination of a polymer compound containing no repeating units A4 to A11 with a polymer compound containing the repeating units A4 to A11. In this case, the polymer containing no repeating units A4 to A11 is blended in an amount of preferably 2 to 5,000 parts by mass, more preferably 10 to 1,000 parts by mass, relative to 100 parts by mass of the polymer containing the repeating units A4 to A11.

Further, when the polymer compound of the component (A) used in the present invention is a polymer from two or more kinds of polymerizable monomers, a total of preferably 5000 ppm or less, more preferably 3000 ppm or less, of residual oligomers in a form of dimer to hexamer are contained in all the polymerizable monomers to be used. Oligomers to be controlled are particularly preferably dimer to tetramer. When the amount of the residual oligomers of dimer to hexamer incorporated in all the polymerizable monomers is not more than 5000 ppm, this makes it possible to more reliably prevent development-residue defect and decrease in yield that is important in semiconductor manufacturing processes.

The repeating units A1 to A14 accounts for preferably 70 mol % or more, more preferably 80 mol % or more, of all the repeating units constituting the polymer compound of the component (A). Thereby, the properties required as the inventive chemically amplified resist composition particularly used to prepare a photomask substrate are reliably obtained.

When the positive resist composition is used for photomask preparation, the coating film thickness for the most-advanced generation may be 150 nm or less, preferably 100 nm or less. As a design of the base polymer constituting the positive resist composition, the dissolution rate in an alkaline developer may be 8 nm/min or less, preferably 6 nm/min or less, further preferably 5 nm/min or less. In a case where the coating film is formed in a thin film region (100 nm or less) on a substrate for the advanced generation, the influence of pattern film reduction in alkaline development is large; if the alkali dissolution rate of the polymer is more than 8 nm/min, the pattern collapses and no fine pattern can be formed. Particularly, in photomask preparation allowing no defect, development process tends to be intense and such problems are noticeable. Note that, in the present invention, the "dissolution rate" of a base polymer in an alkaline developer refers to a value calculated from a film reduction amount when a silicon wafer with a diameter of 200 mm (8 inches) is spin-coated with a polymer solution and baked at 100° C. for 90 seconds, followed by development with a 2.38% TMAH aqueous solution for 100 seconds.

Meanwhile, when the negative resist composition is used for photomask preparation, the coating film thickness for the most-advanced generation may be 150 nm or less, preferably 100 nm or less. Generally, the development process is often intense so as to reduce defect due to resist residue; thus, the dissolution rate of the base polymer constituting the negative resist composition in an alkaline developer (2.38 mass % tetramethylammonium hydroxide (TMAH) aqueous solution) is preferably 80 nm/second or less, more preferably 50 nm/second or less, to thereby form a fine pattern. Moreover, for example, in LSI chip preparation from a wafer, when the inventive negative resist composition is used in EUV exposure process, the coating film thickness is set to 100 nm or less in many cases because a pattern of 50 nm or less needs to be formed. The pattern conceivably deteriorates by development due to such thin film. The dissolution rate of the polymer to be used is preferably 80 nm/second or less, more preferably 50 nm/second or less. Meanwhile, in KrF exposure process, the coating film thickness is often 200 nm or more, although depending on the purpose. The dissolution rate of the polymer used in this event is preferably designed to be 90 nm/second or more.

The polymer compound of the component (A) can be synthesized according to known methods by copolymerizing monomers protected with protective groups as necessary, followed by deprotection reaction as necessary. The copolymerization reaction is not particularly limited, but is preferably radical polymerization or anionic polymerization. These methods are elaborated in WO2006/121096 A1, JP2008-102383A, JP2008-304590A, and JP2004-115630A.

The polymer compound of the component (A) has a weight-average molecular weight (Mw) of preferably 1,000 to 50,000, further preferably 2,000 to 25,000. The Mw of 1,000 or more eliminates the risks that the head of a pattern becomes rounded to lower the resolution and degrade the LER, which have been known previously. Meanwhile, the Mw of 50,000 or less eliminates the risk of increasing the LER, particularly when a pattern with the pattern line width of 100 nm or less is formed. Incidentally, Mw in the present invention is a value measured by gel permeation chromatography (GPC) in terms of polystyrene.

The polymer compound of the component (A) preferably has a narrow molecular-weight distribution (Mw/Mn) of 1.0 to 2.5, particularly preferably 1.0 to 2.2. Such narrow dispersity prevents foreign matter on the pattern or pattern profile deterioration after development.

[(B) Acid Generator]

To function as a chemically amplified resist composition, the inventive chemically amplified resist composition may contain (B) an acid generator, particularly a photo-acid generator. The photo-acid generator is not particularly limited, as long as it is a compound that can generate an acid by high-energy beam irradiation. Examples of suitable photo-acid generator include sulfonium salt, iodonium salt, sulfonyldiazomethane, N-sulfonyl oxyimide, oxime-O-sulfonate type acid generators, etc. One of these can be used singly, or two or more thereof can be used in combination.

Specific examples of the photo-acid generator include nonafluorobutanesulfonate, partially fluorinated sulfonates disclosed in paragraphs [0247] to [0251] of JP2012-189977A, partially fluorinated sulfonates disclosed in paragraphs [0261] to [0265] of JP2013-101271A, ones disclosed in paragraphs [0122] to [0142] of JP2008-111103A and paragraphs [0080] to [0081] of JP2010-215608A, etc. Among these specific examples, aryl sulfonate type and alkane sulfonate type photo-acid generators are preferable since these generate an acid with acidity appropriate for deprotection of the acid-labile group in the repeating unit shown by the general formula (A1). Such photo-acid generators are preferably compounds having sulfonium anion with the following structures. Examples of cations paired therewith include those described as the specific examples of the sulfonium cations in the general formulae (A5) to (A7).

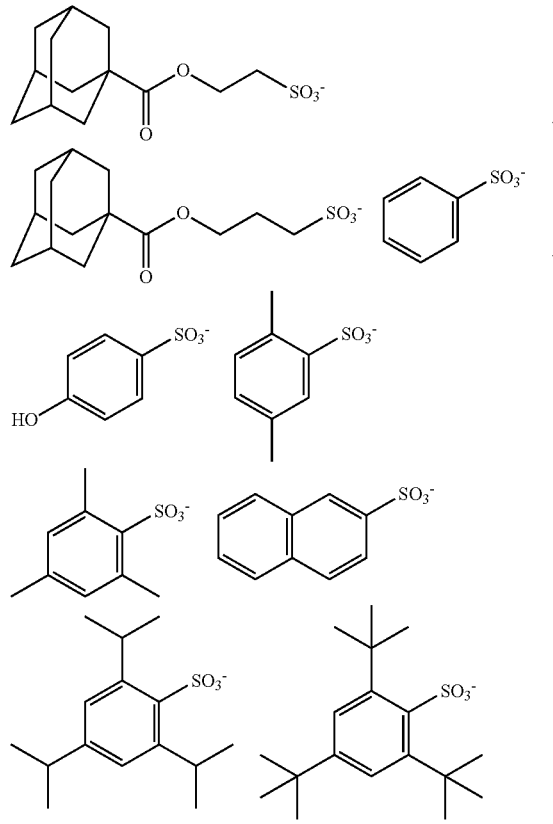

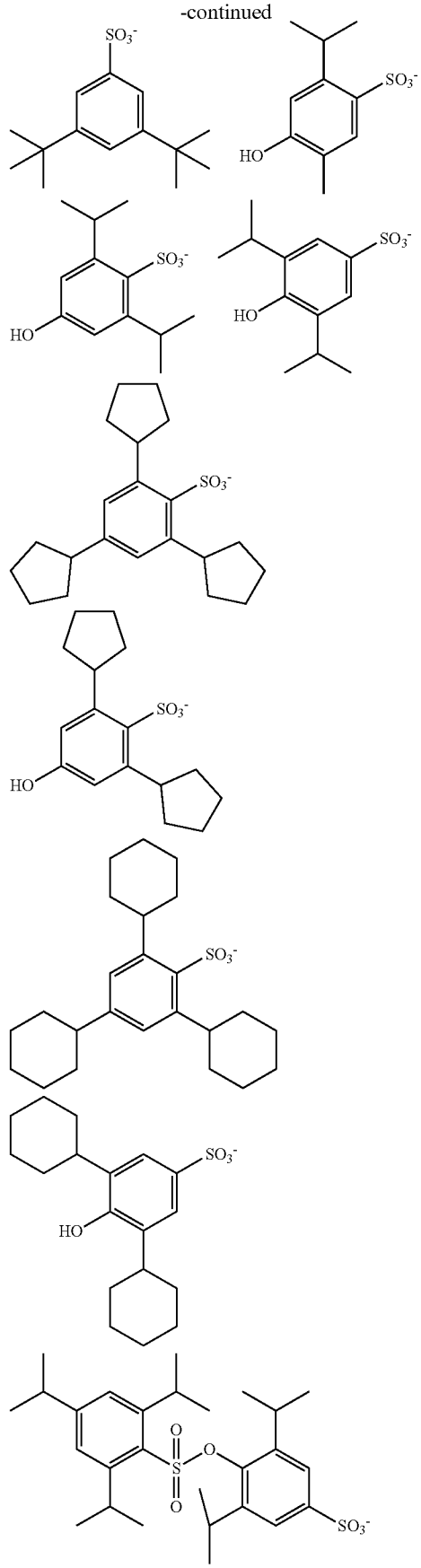

117
-continued
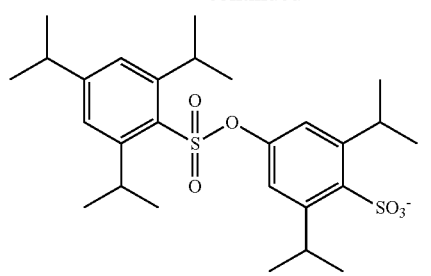
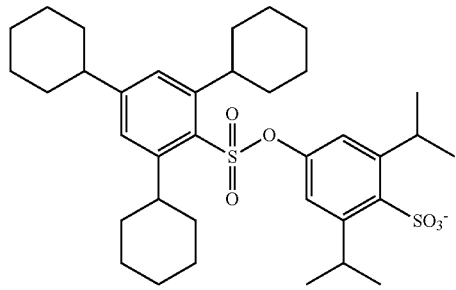
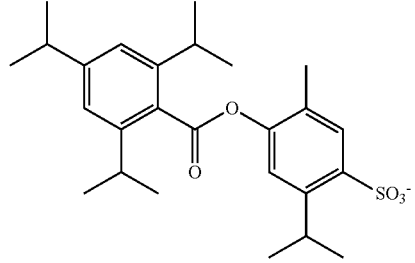
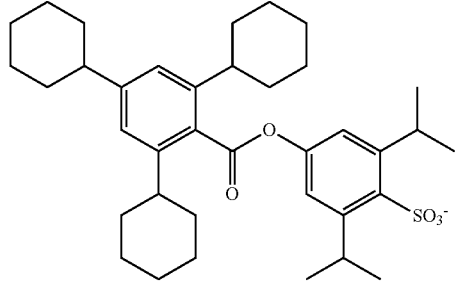
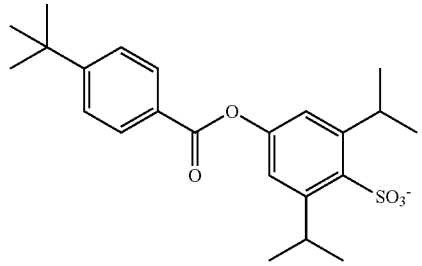
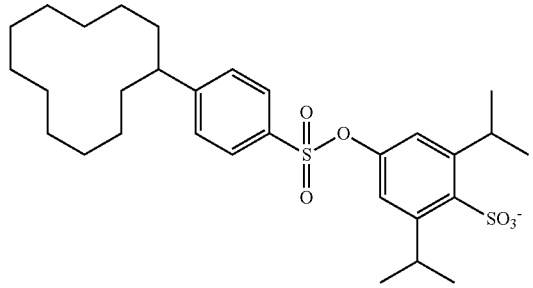
118
-continued
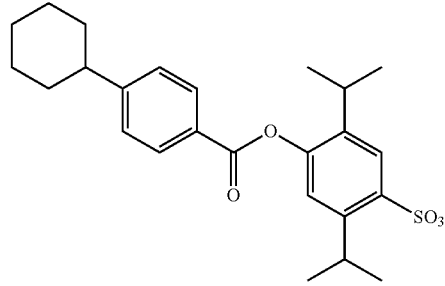
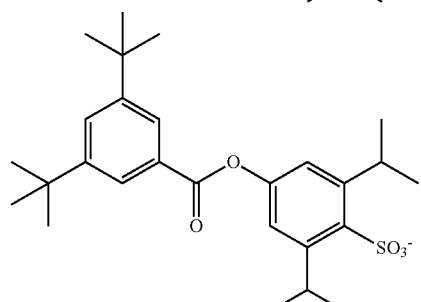
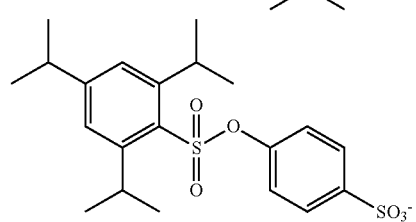
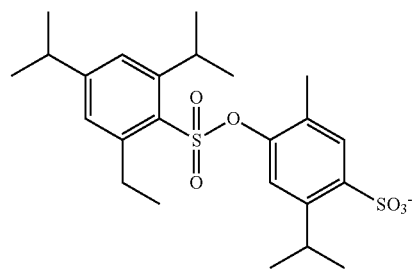
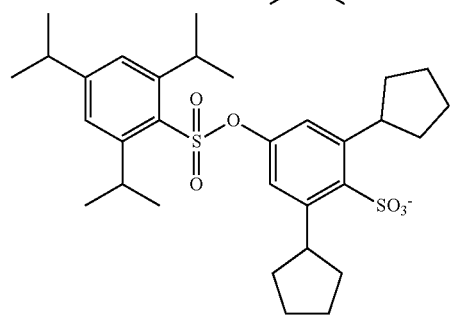
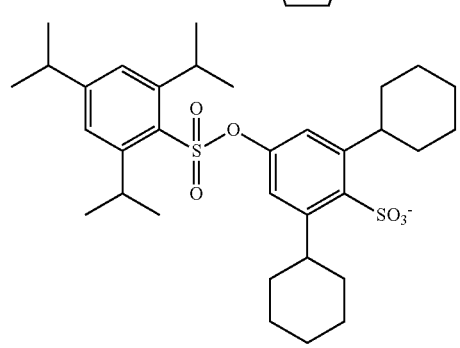

119
-continued
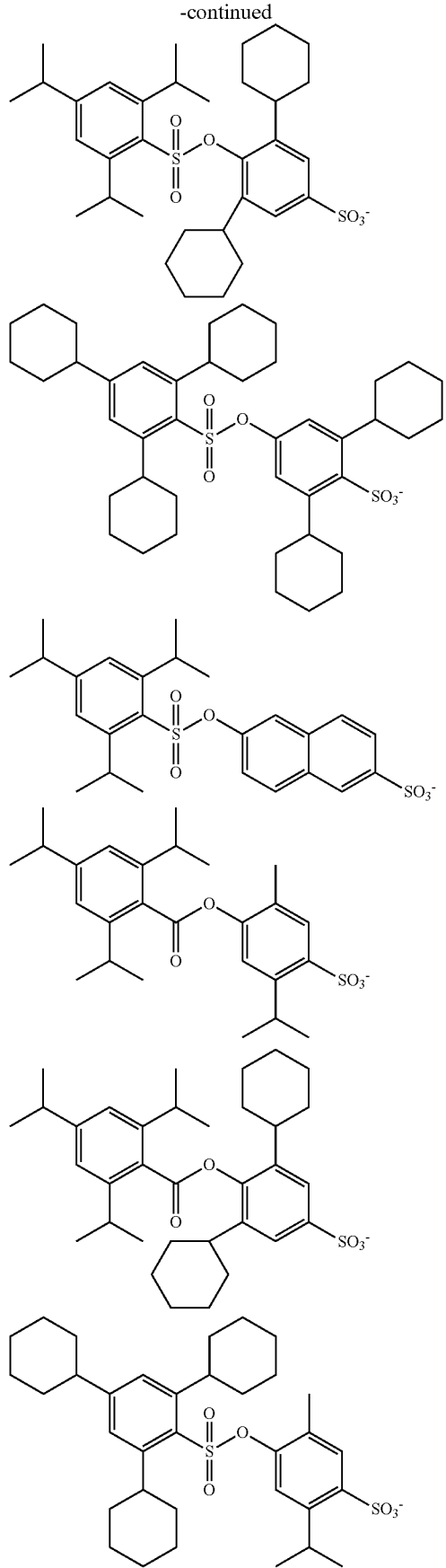
120
-continued
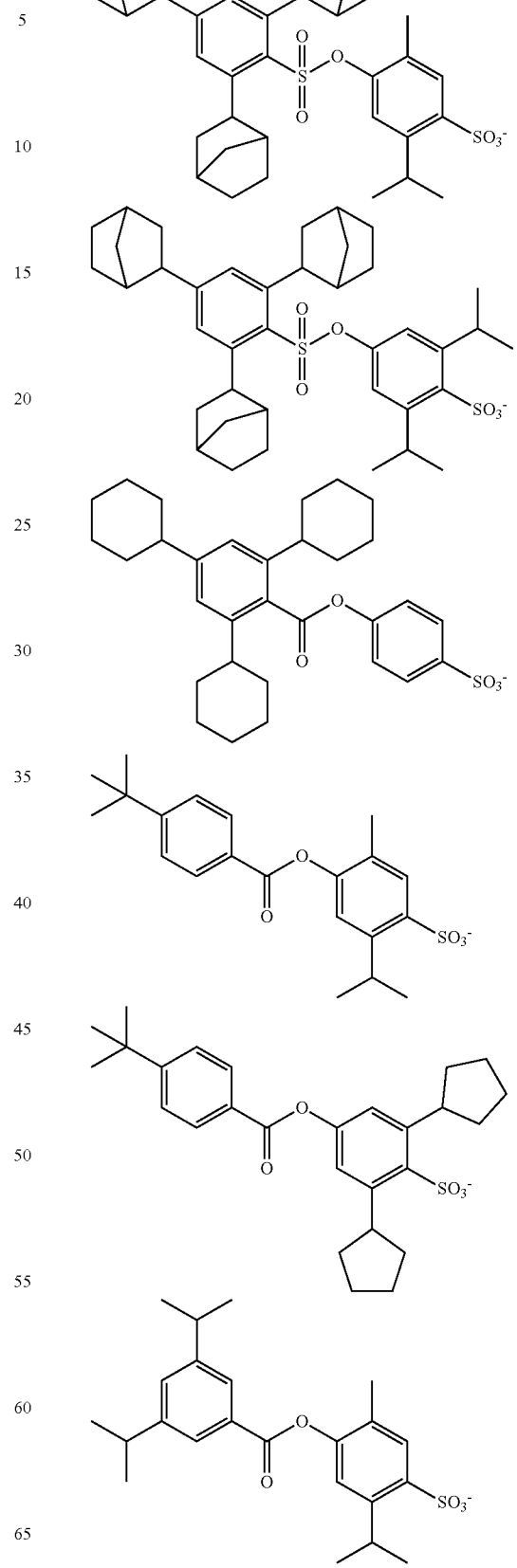

121
-continued
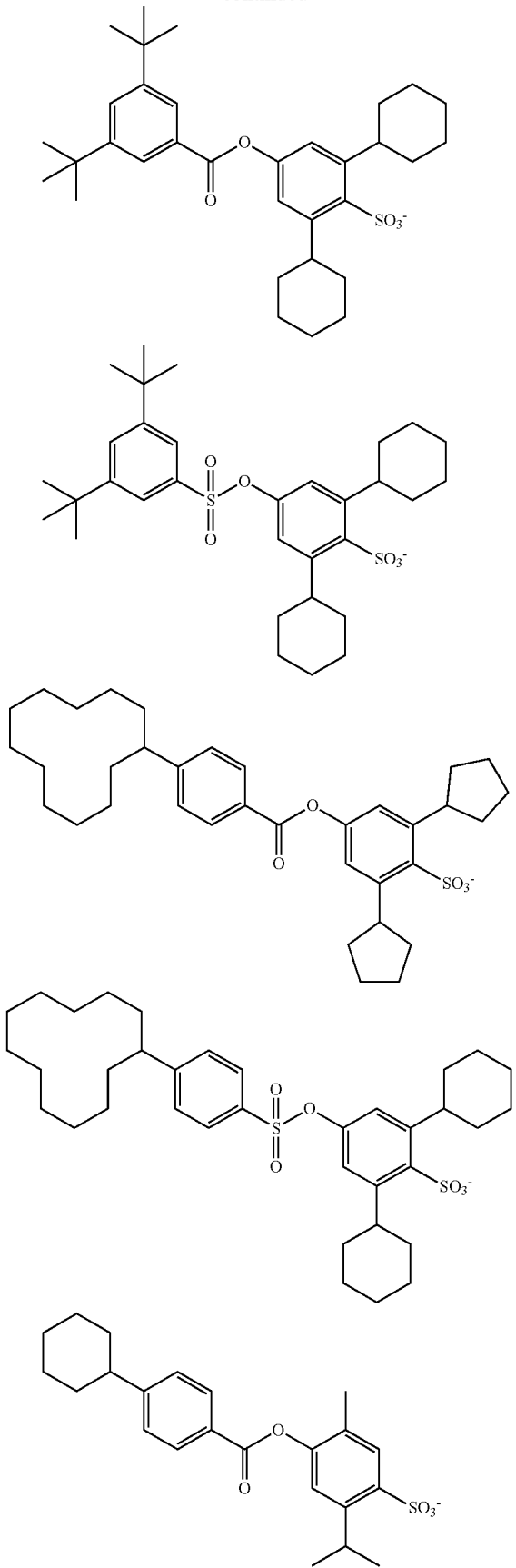
122
-continued
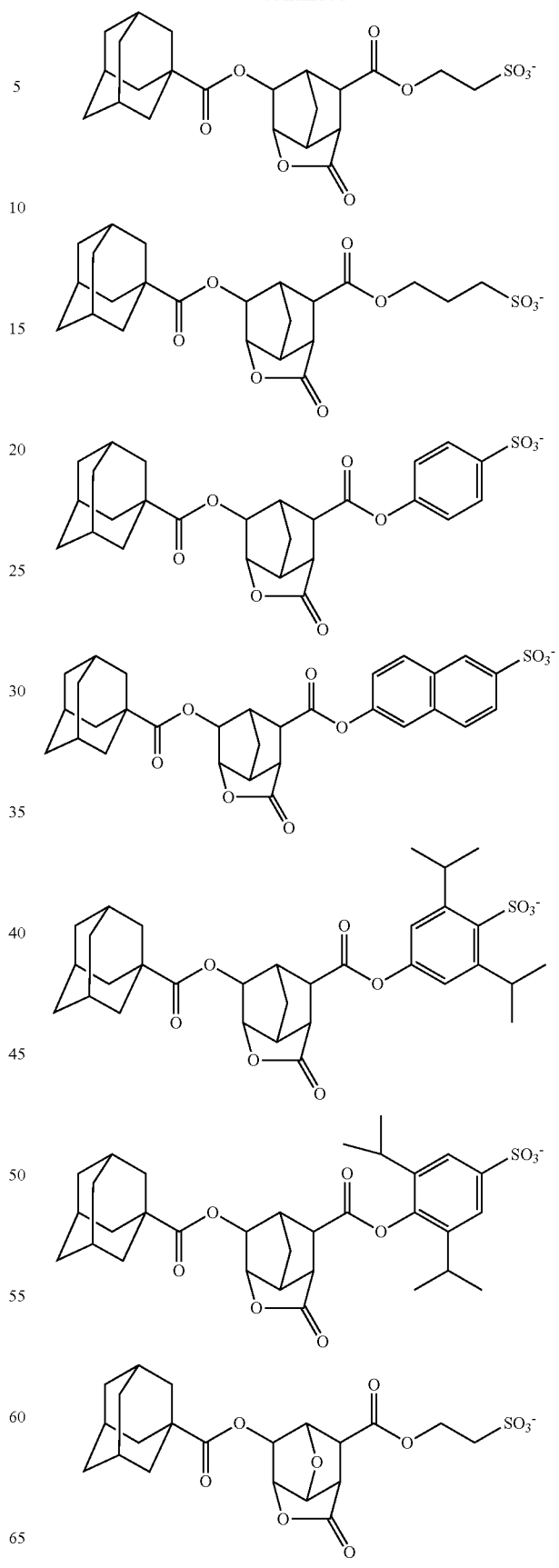

123
-continued
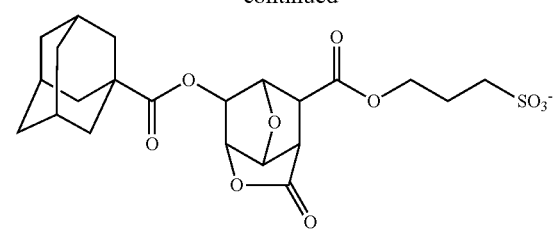
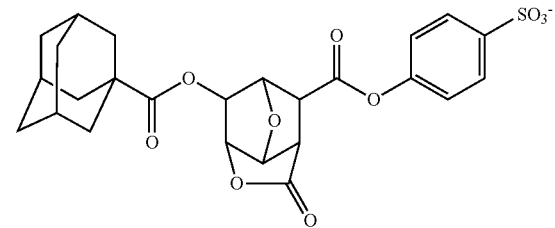
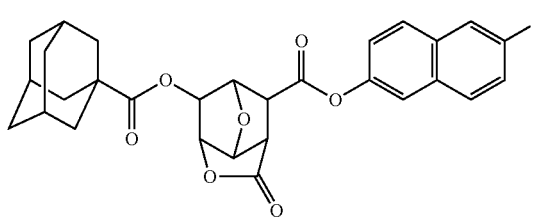
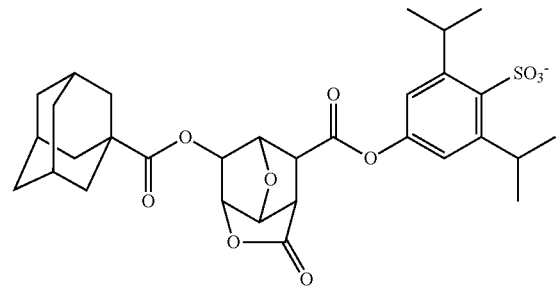
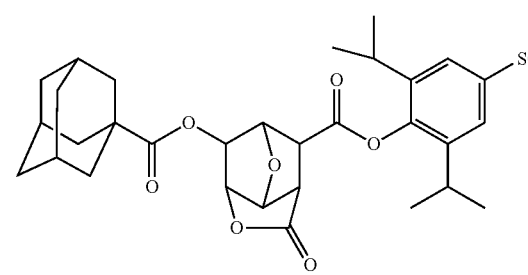
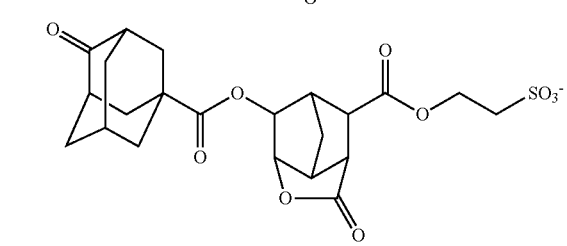
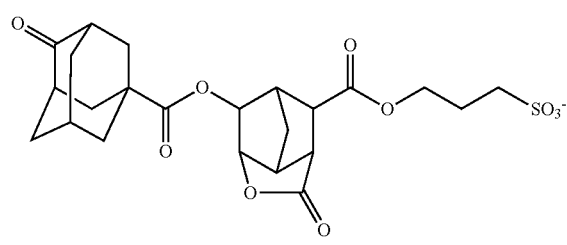
124
-continued
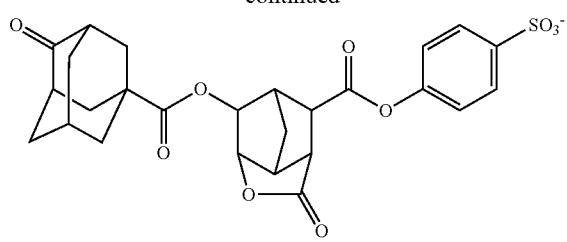
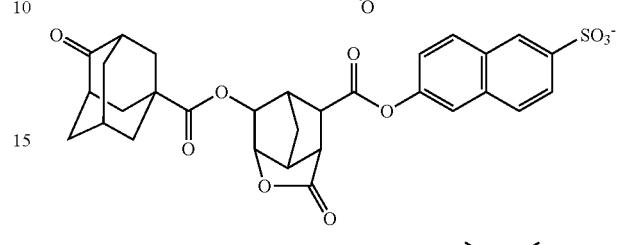
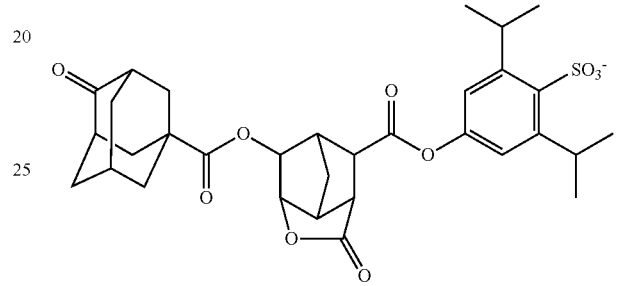
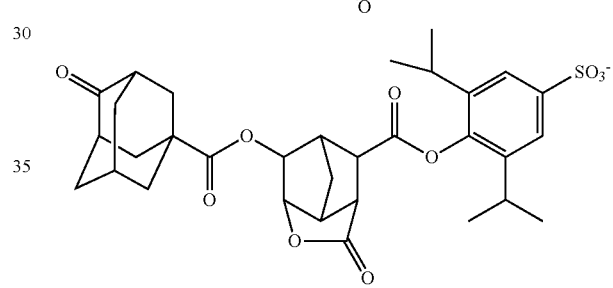
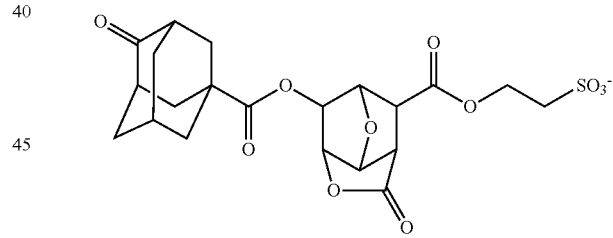
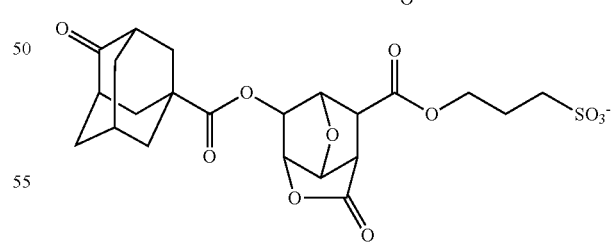
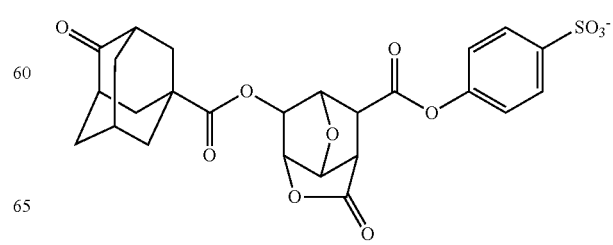

-continued

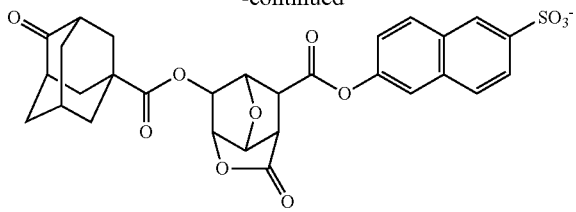
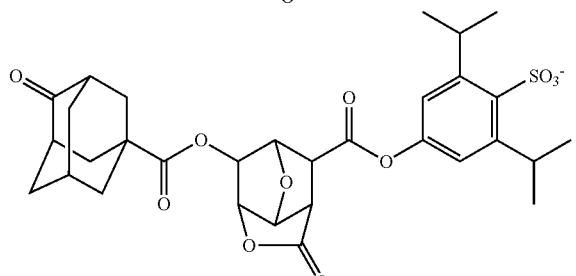
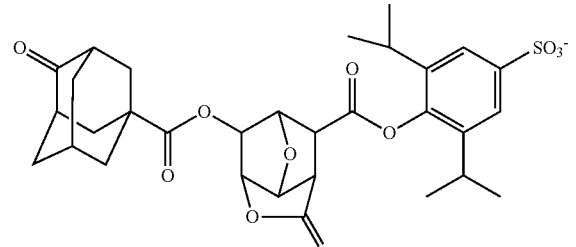
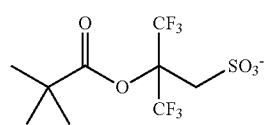
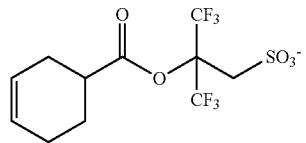
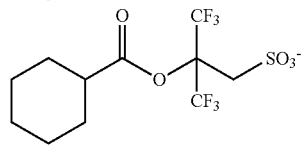
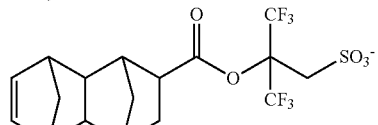
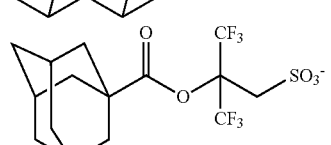
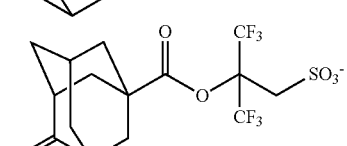
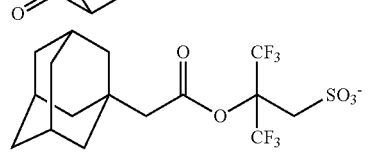

-continued

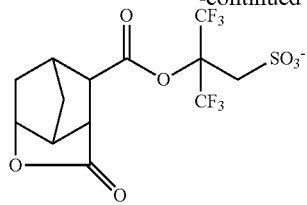
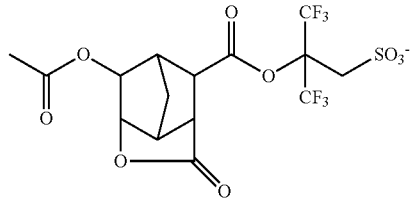
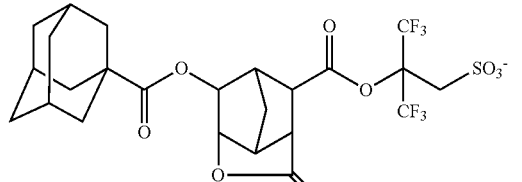
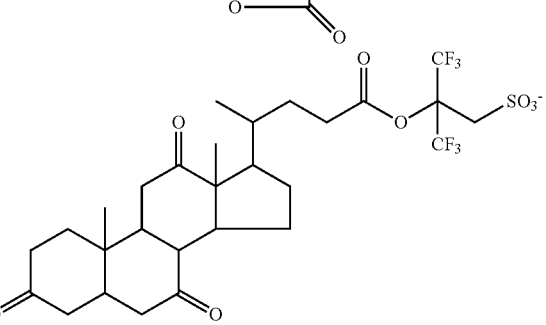

The acid generator (B), particularly photo-acid generator, is incorporated in an amount of preferably 1 to 30 parts by mass, more preferably 2 to 20 parts by mass, relative to 80 parts by mass of the polymer compound of the component (A). Additionally, regarding preferable acidity of the anions, pKa is −1.5 or more. Note that the pKa value is calculated using pKa DB in software ACD/Chemsketch ver: 9.04 available from Advanced Chemistry Development, Inc.

[(C) Basic Compound (Quencher)]

The inventive chemically amplified resist composition preferably contains a basic compound. Optimum basic compounds include conventional basic compound.

Examples of the conventional basic compounds include primary, secondary, and tertiary aliphatic amines, mixed amines, aromatic amines, heterocyclic amines, nitrogen-containing compounds having a carboxy group, nitrogen-containing compounds having a sulfonyl group, nitrogen-containing compounds having a hydroxy group, nitrogen-containing compounds having a hydroxyphenyl group, alcoholic nitrogen-containing compounds, amides, imides, carbamates, etc. Particularly preferable are primary, secondary, and tertiary amine compounds disclosed in paragraphs [0146] to [0164] of JP 2008-111103A; especially, amine compounds having a hydroxy group, an ether bond, an ester bond, a lactone ring, a cyano group, or a sulfonic acid ester bond; compounds having a carbamate group disclosed in JP 3790649B; etc. Preferable examples thereof include tris[2-(methoxymethoxy)ethyl]amine, tris[2-(methoxymethoxy)ethyl]amine N-oxide, dibutylaminobenzoic acid, morpholine derivatives, imidazole derivatives, etc. Adding such a basic compound can, for example, further suppress the acid diffusion rate in the resist film and correct the shape.

Other examples of the quencher include onium salts, such as sulfonium salts, iodonium salts, and ammonium salts of carboxylic acids which are not fluorinated at α position as disclosed in JP 2008-158339A. While α-fluorinated sulfonic acid, imide acid, or methide acid is necessary to deprotect the acid labile group, a carboxylic acid not fluorinated at α position is released by salt exchange with the onium salt not fluorinated at α position. Such carboxylic acid not fluorinated at α position hardly induces deprotection reaction, and thus functions as a quencher.

Examples of such onium salt of carboxylic acid not fluorinated at α position include a compound shown by the following general formula (H1).

$R^{101}$—$CO_2^-Mq^+$ (H1)

In the general formula (H1), $R^{101}$ represents a hydrogen atom or a hydrocarbyl group having 1 to 40 carbon atoms optionally containing a heteroatom, but excludes groups in which a hydrogen atom bonded to the carbon atom at α position of a sulfo group is substituted with a fluorine atom or a fluoroalkyl group.

The hydrocarbyl group may be saturated or unsaturated, and may be linear, branched, or cyclic. Specific examples thereof include: alkyl groups, such as a methyl group, an ethyl group, a propyl group, an isopropyl group, an n-butyl group, a sec-butyl group, a tert-butyl group, an n-pentyl group, a tert-pentyl group, an n-hexyl group, an n-octyl group, a 2-ethylhexyl group, an n-nonyl group, and an n-decyl group; cyclic saturated hydrocarbyl groups, such as a cyclopentyl group, a cyclohexyl group, a cyclopentylmethyl group, a cyclopentylethyl group, a cyclopentylbutyl group, a cyclohexylmethyl group, a cyclohexylethyl group, a cyclohexylbutyl group, a norbornyl group, a tricyclo [5.2.1.0$^{2,6}$]decanyl group, an adamantyl group, and an adamantylmethyl group; alkenyl groups, such as a vinyl group, an allyl group, a propenyl group, a butenyl group, and a hexenyl group; cyclic unsaturated aliphatic hydrocarbyl groups, such as a cyclohexenyl group; aryl groups, such as a phenyl group, a naphthyl group, alkylphenyl groups (such as a 2-methylphenyl group, 3-methylphenyl group, 4-methylphenyl group, 4-ethylphenyl group, 4-tert-butylphenyl group, 4-n-butylphenyl group), dialkylphenyl groups (such as a 2,4-dimethylphenyl group), trialkyl phenyl groups (such as a 2,4,6-triisopropylphenyl group), alkylnaphthyl groups (such as a methylnaphthyl group, ethylnaphthyl group), and dialkylnaphthyl groups (such as a dimethylnaphthyl group, diethylnaphthyl group); aralkyl groups, such as a benzyl group, a 1-phenylethyl group, and a 2-phenylethyl group; etc.

Moreover, these groups may have some of hydrogen atoms substituted with a group containing a heteroatom, such as an oxygen atom, a sulfur atom, a nitrogen atom, or a halogen atom, while these groups may have some of carbon atoms substituted with a group containing a heteroatom, such as an oxygen atom, a sulfur atom, or a nitrogen atom. Thus, the resulting hydrocarbyl group may contain a hydroxy group, a cyano group, a carbonyl group, an ether bond, a thioether bond, an ester bond, a sulfonic acid ester bond, a carbonate bond, a lactone ring, a sultone ring, a carboxylic anhydride, a haloalkyl group, etc. Examples of the hydrocarbyl group containing a heteroatom include: heteroaryl groups, such as a thienyl group; alkoxyphenyl groups, such as a 4-hydroxyphenyl group, a 4-methoxyphenyl group, a 3-methoxyphenyl group, a 2-methoxyphenyl group, a 4-ethoxyphenyl group, a 4-tert-butoxyphenyl group, and a 3-tert-butoxyphenyl group; alkoxynaphthyl groups, such as a methoxynaphthyl group, an ethoxynaphthyl group, an n-propoxynaphthyl group, and an n-butoxynaphthyl group; dialkoxynaphthyl groups, such as a dimethoxynaphthyl group and a diethoxynaphthyl group; aryloxoalkyl groups, such as a 2-aryl-2-oxoethyl groups including a 2-phenyl-2-oxoethyl group, a 2-(1-naphthyl)-2-oxoethyl group, and a 2-(2-naphthyl)-2-oxoethyl group; etc.

In the general formula (H1), $Mq^+$ represents an onium cation. The onium cation is preferably a sulfonium cation, an iodonium cation, or an ammonium cation, more preferably a sulfonium cation or an iodonium cation. Preferable examples thereof include the specific examples of the sulfonium cations in the general formulae (A5) to (A7). Specific examples of the anion structure of the salt shown by the general formula (H1) include the following, but the present invention is not limited thereto.

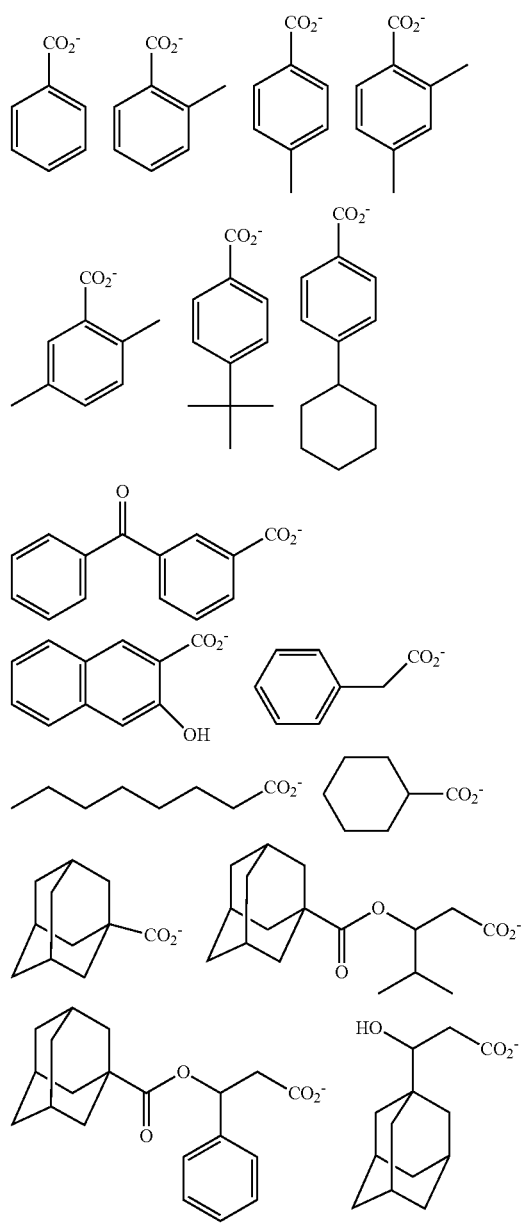

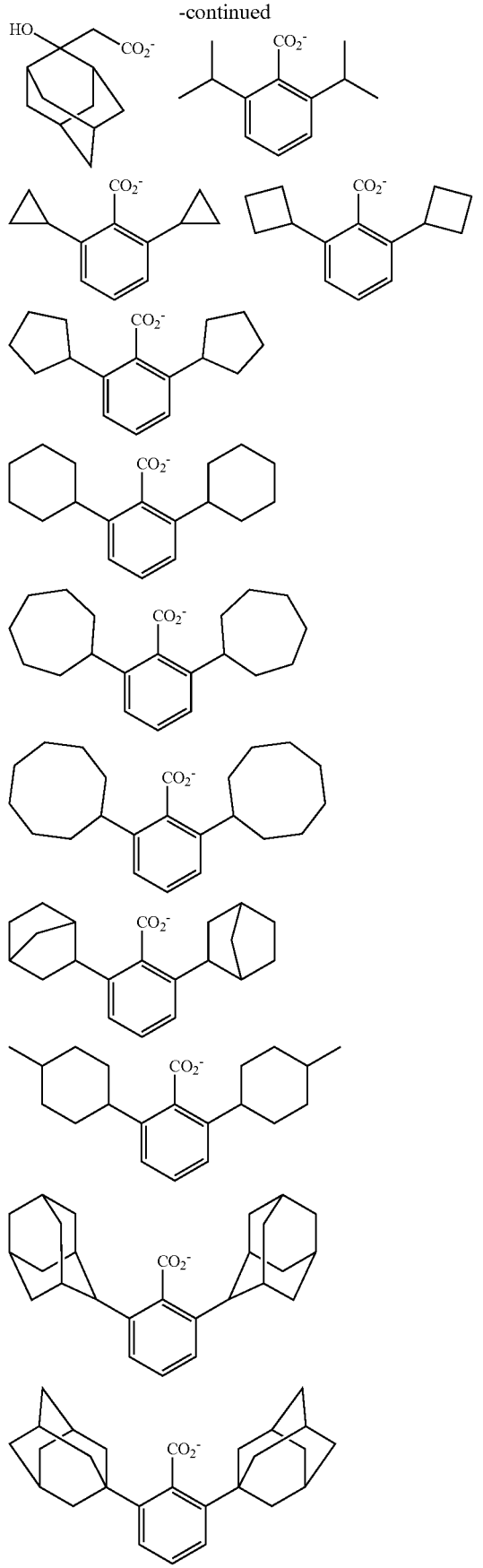
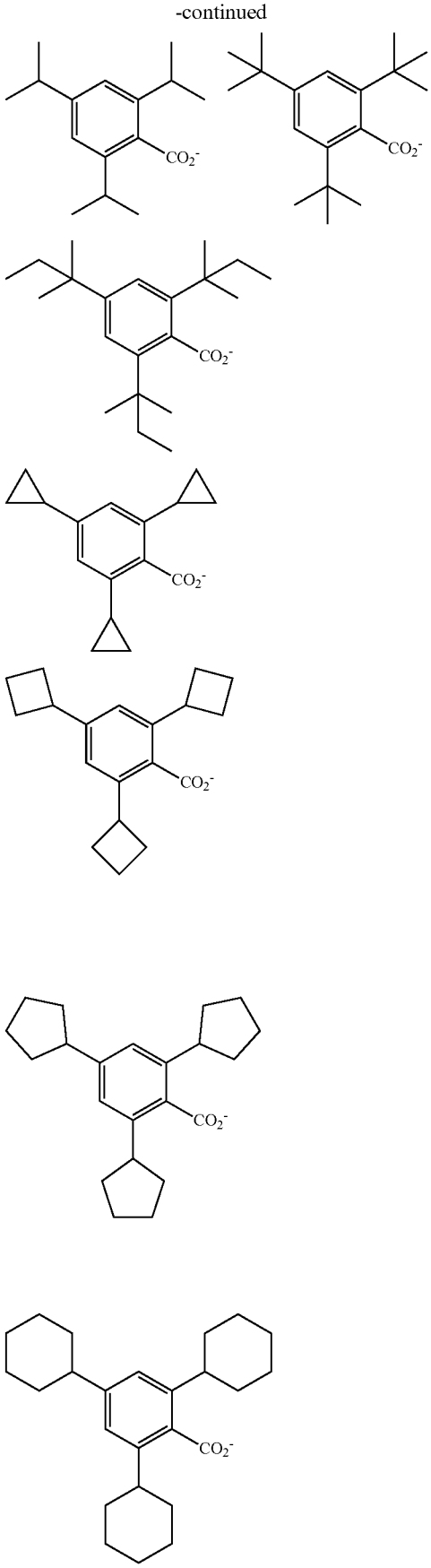

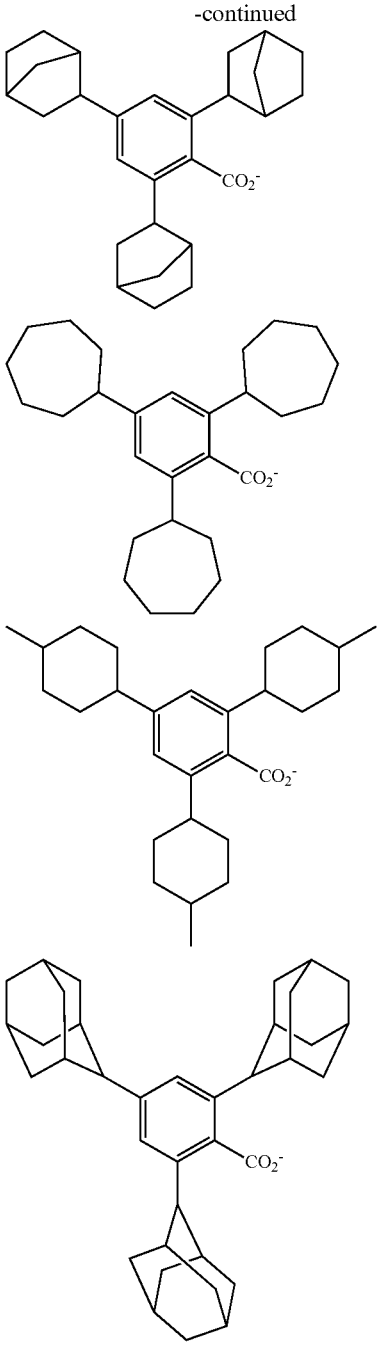

A sulfonium salt of a carboxylic acid containing an iodized benzene ring shown by the following general formula (H2) can also be suitably used as a quencher.

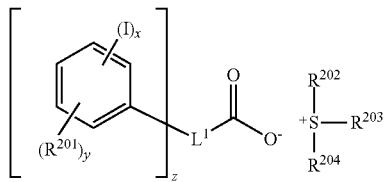

In the general formula (H2), $R^{201}$ represents: a hydroxy group, a fluorine atom, a chlorine atom, a bromine atom, an amino group, a nitro group, or a cyano group; a saturated hydrocarbyl group having 1 to 6 carbon atoms, saturated hydrocarbyloxy group having 1 to 6 carbon atoms, saturated hydrocarbylcarbonyloxy group having 2 to 6 carbon atoms, or saturated hydrocarbylsulfonyloxy group having 1 to 4 carbon atoms, in each of which some or all of hydrogen atoms are optionally substituted with a halogen atom; or —$NR^{201A}$—C(=O)—$R^{201B}$ or —$NR^{201A}$—C(=O)—O—$R^{201B}$. $R^{201A}$ represents a hydrogen atom or a saturated hydrocarbyl group having 1 to 6 carbon atoms. $R^{201B}$ represents a saturated hydrocarbyl group having 1 to 6 carbon atoms or an unsaturated aliphatic hydrocarbyl group having 2 to 8 carbon atoms.

In the general formula (H2), "x" represents an integer of 1 to 5. "y" represents an integer of 0 to 3. "z" represents an integer of 1 to 3. L1 represents a single bond or a linking group having a valency of (z+1) with 1 to 20 carbon atoms, and optionally contains at least one selected from the group consisting of an ether bond, a carbonyl group, an ester bond, an amide bond, a sultone ring, a lactam ring, a carbonate group, a halogen atom, a hydroxy group, and a carboxy group. The saturated hydrocarbyl group, saturated hydrocarbyloxy group, saturated hydrocarbylcarbonyloxy group, and saturated hydrocarbylsulfonyloxy group may be linear, branched, or cyclic. When "y" and/or "z" are 2 or more, $R^{201}$'s may be identical to or different from one another.

In the general formula (H2), $R^{202}$, $R^{203}$ and $R^{204}$ each independently represent a halogen atom, or a hydrocarbyl group having 1 to 20 carbon atoms optionally containing a heteroatom. The hydrocarbyl group may be saturated or unsaturated, and may be linear, branched, or cyclic. Specific examples thereof include alkyl groups having 1 to 20 carbon atoms, alkenyl groups having 2 to 20 carbon atoms, aryl groups having 6 to 20 carbon atoms, aralkyl groups having 7 to 20 carbon atoms, etc. These groups may have some or all of hydrogen atoms substituted with a hydroxy group, a carboxy group, a halogen atom, an oxo group, a cyano group, a nitro group, a sultone group, a sulfone group, or a sulfonium salt-containing group, while these groups may have some of carbon atoms substituted with an ether bond, an ester bond, a carbonyl group, an amide bond, a carbonate group, or a sulfonic acid ester bond. Alternatively, $R^{202}$ and $R^{203}$ are optionally bonded to each other to form a ring together with a sulfur atom bonded therewith.

Specific examples of the compound shown by the general formula (H2) include ones disclosed in JP2017-219836A. Such compound achieves high absorption and high sensitization effect, and the acid-diffusion control effect is also high.

Moreover, as the quencher, it is also possible to use a nitrogen atom-containing carboxylic acid salt compound disclosed in JP 2016-200805A. Specific examples thereof include ones shown below, but are not limited thereto.

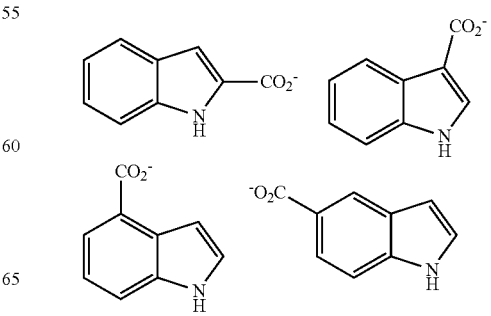

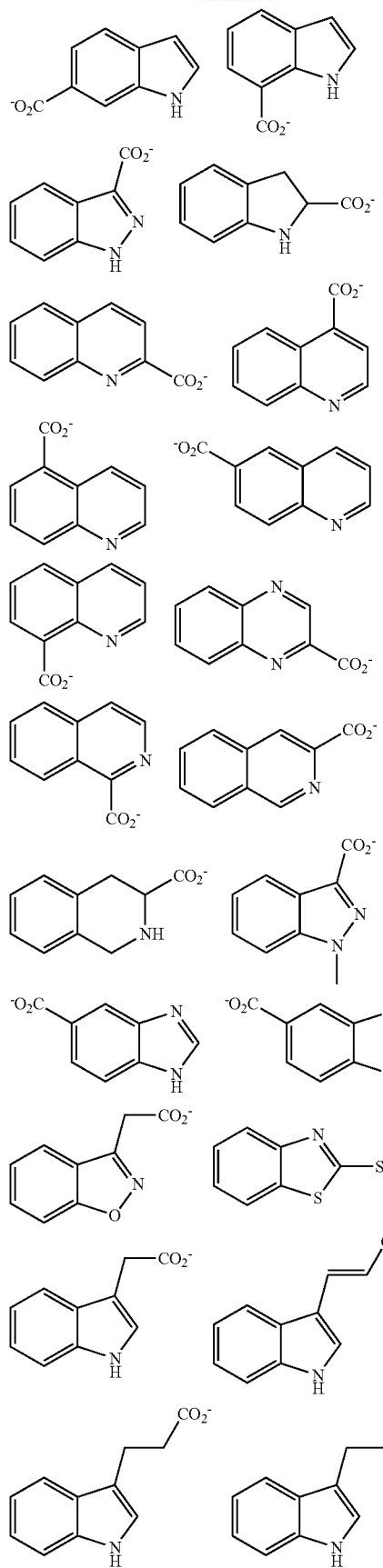
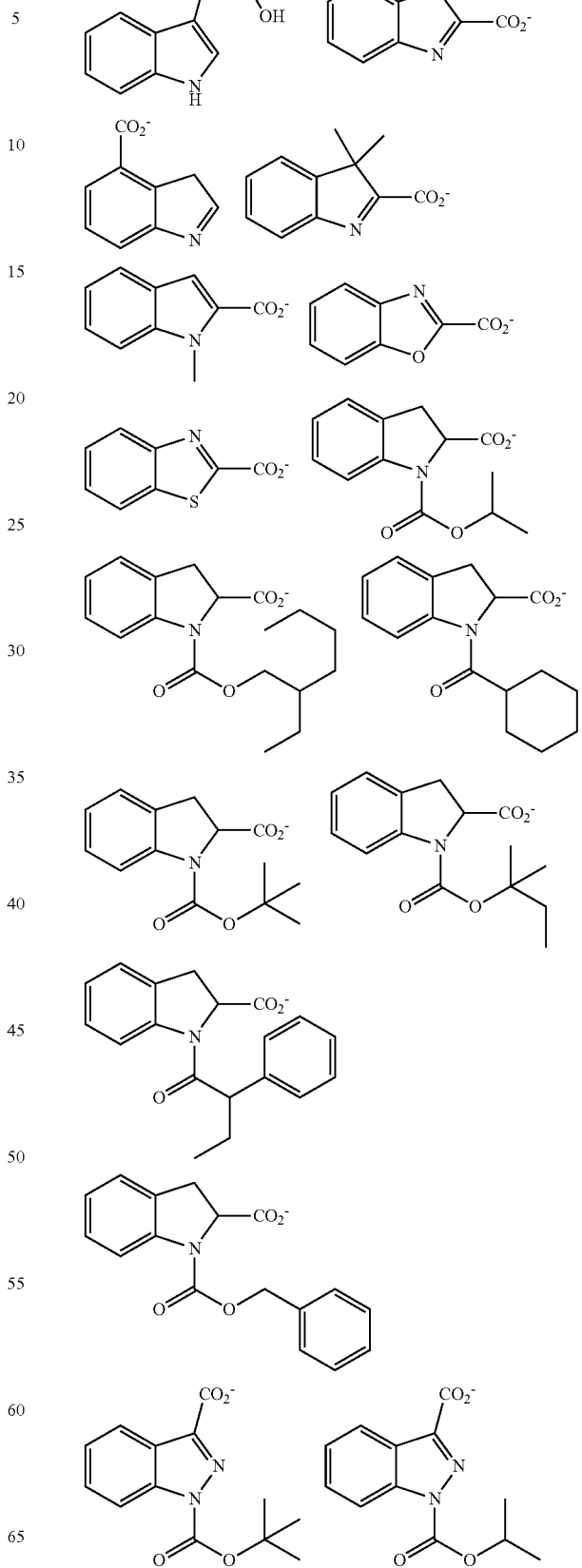

135
-continued
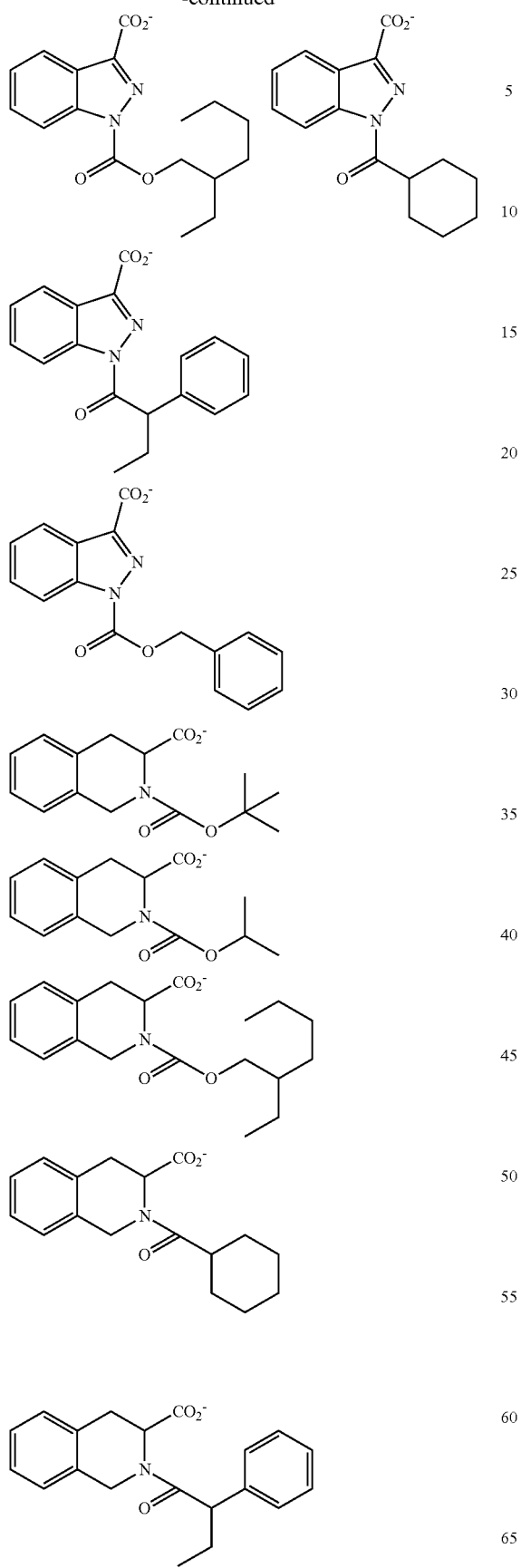
136
-continued
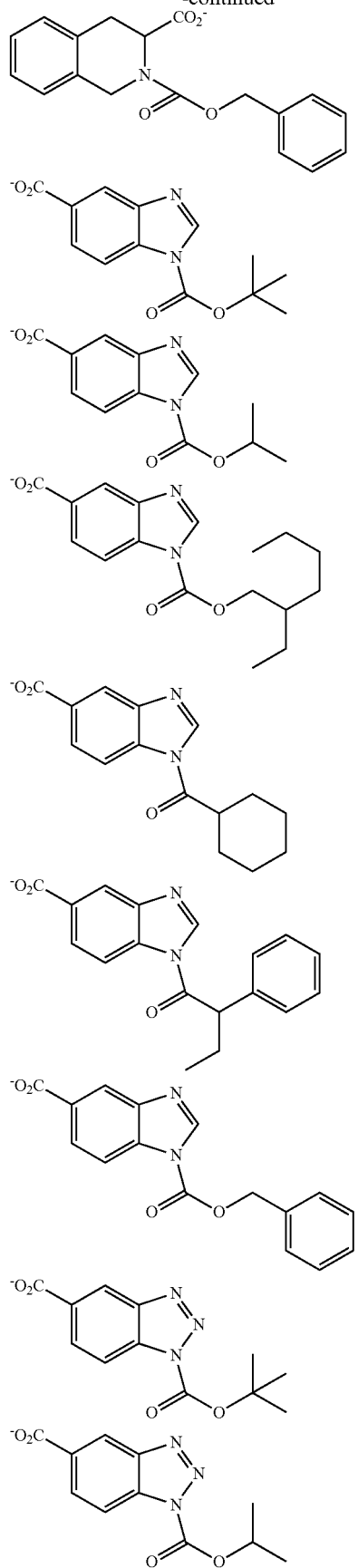

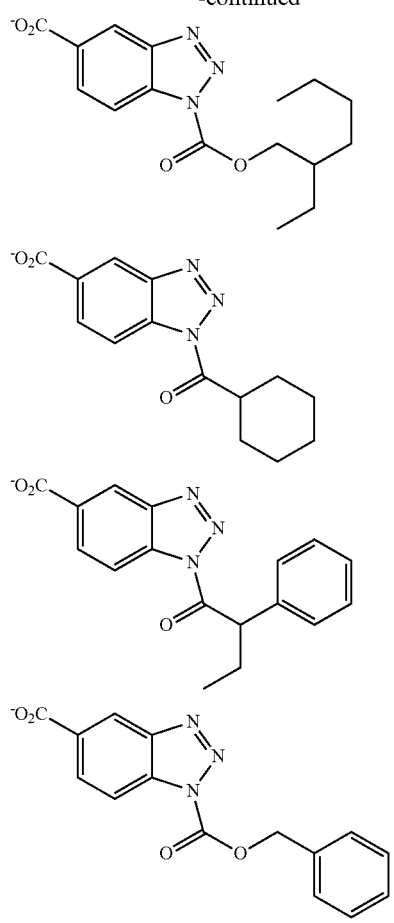
Moreover, a weakly-acidic betaine-type compound can also be used as the quencher. Specific examples thereof include ones shown below, but are not limited thereto.
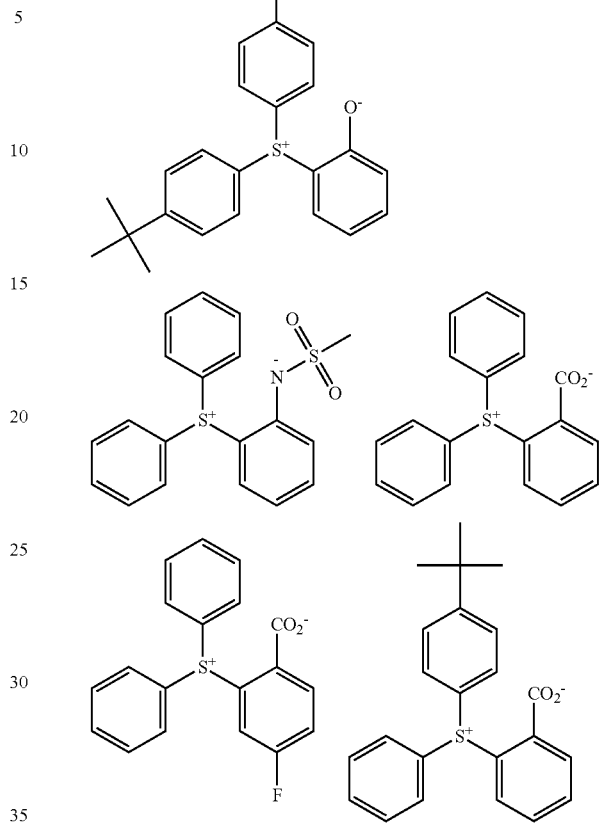
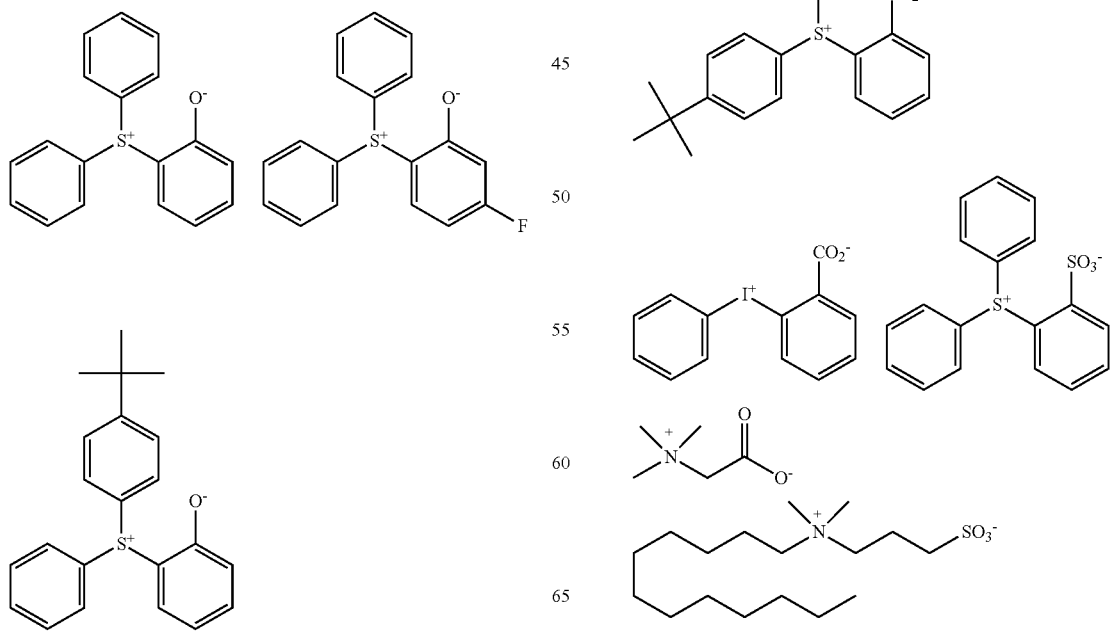

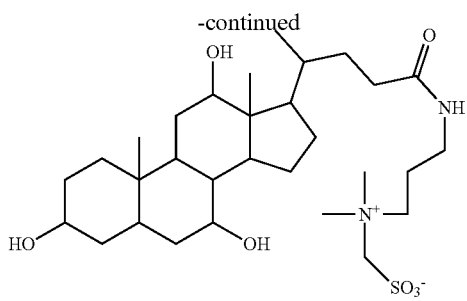

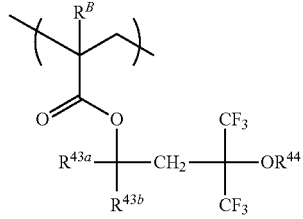

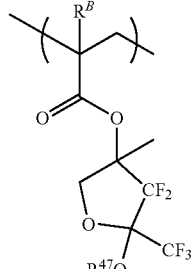

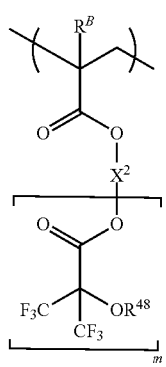

Examples of the quencher further include polymeric quenchers as disclosed in JP2008-239918A. This quencher is oriented on the resist surface after the resist composition is applied, and thereby enhances the rectangularity of the resist after patterning. The polymeric quencher also has effects of preventing rounding of pattern top and film thickness loss of pattern when a top coat for immersion exposure is applied.

When the inventive chemically amplified resist composition contains a quencher, the content is preferably 0 to 50 parts by mass, more preferably 0.1 to 40 parts by mass, relative to 80 parts by mass of the base polymer (for example, the polymer compound (A)). One kind of the quencher can be used singly, or two or more kinds thereof can be used in combination.

[(D) Fluorine-Containing Polymer]

In order to achieve high contrast, prevent chemical flare of acid by high-energy beam irradiation, prevent mixing of acid from an antistatic film in the application process of the antistatic film material onto a resist, and suppress unexpected unnecessary pattern deterioration, the inventive chemically amplified resist composition may contain a component (D) that is fluorine-containing polymer containing a repeating unit shown by the following general formula (D1) (hereinafter also referred to as repeating unit D1) and at least one selected from repeating units shown by the following general formulae (D2), (D3), (D4), and (D5) (hereinafter also referred to as repeating units D2, D3, D4, and D5, respectively). The fluorine-containing polymer has a surface-activating function, too. Thereby, insoluble matters which may be generated during development process can be prevented from re-adhering to a substrate, and the effect on development defect is also exhibited.

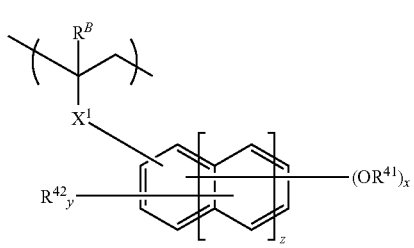

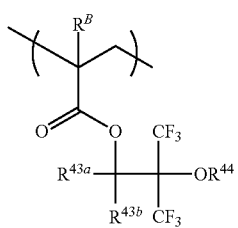

In the formulae, each $R^B$ independently represents a hydrogen atom or a methyl group. Each $R^C$ independently represents a hydrogen atom, a fluorine atom, a methyl group, or a trifluoromethyl group. $R^{41}$ represents a hydrogen atom, or a linear or branched monovalent hydrocarbon group having 1 to 5 carbon atoms optionally having a heteroatom in a carbon-carbon bond. $R^{42}$ represents a linear or branched monovalent hydrocarbon group having 1 to 5 carbon atoms optionally having a heteroatom in a carbon-carbon bond. $R^{43a}$, $R^{43b}$, $R^{45a}$, and $R^{45b}$ each independently represent a hydrogen atom, or a linear, branched, or cyclic alkyl group having 1 to 10 carbon atoms. $R^{44}$, $R^{46}$, $R^{47}$, and $R^{48}$ each independently represent a hydrogen atom, an acid-labile group, or a linear, branched, or cyclic monovalent hydrocarbon group or fluorinated monovalent hydrocarbon group having 1 to 15 carbon atoms. When $R^{44}$, $R^{46}$, $R^{47}$ and $R^{48}$ are monovalent hydrocarbon groups or fluorinated monovalent hydrocarbon groups, an ether group or a carbonyl group may be present in carbon-carbon bonds thereof. "x" represents an integer of 1 to 3. "y" represents an integer satisfying $0 \leq y \leq 5 + 2z - x$. "z" represents 0 or 1. "m" represents an integer of 1 to 3. $X^1$ represents a single bond, —C(=O)—O—, or —C(=O)—NH—. $X^2$ represents a linear, branched, or cyclic hydrocarbon group or fluorinated hydrocarbon group having a valency of (m+1) with 1 to 20 carbon atoms.

Examples of the monovalent hydrocarbon group as $R^{41}$, $R^{42}$, $R^{44}$, $R^{46}$, $R^{47}$, and $R^{48}$ include alkyl groups, alkenyl groups, alkynyl groups, etc. Alkyl groups are preferable. Examples of the alkyl groups include a methyl group, an ethyl group, an n-propyl group, an isopropyl group, an n-butyl group, an isobutyl group, a sec-butyl group, an n-pentyl group, etc. Additionally, a group containing a heteroatom, such as an oxygen atom, a sulfur atom, or a nitrogen atom, may be present in carbon-carbon bonds of these groups.

In the general formula (D1), —OR$^{41}$ is preferably a hydrophilic group. In this case, R$^{41}$ is preferably a hydrogen atom, an alkyl group having 1 to 5 carbon atoms optionally having an oxygen atom in a carbon-carbon bond, or the like.

Examples of the repeating unit D1 include ones shown below, but are not limited thereto. Note that, in the following formulae, R$^B$ is as defined above.

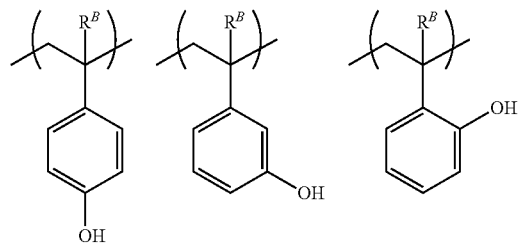

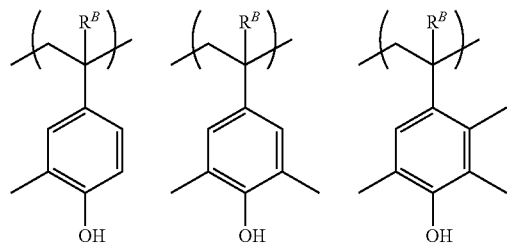

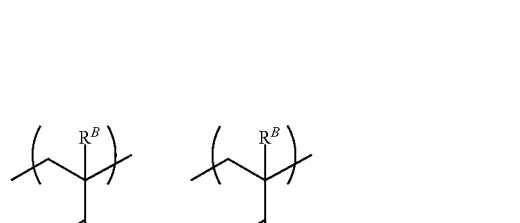

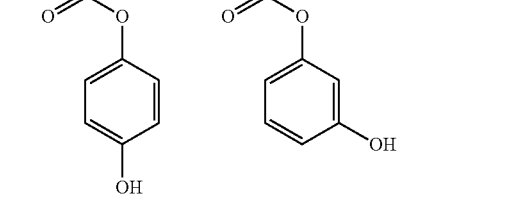

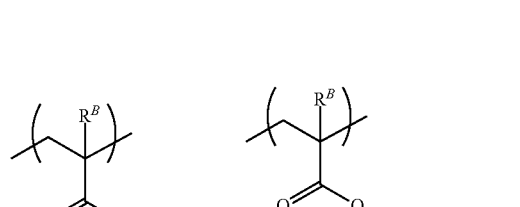

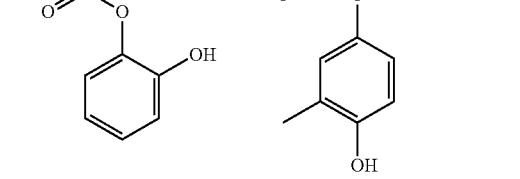

-continued

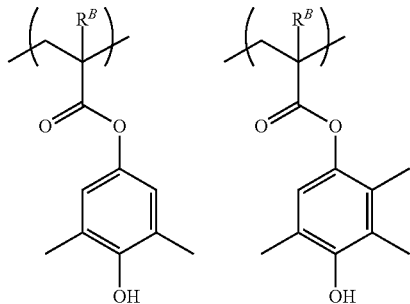

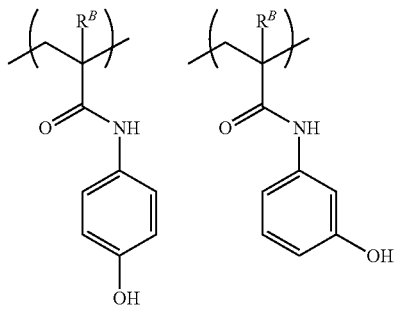

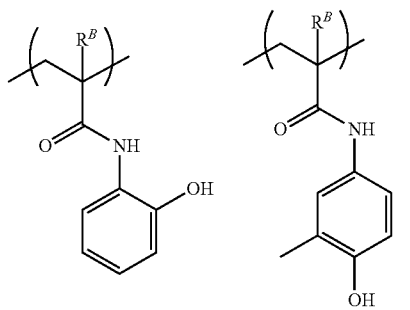

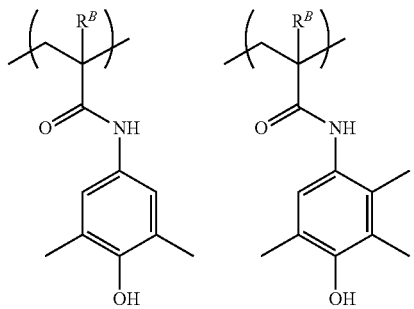

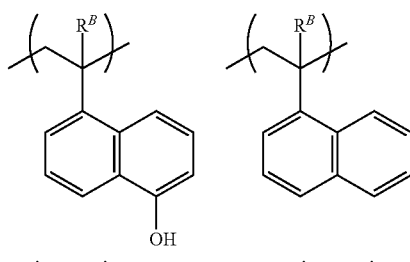

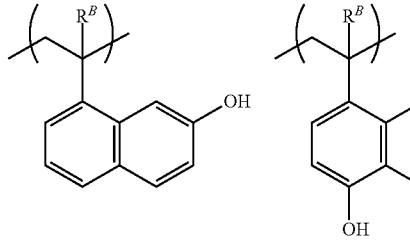

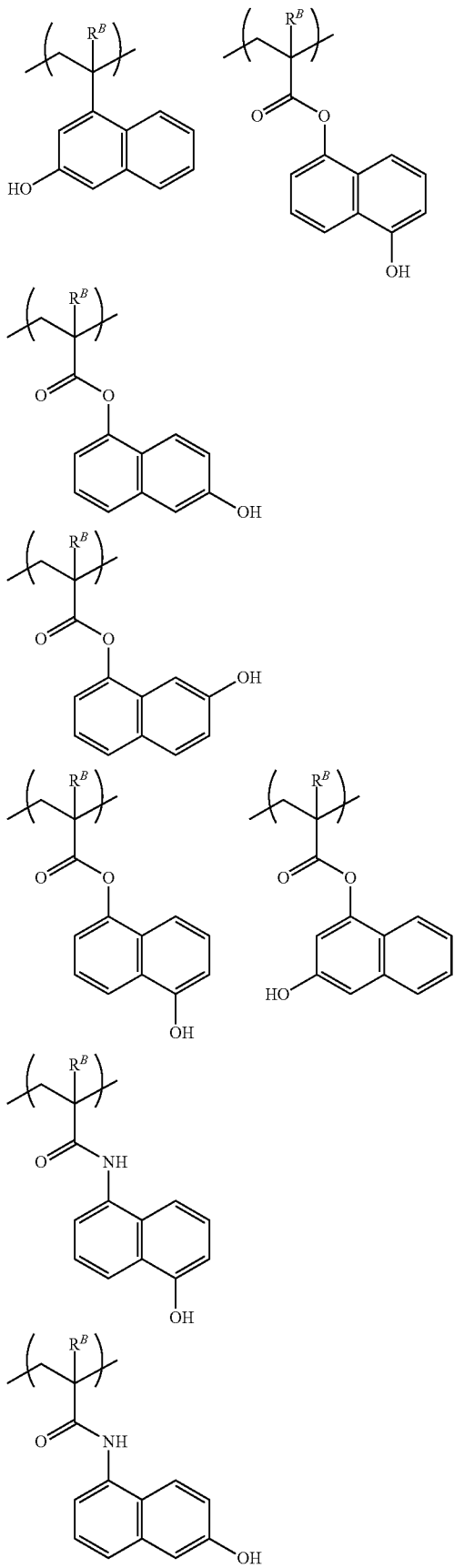
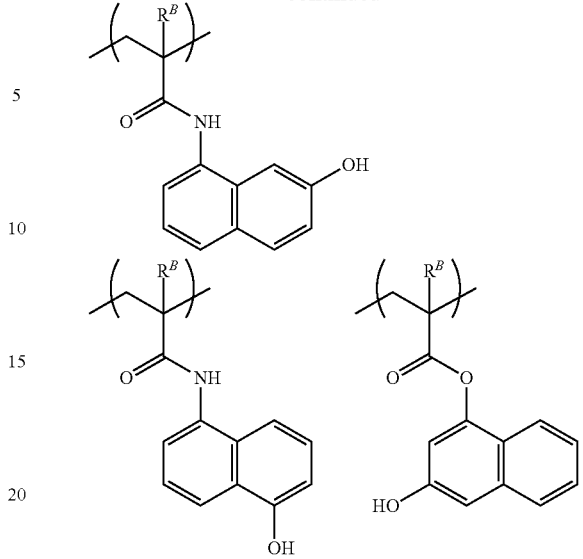

In the repeating unit D1, $X^1$ is preferably —C(=O)—O— or —C(=O)—NH—. Further, $R^B$ is preferably a methyl group. The presence of a carbonyl group in $X^1$ enhances the ability to trap an acid derived from an antistatic film. Moreover, the presence of a methyl group in $R^B$ results in a rigid polymer having higher glass transition temperature (Tg), and thereby suppresses acid diffusion. Thus, the resist film has favorable stability over time, and the resolution and pattern profile do not deteriorate.

In the general formulae (D2) and (D3), examples of the alkyl group represented by $R^{43a}$, $R^{43b}$, $R^{45a}$ and $R^{45b}$ include a methyl group, an ethyl group, an n-propyl group, an isopropyl group, a cyclopropyl group, an n-butyl group, an isobutyl group, a sec-butyl group, a tert-butyl group, a cyclobutyl group, an n-pentyl group, a cyclopentyl group, an n-hexyl group, a cyclohexyl group, an n-heptyl group, an n-octyl group, an n-nonyl group, an n-decyl group, an adamantyl group, a norbornyl group, etc. Among these, linear, branched, or cyclic alkyl groups having 1 to 6 carbon atoms are preferable.

In the general formulae (D2) to (D5), examples of the monovalent hydrocarbon group represented by $R^{44}$, $R^{46}$, $R^{47}$, and $R^{48}$ include alkyl groups, alkenyl groups, alkynyl groups, etc. Alkyl groups are preferable. Examples of the alkyl groups include, in addition to those mentioned above, an n-undecyl group, an n-dodecyl group, a tridecyl group, a tetradecyl group, a pentadecyl group, etc. Moreover, examples of the fluorinated monovalent hydrocarbon group include groups obtained from the aforementioned monovalent hydrocarbon groups in which some or all of hydrogen atoms bonded to a carbon atom are substituted with a fluorine atom.

Examples of the linear, branched, or cyclic hydrocarbon group or fluorinated hydrocarbon group having a valency of (m+1) with 1 to 20 carbon atoms as $X^2$ include groups obtained by further removing "m" hydrogen atoms from the aforementioned monovalent hydrocarbon group or fluorinated monovalent hydrocarbon group, etc.

Specific examples of the repeating units D2 to D5 include ones shown below, but are not limited thereto. Note that, in the following formulae, $R^C$ is as defined above.

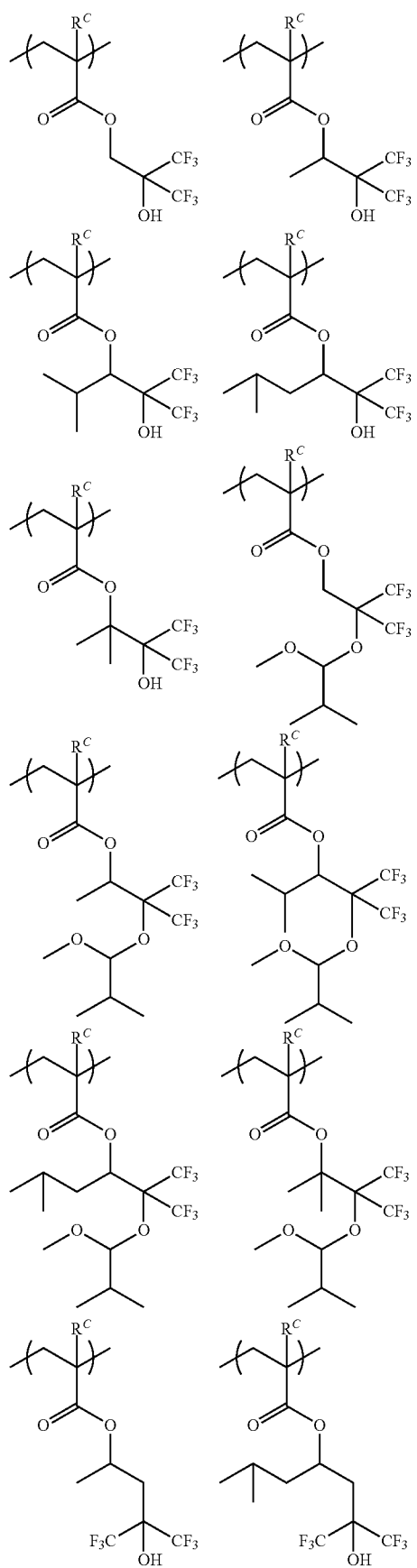
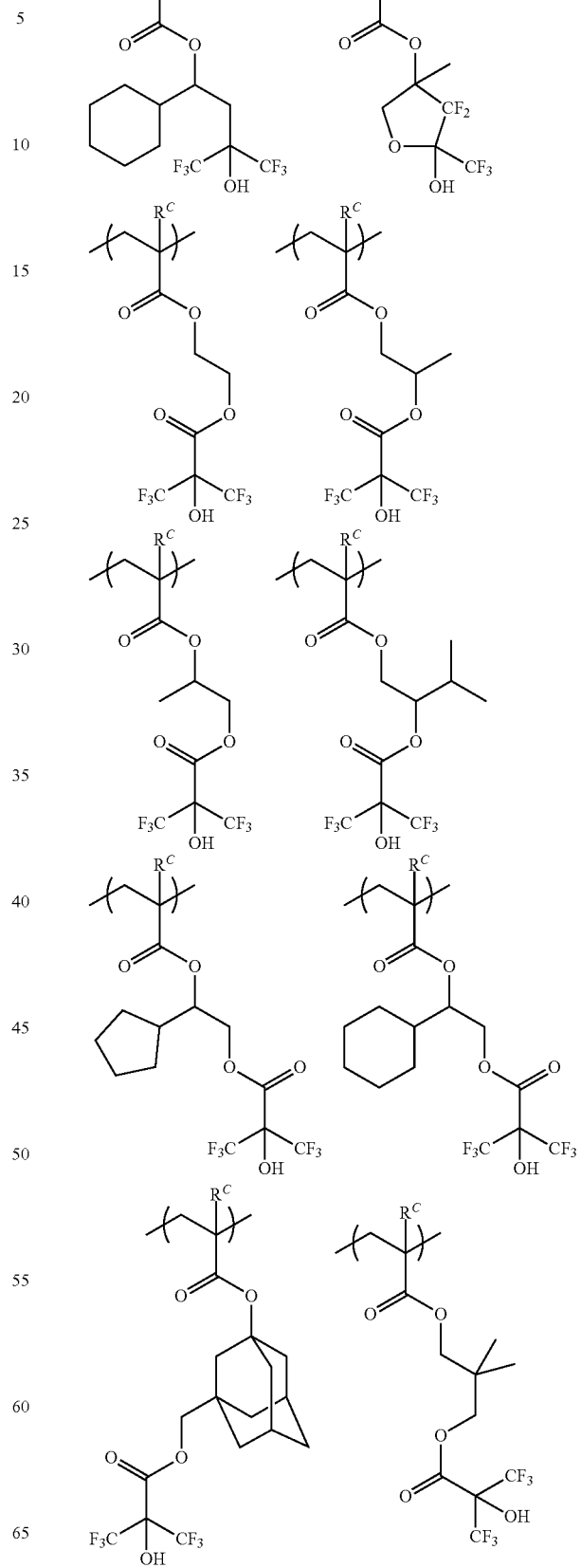

-continued

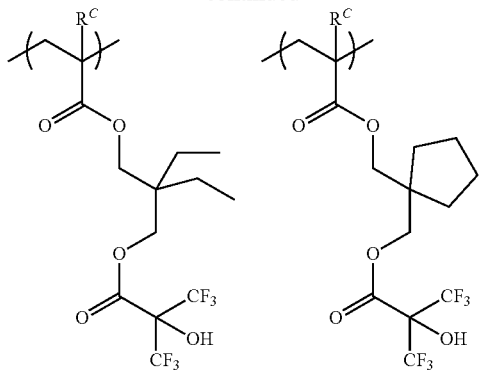

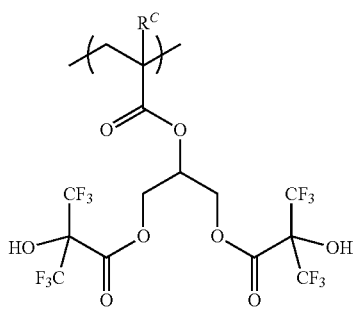

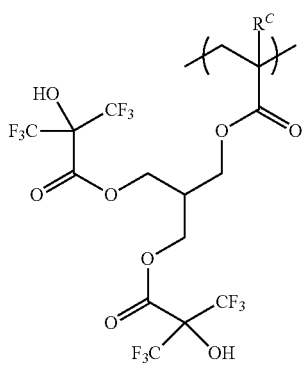

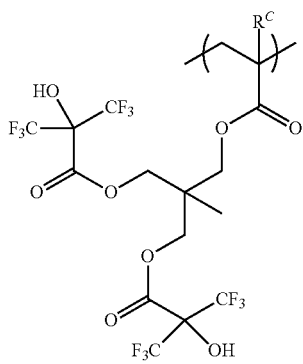

-continued

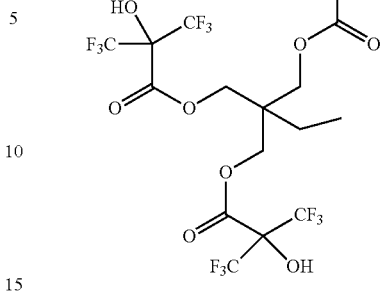

The content of the repeating unit D1 is preferably 5 to 85 mol %, more preferably 15 to 80 mol %, relative to all the repeating units of the fluorine-containing polymer (D). One of the repeating units D2 to D5 may be used singly, or two or more thereof may be used in combination, and the content of the repeating units D2 to D5 is preferably 15 to 95 mol %, more preferably 20 to 85 mol %, relative to all the repeating units of the fluorine-containing polymer (D).

Besides the above-described repeating units, the fluorine-containing polymer (D) may contain another repeating unit. Examples of such repeating unit include ones disclosed in paragraphs [0046] to [0078] of JP2014-177407A, etc. When the fluorine-containing polymer (D) contains another repeating unit, the content is preferably 50 mol % or less relative to all the repeating units.

The fluorine-containing polymer (D) can be synthesized according to known methods by copolymerizing monomers protected with protective groups as necessary, followed by deprotection reaction as necessary. The copolymerization reaction is not particularly limited, but is preferably radical polymerization or anionic polymerization. These methods are elaborated in JP2004-115630A.

The fluorine-containing polymer (D) has a weight-average molecular weight (Mw) of preferably 2,000 to 50,000, more preferably 3,000 to 20,000. With the Mw of 2,000 or more, it is possible to prevent acid diffusion and sufficiently keep the resolution and over-time stability. With the Mw of 50,000 or less, the solubility in a solvent is sufficiently high, and coating defect is prevented. Moreover, the fluorine-containing polymer (D) has a molecular weight distribution (Mw/Mn) of preferably 1.0 to 2.2, more preferably 1.0 to 1.7.

The fluorine-containing polymer (D) is incorporated in an amount of preferably 0.01 to 30 parts by mass, more preferably 0.1 to 20 parts by mass, further preferably 0.5 to 10 parts by mass, relative to 80 parts by mass of the base polymer (for example, the polymer compound (A)). Incidentally, the fluorine-containing polymer is not limited to those described above, and for example, ones disclosed in paragraphs [0027] to [0041] of JP4466881B can be employed similarly.

[(E) Organic Solvent]

The inventive chemically amplified resist composition may contain a component (E) that is an organic solvent. The organic solvent is not particularly limited, as long as it can dissolve each component contained in the composition.

Examples of such organic solvent include ones disclosed in paragraphs [0144] to [0145] of JP2008-111103A: ketones, such as cyclohexanone and methyl-2-n-pentyl ketone; alcohols, such as 3-methoxybutanol, 3-methyl-3-methoxybutanol, 1-methoxy-2-propanol, 1-ethoxy-2-propanol, and diacetone alcohol; ethers, such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters, such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones, such as γ-butyrolactone; and mixed solvents thereof. When an acetal-based acid-labile group is used, a high-boiling-point alcohol-based solvent can also be added to accelerate the deprotection reaction of the acetal. Specific examples of the alcohol-based solvent include diethylene glycol, propylene glycol, glycerin, 1,4-butanediol, 1,3-butanediol, etc.

Among these organic solvents, preferable are 1-ethoxy-2-propanol, propylene glycol monomethyl ether acetate, propylene glycol monomethyl ether, cyclohexanone, ethyl lactate, γ-butyrolactone, and mixed solvents thereof.

The organic solvent (E) is contained in an amount of preferably 200 to 10,000 parts by mass, more preferably 400 to 5,000 parts by mass, relative to 100 parts by mass of the base polymer (for example, the polymer compound (A)). One kind of the organic solvent (E) can be used singly, or two or more kinds thereof can be used in mixture.

[(F) Crosslinking Agent]

When the inventive chemically amplified resist composition is a negative resist composition and the polymer compound of the component (A) does not contain the repeating unit shown by the general formula (A2), a crosslinking agent is preferably blended. Meanwhile, when the polymer compound of the component (A) contains the repeating unit shown by the general formula (A2), it is not necessary to blend a crosslinking agent.

Specific examples of the crosslinking agent usable in the present invention include: melamine compounds, guanamine compounds, glycoluril compounds, urea compounds, epoxy compounds, isocyanate compounds, azide compounds, compounds containing a double bond, such as an alkenyl ether group; etc. These compounds may be substituted with at least one selected from a methylol group, an alkoxymethyl group, and an acyloxymethyl group. These may be used as an additive, or introduced into a polymer side chain as a pendant group. Additionally, compounds containing a hydroxy group can also be used as a crosslinking agent.

Among these crosslinking agents, examples of the epoxy compounds include tris(2,3-epoxypropyl)isocyanurate, trimethylolmethane triglycidyl ether, trimethylolpropane triglycidyl ether, triethylolethane triglycidyl ether, etc.

Examples of the melamine compounds include hexamethylolmelamine, hexamethoxymethylmelamine, such compounds as hexamethylolmelamine having 1 to 6 methylol groups methoxymethylated, and mixtures thereof; and hexamethoxyethylmelamine, hexaacyloxymethylmelamine, such compounds as hexamethylolmelamine having 1 to 6 methylol groups acyloxymethylated, and mixtures thereof.

Examples of the guanamine compounds include tetramethylolguanamine, tetramethoxymethylguanamine, such compounds as tetramethylolguanamine having 1 to 4 methylol groups methoxymethylated, and mixtures thereof; and tetramethoxyethylguanamine, tetraacyloxyguanamine, such compounds as tetramethylolguanamine having 1 to 4 methylol groups acyloxymethylated, and mixtures thereof.

Examples of the glycoluril compounds include tetramethylolglycoluril, tetramethoxyglycoluril, tetramethoxymethylglycoluril, such compounds as tetramethylolglycoluril having 1 to 4 methylol groups methoxymethylated, and mixtures thereof; and such compounds as tetramethylolglycoluril having 1 to 4 methylol groups acyloxymethylated, and mixtures thereof.

Examples of the urea compounds include tetramethylol urea, tetramethoxymethyl urea, such compounds as tetramethylol urea having 1 to 4 methylol groups methoxymethylated, mixtures thereof, tetramethoxyethyl urea, etc.

Examples of the isocyanate compounds include tolylene diisocyanate, diphenylmethane diisocyanate, hexamethylene diisocyanate, cyclohexane diisocyanate, etc.

Examples of the azide compounds include 1,1'-biphenyl-4,4'-bisazide, 4,4'-methylidene bisazide, 4,4'-oxybisazide, etc.

Examples of the compounds containing an alkenyl ether groups include ethylene glycol divinyl ether, triethylene glycol divinyl ether, 1,2-propanediol divinyl ether, 1,4-butanediol divinyl ether, tetramethylene glycol divinyl ether, neopentylglycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, trimethylolpropane trivinyl ether, etc.

Such a crosslinking agent is blended in an amount of preferably 0.5 to 50 parts by mass, more preferably 5 to 30 parts by mass, relative to 80 parts by mass of the polymer compound of the component (A). Within these ranges, there is low risk of pattern merging and resolution reduction. One kind of the crosslinking agent can be used singly, or two or more kinds thereof can be used in combination.

[(G) Surfactant]

A surfactant conventionally used to improve the coating property onto a substrate to be processed may be added to the inventive chemically amplified resist composition. When a surfactant is used, there are many known surfactants as disclosed in JP2004-115630A, which can be referred to as option. The content of the surfactant is preferably 0 to 5 parts by mass relative to 80 parts by mass of the polymer compound of the component (A). When the component (D) is incorporated in the resist, it is not necessary to add a surfactant into the resist because the component (D) also serves as a surfactant.

As a design of the positive resist composition, the resist coating film is dissolved in an alkaline developer at a dissolution rate of 10 nm/min or less, preferably 8 nm/min or less, further preferably 6 nm/min or less. In a case where the coating film is formed in a thin film region (100 nm or less) on a substrate, the influence of pattern film reduction in alkaline development is large; if the alkali dissolution rate of the positive resist composition is more than 10 nm/min, the pattern collapses and no fine pattern can be formed. Particularly, in photomask preparation allowing no defect, development process tends to be intense and such problems are prominent. Note that, in the present invention, the "dissolution rate" in an alkaline developer refers to a value calculated from film reduction amount when a 6-inch silicon wafer is spin-coated with the inventive positive resist composition and baked at 110° C. for 240 seconds, followed by development with a 2.38% TMAH aqueous solution for 80 seconds.

Meanwhile, as a design of the negative resist composition, the resist coating film is dissolved in an alkaline developer at a dissolution rate of 0.5 nm/second or more, preferably 1 nm/second or more, in view of development residue after alkaline development in lithography for the advanced generation. When the alkali dissolution rate of the negative resist composition is 0.5 nm/second or more, there is less risk that development residue after the alkaline development occurs and leads to defect. In the present invention, the "dissolution rate" in an alkaline developer refers to a value calculated from film reduction amount when a 6-inch silicon wafer is spin-coated with the inventive negative resist composition and baked at 110° C. for 240 seconds, followed by development with a 2.38% TMAH aqueous solution for 60 seconds.

[Method for Producing Polymer Compound]

The present invention also provides a method for producing a polymer compound containing one or two or more kinds of repeating units used in a chemically amplified resist composition, the method including polymerizing at least one kind of a polymerizable monomer with not more than 1000 ppm of a residual oligomer in a form of dimer to hexamer to obtain the polymer compound.

In this event, at least one kind of repeating units obtained from the polymerizable monomer with not more than 1000 ppm of a residual oligomer in a form of dimer to hexamer is preferably the repeating unit A1 shown by the general formula (A1) or the repeating unit A2 shown by the general formula (A2).

In these manners, instead of performing purification in the state of polymer, the material with few oligomer components in the state of monomer before the polymerization is employed to successfully produce a polymer compound that is used in a chemically amplified resist composition capable of achieving favorable resolution, pattern profile, and line edge roughness, and simultaneously suppressing development-residue defect, which would otherwise cause mask defect.

[Method for Forming Resist Pattern]

In addition, the present invention provides a method for forming a resist pattern, the method including:
  (1) a step of forming a resist film on a substrate by using the above-described chemically amplified resist composition;
  (2) a step of irradiating the resist film with a high-energy beam to form a pattern; and
  (3) a step of developing the pattern-irradiated resist film by using an alkaline developer.

As the substrate, it is possible to use, for example, a substrate for manufacturing an integrated circuit (such as Si, SiO, $SiO_2$, SiN, SiON, TiN, WSi, BPSG, SOG, organic antireflective film), a substrate for manufacturing a mask circuit (such as Cr, CrO, CrON, $MoSi_2$, Si, SiO, $SiO_2$, SiON, SiONC, CoTa, NiTa, TaBN, $SnO_2$), etc. The inventive chemically amplified resist composition is applied onto the substrates by a technique such as spin coating to a film thickness of, for example, 0.03 to 2 μm. The resulting film is prebaked on a hot plate preferably at 60 to 150° C. for 1 to 20 minutes, more preferably at 80 to 140° C. for 1 to 10 minutes. In this manner, a resist film is formed.

Then, the resist film is exposed by using a high-energy beam for pattern irradiation. Examples of the high-energy beam include ultraviolet ray, deep ultraviolet ray, excimer laser beam (such as KrF, ArF), EUV (extreme ultraviolet ray), X-ray, γ-ray, synchrotron radiation, EB, etc. In the present invention, EUV or EB (electron beam) is preferably used for the exposure.

When ultraviolet ray, deep ultraviolet ray, excimer laser beam, EUV, X-ray, γ-ray, or synchrotron radiation is employed as the high-energy beam, a target pattern is formed by irradiation using a mask at an exposure dose of preferably 1 to 500 $mJ/cm^2$, more preferably 10 to 400 $mJ/cm^2$. When EB is employed, a target pattern is formed by direct irradiation at an exposure dose of preferably 1 to 500 $\mu C/cm^2$, more preferably 10 to 400 $\mu C/cm^2$.

In the exposure, it is possible to adopt not only ordinal exposure methods but also an immersion method with a liquid between a mask and a resist. In this case, a top coat insoluble in water may be used.

Subsequently, the post-exposure baking (PEB) is performed on a hot plate preferably at 60 to 150° C. for 1 to 20 minutes, more preferably at 80 to 140° C. for 1 to 10 minutes.

Thereafter, the development can be performed by a conventional method, such as dipping, puddling, or spraying, for preferably 0.1 to 3 minutes, more preferably 0.5 to 2 minutes, by using a developer of an aqueous alkaline solution of TMAH, for example, at a concentration of 0.1 to 5 mass %, preferably 2 to 3 mass %. In this manner, a target pattern is formed on the substrate.

More preferably, the substrate has a top surface composed of a material containing at least one of chromium, silicon, tantalum, molybdenum, cobalt, nickel, tungsten, and tin.

Note that the inventive chemically amplified resist composition is useful because it is particularly capable of suppressing development defect that may lead to mask defect. Moreover, even though adhesiveness varies among substrates depending on the kinds, the inventive chemically amplified resist composition is capable of reducing development defect effectively. Examples of such substrates include substrates each having a top surface with a film formed by sputtering from either metal chromium or chromium compound containing one or more light elements selected from oxygen, nitrogen, and carbon; substrates each having a top surface layer containing SiO, $SiO_x$, a tantalum compound, a molybdenum compound, a cobalt compound, a nickel compound, a tungsten compound, or a tin compound; etc. The inventive chemically amplified resist composition is particularly useful for pattern formation using photomask blanks as the substrate. In this case, the photomask blanks may be transmissive or reflective.

The inventive method for forming a resist pattern forms a pattern with high resolution and little influence on development defect even when the top surface of a substrate (for example, photomask blank) to be used is made of a material which readily influences resist pattern profile, such as a material containing chromium, silicon, or tantalum.

[Photomask Blank]

Thus, the present invention provides a photomask blank coated with the above-described chemically amplified resist composition. The inventive chemically amplified resist composition is particularly useful for pattern formation using photomask blanks as a substrate.

EXAMPLE

Hereinafter, the present invention will be specifically described with reference to Synthesis Examples, Examples and Comparative Examples. However, the present invention is not limited to these descriptions. Note that, in the following examples, Me represents a methyl group. Moreover, copolymer composition ratio means mole ratio, and weight-average molecular weight (Mw) means weight-average molecular weight in terms of polystyrene measured by gel permeation chromatography (GPC). Further, each oligomer value is a concentration value calculated based on the corresponding monomer obtained by LC-MS measurement (equipment name: Thermo Fisher SCIENTIFIC/Vanquish (LC system), Q-Exactive (MS)).

[1] Synthesis of Monomers

[Synthesis Example 1] Synthesis of Monomers (1), (2)

Under nitrogen atmosphere, a 3-L four-necked flask was charged with 42.1 g of magnesium and 50 mL of THF, and a solution obtained by dissolving 200 g of 4-chlorostyrene in 200 mL of THF was added dropwise at room temperature over 1 hour. After the temperature was raised to 80° C., the mixture was stirred for 3 hours. Thereby, a Grignard reagent was prepared. The obtained Grignard reagent was cooled in an ice bath, and a solution obtained by dissolving 100.6 g of acetone in 200 mL of THF was added dropwise thereto over 1 hour. After the mixture was stirred overnight, a 15 mass % ammonium chloride aqueous solution (1,000 g) was added dropwise to stop the reaction. After normal aqueous work-up was performed, 0.02 g of 4-tertiary butylcatechol was added to the crude product and the resultant was purified by distillation under reduced pressure of 20 Pa with a bath temperature of 90° C. Thus, 145.2 g of target Monomer (1) with the following structure was obtained (yield: 62%). The dimer to hexamer oligomers were 1700 ppm.

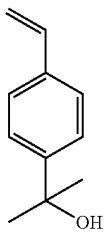

140.5 g of target Monomer (2) was obtained (yield: 60%) in the same manner as in Synthesis of Monomer (1) described above, except that 0.2 g of 4-tertiary butylcatechol was added after the aqueous work-up and the resultant was purified by distillation under reduced pressure of 5 Pa with a bath temperature of 70° C. The dimer to hexamer oligomers were 90 ppm.

[Synthesis Example 2] Synthesis of Monomers (3), (4)

Under nitrogen atmosphere, a 3-L four-necked flask was charged with 27.8 g of magnesium and 50 mL of THF, and a solution obtained by dissolving 200 g of 1-chloro-4-[(1-methylcyclopentyl)oxy]benzene in 200 mL of THF was added dropwise at room temperature over 1 hour. After the temperature was raised to 80° C., the mixture was stirred for 3 hours. Thereby, a Grignard reagent was prepared. The obtained Grignard reagent was cooled in an ice bath, and 2.5 g of dichloro(1,3-bis(diphenylphosphino)propane)nickel was added thereto and aged for 30 minutes. Then, a solution obtained by dissolving 151.2 g of vinyl bromide in 200 mL of THF was added dropwise over 1 hour. After the mixture was stirred overnight, a 15 mass % ammonium chloride aqueous solution (1,000 g) was added dropwise to stop the reaction. After normal aqueous work-up was performed, 0.02 g of 4-tertiary butylcatechol was added to the crude product and the resultant was purified by distillation under reduced pressure of 20 Pa with a bath temperature of 100° C. Thus, 111.3 g of target Monomer (3) with the following structure was obtained (yield: 58%). The dimer to hexamer oligomers were 1600 ppm.

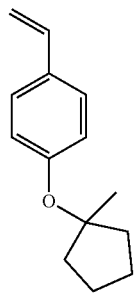

105.6 g of target Monomer (4) was obtained (yield: 55%) in the same manner as in Synthesis of Monomer (3) described above, except that 0.2 g of 4-tertiary butylcatechol was added after the aqueous work-up and the resultant was purified by distillation under reduced pressure of 5 Pa with a bath temperature of 80° C. The dimer to hexamer oligomers were 110 ppm.

[Synthesis Example 3] Synthesis of Monomers (5), (6)

200 g of 4-acetoxystyrene (manufactured by Tokyo Chemical Industry Co., Ltd.) was dissolved in 800 g of ethyl acetate, and a solution obtained by dissolving 73.5 g of sodium methoxide in 200 mL of methanol was added dropwise thereto over 1 hour under ice-cooling condition. After the mixture was stirred for 3 hours, 800 g of water was added dropwise to stop the reaction. After normal aqueous work-up was performed, 0.02 g of 4-tertiary butylcatechol was added to the crude product and the resultant was concentrated with a bath temperature of 50° C. Thus, 121.5 g of target Monomer (5) with the following structure was obtained (yield: 82%). The dimer to hexamer oligomers were 1650 ppm.

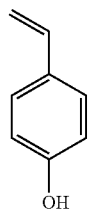

118.5 g of target Monomer (6) was obtained (yield: 80%) in the same manner as in Synthesis of Monomer (5) described above, except that 0.2 g of 4-tertiary butylcatechol was added after the aqueous work-up and the resultant was concentrated with a bath temperature of 35° C. The dimer to hexamer oligomers were 160 ppm.

[Synthesis Example 4] Synthesis of Monomers (7), (8)

49.0 g (0.1 mol) of triphenylsulfonium 1,1,3,3,3-pentafluoro-2-hydroxypropane-1-sulfonate was dissolved in 200 g of dichloromethane, and 10.1 g (0.10 mol) of triethylamine and 2.4 g (0.2 mol) of N,N-dimethylaminopyridine were added, followed by stirring under ice-cooling condition. 10.0 g (0.10 mol) of methacrylic anhydride was added dropwise at a temperature not exceeding 10° C. After aging for 15 minutes, dilute hydrochloric acid was further added for liquid separation. Further, the organic layer was washed with 200 g of water three times. Then, the organic layer was concentrated, and diethyl ether was added to the residue for the crystallization. The crystal was subjected to filtration and purification with a silica gel column chromatograph (eluent: dichloromethane-methanol mixed solvent). Subsequently, the resultant was re-crystallized again with diethyl ether, followed by filtration and drying. Thus, Monomer (7) with the following structure was obtained (yield: 51%). The dimer to hexamer oligomers were 1540 ppm.

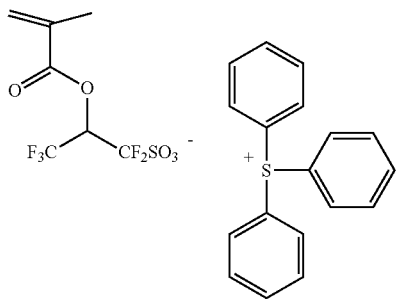

15 g of Monomer (7) synthesized by the above method was dissolved in 30 g of methanol, and 600 g of water was added dropwise thereto for crystallization, followed by filtration and drying. Thus, 12.3 g of target Monomer (8) was obtained. The dimer to hexamer oligomers were 130 ppm.

[Synthesis Example 5] Synthesis of Monomers (9), (10)

4-chlorostyrene with the following structure (manufactured by Tokyo Chemical Industry Co., Ltd.) was used (as Monomer (9)). The dimer to hexamer oligomers were 1800 ppm.

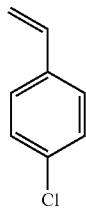

0.1 g of 4-tertiary butylcatechol was added to 100 g of Monomer (9), and the resultant was purified by distillation under reduced pressure of 5 Pa with a bath temperature of 50° C. Thus, 95.0 g of target Monomer (10) was obtained. The dimer to hexamer oligomers were 280 ppm.

[Polymer Synthesis Example 1] Synthesis of Polymer 3

Under nitrogen atmosphere, 49.3 g of 4-acetoxystyrene, 7.1 g of acenaphthylene, 23.6 g of Monomer (4), 8.6 g of dimethyl-2,2'-azobis-(2-methylpropionate) (product name: V601 manufactured by Wako Pure Chemical Industries, Ltd.), and 124 g of methyl ethyl ketone as a solvent were added into a 300-mL dropping cylinder to prepare a solution. Separately, 62 g of methyl ethyl ketone was added into a 500-mL flask for polymerization under nitrogen atmosphere and heated to 80° C. In this state, the above-prepared solution was added dropwise into the flask over 4 hours. After the completion of the dropwise addition, stirring was continuously performed for 18 hours while the polymerization temperature was kept at 80° C. Thereafter, the resultant was cooled to room temperature. The resulting polymer solution was added dropwise to 1300 g of hexane, and the precipitated copolymer was collected by filtration. The collected copolymer was washed twice with 500 g of hexane. In a 1-L flask under nitrogen atmosphere, the resulting copolymer was dissolved in a mixed solvent containing 144 g of tetrahydrofuran and 48 g of methanol. 22.3 g of ethanolamine was added to the solution and stirred at 60° C. for 3 hours. This reaction solution was concentrated under reduced pressure. The obtained concentrate was dissolved in a mixed solvent containing 240 g of ethyl acetate and 60 g of water. The resulting solution was transferred to a separation funnel, 11.1 g of acetic acid was added thereto, and liquid separation operation was performed. The lower layer was removed by distillation, 60 g of water and 14.8 g of pyridine were added to the resulting organic layer, and liquid separation operation was performed. The lower layer was removed by distillation, 60 g of water was further added to the resulting organic layer, and water-washing and liquid separation were performed (the water-washing and liquid separation were performed five times in total). After the liquid separation, the organic layer was concentrated, and then dissolved in 130 g of acetone. The obtained acetone solution was added dropwise to 1200 g of water. The resulting crystal precipitate was subjected to filtration, water washing, and 2-hour suction filtration. The resulting filtride was again dissolved in 130 g of acetone. The obtained acetone solution was added dropwise to 1200 g of water. The resulting crystal precipitate was subjected to filtration, water washing, and drying. Thus, 51.0 g of a white polymer was obtained. The obtained polymer was measured by $^{13}$C-NMR, $^{1}$H-NMR, and GPC, and the following analysis results were obtained.

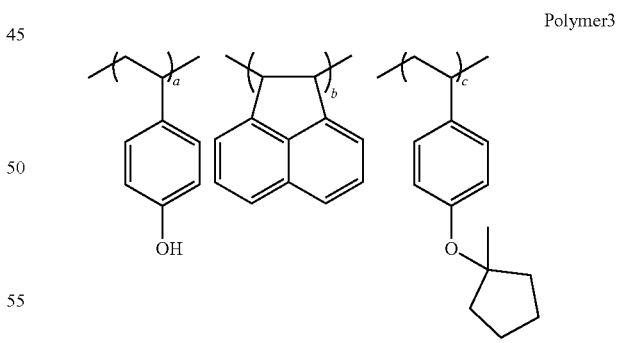

Polymer3

(a = 0.65. b = 0.10, c = 0.25, Mw = 4,700, Mw/Mn = 1.55)

[Polymer Synthesis Example 2] Synthesis of Polymer 22

Under nitrogen atmosphere, 890 g of a 50.0 mass % solution of 4-hydroxystyrene in propylene glycol monomethyl ether acetate (PGMEA), 47.7 g of acenaphthylene, 310 g of a 54.7 mass % solution of Monomer (2) in PGMEA, 87.0 g of triphenylsulfonium-1,1,3,3,3-pentafluoro-2-methacryloyloxypropane-1-sulfonate, 96.1 g of dimethyl-2,2'-azobis-(2-methylpropionate) (V-601 manufactured by Wako Pure Chemical Industries, Ltd.), and solvents of 360 g of γ-butyrolactone and 220 g of PGMEA were added into a 3,000-mL dropping cylinder to prepare a solution. Separately, 580 g of γ-butyrolactone was added into a 5,000-mL flask for polymerization under nitrogen atmosphere and heated to 80° C. In this state, the above-prepared solution was added dropwise into the flask over 4 hours. After the completion of the dropwise addition, stirring was continuously performed for 18 hours while the polymerization temperature was kept at 80° C. Thereafter, the resultant was cooled to room temperature. The resulting polymer solution was added dropwise to 22.5 kg of diisopropyl ether, so that the copolymer aggregated. The diisopropyl ether was removed by decantation, and the copolymer was dissolved in 2,250 g of acetone. This acetone solution was added dropwise to 22.5 kg of diisopropyl ether, and the precipitated copolymer was collected by filtration. The collected copolymer was dissolved again in 2,250 g of acetone. This acetone solution was added dropwise to 22.5 kg of water, and the precipitated copolymer was collected by filtration and then dried at 40° C. for 40 hours. Thus, 700 g of a white polymer was obtained as Polymer 22. The obtained polymer was measured by $^{13}$C-NMR, $^{1}$H-NMR, and GPC, and the following analysis results were obtained.

Polymer 22

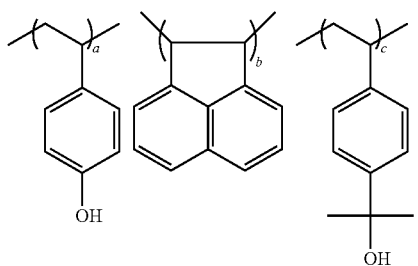

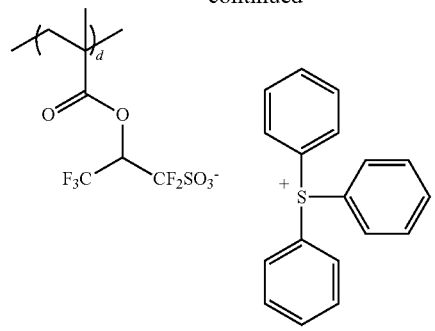

(a = 0.66. b = 0.09, c = 0.21, d = 0.04, Mw = 18,000, Mw/Mn = 1.65)

[Polymer Synthesis Example 3] Synthesis of Polymers 1 to 2, 4 to 21, 23 to 32, and Comparative Polymers 1 to 5

Polymers 1 to 2, 4 to 21, 23 to 32, and Comparative Polymers 1 to 5 were synthesized in the same procedure as Polymer Synthesis Example 1 or 2, except for changing the kinds and introduction ratios (mole ratios) of the polymerizable monomers. Tables 1-1 to 1-3 show summaries of the kinds and introduction ratios of the monomers of Polymers 1 to 32 and Comparative Polymers 1 to 5. In addition, Tables 2 to 6 show the structures of the polymerizable monomers corresponding to repeating units introduced into the polymers. Note that the Mw of each polymer is a value measured in terms of polystyrene by GPC using tetrahydrofuran as a solvent. Nevertheless, as to the polymer containing any of P-1 to P-6, the Mw is a value measured in terms of polystyrene by GPC using dimethylformamide as a solvent. The Mw of Polymers 1 to 32 and Comparative Polymers 1 to 5 ranged from 2500 to 21000, and the Mw/Mn ranged from 1.4 to 2.2.

TABLE 1-1

| | Unit 1 (residual oligomer) | Introduction ratio (mol %) | Unit 2 (residual oligomer) | Introduction ratio (mol %) | Unit 3 (residual oligomer) | Introduction ratio (mol %) | Unit 4 (residual oligomer) | Introduction ratio (mol %) |
|---|---|---|---|---|---|---|---|---|
| Polymer 1 | A-1 (unconcerned) | 63.0 | B-4 (unconcerned) | 10.0 | C-1 (110 ppm) | 27.0 | | |
| Polymer 2 | A-1 (unconcerned) | 65.0 | B-4 (unconcerned) | 10.0 | C-2 (90 ppm) | 25.0 | | |
| Polymer 3 | A-1 (unconcerned) | 65.0 | B-2 (unconcerned) | 10.0 | C-1 (110 ppm) | 25.0 | | |
| Polymer 4 | A-1 (unconcerned) | 70.0 | B-2 (unconcerned) | 10.0 | C-2 (90 ppm) | 20.0 | | |
| Polymer 5 | A-1 (unconcerned) | 75.0 | B-4 (unconcerned) | 10.0 | C-5 (120 ppm) | 15.0 | | |
| Polymer 6 | A-1 (unconcerned) | 76.0 | B-2 (unconcerned) | 10.0 | C-6 (110 ppm) | 14.0 | | |
| Polymer 7 | A-2 (unconcerned) | 70.0 | C-1 (110 ppm) | 30.0 | | | | |
| Polymer 8 | A-1 (unconcerned) | 58.0 | B-2 (unconcerned) | 10.0 | C-1 (110 ppm) | 20.0 | P-5 (unconcerned) | 12.0 |
| Polymer 9 | A-1 (unconcerned) | 58.0 | B-2 (unconcerned) | 10.0 | C-2 (90 ppm) | 20.0 | P-5 (unconcerned) | 12.0 |
| Polymer 10 | A-2 (unconcerned) | 60.0 | C-1 (110 ppm) | 35.0 | P-5 (unconcerned) | 5.0 | | |
| Polymer 11 | A-2 (unconcerned) | 50.0 | C-1 (110 ppm) | 20.0 | C-3 (140 ppm) | 20.0 | P-5 (unconcerned) | 10.0 |
| Polymer 12 | A-2 (unconcerned) | 50.0 | C-1 (110 ppm) | 20.0 | C-4 (100 ppm) | 20.0 | P-5 (unconcerned) | 10.0 |

TABLE 1-1-continued

| | Unit 1 (residual oligomer) | Introduction ratio (mol %) | Unit 2 (residual oligomer) | Introduction ratio (mol %) | Unit 3 (residual oligomer) | Introduction ratio (mol %) | Unit 4 (residual oligomer) | Introduction ratio (mol %) |
|---|---|---|---|---|---|---|---|---|
| Polymer 13 | A-1 (unconcerned) | 60.0 | B-2 (unconcerned) | 10.0 | E-1 (90 ppm) | 30.0 | | |
| Polymer 14 | A-1 (unconcerned) | 65.0 | B-2 (unconcerned) | 10.0 | E-2 (110 ppm) | 25.0 | | |
| Polymer 15 | A-1 (unconcerned) | 70.0 | B-2 (unconcerned) | 10.0 | E-3 (180 ppm) | 20.0 | | |
| Polymer 16 | A-1 (unconcerned) | 45.0 | B-2 (unconcerned) | 10.0 | E-4 (190 ppm) | 45.0 | | |

TABLE 1-2

| | Unit 1 (residual oligomer) | Introduction ratio (mol %) | Unit 2 (residual oligomer) | Introduction ratio (mol %) | Unit 3 (residual oligomer) | Introduction ratio (mol %) | Unit 4 (residual oligomer) | Introduction ratio (mol %) |
|---|---|---|---|---|---|---|---|---|
| Polymer 17 | A-1 (unconcerned) | 40.0 | B-2 (unconcerned) | 10.0 | E-5 (160 ppm) | 50.0 | | |
| Polymer 18 | A-1 (unconcerned) | 50.0 | B-4 (unconcerned) | 10.0 | E-1 (90 ppm) | 40.0 | | |
| Polymer 19 | A-1 (unconcerned) | 40.0 | B-5 (unconcerned) | 10.0 | E-1 (90 ppm) | 50.0 | | |
| Polymer 20 | A-1 (unconcerned) | 30.0 | B-5 (unconcerned) | 10.0 | E-4 (180 ppm) | 60.0 | | |
| Polymer 21 | A-2 (unconcerned) | 70.0 | E-1 (90 ppm) | 30.0 | | | | |
| Polymer 22 | A-1 (unconcerned) | 66.0 | B-2 (unconcerned) | 9.0 | E-1 (90 ppm) | 21.5 | P-1 (unconcerned) | 3.5 |
| Polymer 23 | A-1 (unconcerned) | 66.0 | B-2 (unconcerned) | 9.0 | E-1 (90 ppm) | 21.5 | P-2 (unconcerned) | 3.5 |
| Polymer 24 | A-1 (unconcerned) | 66.0 | B-2 (unconcerned) | 9.0 | E-1 (90 ppm) | 21.5 | P-3 (unconcerned) | 3.5 |
| Polymer 25 | A-1 (unconcerned) | 66.0 | B-2 (unconcerned) | 9.0 | E-1 (90 ppm) | 21.5 | P-4 (unconcerned) | 3.5 |
| Polymer 26 | A-1 (unconcerned) | 66.0 | B-2 (unconcerned) | 9.0 | E-1 (90 ppm) | 21.5 | P-5 (unconcerned) | 3.5 |
| Polymer 27 | A-1 (unconcerned) | 66.0 | B-2 (unconcerned) | 9.0 | E-1 (90 ppm) | 21.5 | P-6 (unconcerned) | 3.5 |
| Polymer 28 | A-2 (unconcerned) | 66.5 | E-1 (90 ppm) | 30.0 | P-1 (unconcerned) | 3.5 | | |
| Polymer 29 | A-1 (unconcerned) | 80.0 | B-1 (unconcerned) | 10.0 | B-3 (280 ppm) | 10.0 | | |
| Polymer 30 | A-1 (160 ppm) | 58.0 | B-2 (220 ppm) | 10.0 | C-1 (110 ppm) | 20.0 | P-5 (120 ppm) | 12.0 |
| Polymer 31 | A-1 (160 ppm) | 66.0 | B-2 (220 ppm) | 9.0 | E-1 (90 ppm) | 21.5 | P-1 (130 ppm) | 3.5 |
| Polymer 32 | A-1 (160 ppm) | 80.0 | B-1 (210 ppm) | 10.0 | B-3 (280 ppm) | 10.0 | | |

TABLE 1-3

| | Unit 1 (residual oligomer) | Introduction ratio (mol %) | Unit 2 (residual oligomer) | Introduction ratio (mol %) | Unit 3 (residual oligomer) | Introduction ratio (mol %) | Unit 4 (residual oligomer) | Introduction ratio (mol %) |
|---|---|---|---|---|---|---|---|---|
| Comparative polymer-1 | A-1 (unconcerned) | 58.0 | B-2 (unconcerned) | 10.0 | C-1 (1600 ppm) | 20.0 | P-5 (unconcerned) | 12.0 |
| Comparative polymer-2 | A-1 (1650 ppm) | 58.0 | B-2 (1700 ppm) | 10.0 | C-1 (1600 ppm) | 20.0 | P-5 (1600 ppm) | 12.0 |
| Comparative polymer-3 | A-1 (unconcerned) | 66.0 | B-2 (unconcerned) | 9.0 | E-1 (1700 ppm) | 21.5 | P-1 (unconcerned) | 3.5 |
| Comparative polymer-4 | A-1 (1650 ppm) | 66.0 | B-2 (1700 ppm) | 9.0 | E-1 (1700 ppm) | 21.5 | P-1 (1540 ppm) | 3.5 |
| Comparative polymer-5 | A-1 (1650 ppm) | 80.0 | B-1 (1750 ppm) | 10.0 | B-3 (1800 ppm) | 10.0 | | |

TABLE 2
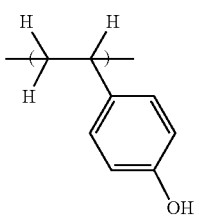 A-1
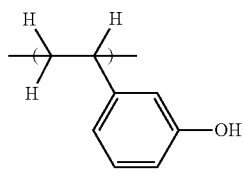 A-2
(Monomers (5), (6) described above were used as the polymerizable monomers to obtain A-1.)
TABLE 3
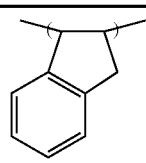 B-1
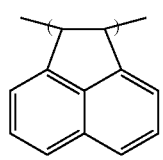 B-2
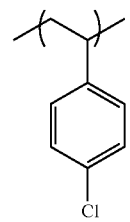 B-3
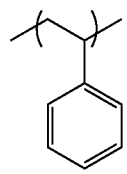 B-4
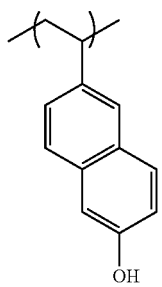 B-5
(Monomers (9), (10) described above were used as the polymerizable monomers to obtain B-3.)
TABLE 4
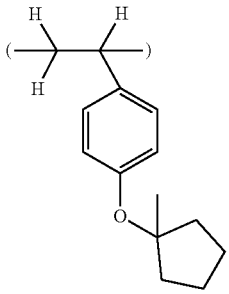 [SMILES: CCC(C)c1ccc(OC2(C)CCCC2)cc1] C-1
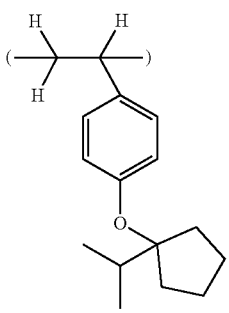 [SMILES: CCC(C)c1ccc(OC2(C(C)C)CCCC2)cc1] C-2
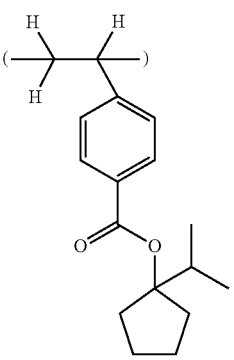 [SMILES: CCC(C)c1ccc(C(=O)OC2(C(C)C)CCCC2)cc1] C-3
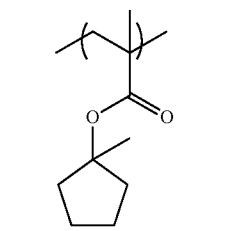 C-4
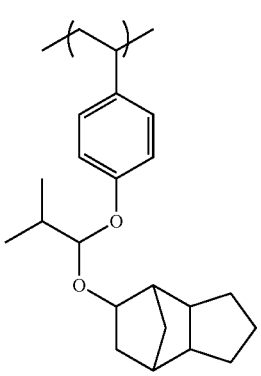 C-5

TABLE 4-continued
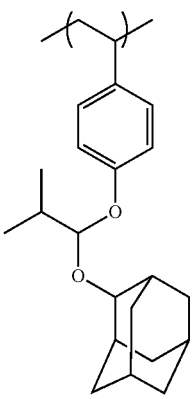
C-6
(Monomers (3), (4) described above were used as the polymerizable monomers to obtain C-1.)
TABLE 5
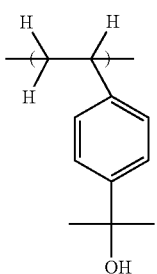
E-1
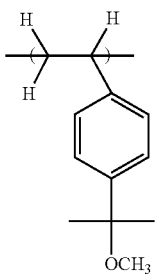
E-2
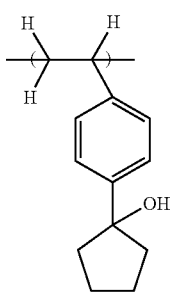 [SMILES: CCC(C)c1ccc(C2(O)CCCC2)cc1]
E-3
TABLE 5-continued
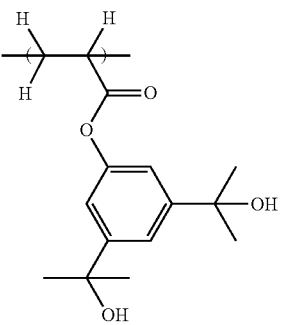 [SMILES: CCC(C)C(=O)Oc1cc(C(C)(C)O)cc(C(C)(C)O)c1]
E-4
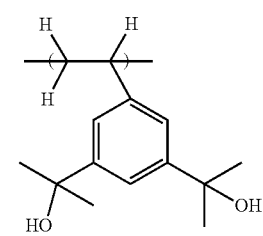 [SMILES: CCC(C)c1cc(C(C)(C)O)cc(C(C)(C)O)c1]
E-5
(Monomers (1), (2) described above were used as the polymerizable monomers to obtain E-1.)
TABLE 6
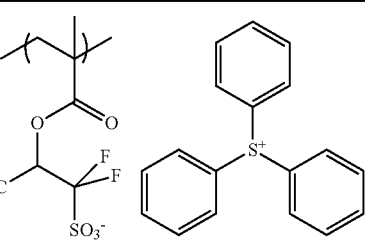
P-1
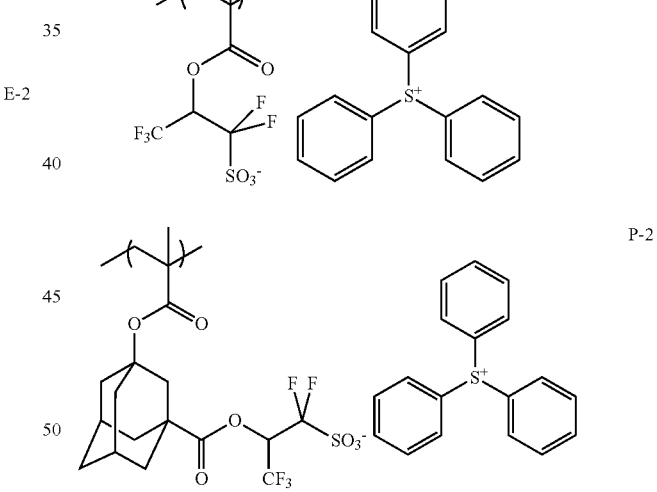
P-2
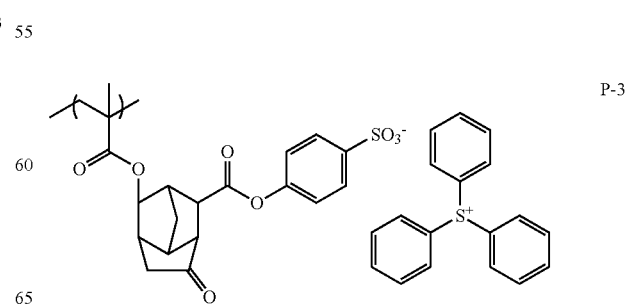
P-3

TABLE 6-continued

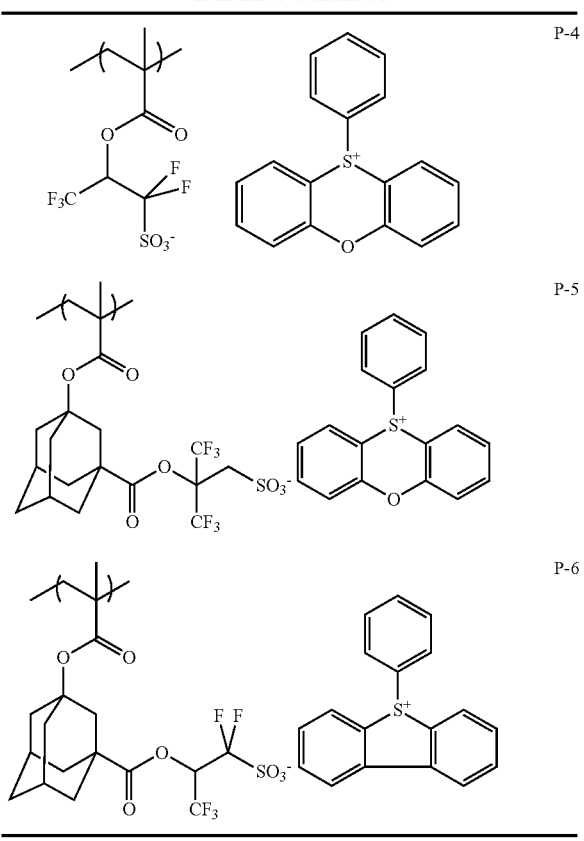

(Monomers (7), (8) described above were used as the polymerizable monomers to obtain P-1.)

Preparation of Resist Compositions

Examples 1-1 to 1-41, Comparative Examples 1-1 to 1-5

The polymers (Polymers 1 to 32, Comparative Polymers 1 to 5) synthesized in Synthesis Examples, acid generators (PAG-A to PAG-F), and acid diffusion regulators (Q-1 to Q-4) were dissolved in organic solvents according to compositions shown in Tables 7. Each of the obtained solutions was filtered through a 10-nm nylon filter and a 3-nm UPE filter. In this manner, resist compositions (R-1 to R-41, CR-1 to CR-5) were prepared.

As the organic solvent of the resist compositions prepared in Examples 1-1 to 1-41 and Comparative Examples 1-1 to 1-5 according to Tables 7-1 to 7-3, a mixed solvent was used which contained 1,204 parts by mass of PGMEA, 1,204 parts by mass of ethyl lactate (EL), and 1,606 parts by mass of propylene glycol monomethyl ether (PGME). In addition, a fluorine-containing polymer (D) (Polymer D1 or D2) as an additive and tetramethoxymethylglycoluril (TMGU) as a crosslinking agent were also added to some of the compositions. Further, PF-636 (manufactured by OMNOVA SOLUTIONS Inc.) was added as a surfactant to some compositions.

Note that the structures of Q-1 to -4, PAG-A to PAG-F, and the polymers D1 to D2 are as follows.

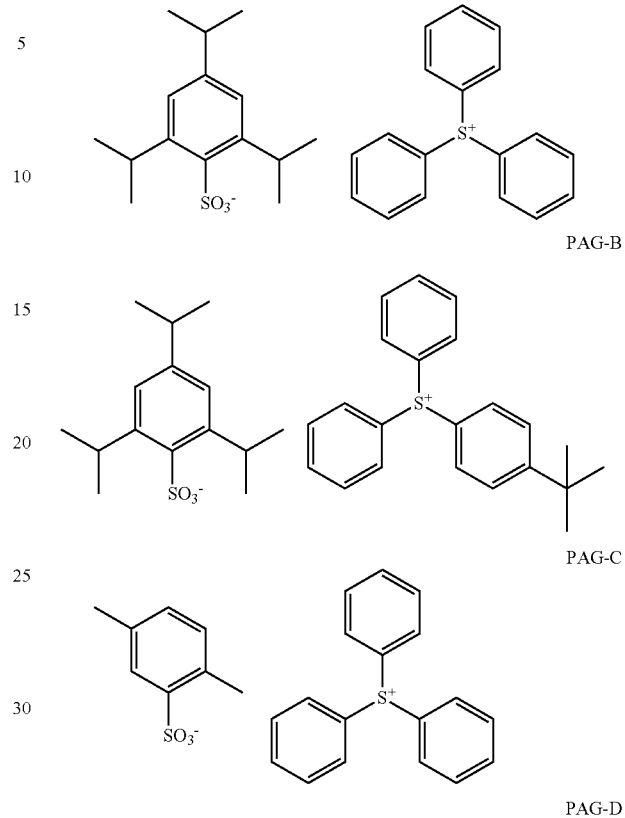

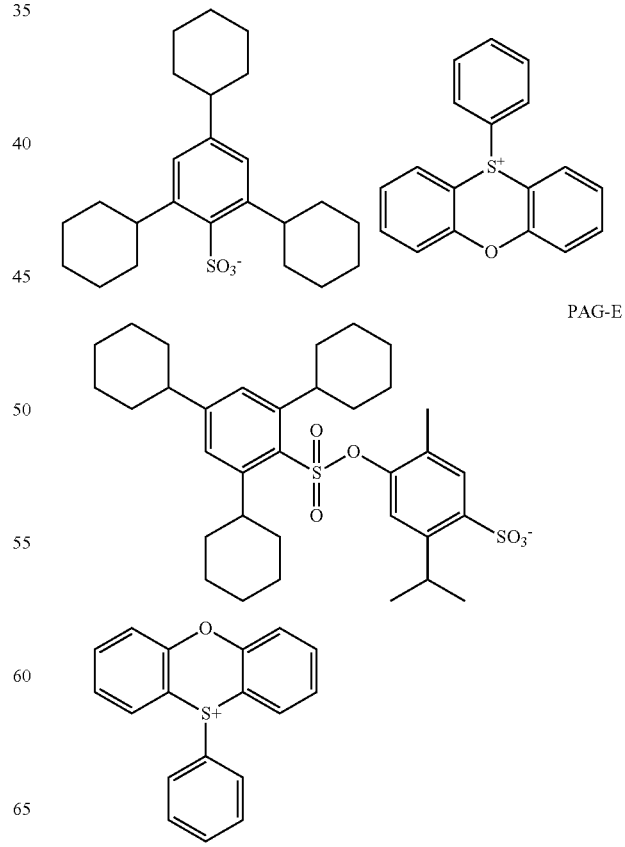

PAG-F
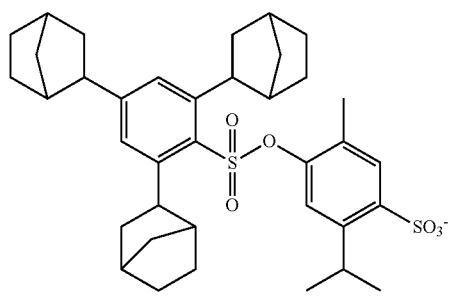

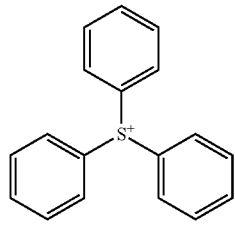
Q-1

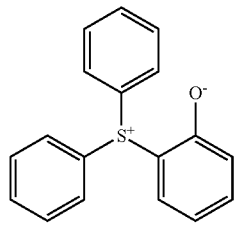
Q-2

Q-3
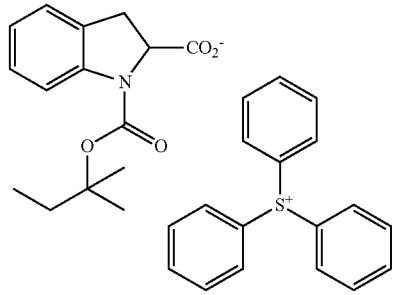

Q-4
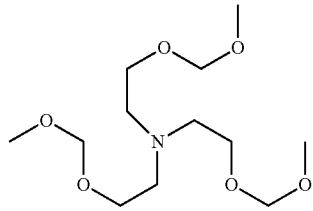

Polymer D1
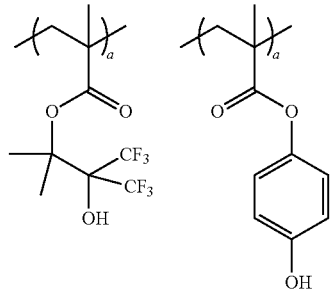
(a = 0.80, b = 0.20, Mw = 6,000)

Polymer D2
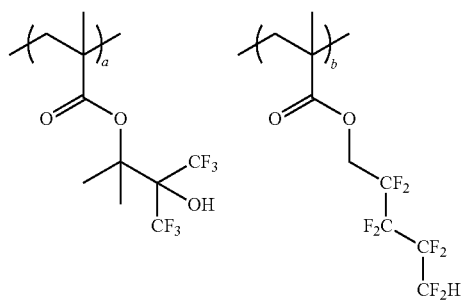
(a = 0.80, b = 0.20, Mw = 8,200)

TABLE 7-1

| Resist composition | Resin 1 (parts by mass) | Resin 2 (parts by mass) | Acid generator (parts by mass) | Acid diffusion regulator (parts by mass) | Cross-linking agent (parts by mass) | Additive (parts by mass) | Surfactant (parts by mass) |
|---|---|---|---|---|---|---|---|
| Example 1-1 | R-1 | Polymer 1 (80) | | PAG-B (2) PAG-E (8) | Q-1 (6.0) | | Polymer D1 (3) | |
| Example 1-2 | R-2 | Polymer 2 (80) | | PAG-B (2) PAG-E (8) | Q-1 (6.0) | | Polymer D1 (3) | |
| Example 1-3 | R-3 | Polymer 3 (80) | | PAG-B (2) PAG-E (8) | Q-1 (6.0) | | Polymer D1 (3) | |

TABLE 7-1-continued

| | Resist composition | Resin 1 (parts by mass) | Resin 2 (parts by mass) | Acid generator (parts by mass) | Acid diffusion regulator (parts by mass) | Cross-linking agent (parts by mass) | Additive (parts by mass) | Surfactant (parts by mass) |
|---|---|---|---|---|---|---|---|---|
| Example 1-4 | R-4 | Polymer 4 (80) | | PAG-B (2) PAG-E (8) | Q-1 (6.0) | | Polymer D1 (3) | |
| Example 1-5 | R-5 | Polymer 5 (80) | | PAG-B (2) PAG-E (8) | Q-1 (6.0) | | Polymer D1 (3) | |
| Example 1-6 | R-6 | Polymer 6 (80) | | PAG-B (2) PAG-E (8) | Q-1 (6.0) | | Polymer D1 (3) | |
| Example 1-7 | R-7 | Polymer 7 (80) | | PAG-B (2) PAG-E (8) | Q-1 (6.0) | | Polymer D1 (3) | |
| Example 1-8 | R-8 | Polymer 8 (80) | | PAG-A (3) PAG-B (2) | Q-1 (6.0) | | Polymer D1 (3) | |
| Example 1-9 | R-9 | Polymer 9 (80) | | PAG-A (3) PAG-B (2) | Q-1 (6.0) | | Polymer D1 (3) | |
| Example 1-10 | R-10 | Polymer 10 (80) | | PAG-A (3) PAG-B (2) | Q-1 (6.0) | | Polymer D1 (3) | |
| Example 1-11 | R-11 | Polymer 11 (80) | | PAG-A (3) PAG-B (2) | Q-1 (6.0) | | Polymer D1 (3) | |
| Example 1-12 | R-12 | Polymer 12 (80) | | PAG-A (3) PAG-B (2) | Q-1 (6.0) | | Polymer D1 (3) | |
| Example 1-13 | R-13 | Polymer 1 (40) | Polymer 12 (40) | PAG-A (3) PAG-B (2) | Q-1 (6.0) | | Polymer D1 (3) | |
| Example 1-14 | R-14 | Polymer 4 (40) | Polymer 9 (40) | PAG-A (3) PAG-B (2) | Q-1 (6.0) | | Polymer D1 (3) | |
| Example 1-15 | R-15 | Polymer 30 (80) | | PAG-A (3) PAG-B (2) | Q-1 (6.0) | | Polymer D1 (3) | |
| Example 1-16 | R-16 | Polymer 13 (80) | | PAG-A (10) | Q-4 (1.3) | | | PF-636 (0.075) |
| Example 1-17 | R-17 | Polymer 22 (80) | | PAG-A (7) | Q-3 (5.0) | | | |
| Example 1-18 | R-18 | Polymer 13 (40) | Polymer 22 (40) | PAG-A (5) | Q-4 (1.7) | | | |
| Example 1-19 | R-19 | Polymer 13 (40) | Polymer 22 (40) | PAG-A (5) PAG-B (2) | Q-3 (11.0) | | Polymer D1 (3) | |
| Example 1-20 | R-20 | Polymer 13 (40) | Polymer 22 (40) | PAG-D (7) | Q-2 (5.0) | | | |

TABLE 7-2

| | Resist composition | Resin 1 (parts by mass) | Resin 2 (parts by mass) | Acid generator (parts by mass) | Acid diffusion regulator (parts by mass) | Cross-linking agent (parts by mass) | Additive (parts by mass) | Surfactant (parts by mass) |
|---|---|---|---|---|---|---|---|---|
| Example 1-21 | R-21 | Polymer 13 (40) | Polymer 22 (40) | PAG-D (7) | Q-1 (3.0) | TMGU (2.0) | Polymer D1 (3) | |
| Example 1-22 | R-22 | Polymer 13 (40) | Polymer 22 (40) | PAG-E (7) | Q-2 (10.0) | | Polymer D1 (3) | |
| Example 1-23 | R-23 | Polymer 13 (40) | Polymer 22 (40) | PAG-F (9) | Q-3 (14.0) | | Polymer D1 (3) | |
| Example 1-24 | R-24 | Polymer 13 (40) | Polymer 22 (40) | PAG-A (5) PAG-B (2) | Q-3 (11.0) | | Polymer D2 (3) | |
| Example 1-25 | R-25 | Polymer 14 (40) | Polymer 22 (40) | PAG-A (5) PAG-B (2) | Q-3 (11.0) | | Polymer D1 (3) | |
| Example 1-26 | R-26 | Polymer 15 (40) | Polymer 22 (40) | PAG-A (5) PAG-B (2) | Q-3 (11.0) | | Polymer D1 (3) | |
| Example 1-27 | R-27 | Polymer 16 (40) | Polymer 22 (40) | PAG-A (5) PAG-B (2) | Q-3 (11.0) | | Polymer D1 (3) | |
| Example 1-28 | R-28 | Polymer 17 (40) | Polymer 22 (40) | PAG-A (5) PAG-B (2) | Q-3 (11.0) | | Polymer D1 (3) | |
| Example 1-29 | R-29 | Polymer 18 (40) | Polymer 22 (40) | PAG-A (5) PAG-B (2) | Q-3 (11.0) | | Polymer D1 (3) | |
| Example 1-30 | R-30 | Polymer 19 (40) | Polymer 22 (40) | PAG-A (5) PAG-B (2) | Q-3 (11.0) | | Polymer D1 (3) | |
| Example 1-31 | R-31 | Polymer 20 (40) | Polymer 22 (40) | PAG-A (5) PAG-B (2) | Q-3 (11.0) | | Polymer D1 (3) | |
| Example 1-32 | R-32 | Polymer 21 (40) | Polymer 22 (40) | PAG-A (5) PAG-B (2) | Q-3 (11.0) | | Polymer D1 (3) | |
| Example 1-33 | R-33 | Polymer 13 (40) | Polymer 23 (40) | PAG-A (5) PAG-B (2) | Q-3 (11.0) | | Polymer D1 (3) | |

TABLE 7-2-continued

| | Resist composition | Resin 1 (parts by mass) | Resin 2 (parts by mass) | Acid generator (parts by mass) | Acid diffusion regulator (parts by mass) | Cross-linking agent (parts by mass) | Additive (parts by mass) | Surfactant (parts by mass) |
|---|---|---|---|---|---|---|---|---|
| Example 1-34 | R-34 | Polymer 13 (40) | Polymer 24 (40) | PAG-A (5) PAG-B (2) | Q-3 (11.0) | | Polymer D1 (3) | |
| Example 1-35 | R-35 | Polymer 13 (40) | Polymer 25 (40) | PAG-A (5) PAG-B (2) | Q-3 (11.0) | | Polymer D1 (3) | |
| Example 1-36 | R-36 | Polymer 13 (40) | Polymer 26 (40) | PAG-A (5) PAG-B (2) | Q-3 (11.0) | | Polymer D1 (3) | |
| Example 1-37 | R-37 | Polymer 13 (40) | Polymer 27 (40) | PAG-A (5) PAG-B (2) | Q-3 (11.0) | | Polymer D1 (3) | |
| Example 1-38 | R-38 | Polymer 13 (40) | Polymer 28 (40) | PAG-A (5) PAG-B (2) | Q-3 (11.0) | | Polymer D1 (3) | |
| Example 1-39 | R-39 | Polymer 29 (80) | | PAG-A (2) PAG-C (8) | Q-4 (1.0) | TMGU (8.2) | | PF-636 (0.075) |
| Example 1-40 | R-40 | Polymer 31 (80) | | PAG-A (7) | Q-3 (5.0) | | | |
| Example 1-41 | R-41 | Polymer 32 (80) | | PAG-A (2) PAG-C (8) | Q-4 (1.0) | TMGU (8.2) | | PF-636 (0.075) |

TABLE 7-3

| | Resist composition | Resin 1 (parts by mass) | Resin 2 (parts by mass) | Acid generator (parts by mass) | Acid diffusion regulator (parts by mass) | Cross-linking agent (parts by mass) | Additive (parts by mass) | Surfactant (parts by mass) |
|---|---|---|---|---|---|---|---|---|
| Comparative Example 1-1 | CR-1 | Comparative Polymer 1 (80) | | PAG-A (3) PAG-B (2) | Q-1 (6.0) | | Polymer D1 (3) | |
| Comparative Example 1-2 | CR-2 | Comparative Polymer 2 (80) | | PAG-A (3) PAG-B (2) | Q-1 (6.0) | | Polymer D1 (3) | |
| Comparative Example 1-3 | CR-3 | Comparative Polymer 3 (80) | | PAG-A (7) | Q-3 (5.0) | | | |
| Comparative Example 1-4 | CR-4 | Comparative Polymer 4 (80) | | PAG-A (7) | Q-3 (5.0) | | | |
| Comparative Example 1-5 | CR-5 | Comparative Polymer 5 (80) | | PAG-A (2) PAG-C (8) | Q-4 (1.0) | TMGU (8.2) | | PF-636 (0.075) |

<Development Residue Evaluation>

The prepared resist compositions (R-1 to R-41, CR-1 to CR-5) were spin-coated onto mask blanks by using ACT-M (manufactured by Tokyo Electron Limited). Each mask blank had a 152-mm-squared top surface which had been vapor primed with hexamethyldisilazane (HMDS) to have a silicon oxide film. The resultant was prebaked on a hot plate at 110° C. for 600 seconds to prepare a resist film with a film thickness of 80 nm. The thickness of the obtained resist film was measured by using an optical measuring apparatus Nanospec (manufactured by Nanometrics Inc.). The film thickness was measured on 81 points of the blank substrate plane except for a peripheral portion within 10 mm inwardly from the periphery of the blank substrate to calculate the average film thickness value and the ranges of the film thickness.

The resist compositions (R-16 to R-41, CR-3 to CR-5) were baked at 120° C. for 600 seconds without drawing, followed by development with a 2.38 mass % aqueous solution of tetramethylammonium hydroxide, and development residue evaluation with a mask defect inspection apparatus (M9650 manufactured by Lasertec Corporation).

Moreover, the resist compositions (R-1 to R-15, CR-1 to CR-2) were subjected to: drawing on the entire surfaces with an electron beam exposure apparatus (EBM-5000plus manufactured by NuFlare Technology Inc., accelerating voltage: 50 keV); PEB at 120° C. for 600 seconds; and development with a 2.38 mass % TMAH aqueous solution. Then, development residue was evaluated with a mask defect inspection apparatus (M9650 manufactured by Lasertec Corporation). Table 8 shows the total number of detects after the development.

TABLE 8

| | Total number of detects after development |
|---|---|
| Example 1-1 | 370 |
| Example 1-2 | 380 |
| Example 1-3 | 390 |
| Example 1-4 | 380 |
| Example 1-5 | 370 |
| Example 1-6 | 380 |
| Example 1-7 | 360 |
| Example 1-8 | 360 |

TABLE 8-continued

| | Total number of detects after development |
|---|---|
| Example 1-9 | 370 |
| Example 1-10 | 380 |
| Example 1-11 | 370 |
| Example 1-12 | 360 |
| Example 1-13 | 350 |
| Example 1-14 | 340 |
| Example 1-15 | 170 |
| Example 1-16 | 350 |
| Example 1-17 | 360 |
| Example 1-18 | 380 |
| Example 1-19 | 370 |
| Example 1-20 | 360 |
| Example 1-21 | 340 |
| Example 1-22 | 360 |
| Example 1-23 | 380 |
| Example 1-24 | 390 |
| Example 1-25 | 340 |
| Example 1-26 | 380 |
| Example 1-27 | 360 |
| Example 1-28 | 340 |
| Example 1-29 | 350 |
| Example 1-30 | 340 |
| Example 1-31 | 360 |
| Example 1-32 | 350 |
| Example 1-33 | 360 |
| Example 1-34 | 380 |
| Example 1-35 | 390 |
| Example 1-36 | 370 |
| Example 1-37 | 360 |
| Example 1-38 | 380 |
| Example 1-39 | 390 |
| Example 1-40 | 160 |
| Example 1-41 | 180 |
| Comparative Example 1-1 | 2100 |
| Comparative Example 1-2 | 2900 |
| Comparative Example 1-3 | 3700 |
| Comparative Example 1-4 | 4500 |
| Comparative Example 1-5 | 3400 |

As apparent from the result in Table 8, the inventive chemically amplified resist compositions containing a polymer which is polymerized from the polymerizable monomer with reduced residual oligomer content are capable of greatly reducing the number of defects due to development residue in comparison with the conventional resist compositions.

Furthermore, the resist compositions (R-1 to R-41, CR-1 to CR-5) were spin-coated onto mask blanks by using ACT-M (manufactured by Tokyo Electron Limited) in the same manner as described above. Each mask blank had a 152-mm-squared top surface which had been vapor primed with hexamethyldisilazane (HMDS) to have a silicon oxide film. The resultant was prebaked on a hot plate at 110° C. for 600 seconds to prepare a resist film with a film thickness of 80 nm. The film was subjected to exposure with an electron beam exposure apparatus (EBM-5000plus manufactured by NuFlare Technology Inc., accelerating voltage: 50 kV); PEB at 110° C. for 600 seconds; and development with a 2.38 mass % TMAH aqueous solution. Thus, negative and positive patterns were obtained.

The obtained resist patterns were evaluated as follows. Each of the prepared patterned mask blanks was observed with a top-down SEM (scanning electron microscope). The exposure dose for resolving 200-nm 1:1 line and space (LS) by 1:1 was defined as an optimal exposure dose ($\mu C/cm^2$). The minimum dimension at the exposure dose for resolving 200-nm LS by 1:1 was defined as resolution (limiting resolution). As a result, all the resists exhibited high resolution performances of 60 nm or less in the 1:1 line and space (LS).

The use of the inventive chemically amplified resist compositions makes it possible to suppress residues after development which otherwise cause mask defect. In addition, the method for forming a resist pattern by using such composition is useful in manufacturing semiconductor devices, particularly in photolithography for photomask blank processing.

It should be noted that the present invention is not limited to the above-described embodiments. The embodiments are just examples, and any embodiments that substantially have the same feature and demonstrate the same functions and effects as those in the technical concept disclosed in claims of the present invention are included in the technical scope of the present invention.

The invention claimed is:
1. A chemically amplified negative resist composition comprising
(A) a polymer compound comprising a repeating unit A2 shown by the following general formula (A2), wherein the repeating unit A2 is polymerized from a polymerizable monomer with not more than 1000 ppm of a residual oligomer in a form of dimer to hexamer,

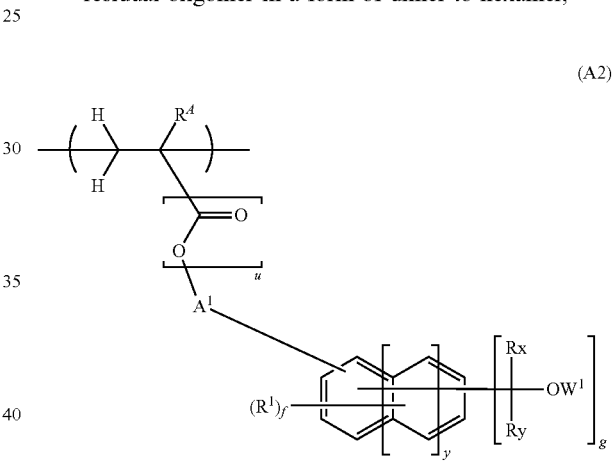

$R^A$ represents a hydrogen atom, a fluorine atom, a methyl group, or a trifluoromethyl group; $A^1$ represents a single bond, or a saturated hydrocarbylene group having 1 to 10 carbon atoms, and —$CH_2$— constituting the saturated hydrocarbylene group is optionally substituted with —O—; each $R^1$ independently represents a halogen atom, a saturated hydrocarbylcarbonyloxy group having 2 to 8 carbon atoms optionally substituted with a halogen atom, a saturated hydrocarbyl group having 1 to 6 carbon atoms optionally substituted with a halogen atom, or a saturated hydrocarbyloxy group having 1 to 6 carbon atoms optionally substituted with a halogen atom; $W^1$ represents a hydrogen atom, an aliphatic hydrocarbyl group having 1 to 10 carbon atoms, or an aryl group optionally having a substituent, and —$CH_2$— constituting the aliphatic hydrocarbyl group is optionally substituted with —O—, —C(=O)—, —O—C(=O)—, or —C(=O)—O—; Rx and Ry each independently represent a hydrogen atom, a saturated hydrocarbyl group having 1 to 15 carbon atoms optionally substituted with a hydroxy group or a saturated hydrocarbyloxy group, or an aryl group optionally having a substituent, provided that Rx and Ry do not represent hydrogen atoms simultaneously, or Rx and Ry are optionally bonded to each other to form a ring together with a carbon atom bonded therewith;

"y" represents an integer of 0 to 2; "u" represents 0 or 1; "f" represents an integer satisfying 0≤f≤5+2y−g; and "g" represents an integer of 1 to 3.

2. The chemically amplified negative resist composition according to claim 1, wherein
the component (A) is a polymer compound comprising a repeating unit A3 shown by the following general formula (A3),

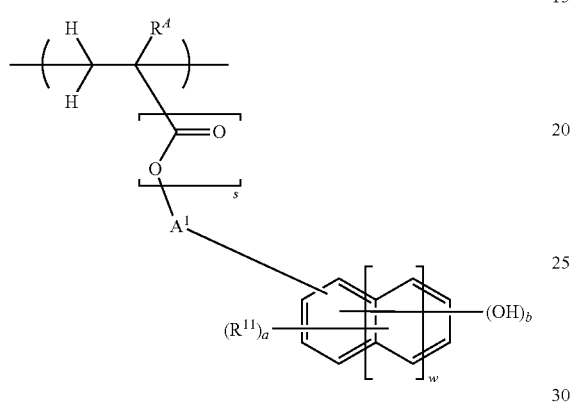

wherein $R^A$ represents a hydrogen atom, a fluorine atom, a methyl group, or a trifluoromethyl group; each $R^{11}$ independently represents a halogen atom, a saturated hydrocarbylcarbonyloxy group having 2 to 8 carbon atoms optionally substituted with a halogen atom, a saturated hydrocarbyl group having 1 to 6 carbon atoms optionally substituted with a halogen atom, or a saturated hydrocarbyloxy group having 1 to 6 carbon atoms optionally substituted with a halogen atom; $A^1$ represents a single bond or a saturated hydrocarbylene group having 1 to 10 carbon atoms, and —CH$_2$— constituting the saturated hydrocarbylene group is optionally substituted with —O—; "s" represents 0 or 1; "w" represents an integer of 0 to 2; "a" represents an integer satisfying 0≤a≤5+2w−b; and "b" represents an integer of 1 to 3.

3. The chemically amplified negative resist composition according to claim 1, wherein the component (A) is a polymer compound comprising at least one selected from repeating units A4 to A11 shown by the following general formulae (A4) to (A11), (A4)

(A5)

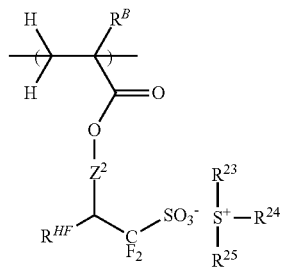

(A6)

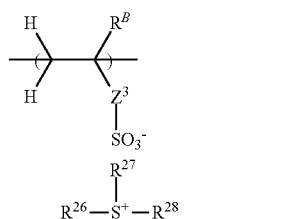

(A7)

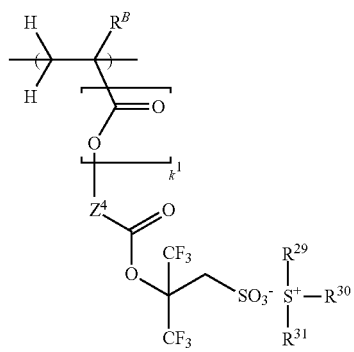

(A8)

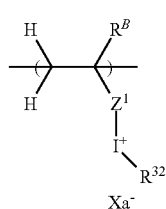

(A9)

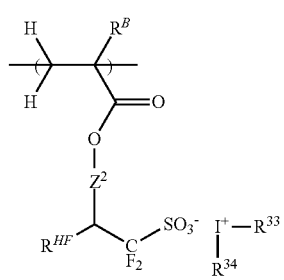

(A10)

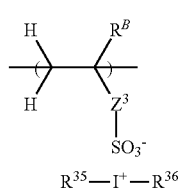

-continued

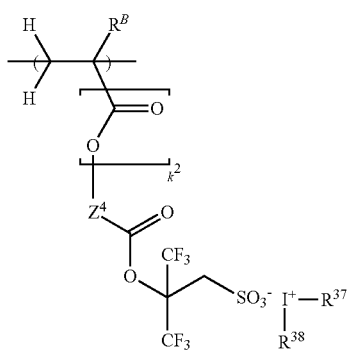
(A11)

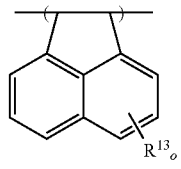
(A12)

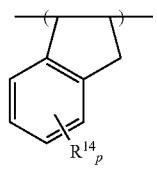
(A13)

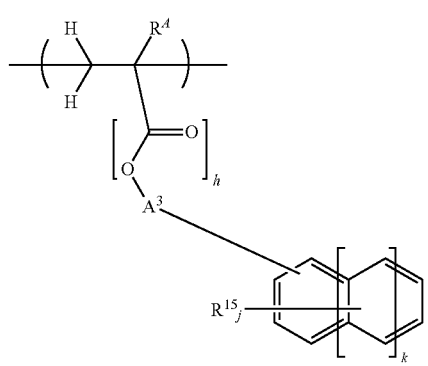
(A14)

wherein each $R^B$ independently represents a hydrogen atom or a methyl group; $Z^1$ represents a single bond, an aliphatic hydrocarbylene group having 1 to 6 carbon atoms, a phenylene group, a naphthylene group, or a group having 7 to 18 carbon atoms obtained from a combination thereof, —O—$Z^{11}$—, —C(=O)—O—$Z^{11}$—, or —C(=O)—NH—$Z^{11}$—; $Z^{11}$ represents an aliphatic hydrocarbylene group having 1 to 6 carbon atoms, a phenylene group, a naphthylene group, or a group having 7 to 18 carbon atoms obtained from a combination thereof, and optionally contains a carbonyl group, an ester bond, an ether bond, or a hydroxy group; $Z^2$ represents a single bond or —$Z^{21}$—C(=O)—O—; $Z^{21}$ represents a hydrocarbylene group having 1 to 20 carbon atoms optionally containing a heteroatom; $Z^3$ represents a single bond, a methylene group, an ethylene group, a phenylene group, a fluorinated phenylene group, a trifluoromethyl group-substituted phenylene group, —O—$Z^{31}$—, —C(=O)—O—$Z^{31}$—, or —C(=O)—NH—$Z^{31}$—; $Z^{31}$ represents an aliphatic hydrocarbylene group having 1 to 6 carbon atoms, a phenylene group, a fluorinated phenylene group, a trifluoromethyl group-substituted phenylene group, or a group having 7 to 20 carbon atoms obtained from a combination thereof, and optionally contains a carbonyl group, an ester bond, an ether bond, or a hydroxy group; $Z^4$ represents a single bond, or a hydrocarbylene group having 1 to 30 carbon atoms optionally containing a heteroatom; $k^1$ and $k^2$ each independently represent 0 or 1, but $k^1$ and $k^2$ each represent 0 when Z is a single bond; $R^{21}$ to $R^{38}$ each independently represent a hydrocarbyl group having 1 to 20 carbon atoms optionally containing a heteroatom; $R^{21}$ and $R^{22}$ are optionally bonded to each other to form a ring together with a sulfur atom bonded therewith; $R^{23}$ and $R^{24}$, $R^{26}$ and $R^{27}$, or $R^{29}$ and $R^{30}$, are optionally bonded to each other to form a ring together with a sulfur atom bonded therewith; $R^{HF}$ represents a hydrogen atom or a trifluoromethyl group; and Xa represents a non-nucleophilic counter ion.

4. The chemically amplified negative resist composition according to claim 1, wherein
the component (A) is a polymer compound comprising at least one repeating units A12 to A14 shown by the following general formulae (A12), (A13), and (A14), wherein $R^A$ represents a hydrogen atom, a fluorine atom, a methyl group, or a trifluoromethyl group; $R^{13}$ and $R^{14}$ each independently represent a hydroxy group, a halogen atom, an acetoxy group, a linear, branched, or cyclic acyloxy group having 2 to 8 carbon atoms optionally substituted with a halogen atom, a linear, branched, or cyclic alkyl group having 1 to 8 carbon atoms optionally substituted with a halogen atom, a linear, branched, or cyclic alkoxy group having 1 to 8 carbon atoms optionally substituted with a halogen atom, or a linear, branched, or cyclic alkylcarbonyloxy group having 2 to 8 carbon atoms optionally substituted with a halogen atom; $R^{15}$ represents an acetyl group, an acetoxy group, a linear, branched, or cyclic alkyl group having 1 to 20 carbon atoms, a linear, branched, or cyclic alkoxy group having 1 to 20 carbon atoms, a linear, branched, or cyclic acyloxy group having 2 to 20 carbon atoms, a linear, branched, or cyclic alkoxyalkyl group having 2 to 20 carbon atoms, an alkylthioalkyl group having 2 to 20 carbon atoms, a halogen atom, a nitro group, a cyano group, a sulfinyl group, or a sulfonyl group; $A^5$ represents a single bond, or a linear, branched, or cyclic alkylene group having 1 to 10 carbon atoms, and optionally has an ether bond in a carbon-carbon bond; "o" and "p" each independently represent an integer of 0 to 4; "h" represents an integer of 0 or 1; "j" represents an integer of 0 to 5; and "k" represents an integer of 0 to 2.

5. The chemically amplified negative resist composition according to claim 1, wherein
the chemically amplified resist composition is a chemically-amplified negative resist composition, and
the component (A) is a polymer compound comprising the repeating unit A2 shown by the general formula (A2) and a repeating unit A3 shown by the following general formula (A3), but no repeating units A4 to A11 shown by the following general formulae (A4) to (A11), (A3)

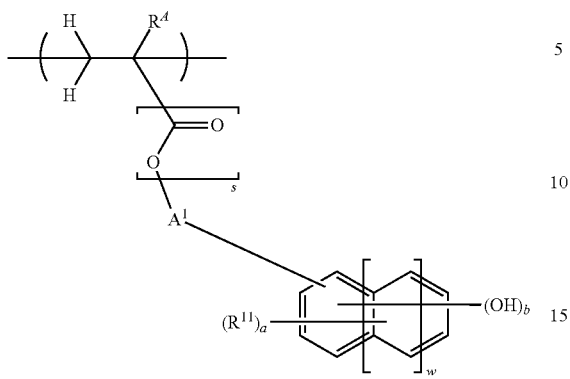

wherein $R^A$ represents a hydrogen atom, a fluorine atom, a methyl group, or a trifluoromethyl group; each $R^{11}$ independently represents a halogen atom, a saturated hydrocarbylcarbonyloxy group having 2 to 8 carbon atoms optionally substituted with a halogen atom, a saturated hydrocarbyl group having 1 to 6 carbon atoms optionally substituted with a halogen atom, or a saturated hydrocarbyloxy group having 1 to 6 carbon atoms optionally substituted with a halogen atom; $A^1$ represents a single bond or a saturated hydrocarbylene group having 1 to 10 carbon atoms, and —CH$_2$— constituting the saturated hydrocarbylene group is optionally substituted with —O—; "s" represents 0 or 1; "w" represents an integer of 0 to 2; "a" represents an integer satisfying 0≤a≤5+2w−b; and "b" represents an integer of 1 to 3, and (A4)

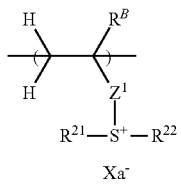

(A5)

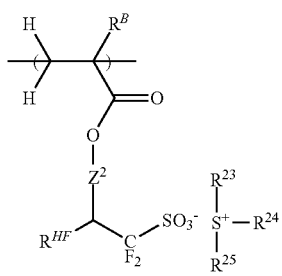

(A6)

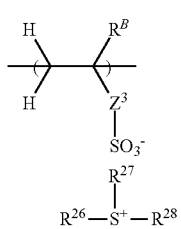

(A7)

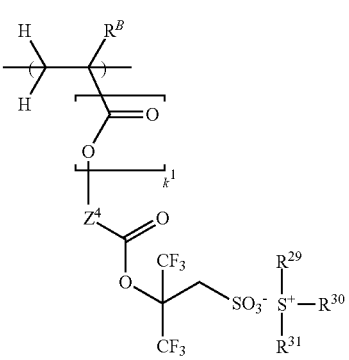

(A8)

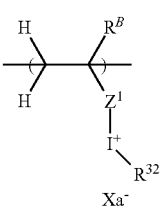

(A9)

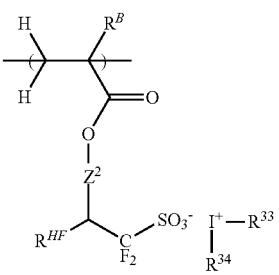

(A10)

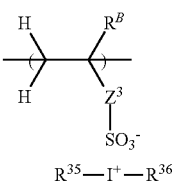

(A11)

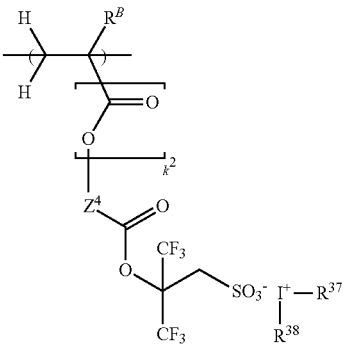

wherein each $R^B$ independently represents a hydrogen atom or a methyl group; $Z^1$ represents a single bond, an aliphatic hydrocarbylene group having 1 to 6 carbon atoms, a phenylene group, a naphthylene group, or a group having 7 to 18 carbon atoms obtained from a combination thereof, —O—$Z^{11}$—, —C(=O)—O—$Z^{11}$—, or —C(=O)—NH—$Z^{11}$—; $Z^{11}$ represents an aliphatic hydrocarbylene group having 1 to 6 carbon atoms, a phenylene group, a naphthylene group, or a group having 7 to 18 carbon atoms obtained from a combination thereof, and optionally contains a carbonyl group, an ester bond, an ether bond, or a hydroxy group; $Z^2$ represents a single bond or —$Z^{21}$—C(=O)—O—; $Z^{21}$ represents a hydrocarbylene group having 1 to 20 carbon atoms optionally containing a heteroatom; Z' represents a single bond, a methylene group, an ethylene group, a phenylene group, a fluorinated phenylene group, a trifluoromethyl group-substituted phenylene group, —O—$Z^{31}$—, —C(=O)—O—$Z^{31}$—, or —C(=O)—NH—$Z^{31}$—; $Z^{11}$ represents an aliphatic hydrocarbylene group having 1 to 6 carbon atoms, a phenylene group, a fluorinated phenylene group, a trifluoromethyl group-substituted phenylene group, or a group having 7 to 20 carbon atoms obtained from a combination thereof, and optionally contains a carbonyl group, an ester bond, an ether bond, or a hydroxy group; $Z^4$ represents a single bond, or a hydrocarbylene group having 1 to 30 carbon atoms optionally containing a heteroatom; $k^1$ and $k^2$ each independently represent 0 or 1, but $k^1$ and $k^2$ each represent 0 when $Z^4$ is a single bond; $R^{21}$ to $R^{38}$ each independently represent a hydrocarbyl group having 1 to 20 carbon atoms optionally containing a heteroatom; $R^{21}$ and $R^{22}$ are optionally bonded to each other to form a ring together with a sulfur atom bonded therewith; $R^{23}$ and $R^{24}$, $R^{26}$ and $R^{27}$, or $R^{29}$ and $R^{30}$, are optionally bonded to each other to form a ring together with a sulfur atom bonded therewith; $R^{HF}$ represents a hydrogen atom or a trifluoromethyl group; and Xa⁻ represents a non-nucleophilic counter ion.

6. The chemically amplified negative resist composition according to claim 1, wherein
the component (A) is a polymer compound comprising:
one or both of a repeating unit shown by the following general formula (A2-1) and a repeating unit shown by the following general formula (A2-2);
a repeating unit shown by the following general formula (A3-1); and
a repeating unit shown by the following general formula (A5-1),

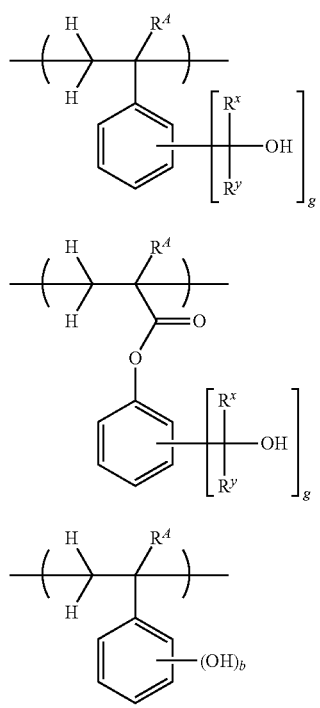

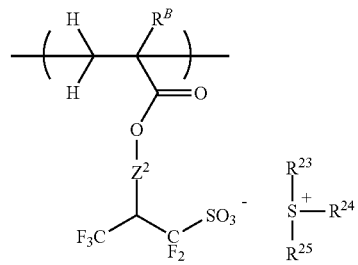

wherein $R^A$ represents a hydrogen atom, a fluorine atom, a methyl group, or a trifluoromethyl group; Rx and Ry each independently represent a hydrogen atom, a saturated hydrocarbyl group having 1 to 15 carbon atoms optionally substituted with a hydroxy group or a saturated hydrocarbyloxy group, or an aryl group optionally having a substituent, provided that Rx and Ry do not represent hydrogen atoms simultaneously, or Rx and Ry are optionally bonded to each other to form a ring together with a carbon atom bonded therewith; "g" represents an integer of 1 to 3; "b" represents an integer of 1 to 3; each $R^B$ independently represents a hydrogen atom or a methyl group; $Z^2$ represents a single bond or —$Z^{21}$—C(=O)—O—; $Z^{21}$ represents a hydrocarbylene group having 1 to 20 carbon atoms optionally containing a heteroatom; $R^{23}$ to $R^{25}$ each independently represent a hydrocarbyl group having 1 to 20 carbon atoms optionally containing a heteroatom; and $R^{25}$ and $R^{24}$ are optionally bonded to each other to form a ring together with a sulfur atom bonded therewith.

7. The chemically amplified negative resist composition according to claim 1, wherein
the polymer compound of the component (A) is a polymer from two or more kinds of polymerizable monomers, and
a total of 5000 ppm or less of residual oligomers in a form of dimer to hexamer are contained in all the polymerizable monomers.

8. The chemically amplified negative resist composition according to claim 1, further comprising (B) an acid generator.

9. A photomask blank comprising the chemically amplified negative resist composition according to claim 1 coated thereon.

10. A method for forming a resist pattern, comprising:
(1) a step of forming a resist film on a substrate by using the chemically amplified negative resist composition according to claim 1;
(2) a step of irradiating the resist film with a high-energy beam to form a pattern; and
(3) a step of developing the pattern-irradiated resist film by using an alkaline developer.

11. The method for forming a resist pattern according to claim 10, wherein the high-energy beam is an ArF excimer laser beam, a KrF excimer laser beam, an extreme ultraviolet ray, or an electron beam.

12. The method for forming a resist pattern according to claim 10, wherein the substrate has a top surface composed of a material containing at least one of chromium, silicon, tantalum, molybdenum, cobalt, nickel, tungsten, and tin.

13. A method for producing a polymer compound comprising one or two or more kinds of repeating units used in a chemically amplified negative resist composition, the method comprising polymerizing at least one kind of a polymerizable monomer with not more than 1000 ppm of a residual oligomer in a form of dimer to hexamer to obtain the polymer compound, wherein the at least one kind of repeating unit obtained from the polymerizable monomer with not more than 1000 ppm of a residual oligomer in a form of dimer to hexamer is a repeating unit A2 shown by the following general formula (A2),

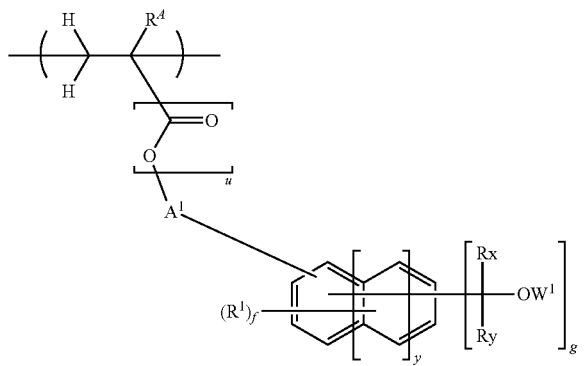

(A2)

wherein $R^A$ represents a hydrogen atom, a fluorine atom, a methyl group, or a trifluoromethyl group; $A^1$ represents a single bond, or a saturated hydrocarbylene group having 1 to 10 carbon atoms, and —$CH_2$— constituting the saturated hydrocarbylene group is optionally substituted with —O—; each $R^1$ independently represents a halogen atom, a saturated hydrocarbylcarbonyloxy group having 2 to 8 carbon atoms optionally substituted with a halogen atom, a saturated hydrocarbyl group having 1 to 6 carbon atoms optionally substituted with a halogen atom, or a saturated hydrocarbyloxy group having 1 to 6 carbon atoms optionally substituted with a halogen atom; $W^1$ represents a hydrogen atom, an aliphatic hydrocarbyl group having 1 to 10 carbon atoms, or an aryl group optionally having a substituent, and —$CH_2$— constituting the aliphatic hydrocarbyl group is optionally substituted with —O—, —C(=O)—, —O—C(=O)—, or —C(=O)—O—; Rx and Ry each independently represent a hydrogen atom, a saturated hydrocarbyl group having 1 to 15 carbon atoms optionally substituted with a hydroxy group or a saturated hydrocarbyloxy group, or an aryl group optionally having a substituent, provided that Rx and Ry do not represent hydrogen atoms simultaneously, or Rx and Ry are optionally bonded to each other to form a ring together with a carbon atom bonded therewith; "y" represents an integer of 0 to 2; "u" represents 0 or 1; "f" represents an integer satisfying 0≤f≤5+2y−g; and "g" represents an integer of 1 to 3.

* * * * *